United States Patent [19]

Wilczek

[11] 4,122,996
[45] Oct. 31, 1978

[54] COPY REPRODUCTION MACHINE WITH CONTROLLER SELF CHECK SYSTEM

[75] Inventor: Stephen P. Wilczek, Fairport, N.Y.

[73] Assignee: Xerox Corporation, Stamford, Conn.

[21] Appl. No.: 829,018

[22] Filed: Aug. 30, 1977

[51] Int. Cl.$^2$ .................... G11C 29/00; G06F 11/00
[52] U.S. Cl. .................. 235/302.3; 235/304; 235/312; 355/14; 364/900
[58] Field of Search ............ 235/302.3, 312, 304; 364/900, 200; 355/14

[56] References Cited

U.S. PATENT DOCUMENTS 3,838,264  9/1974  Maker .......................... 235/312

OTHER PUBLICATIONS

Glickstein, Weighted Checksum to Detect and Restore Altered Bits in Mar. 1971, pp. 3146–3147. Computer Memory, I.B.M. Technical Disclosure Bulletin, vol. 13, No. 10.

Crandall, et al., Dynamic Self-Checking for a Read-Only Storage, I.B.M. Technical Disclosure Bulletin, vol. 19, No. 8, Jan. 1977, pp. 2868–2869.

*Primary Examiner*—Charles E. Atkinson

[57] ABSTRACT

An electrostatographic type copying or reproduction machine incorporating a programmable controller to operate the various machine components in an integrated manner to produce copies is disclosed. The controller carries a master program bearing machine operating parameters from which an operating program for the specific copy run desired is formed and used to operate the machine components to produce the copies programmed. A multiple prioritized interrupt system is employed to distribute the operating program to the machine.

Self check routines check the operational integrity of the controller prior to start-up of the machine and periodically while the machine is processing copies.

4 Claims, 62 Drawing Figures

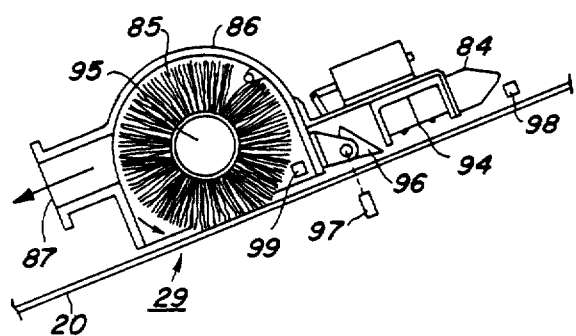
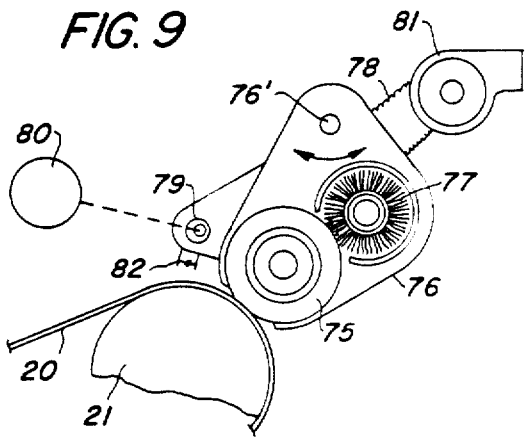
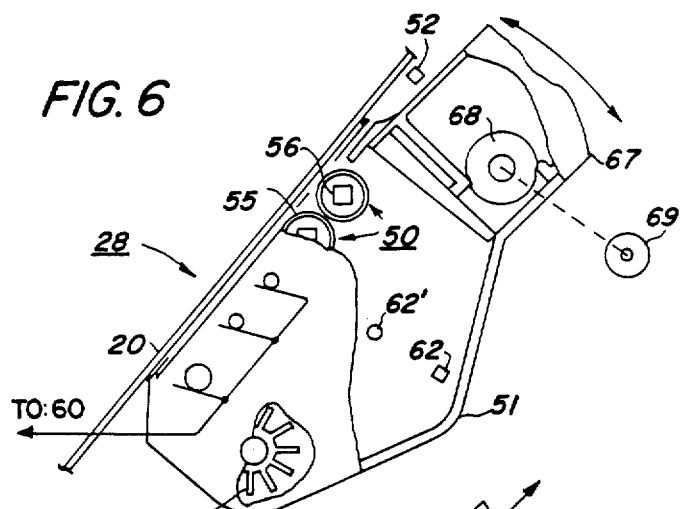
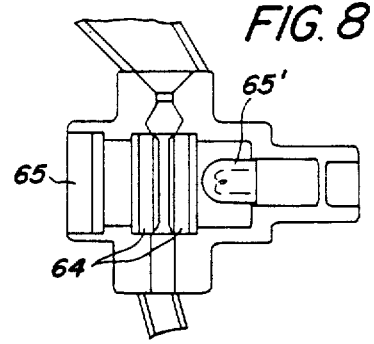
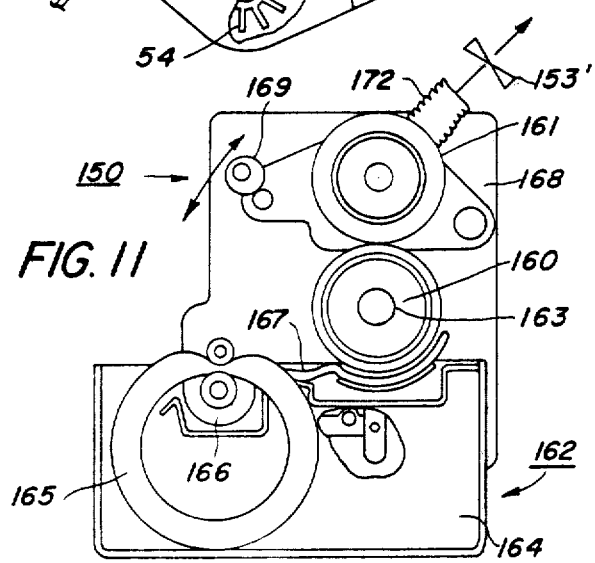
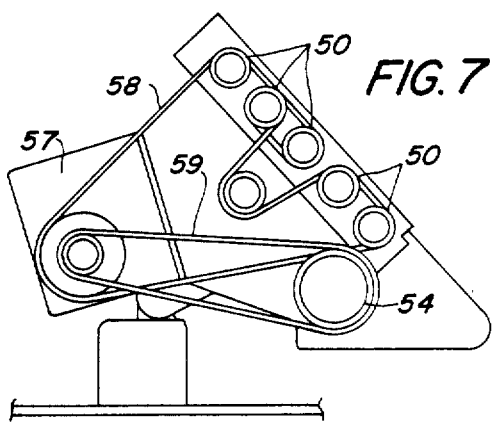
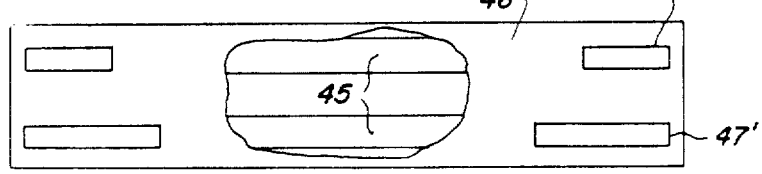

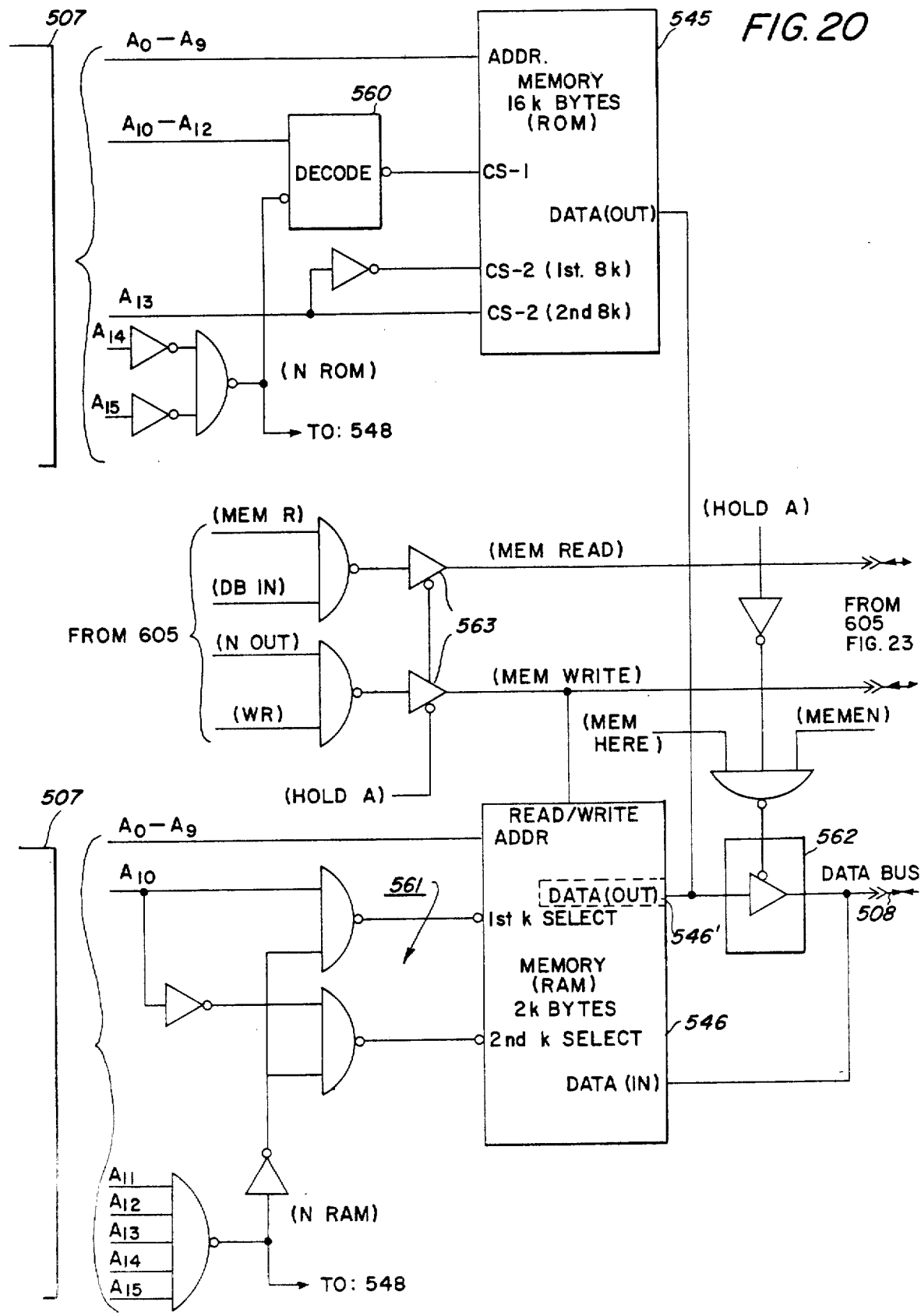

MEMORY READY

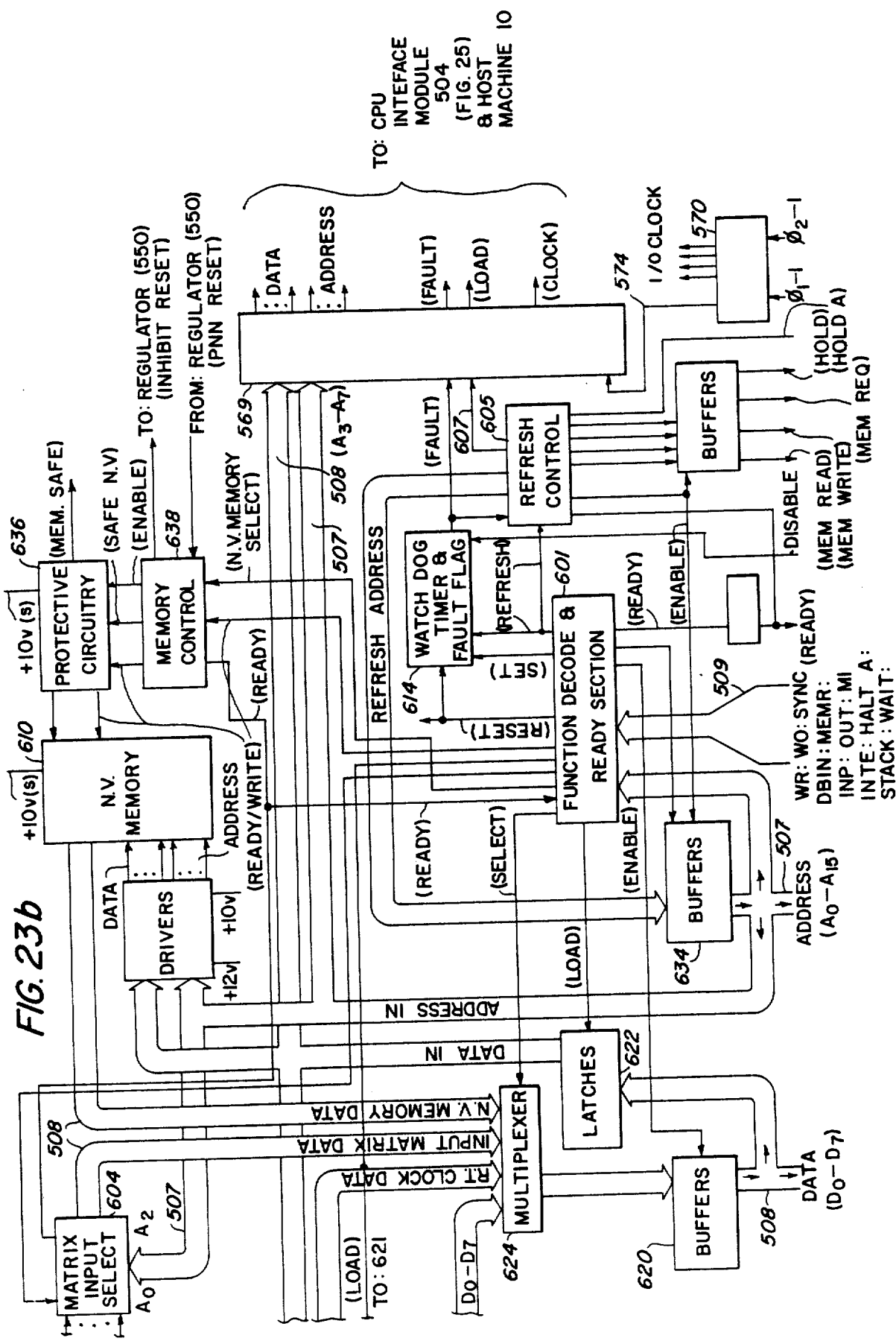

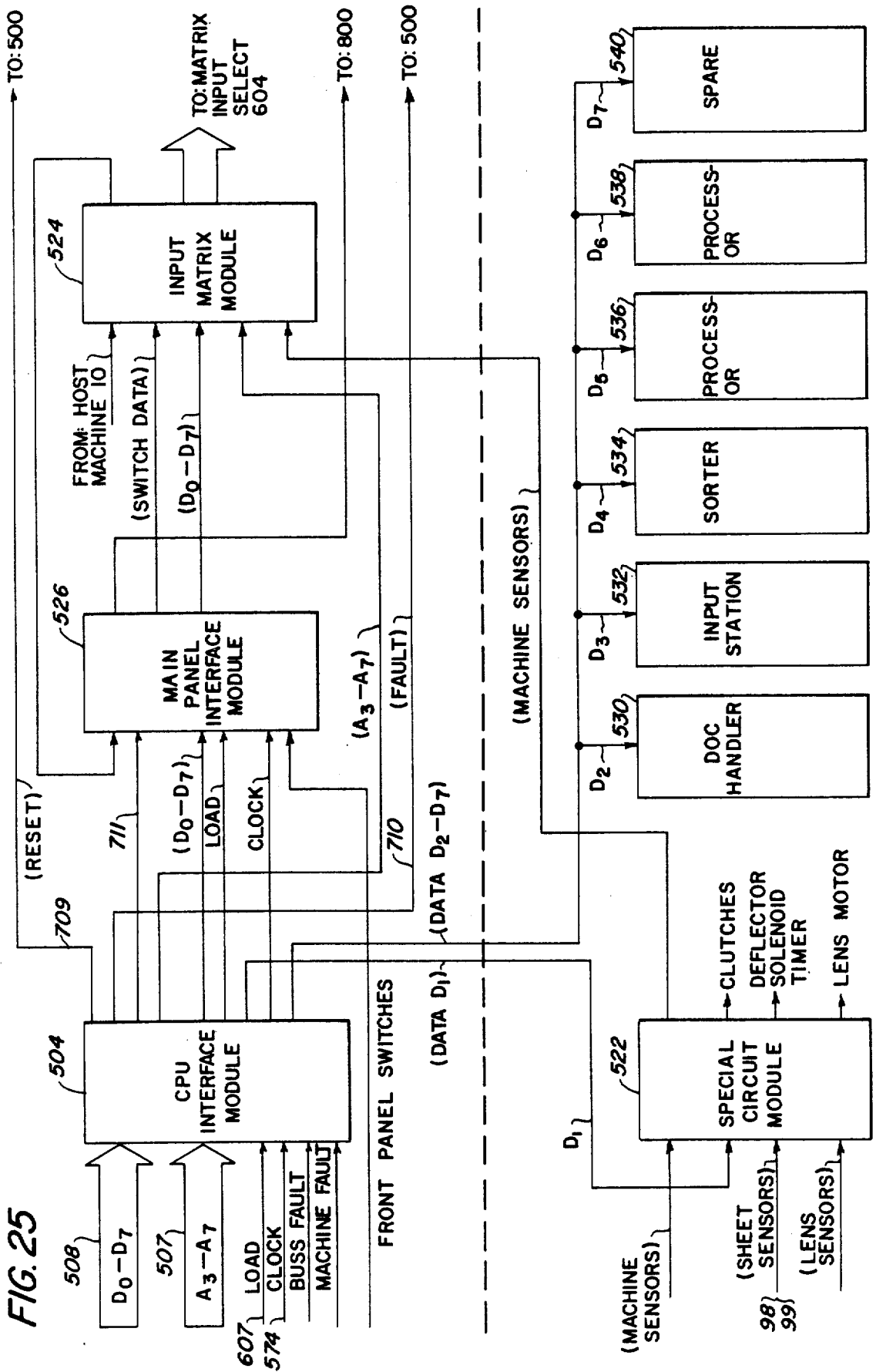

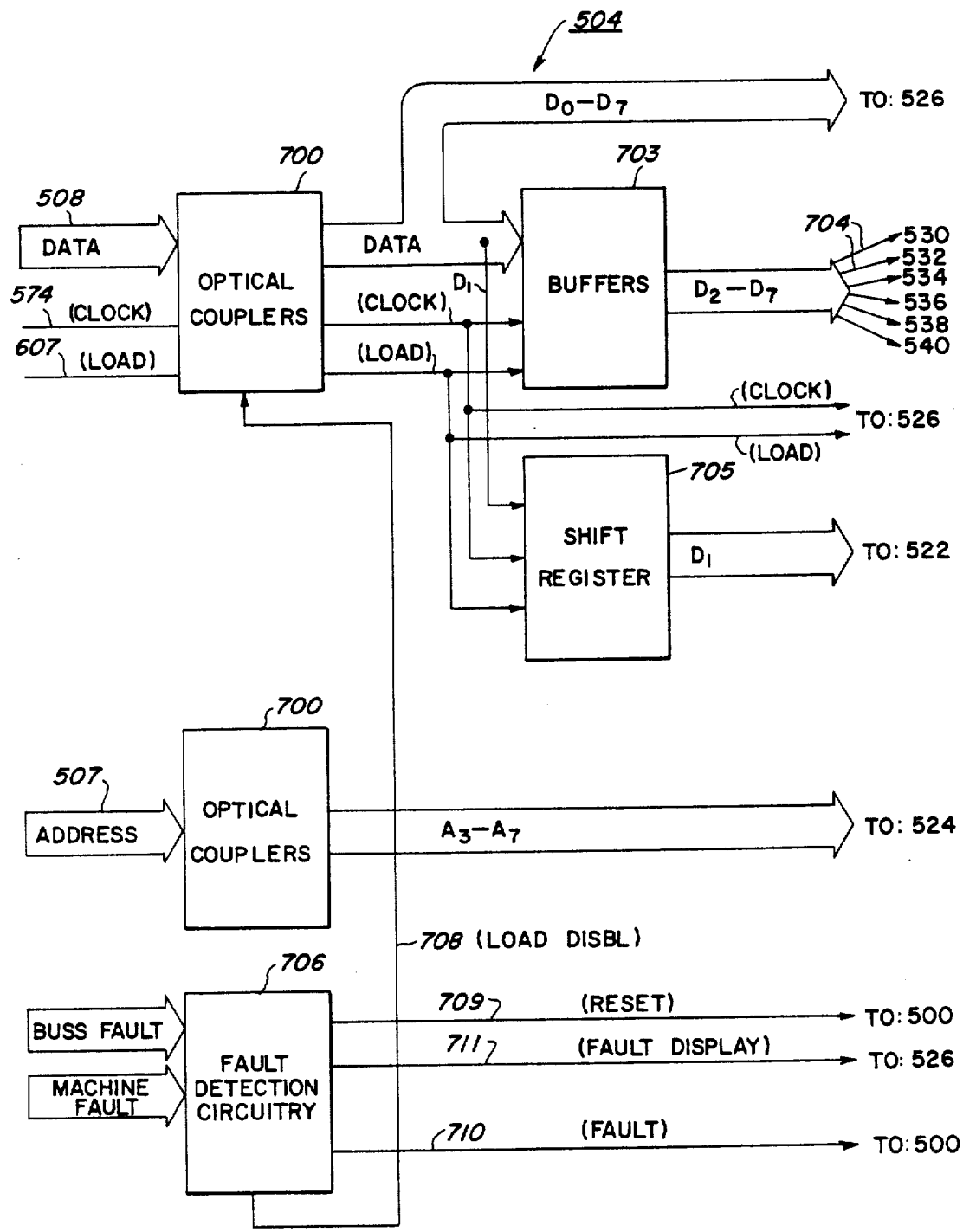

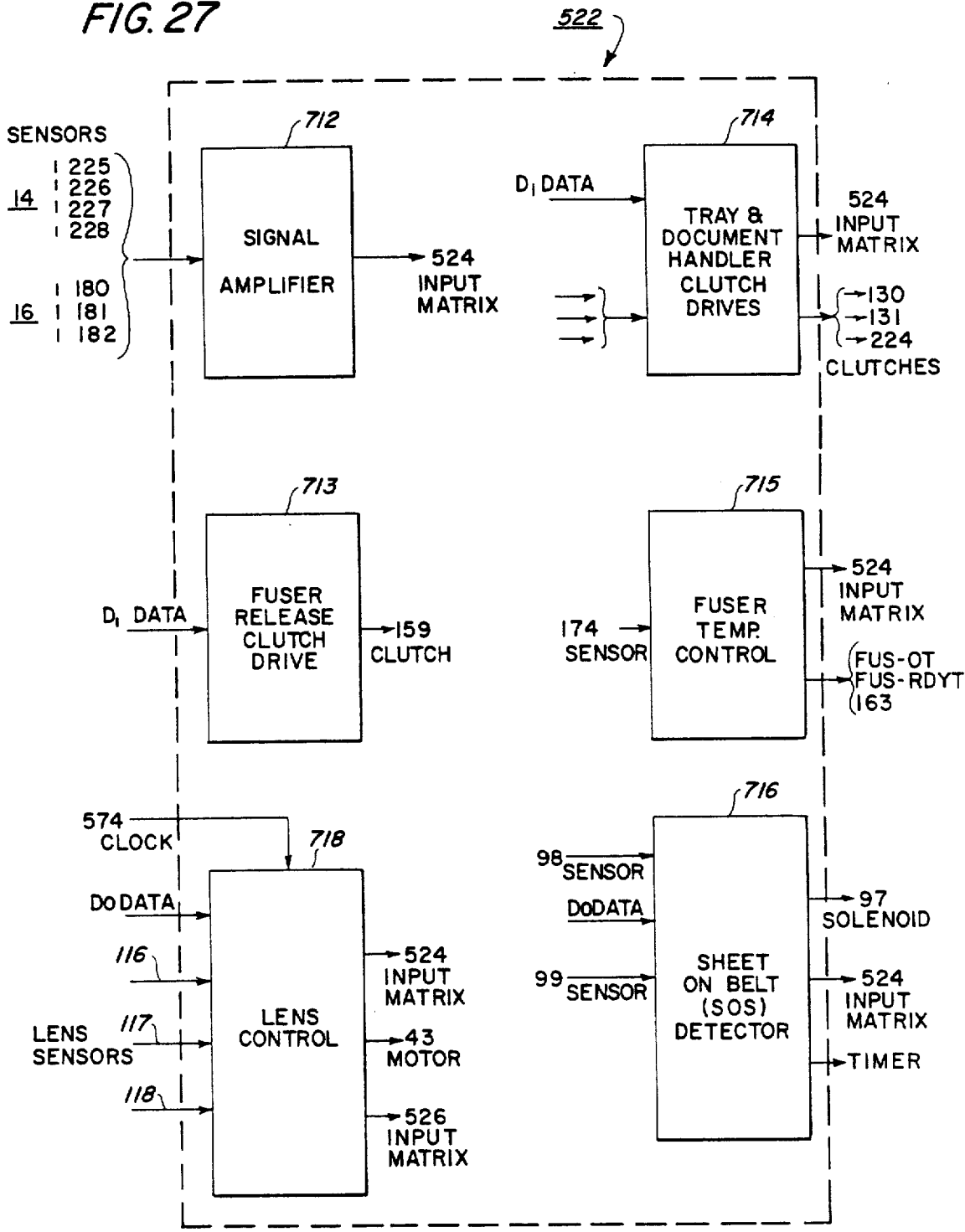

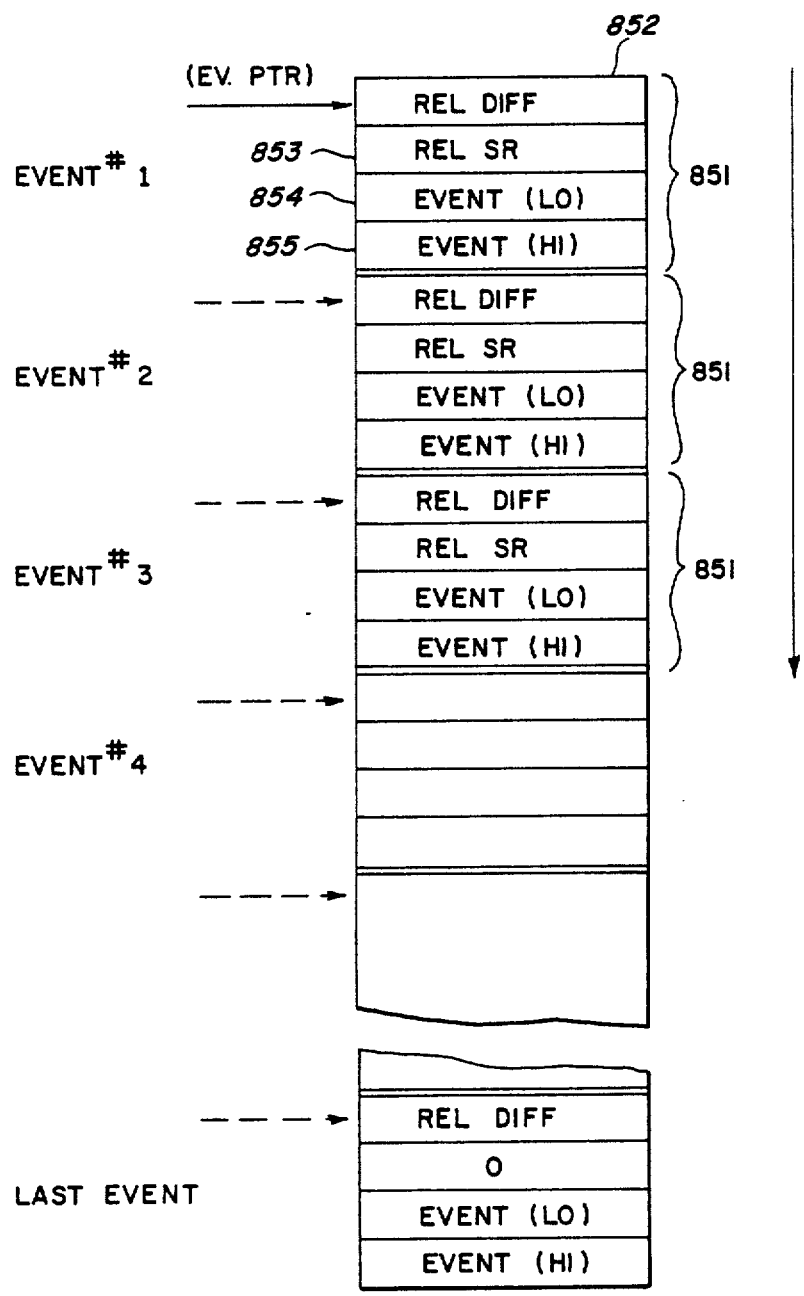

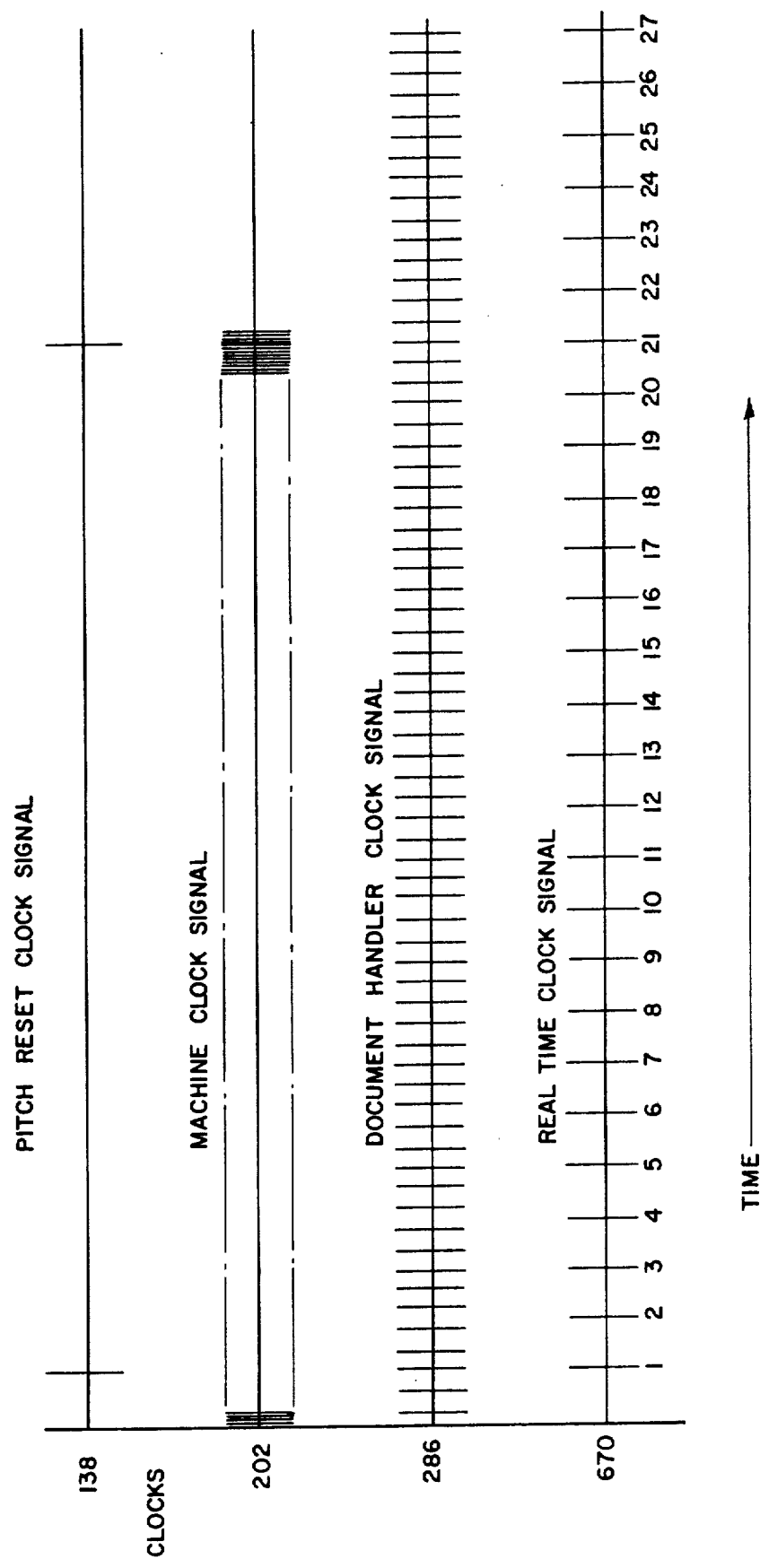

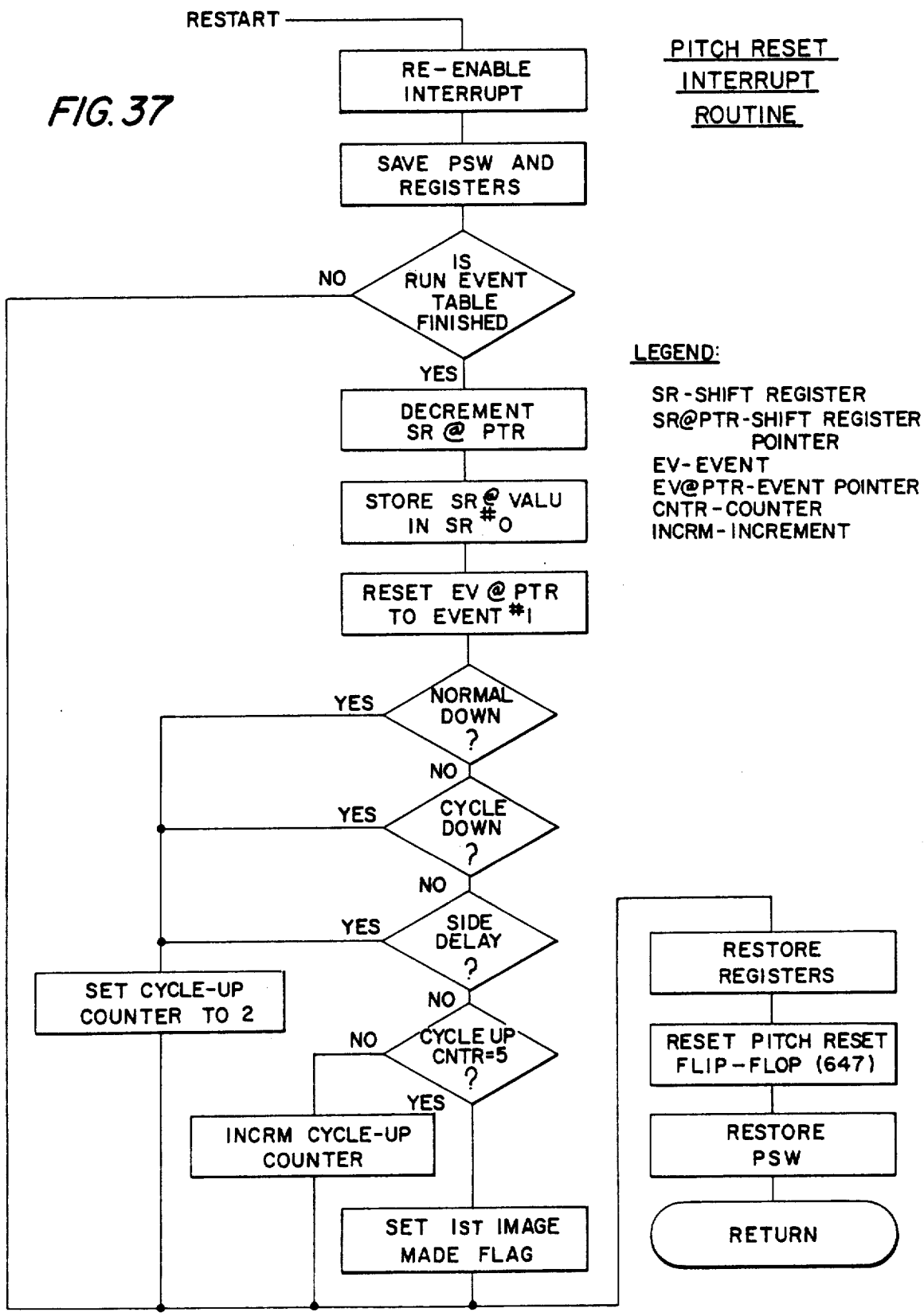

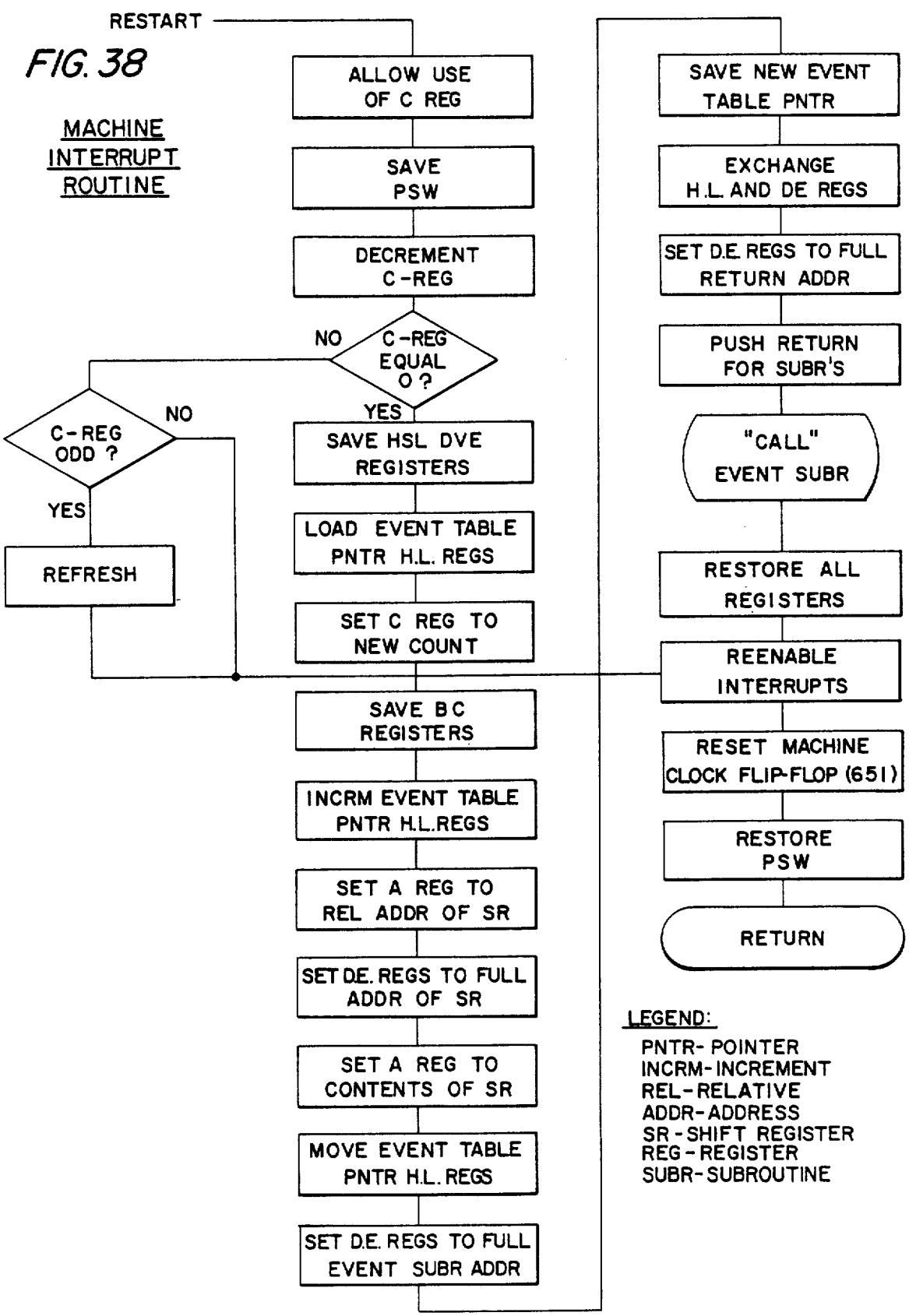

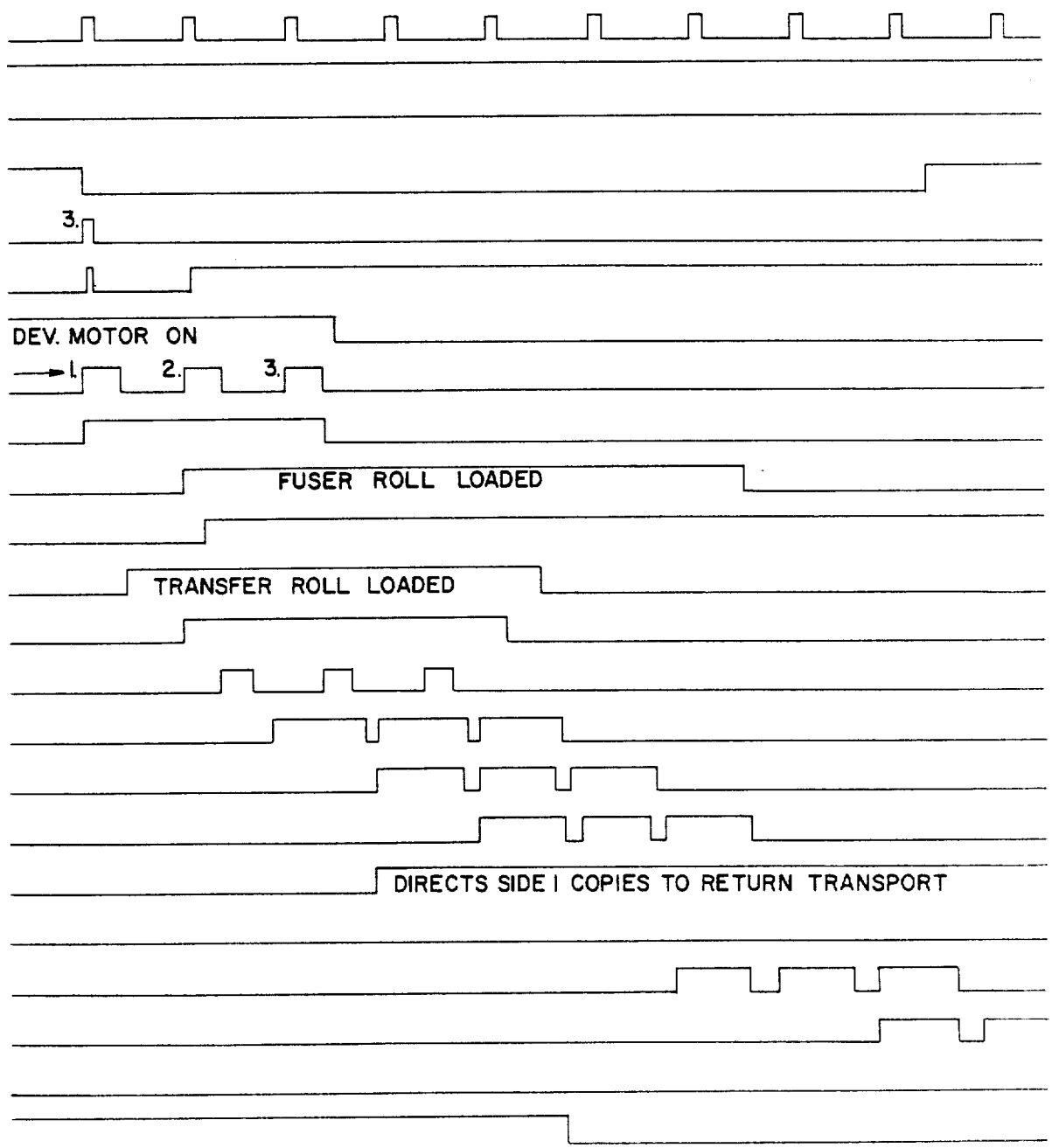

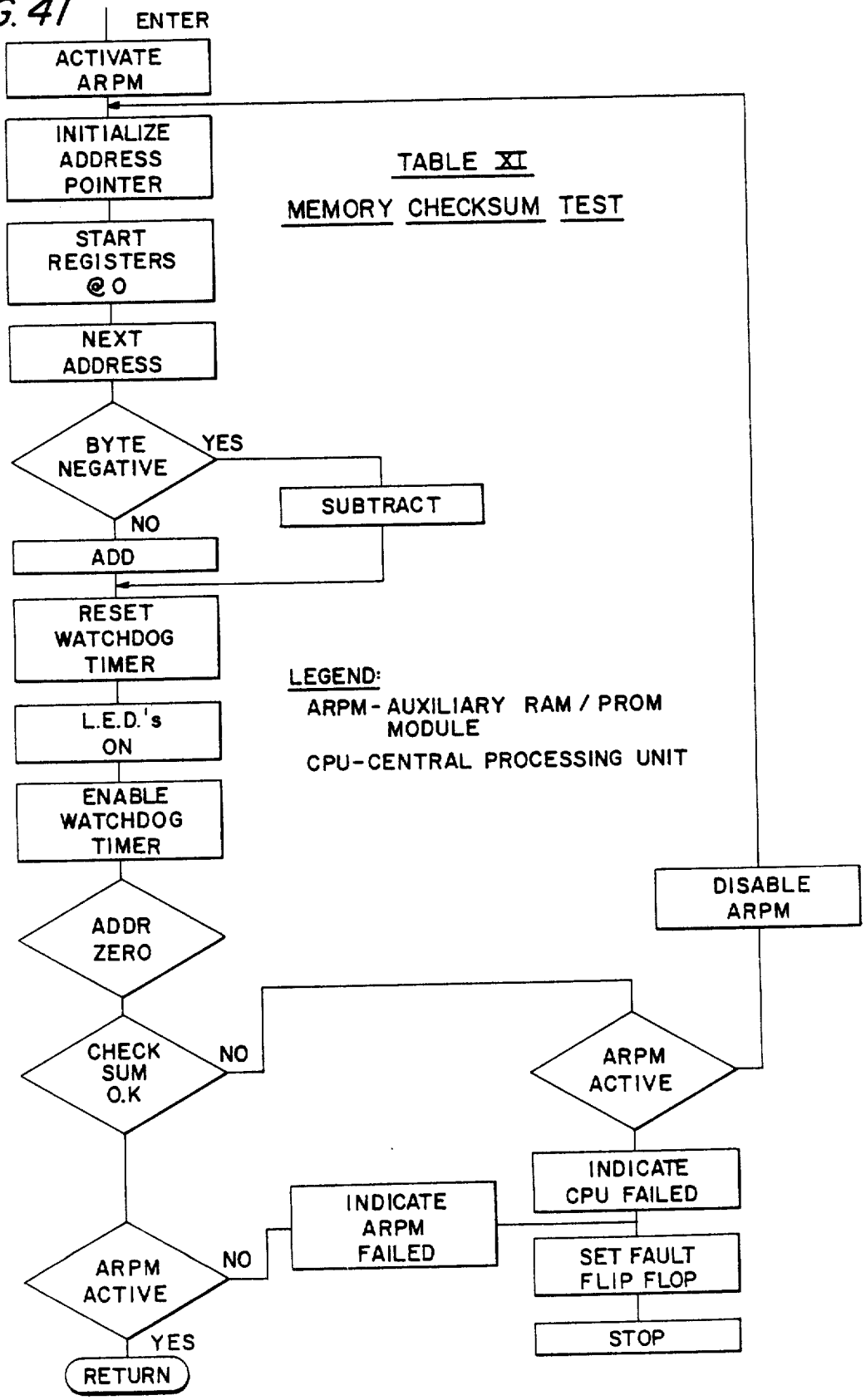

TABLE XII - PART II
RAM MEMORY TEST

LEGEND:
ADDR. — ADDRESS
CMP — COMPARE
CHK — CHECK
ARPM — AUXILLIARY RAM/PROM MODULE

FIG. 42b
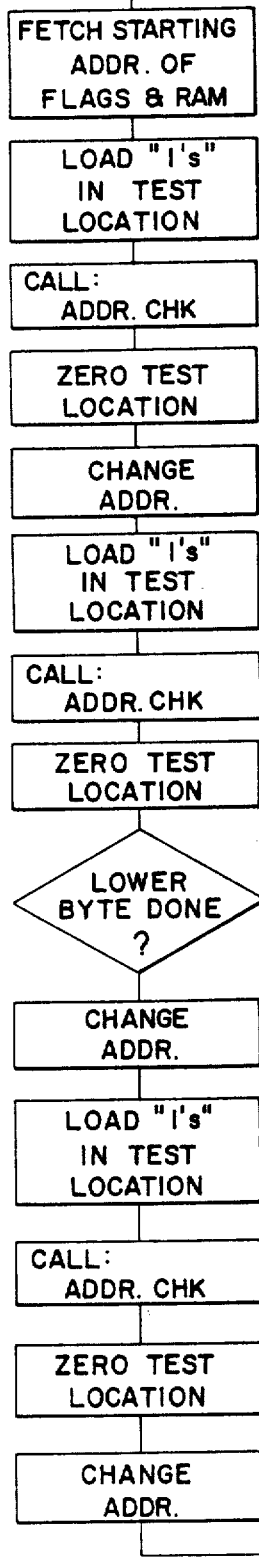
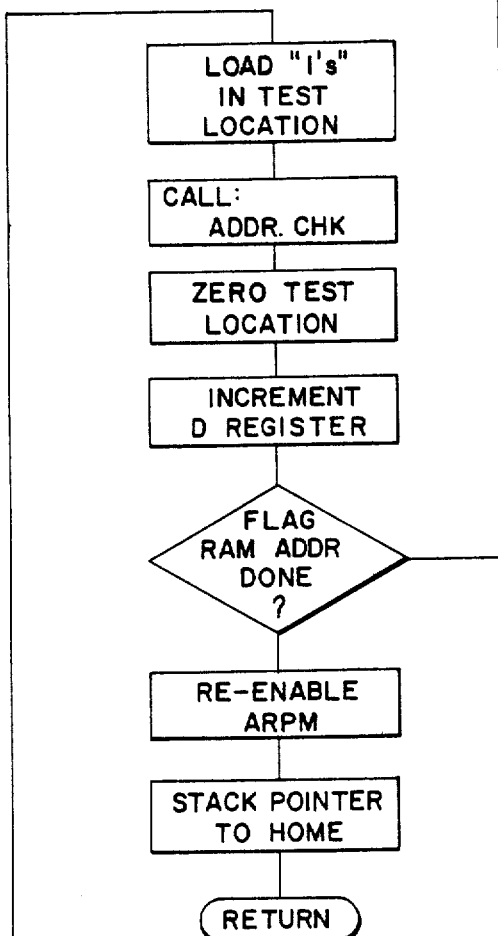
TABLE XII - PART II
CHECK FOR SHORTED OR OPEN ADDRESS LINES OR IMPROPER DECODE

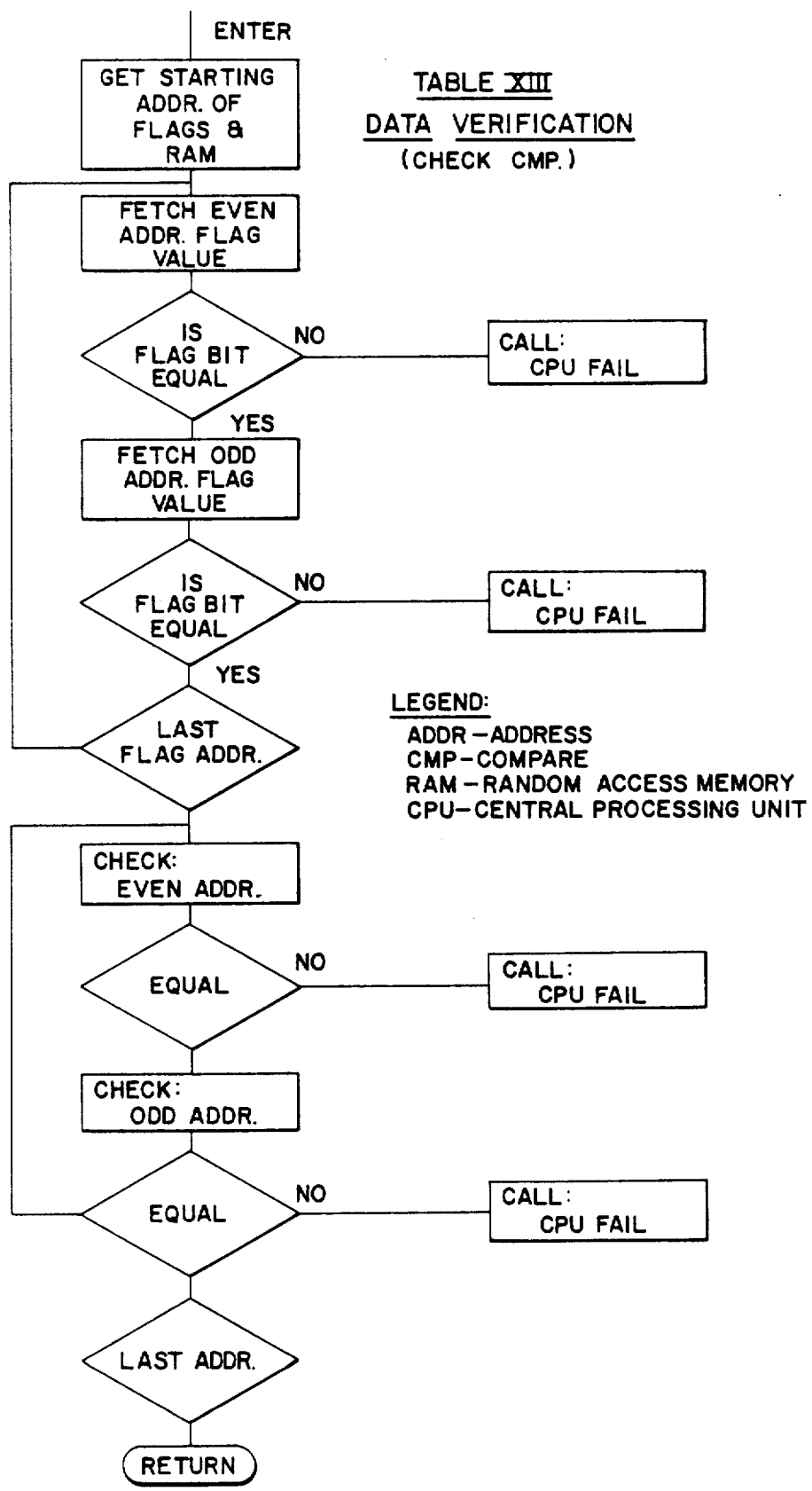

TABLE XV
NON-VOLATILE MEMORY TEST

LEGEND:
NVM — NON-VOLATILE MEMORY (610)
IOP — INPUT / OUTPUT MODULE (502)
NIB — NIBBLE

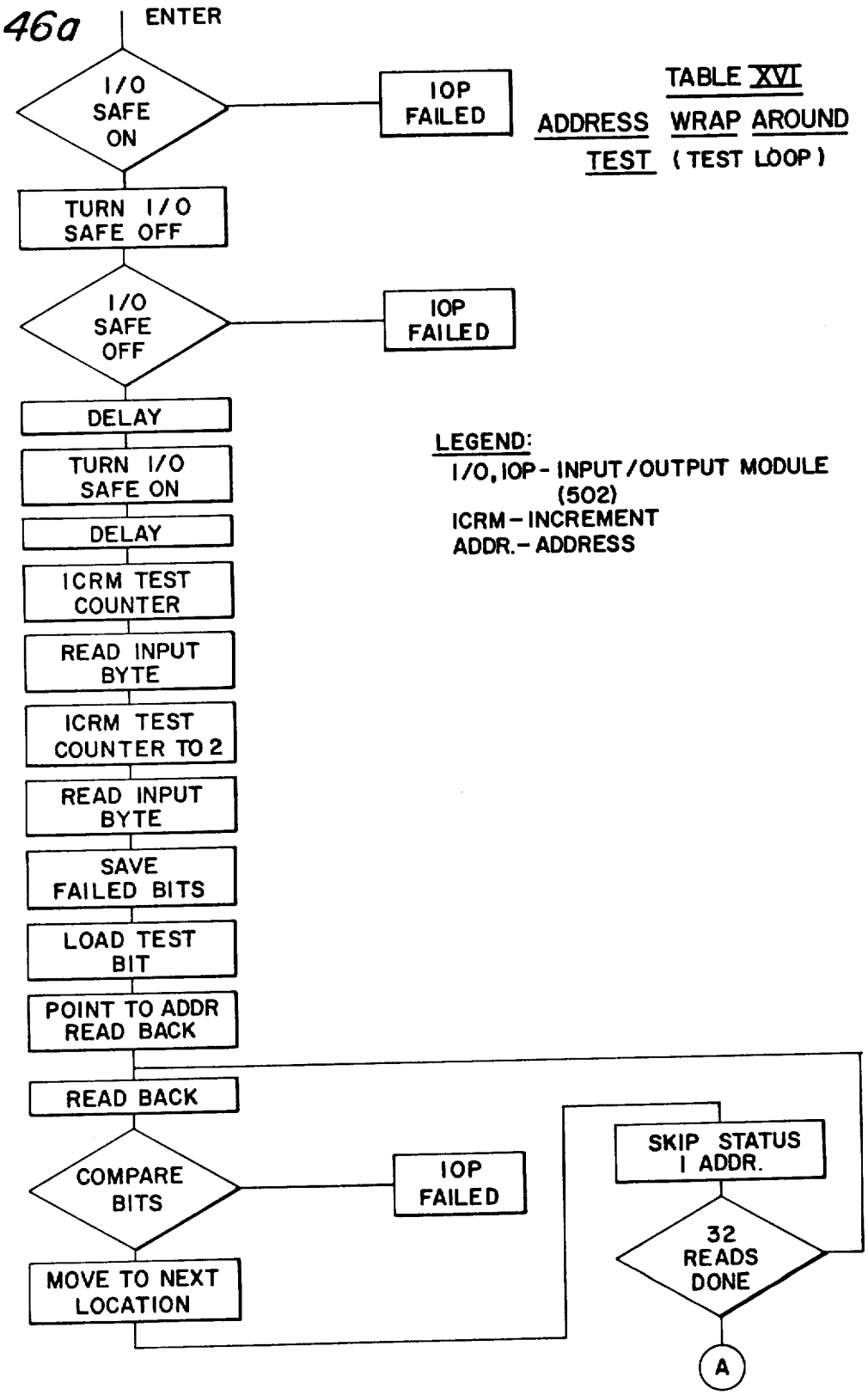

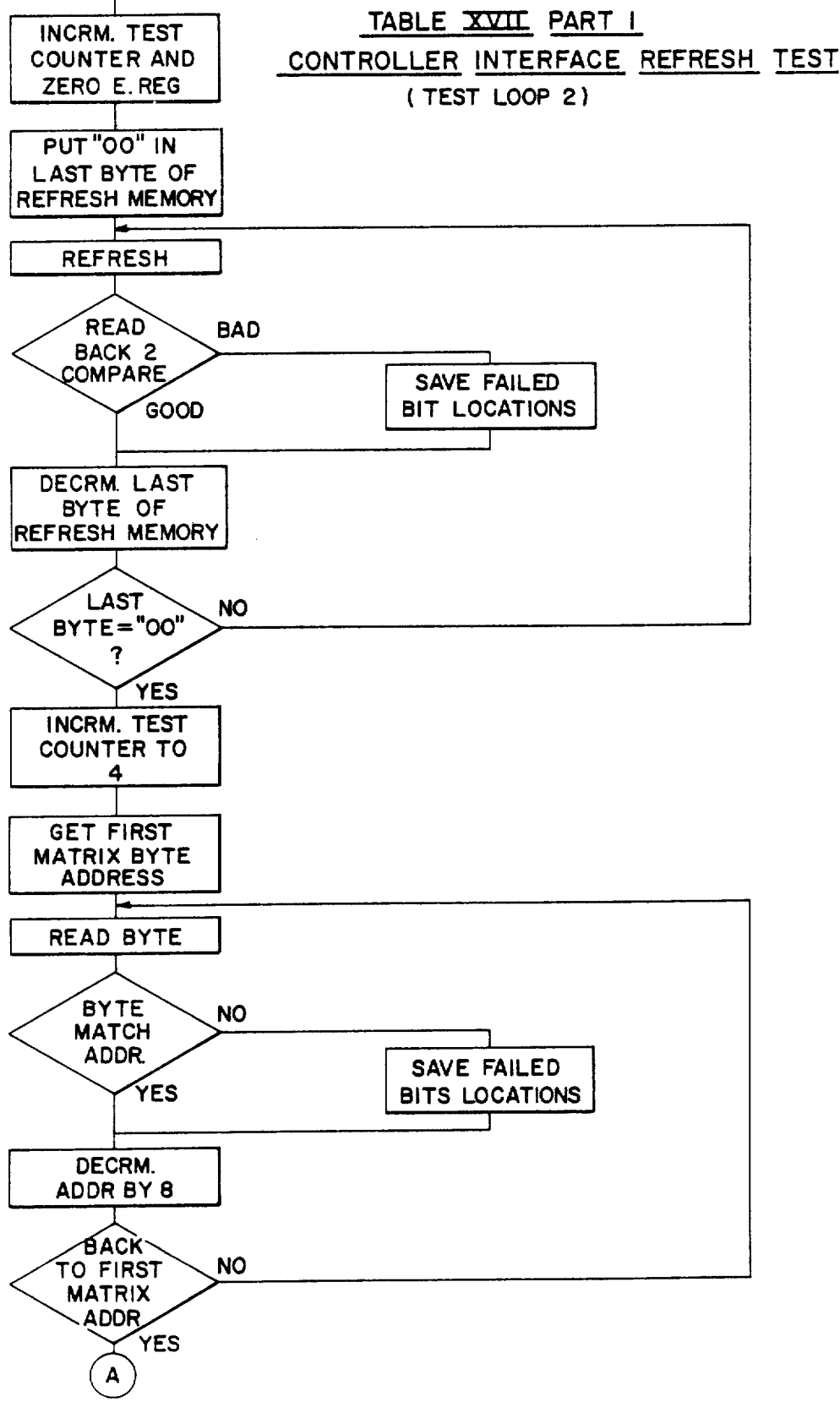

LEGEND:
ICRM.- INCREMENT
REG.- REGISTER
DECRM.- DECREMENT
ADDR.- ADDRESS
CTL.- CONTROLLER
INT.- INTERFACE
IOP.- INPUT / OUTPUT MODULE (502)

TABLE XVIII

DATA TRANSMISSION TO DIDGIT DISPLAY TEST

LEGEND:

MNPL. CK – MAIN PANEL CHECK
(TABLE XX)

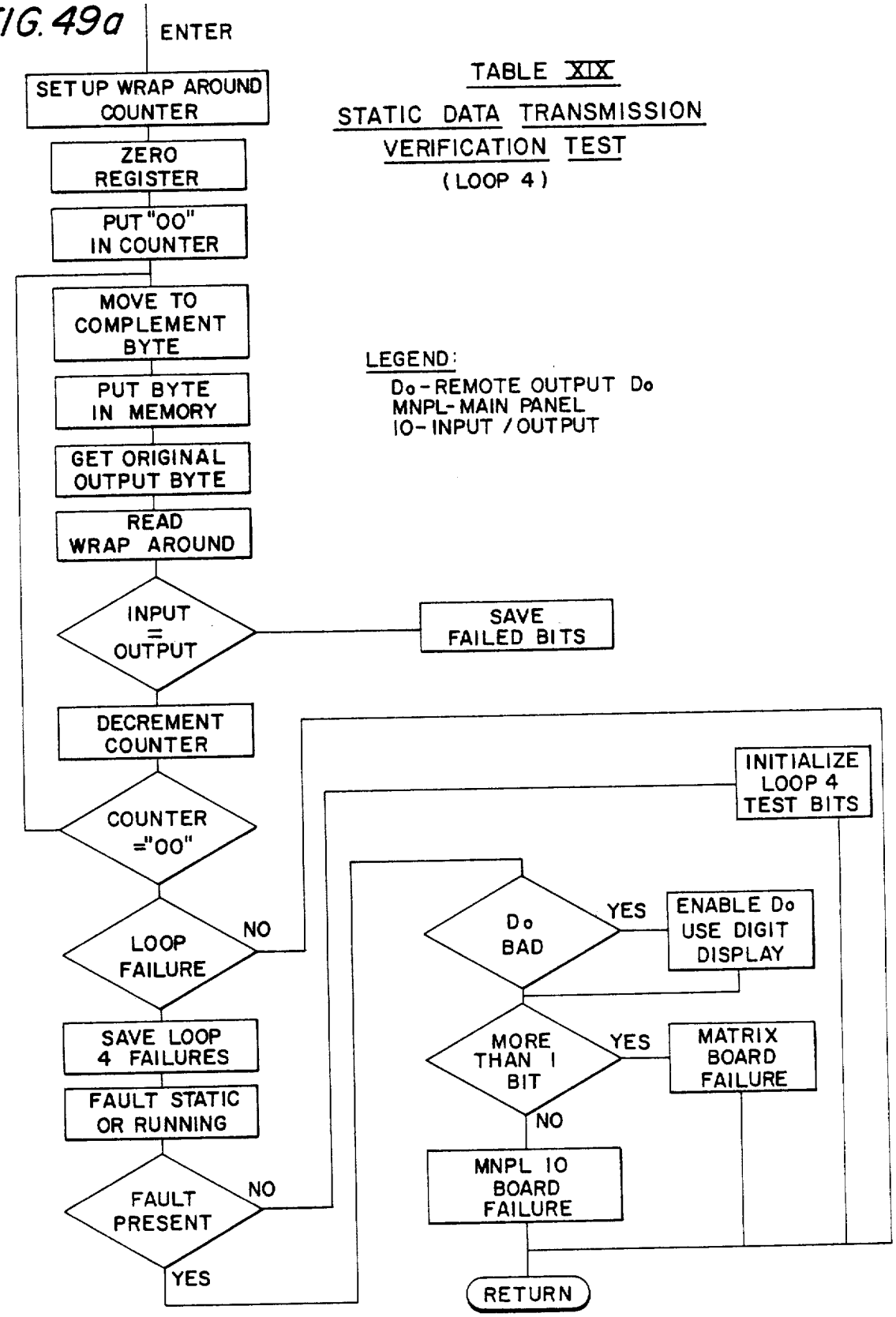

TABLE XIX

COPY REPRODUCTION MACHINE WITH CONTROLLER SELF CHECK SYSTEM

BACKGROUND OF THE INVENTION

This invention relates to electrostatographic xerographic type reproduction machines, and more particularly, to an improved control system for such machines.

The advent of higher speed and more complex copiers and reproduction machines has brought with it a corresponding increase in the complexity in the machine control wiring and logic. While this complexity manifests itself in many ways, perhaps the most onerous involves the inflexibility of the typical control logic/wiring systems. For as can be appreciated, simple unsophisticated machines with relatively simple control logic and wiring can be altered and modified easily to incorporate changes, retrofits, and the like. Servicing and repair of the control logic is also fairly simple. On the other hand, some modern high speed machines, which often include sorters, a document handler, choice of copy size, multiple paper trays, jam protection and the like have extremely complex logic systems making the most minor changes and improvements in the control logic difficult, expensive and time consuming. And servicing or repairing the machine control logic may similarly entail substantial difficulty, time and expense.

To mitigate problems of the type alluded to, a programmable controller may be used, enabling changes and improvements in the machine operation to be made through the expediency of reprogramming the controller. However, the control data which operates the machine and which is stored in the controller memory pending use, must be transferred to the various machine components at the proper time and in the correct sequence without unduly interfering with or introducing unnecessarily upon the other essential functions and operations of the controller.

It is therefore an object of the present invention to provide a new and improved control system for electrostatographic type reproduction machines.

It is a further object of the present invention to provide a self-testing system for the controller of a reproduction machine.

It is an object of the present invention to provide a system for checking the operating condition of the controller in a reproduction machine both before start-up of the machine and periodically during machine operation.

It is an object of the present invention to provide an improved arrangement for verifying the operating integrity of a reproduction machine controller and terminating machine operation in the event a fault is found.

It is a further object of the present invention to provide a system for checking the operational integrity of a copier controller and identifying, in the event a malfunction is found, the offending controller part.

The invention relates to a method for checking the integrity of the memory section of a controller for an electrostatic type reproduction machine, the steps comprising: totalizing the content of said memory; comparing the memory total with a predetermined checksum; and preventing operation of said machine when said memory total is different than said predetermined checksum.

BRIEF DESCRIPTION OF THE DRAWINGS

Other objects and advantages will be apparent from the ensuing description and drawings in which:

FIG. 5 is an enlarged view showing details of the photoreceptor edge fade-out mechanism for the apparatus shown in FIG. 1;

FIG. 6 is an enlarged view showing details of the developing mechanism for the apparatus shown in FIG. 1;

FIG. 7 is an enlarged view showing details of the developing mechanism drive;

FIG. 8 is an enlarged view showing details of the developability control for the apparatus shown in FIG. 1;

FIG. 9 is an enlarged view showing details of the transfer roll support mechanism for the apparatus shown in FIG. 1;

FIG. 10 is an enlarged view showing details of the photoreceptor cleaning mechanism for the apparatus shown in FIG. 1;

FIG. 11 is an enlarged view showing details of the fuser for the apparatus shown in FIG. 1;

FIG. 19b is a chart illustrating the output wave form of the clock shown in FIG. 19a;

FIG. 20 is a logic schematic of the CPU memory;

FIGS. 23a and 23b comprise a block diagram of the controller I/O module;

FIG. 25 is a block diagram of the apparatus interface and remote output connections;

FIG. 26 is a block diagram of the CPU interface module;

FIG. 27 is a block diagram of the apparatus special circuits module;

FIG. 35 is a view showing the event table layout;

FIG. 36 is a chart illustrating the relative timing sequences of the clock interrupt pulses;

FIG. 37 is a flow charge of the pitch interrupt routine;

FIG. 38 is a flow chart of the machine clock interrupt routine;

FIGS. 40a, 40b, 40c are a timing chart of the principal operating components of the host machine in an exemplary copy run; and FIG. 41 is a flow chart showing the memory checksum comparison test routine;

FIGS. 42a and 42b are the flow charts showing the output driver stuck test routines;

FIG. 43 is a flow chart showing the check checker board pattern routine;

FIGS. 46a and 46b are a flow chart showing the address wrap around test routine;

FIGS. 47a and 47b are a flow chart showing the controller interface refresh test routine;

DETAILED DESCRIPTION OF THE PREFERRED EMBODIMENT OF THE INVENTION

Figure 1:
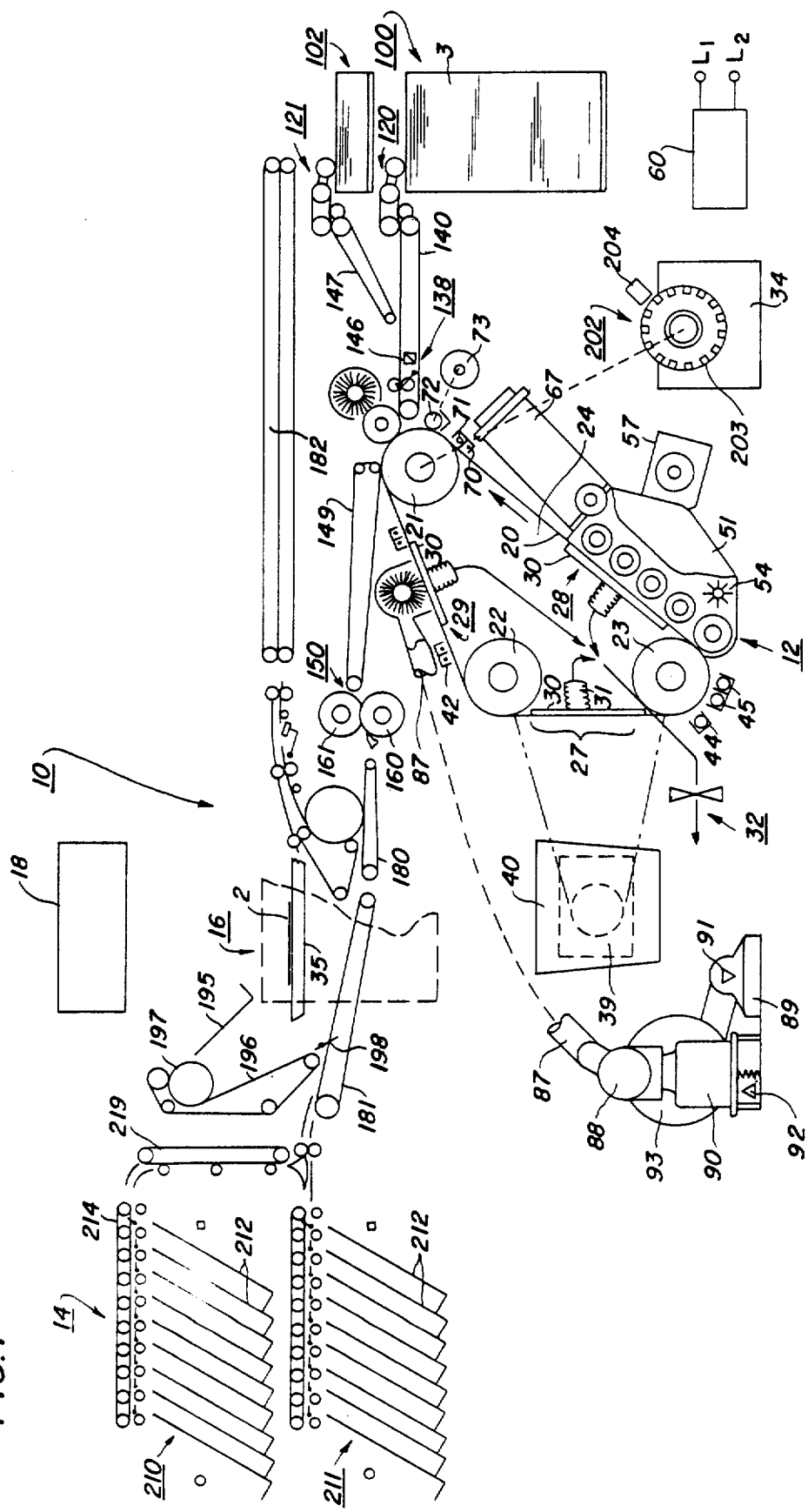
FIG. 1 is a schematic representation of an exemplary reproduction apparatus incorporating the control system of the present invention.
Figure 2:
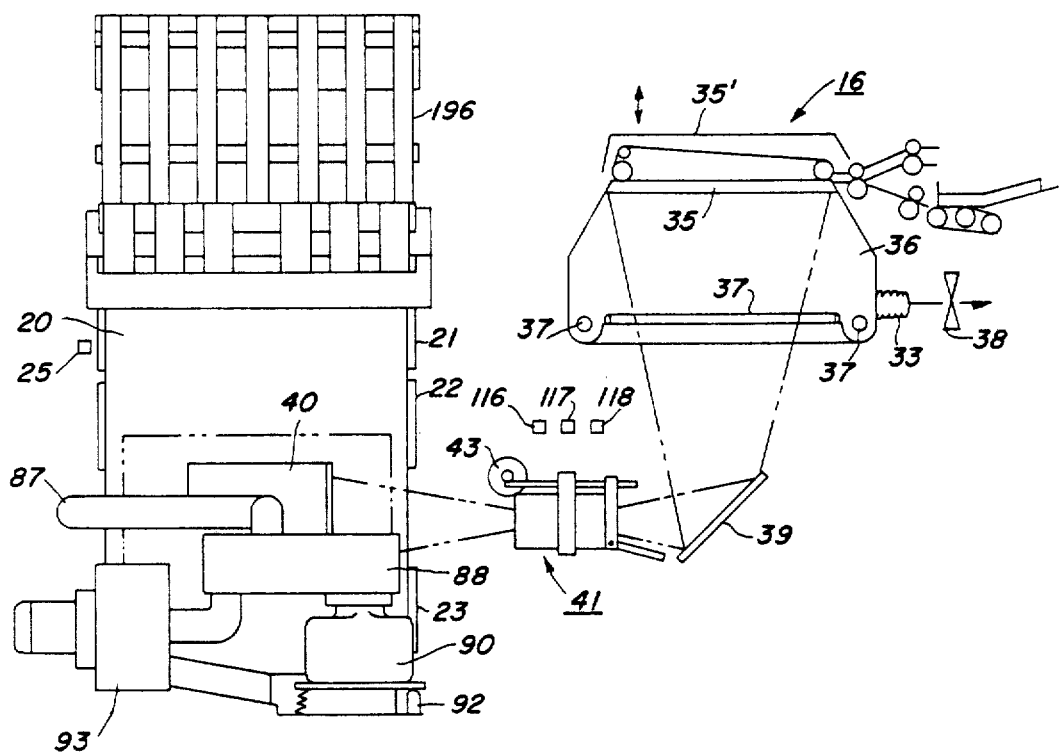
FIG. 2 is a vertical sectional view of the apparatus shown in FIG. 1 along the image plane.
Figure 3:
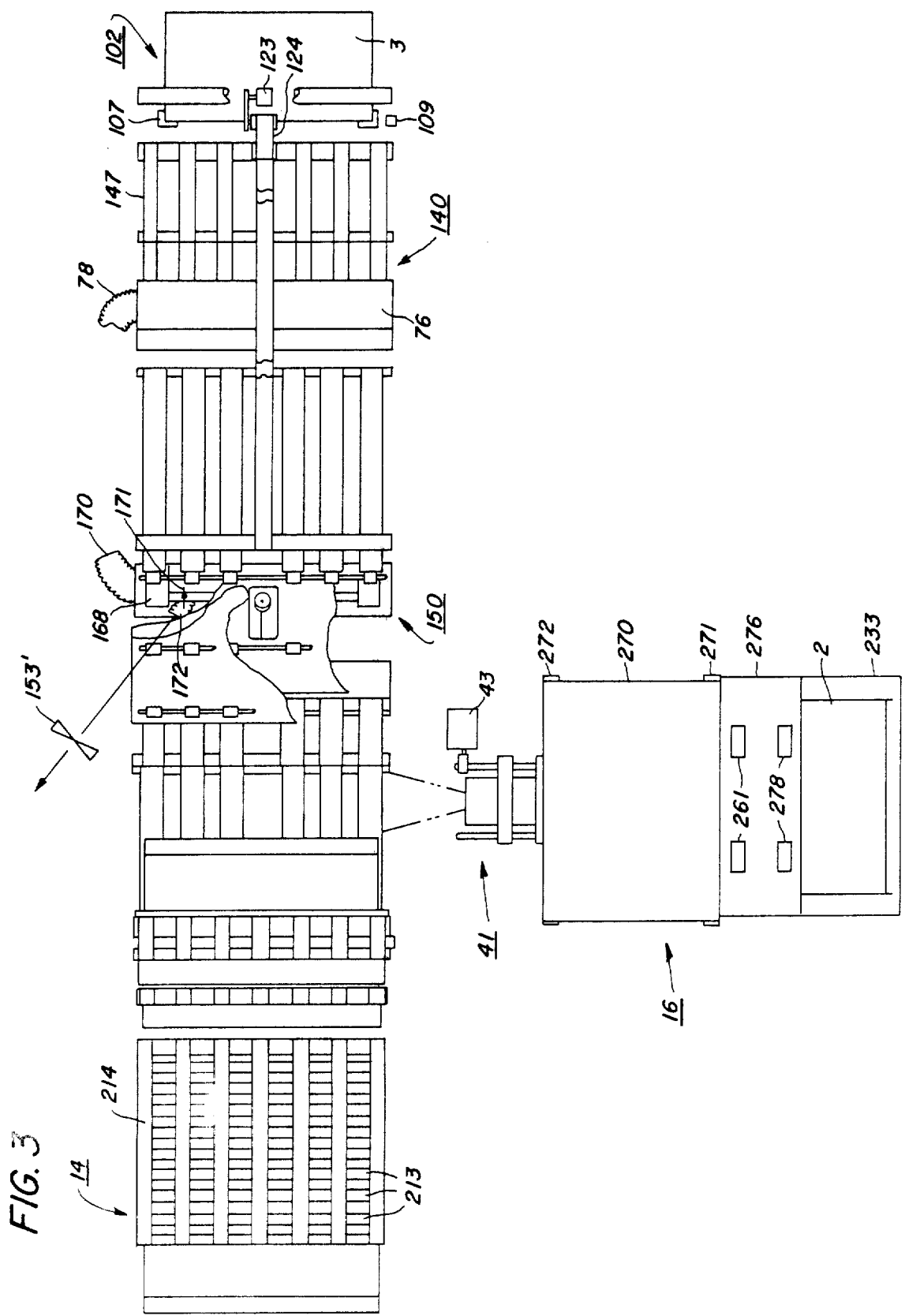
FIG. 3 is a top plane view of the apparatus shown in FIG. 1.

Referring particularly to FIGS. 1–3 of the drawings, there is shown, in schematic outline, an electrostatic reproduction system or host machine, identified by numeral 10, incorporating the control arrangement of the present invention. To facilitate description, the reproduction system 10 is divided into a main electrostatic xerographic processor 12, sorter 14, document handler 16, and controller 18. Other processor, sorter and/or document handler types and constructions, and different combinations thereof may instead by envisioned.

PROCESSOR

Processor 12 utilizes a photoreceptor in the form of an endless photoconductive belt 20 supported in generally triangular configuration by rolls 21, 22, 23. Belt supporting rolls 21, 22, 23 are in turn rotatably journaled on subframe 24.

In the exemplary processor illustrated, belt 20 comprises a photoconductive layer of selenium, which is the light receiving surface and imaging medium, on a conductive substrate. Other photoreceptor types and forms, such as comprising organic materials or of multilayers or a drum may instead be envisioned. Still other forms may comprise scroll type arrangements wherein webs of photoconductive material may be played in and out of the interior of supporting cylinders.

Figure 4:
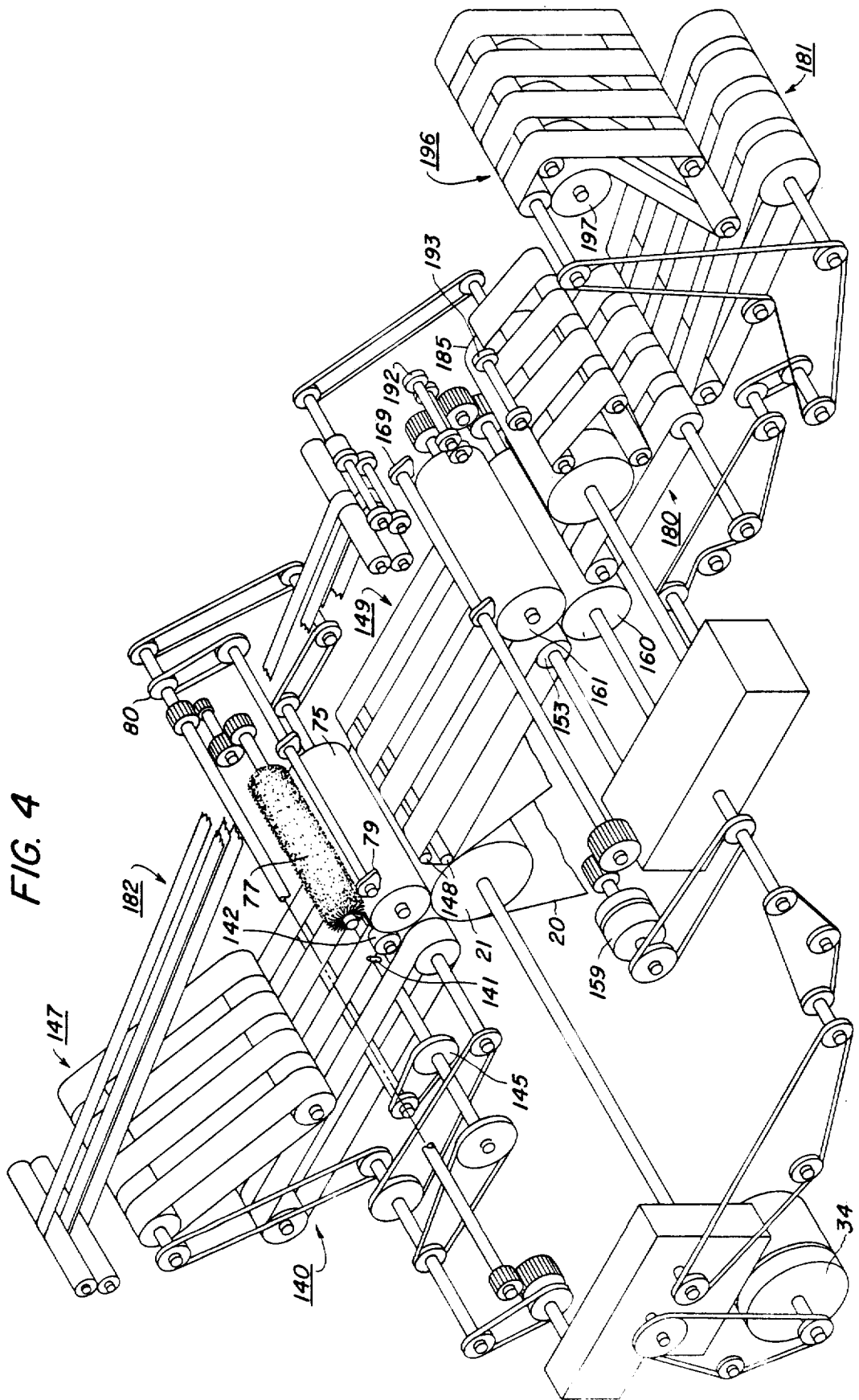
FIG. 4 is an isometric view showing the drive train for the apparatus shown in FIG. 1.

Suitable biasing means (not shown) are provided on subframe 24 to tension the photoreceptor belt 20 and insure movement of belt 20 along a prescribed operating path. Belt tracking switch 25 (shown in FIG. 2) monitors movement of belt 20 from side to side. Belt 20 is supported so as to provide a trio of substantially flat belt runs opposite exposure, developing, and cleaning stations 27, 28, 29 respectfully. To enhance belt flatness at these stations, vacuum platens 30 are provided under belt 20 at each belt run. Conduits 31 communicate vacuum platens 30 with a vacuum pump 32. Photoconductive belt 20 moves in the direction indicated by the solid line arrow, drive thereto being effected through roll 21, which in turn is driven by main drive motor 34, as seen in FIG. 4.

Processor 12 includes a generally rectangular, horizontal transparent platen 35 on which each original 2 to be copied is disposed. A two or four sided illumination assembly, consisting of internal reflectors 36 and flash lamps 37 (shown in FIG. 2) disposed below and along at least two sides of platen 35, is provided for illuminating the original 2 on platen 35. To control temperatures within the illumination space, the assembly is coupled through conduit 33 with a vacuum pump 38 which is adapted to withdraw overly heated air from the space. To retain the original 2 in place on platen 35 and prevent escape of extraneous light from the illumination assembly, a platen cover 35' may be provided.

The light image generated by the illumination system is projected via mirrors 39, 40 and a variable magnification lens assembly 41 onto the photoreceptive belt 20 at the exposure station 27. Reversible motor 43 is provided to move the main lens and add on lens elements that comprise the lens assembly 41 to different predetermined positions and combinations to provide the preselected image sizes corresponding to push button selectors 818, 819, 820 on operator module 800. (See FIG. 32) Sensors 116, 117, 118 signal the present disposition of lens assembly 41. Exposure of the previously charged belt 20 selectively discharges the photoconductive belt to produce on belt 20 an electrostatic latent image of the original 2. To prepare belt 20 for imaging, belt 20 is uniformly charged to a preselected level by charge corotron 42 upstream of the exposure station 27.

To prevent development of charged but unwanted image areas, erase lamps 44, 45 are provided. Lamp 44, which is referred to herein as the pitch fadeout lamp, is supported in transverse relationship to belt 20, lamp 44 extending across substantially the entire width of belt 20 to erase (i.e. discharge) areas of belt 20 before the first image, between successive images, and after the last image. Lamps 45, which are referred to herein as edge fadeout lamps, serve to erase areas bordering each side of the images. Referring particularly to FIG. 5, edge fadeout lamps 45, which extend transversely to belt 20, are disposed within a housing 46 having a pair of transversely extending openings 47, 47' of differing length adjacent each edge of belt 20. By selectively actuating one or the other of the lamps 45, the width of the area bordering the sides of the image that is erased can be controlled.

Referring to FIGS. 1, 6 and 7, magnetic brush rolls 50 are provided in a developer housing 51 at developing station 28. Housing 51 is pivotally supported adjacent the lower end thereof with interlock switch 52 to sense disposition of housing 51 in operative position adjacent belt 20. The bottom of housing 51 forms a sump within which a supply of developing material is contained. A rotatable auger 54 in the sump area serves to mix the developing material and bring the material into operative relationship with the lowermost of the magnetic brush rolls 50.

As will be understood by those skilled in the art, the electrostatically attractable developing material commonly used in magnetic brush developing apparatus of the type shown comprises a pigmented resinous powder, referred to as toner, and larger granular beads referred to as carrier. To provide the necessary magnetic properties, the carrier is comprised of a magnetizable material such as steel. By virtue of the magnetic fields established by developing rolls 50 and the interrelationship therebetween, a blanket of developing material is formed along the surfaces of developing rolls 50 adjacent the belt 20 and extending from one roll to another. Toner is attracted to the electrostatic latent image from the carrier bristles to produce a visible powder image on the surface of belt 20.

Magnetic brush rolls 50 each comprise a rotatable exterior sleeve 55 with relatively stationary magnet 56 inside. Sleeves 55 are rotated in unison and at substantially the same speed as belt 20 by a developer drive motor 57 through a belt and pulley arrangement 58. A second belt and pulley arrangement 59 drives auger 54.

To regulate development of the latent electrostatic images on belt 20, magnetic brush sleeves 55 are electrically biased. A suitable power supply 60 is provided for this purpose with the amount of bias being regulated by controller 18.

Developing material is returned to the upper portion of developer housing 51 for reuse and is accomplished by utilizing a photocell 62 which monitors the level of developing material in housing 51 and a photocell lamp 62' spaced opposite to the photocell 62 in cooperative relationship therewith. The disclosed machine is also provided with automatic developability control which maintains an optimum proportion of toner-to-carrier material by sensing toner concentration and replenishing toner, as needed. As shown in FIG. 8, the automatic developability control comprises a pair of transparent plates 64 mounted in spaced, parallel arrangement in developer housing 51 such that a portion of the returning developing material passes therebetween. A suitable circuit, not shown, alternately places a charge on the plates 64 to attract toner thereto. Photocell 65 on one side of the plate pair senses the developer material as the material passes therebetween. Lamp 65' on the opposite side of plate pair 64 provides reference illumination. In this arrangement, the returning developing material is alternately attracted and repelled to and from plate 64. The accumulation of toner, i.e density determines the amount of light transmitted from lamp 65' to photocell 65. Photocell 65 monitors the density of the returning developing material with the signal output therefrom being used by controller 18 to control the amount of fresh or make-up toner to be added to developer housing 51 from toner supply container 67.

To discharge toner from container 67, rotatable dispensing roll 68 is provided in the inlet to developer housing 51. Motor 69 drives roll 68. When fresh toner is required, as determined by the signal from photocell 65, controller 18 actuates motor 69 to turn roll 68 for a timed interval. The rotating roll 68, which is comprised of a relatively porous sponge-like material, carries toner particles thereon into developer housing 51 where it is discharged. Pre-transfer corotron 70 and lamp 71 are provided downstream of magnetic brush rolls 50 to regulate developed image charges before transfer.

A magnetic pick-off roll 72 is rotatably supported opposite belt 20 downstream of pre-transfer lamp 71, roll 72 serving to scavenge leftover carrier from belt 20 preparatory to transfer of the developed image to the copy sheet 3. Motor 73 turns roll 72 in the same direction and at substantially the same speed as belt 20 to prevent scoring or scratching of belt 20. One type of magnetic pick-off roll is shown in U.S. Pat. No. 3,834,804, issued Oct. 10, 1974 to Bhagat et al.

Figure 12:
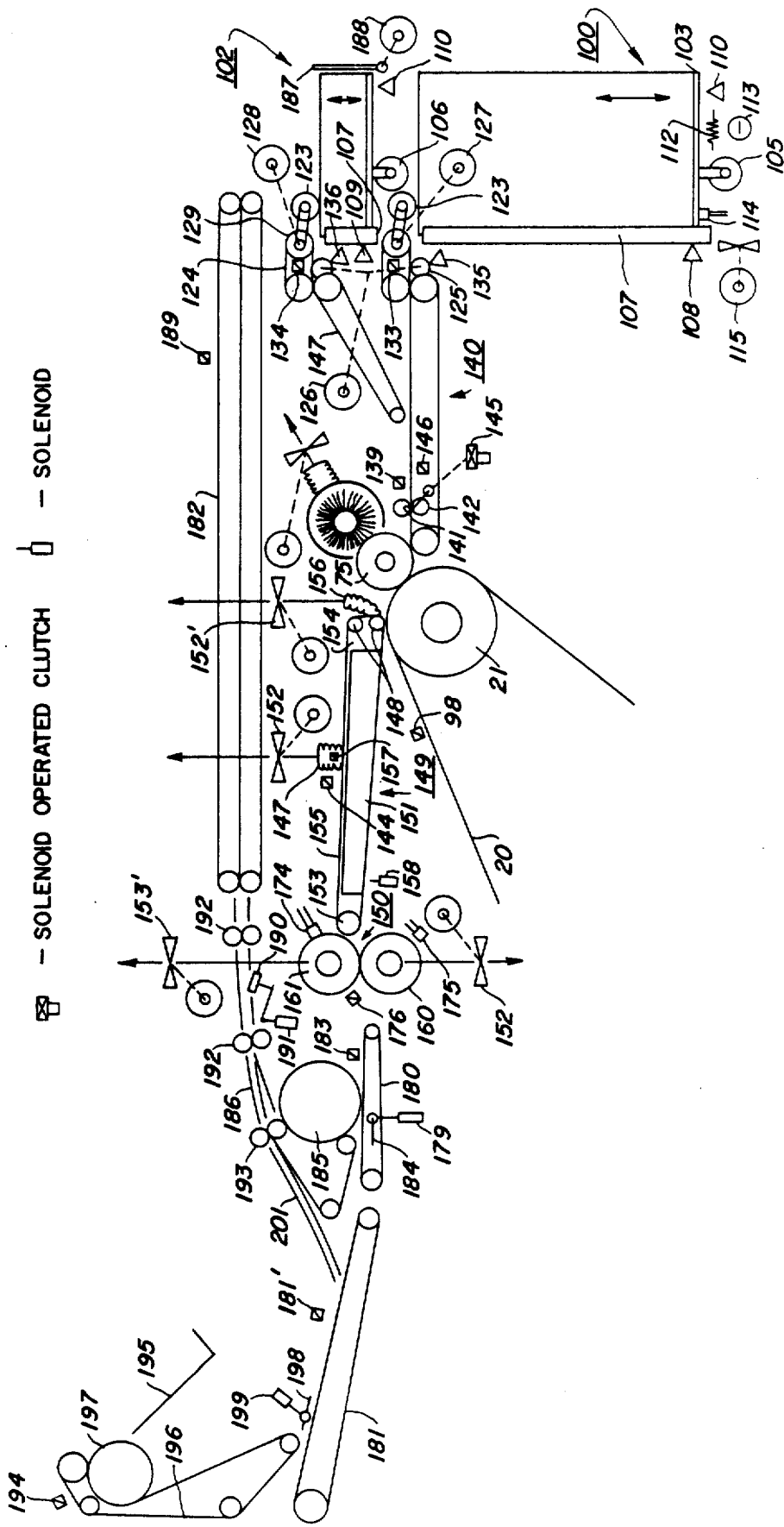
FIG. 12 is a schematic view showing the paper path and sensors of the apparatus shown in FIG. 1.

Referring to FIGS. 4, 9 and 12, to transfer developed images from belt 20 to the copy sheets 3, a transfer roll 75 is provided. Transfer roll 75, which forms part of the copy sheet feed path, is rotatably supported within a transfer roll housing opposite belt support roll 21. Housing 76 is pivotally mounted at 76' to permit the transfer roll assembly to be moved into and out of operative relationship with belt 20. A transfer roll cleaning brush 77 is rotatably journalled in transfer roll housing 76 with the brush periphery in contact with transfer roll 90. Transfer roll 75 is driven through contact with belt 20 while cleaning brush 77 is coupled to main drive motor 34. To remove toner, housing 76 is connected through conduit 78 with vacuum pump 81. To facilitate and control transfer of the developed images from belt 20 to the copy sheets 3, a suitable electrical bias is applied to transfer roll 75.

To permit transfer roll 75 to be moved into and out of operative relationship with belt 20, cam 79 is provided in driving contact with transfer roll housing 76. Cam 79 is driven from motor 34 through an electromagnetically operated one revolution clutch 80. Spring means (not shown) serves to maintain housing 76 in driving engagement with cam 79.

To facilitate separation of the copy sheets 3 from belt 20 following transfer of developed images, a detack corotron 82 is provided. Corotron 82 generates a charge designed to neutralize or reduce the charges tending to retain the copy sheet on belt 20. Corotron 82 is supported on transfer roll housing 76 opposite belt 20 and downstream of transfer roll 75.

Referring to FIGS. 1, 2 and 10, to prepare belt 20 for cleaning, residual charges on belt 20 are removed by discharge lamp 84 and preclean corotron 94. A cleaning brush 85, rotatably supported within an evacuated semicircular shaped brush housing 86 at cleaning station 29, serves to remove residual developer from belt 20. Motor 95 drives brush 85, brush 85 turning in a direction opposite that of belt 20.

Vacuum conduit 87 couples brush housing 86 through a centrifugal type separator 88 with the suction side of vacuum pump 93. A final filter 89 on the outlet of motor 93 traps particles that pass through separator 88. The heavier toner particles separated by separator 88 drop into and are collected in one or more collecting bottles 90. Pressure sensor 91 monitors the condition of final filter 89 while a sensor 92 monitors the level of toner particles in collecting bottles 90.

To obviate the danger of copy sheets remaining on belt 20 and becoming entangled with the belt cleaning mechanism, a deflector 96 is provided upstream of cleaning brush 85. Deflector 96, which is pivotally supported on the brush housing 86, is operated by solenoid 97. In the normal or off position, deflector 96 is spaced from belt 20 (the solid line position shown in the drawings). Energization of solenoid 97 pivots deflector 96 downwardly to bring the deflector leading edge into close proximity to belt 20.

Sensors 98, 99 are provided on each side of deflector 96 for sensing the presence of copy material on belt 20. A signal output from upstream sensor 98 triggers solenoid 97 to pivot deflector 96 into position to intercept the copy sheet on belt 20. The signal from sensor 98 also initiates a system shutdown cycle (mis-strip jam) wherein the various operating components are, within a prescribed interval, brought to a stop. The interval permits any copy sheet present in fuser 150 to be removed, sheet trap solenoid 158 (FIG. 12) having been actuated to prevent the next copy sheet from entering fuser 150 and becoming trapped therein. The signal from sensor 99, indicating failure of deflector 96 to intercept or remove the copy sheet from belt 20, triggers an immediate or hard stop (sheet on selenium jam) of the processor. In such instances the power to drive motor 34 is interrupted to bring belt 20 and the other components driven therefrom to an immediate stop.

Referring particularly to FIGS. 1 and 12, copy sheets 3 comprise precut paper sheets supplied from either main or auxiliary paper trays 100, 102. Each paper tray has a platform or base 103 for supporting in stack-like fashion a quantity of sheets. The tray platforms 103 are supported for vertical up and down movement by motors 105, 106. Side guide pairs 107, in each tray 100, 102 delimit the tray side boundaries, the guide pairs being adjustable toward and away from one another in accommodation of different size sheets. Sensors 108, 109 respond to the position of each side guide pair 107, the output of sensors 108, 109 serving to regulate operation of edge fadeout lamps 45 and fuser cooling valve 171 (FIG. 3). Lower limit switches 110 on each tray prevent overtravel of the tray platform in a downward direction.

A heater 112 is provided below the platform 103 of main tray 100 to warm the tray area and enhance feeding of sheets therefrom. Humidstat 113 and thermostat 114 control operation of heater 112 in response to the temperature/humidity conditions of main tray 100. Fan 115 is provided to circulate air within tray 100.

To advance the sheets 3 from either main or auxiliary tray 100, 102, main and auxiliary sheet feeders 120, 121 are provided. Feeders 120, 121 each include a nudger roll 123 to engage and advance the topmost sheet in the paper tray forward into the nip formed by a feed belt 124 and retard roll 125. Retard rolls 125, which are driven at an extremely low speed by motor 126, cooperate with feed belts 124 to restrict feeding of sheets from trays 100, 102 to one sheet at a time.

Feed belts 124 are driven by main and auxiliary sheet feed motors 127, 128 respectively. Nudger rolls 123 are supported for pivotal movement about the axis of feed belt drive shaft 129 with drive to the nudger rolls taken from drive shaft 129. Stack height sensors 133, 134 are provided for the main and auxiliary trays, the pivoting nudger rolls 123 serving to operate sensors 133, 134 in response to the sheet stack height. Main and auxiliary tray misfeed sensors 135, 136 are provided at the tray outlets.

Main transport 140 extends from main paper tray 100 to a point slightly upstream of the nip formed by photoconductive belt 20 and transfer roll 75. Transport 140 is driven from the main motor 34. To register sheets 3 with the images developed on belt 20, sheet register fingers 141 are provided, fingers 141 being arranged to move into and out of the path of the sheets on transport 140 once each revolution (see also FIG. 4). Registration fingers 141 are driven from main motor 34 through electromagnetic clutch 145. A timing or reset switch 146 is set once on each revolution of sheet register fingers 141. Sensor 139 monitors transport 140 for jams. Further amplification of sheet register system may be found in U.S. Pat. No. 3,781,004, issued Dec. 25, 1973 to Buddendeck et al.

Pinch roll pair 142 is interspaced between transport belts that comprise main transport 140 on the downstream side of register fingers 141. Pinch roll pair 142 are driven from main motor 34.

Auxiliary transport 147 extends from auxiliary tray 102 to main transport 140 at a point upstream of sheet register fingers 141. Transport 147 is driven from motor 34.

To maintain the sheets in driving contact with the belts of transports 140, 147, suitable guides or retainers (not shown) may be provided along the belt runs.

The image bearing sheets leaving the nip formed by photoconductive belt 20 and transfer roll 75 are picked off by belts 155 of the leading edge of vacuum transport 149. Belts 155, which are perforated for the admission of vacuum therethrough, ride on forward roller pair 148 and rear roll 153. A pair of internal vacuum plenums 151, 154 are provided, the leading plenum 154 cooperating with belts 155 to pick up the sheets leaving the belt/transfer roll nip. Transport 149 conveys the image bearing sheets to fuser 150. Vacuum conduits 147, 156 communicate plenums 151, 154 with vacuum pumps 152, 152'. A pressure sensor 157 monitors operation of vacuum pump 152. Sensor 144 monitors transport 149 for jams.

To prevent the sheet on transport 149 from being carried into fuser 150 in the event of a jam or malfunction, a trap solenoid 158 is provided below transport 149. Energization of solenoid 158 raises the armature thereof into contact with the lower face of plenum 154 to intercept and stop the sheet moving therepast.

Referring particularly to FIGS. 4, 10 and 12, fuser 150 comprises a lower heated fusing roll 160 and upper pressure roll 161. Rolls 160, 161 are supported for rotation in fuser housing 162. The core of fusing roll 160 is hollow for receipt of heating rod 163 therewithin.

Housing 162 includes a sump 164 for holding a quantity of liquid release agent, herein termed oil. Dispensing belt 165, moves through sump 164 to pick up the oil, belt 165 being driven by motor 166. A blanket-like wick 167 carries the oil from belt 165 to the surface of fusing roll 160.

Pressure roll 161 is supported within an upper pivotal section 168 of housing 162. This enables pressure roll 161 to be moved into and out of operative contact fusing roll 160. Cam shaft 169 in the lower portion of fuser housing 162 serves to move housing section 168 and pressure roll 161 into operative relationship with fusing roll 160 against a suitable bias (not shown). Cam shaft 169 is coupled to main motor 34 through an electromagnetically operated one revolution clutch 159.

Fuser section 168 is evacuated, conduit 170 coupling housing section 168 with vacuum pump 152. The ends of housing section 168 are separated into vacuum compartments opposite the ends of pressure roll 161 thereunder to cool the roll ends where smaller size copy sheets 3 are being processed. Vacuum valve 171 (FIG. 3) in conduit 172 regulates communication of the vacuum compartments with vacuum pump 153' in response to the size sheets as sensed by side guide sensors 108, 109 in paper trays 100, 102.

Fuser roll 160 is driven from main motor 34. Pressure roll 161 is drivingly coupled to fuser roll 160 for rotation therewith.

Thermostat 174 (FIG. 12) in fuser housing 162 controls operation of heating rod 163 in response to temperature. Sensor 175 protects against fuser over-temperature. To protect against trapping of a sheet in fuser 150 in the event of a jam, sensor 176 is provided.

Following fuser 150, the sheet is carried by post fuser transport 180 to either discharge transport 181 or, where duplex or two sided copies are desired, to return transport 182. Sheet sensor 183 monitors passage of the sheets from fuser 150. Transports 180, 181 are driven from main motor 34. Sensor 181' monitors transport 181 for jams. Suitable retaining means may be provided to retain the sheets on transports 180, 181.

A deflector 184, when extended, directs sheets on transport 180 onto conveyor roll 185 and into chute 186 leading to return transport 182. Solenoid 179, when energized raises deflector 184 into the sheet path. Return transport 182 carries the sheets back to auxiliary tray 102. Sensor 189 monitors transport 182 for jams. The forward stop 187 of tray 102 is supported for oscillating movement. Motor 188 drives stop 187 back and forth tap sheets returned to auxiliary tray 102 into alignment for refeeding.

To invert duplex copy sheets following fusing of the second or duplex image, a diplaceable sheet stop 190 is provided adjacent the discharge end of chute 186. Stop 190 is pivotally supported for swinging movement into and out of chute 186. Solenoid 191 is provided to move stop 190 selectively into or out of chute 186. Pinch roll pairs 192, 193 serve to draw the sheet trapped in chute 186 by stop 190 and carry the sheet forward onto discharge transport 181. Further description of the inverter mechanism may be found in U.S. Pat. No. 3,856,295, issued Dec. 24, 1974, to John H. Looney.

Output tray 195 receives unsorted copies. Transport 196 a portion of which is wrapped around a turn around roll 197, serves to carry the finished copies to tray 195. Sensor 194 monitors transport 196 for jams. To route copies into output tray 195, a deflector 198 is provided. Deflector solenoid 199, when energized, turns deflector 198 to intercept sheets on conveyor 181 and route the sheets onto conveyor 196.

When output tray 195 is not used, the sheets are carried by conveyor 181 to sorter 14.

SORTER

Figure 13:
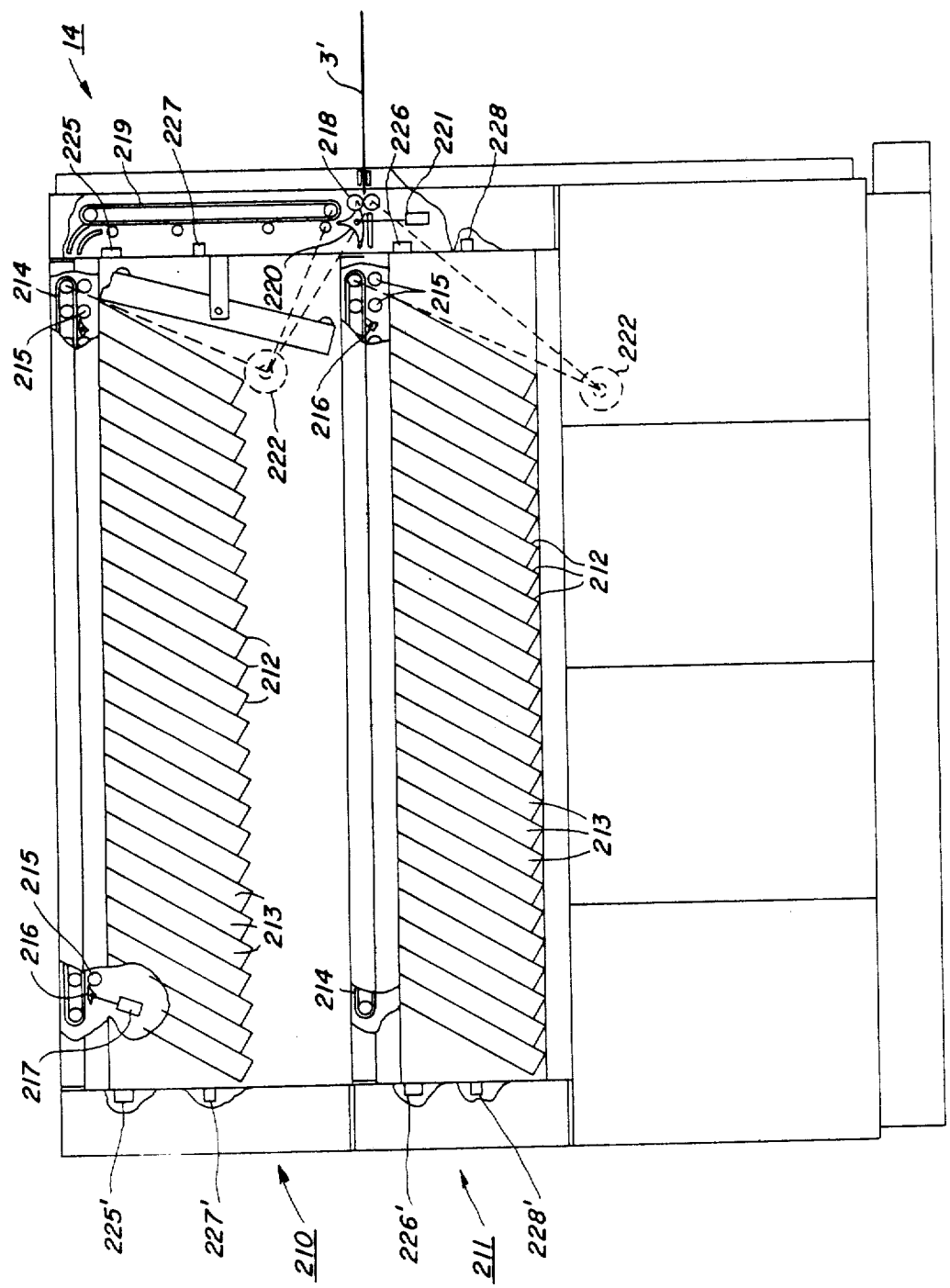
FIG. 13 is an enlarged view showing details of the copy sorter for the apparatus shown in FIG. 1.

Referring particularly to FIG. 13, sorter 14 comprises upper and lower bin arrays 210, 211. Each bin array 210, 211 consists of series of spaced downwardly inclined trays 212, forming a series of individual bins 213 for receipt of finished copies 3'. Conveyors 214 along the top of each bin array, cooperate with idler rolls 215 adjacent the inlet to each bin to transport the copies into juxtaposition with the bins. Individual defelctors 216 at each bin cooperate, when depressed, with the adjoining idler roll 215 to turn the copies into the bin associated therewith. An operating solenoid 217 is provided for each deflector.

A driven roll pair 218 is provided at the inlet to sorter 14. A generally vertical conveyor 219 serves to bring copies 3' to the upper bin array 210. Entrance deflector 220 routes the copies selectively to either the upper or lower bin array 210, 211 respectively. Solenoid 221 operates deflector 220.

Motor 222 is provided for each bin array to drive the conveyors 214 and 219 of upper bin array 210 and conveyor 214 of lower bin array 211. Roll pair 218 is drivingly coupled to both motors.

To detect entry of copies 3' in the individual bins 213, a photoelectric type sensor 225, 226 is provided at one end of each bin array 210, 211 respectively. Sensor lamps 225', 226' are disposed adjacent the other end of the bin array. To detect the presence of copies in the bins 213, a second set of photoelectric type sensors 227, 228 is provided for each bin array, on a level with a tray cutout (not shown). Reference lamps 227', 228' are disposed opposite sensors 227, 228.

DOCUMENT HANDLER

Figure 14:
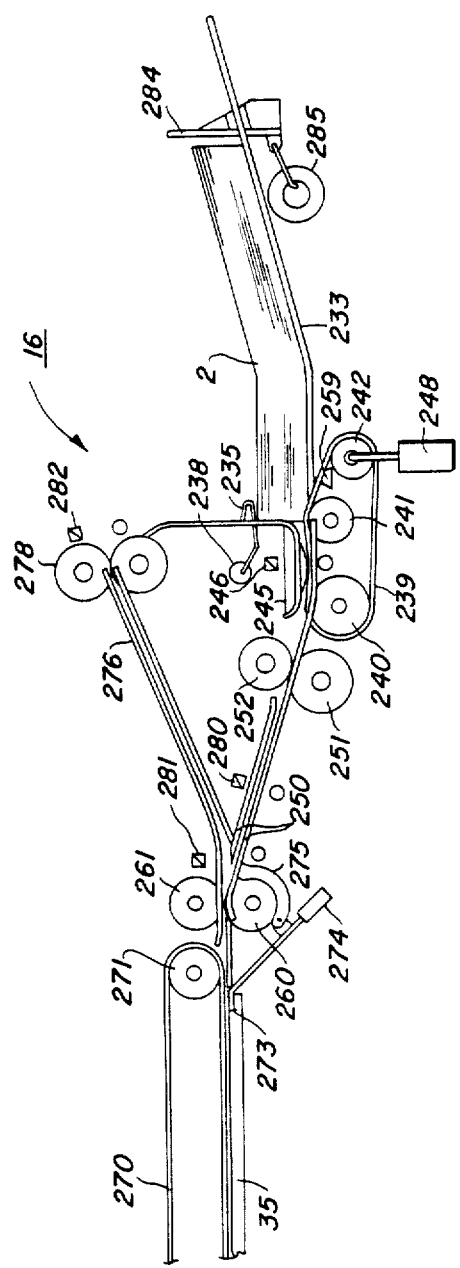
FIG. 14 is a schematic view showing details of the document handler for the apparatus shown in FIG. 1.
Figure 15:
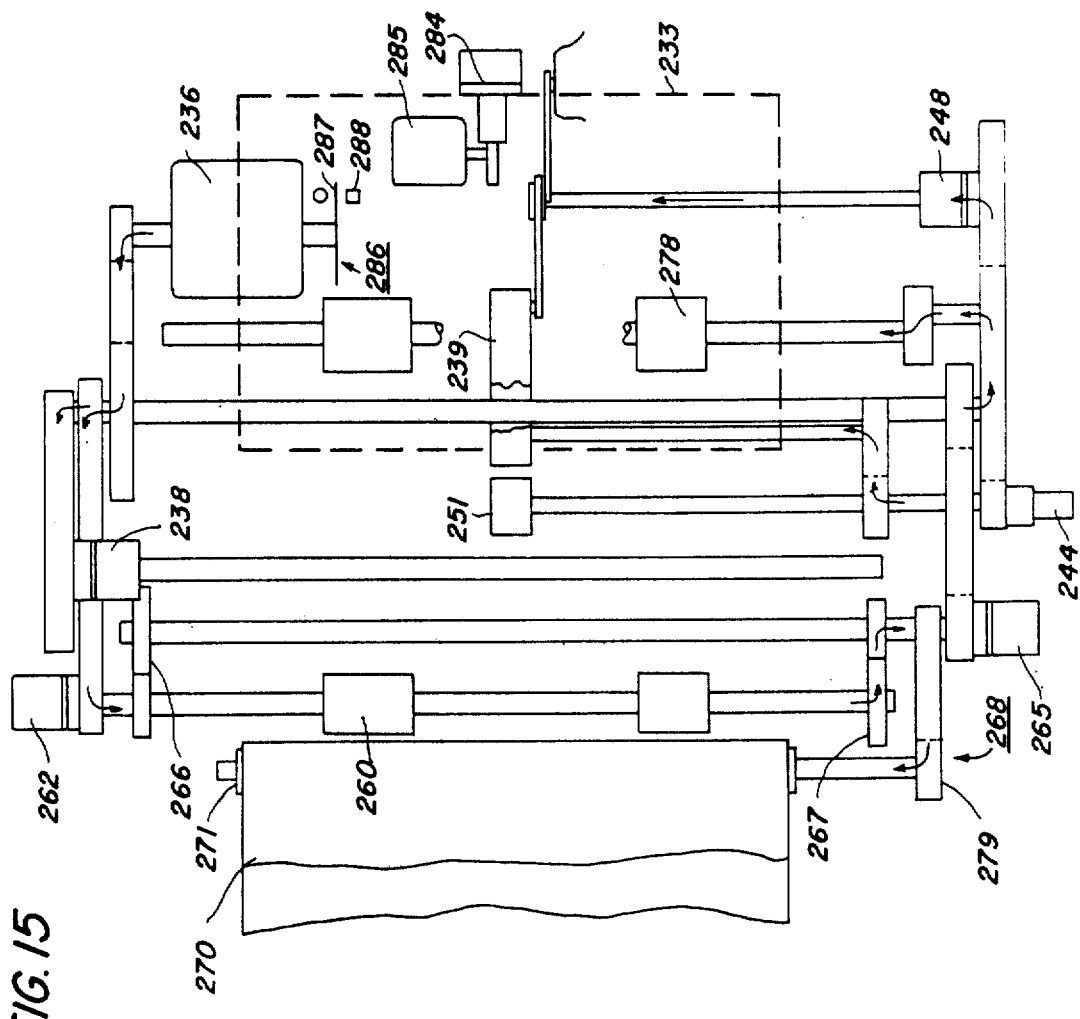
FIG. 15 is a view showing details of the drive mechanism for the document handler shown in FIG. 14.

Referring particularly to FIGS. 14 and 15, document handler 16 includes a tray 233 into which originals or documents 2 to be copied are placed by the operator following which a cover (not shown) is closed. A movable bail or separator 235, driven in an oscillatory path from motor 236 through a solenoid operated one revolution clutch 238, is provided to maintain document separation.

A document feed belt 239 is supported on drive and idler rolls 240, 241 and kicker roll 242 under tray 233, tray 233 being suitably apertured to permit the belt surface to project therewithin. Feedbelt 239 is driven by motor 236 through electromagnetic clutch 244. Guide 245, disposed near the discharge end of feed belt 239, cooperates with belt 239 to form a nip between which the documents pass.

A photoelectric type sensor 246 is disposed adjacent the discharge end of belt 239. Sensor 246 responds on failure of a document to feed within a predetermined interval to actuate solenoid operated clutch 248 which raises kicker roll 242 and increases the surface area of feed belt 239 in contact with the documents. Another sensor 259 located underneath tray 233 provides an output signal when the last document 2 of each set has left the tray 233.

Document guides 250 route the document fed from tray 233 via roll pair 251, 252 to platen 35. Roll 251 is drivingly coupled to motor 236 through electromagnetic clutch 244. Contact of roll 251 with roll 252 turns roll 252.

Roll pair 260, 261 at the entrance to platen 35 advance the document onto platen 35, roll 260 being driven through electromagnetic clutch 262 in the forward direction. Contact of roll 260 with roll 261 turns roll 261 in the document feeding direction. Roll 260 is selectively coupled through gearset 268 with motor 236 through electromagnetic clutch 265 so that on engagement of clutch 265 and disengagement of clutch 262, roll 260 and roll 261 therewith turn in the reverse direction to carry the document back to tray 233 via return chute 276. One way clutches 266, 267 permit free wheeling of the roll drive shafts.

The document leaving roll pair 260, 261 is carried by platen feed belt 270 onto platen 35, belt 270 being comprised of a suitable flexible material having an exterior surface of xerographic white. Belt 270 is carried about drive and idler rolls 271, 272. Roll 271 is drivingly coupled to motor 236 for rotation in either a forward or reverse direction through clutches 262, 265. Engagement of clutch 262 operates through belt and pulley drive 279 to drive belt in the forward direction, engagement of clutch 265 operates through drive 279 to drive belt 270 in the reverse direction.

To locate the document in predetermined position on platen 35, a register 273 is provided at the platen inlet for engagement with the document trailing edge. For this purpose, control of platen belt 270 is such that following transporting of the document onto plate 35 and beyond register 273, belt 270 is reversed to carry the document backwards against register 273.

To remove the document from platen 35 following copying, register 273 is retracted to an inoperative position. Solenoid 274 is provided for moving register 273.

A document deflector 275, is provided to route the document leaving platen 35 into return chute 276. For this purpose, platen belt 270 and pinch roll pair 260, 261 are reversed through engagement of clutch 265. Discharge roll pair 278, driven by motor 236, carry the returning document into tray 233.

To monitor movement of the documents in document handler 16 and detect jams and other malfunctions, photoelectric type sensors 246 and 280, 281 and 282 are disposed along the document routes.

To align documents 2 returned to tray 233, a document patter 284 is provided adjacent one end of tray 233. Patter 284 is oscillated by motor 285.

TIMING

To provide the requisite operational synchronization between host machine 10 and controller 18 as will appear, processor or machine clock 202 is provided. Referring particularly to FIG. 1, clock 202 comprises a toothed disc 203 drivingly supported on the output shaft of main drive motor 34. A photoelectric type signal generator 204 is disposed astride the path followed by the toothed rim of disc 203, generator 204 producing, whenever drive motor 34 is energized, a pulse like signal output at a frequency correlated with the speed of motor 34, and the machine components driven therefrom.

As described, a second machine clock, termed a pitch reset clock 138 herein, and comprising timing switch 146 is provided. Switch 146 cooperates with sheet register fingers 141 to generate an output pulse once each revolution of fingers 141. As will appear, the pulse like output of the pitch reset clock is used to reset or resynchronize controller 18 with host machine 10.

Figure 17:
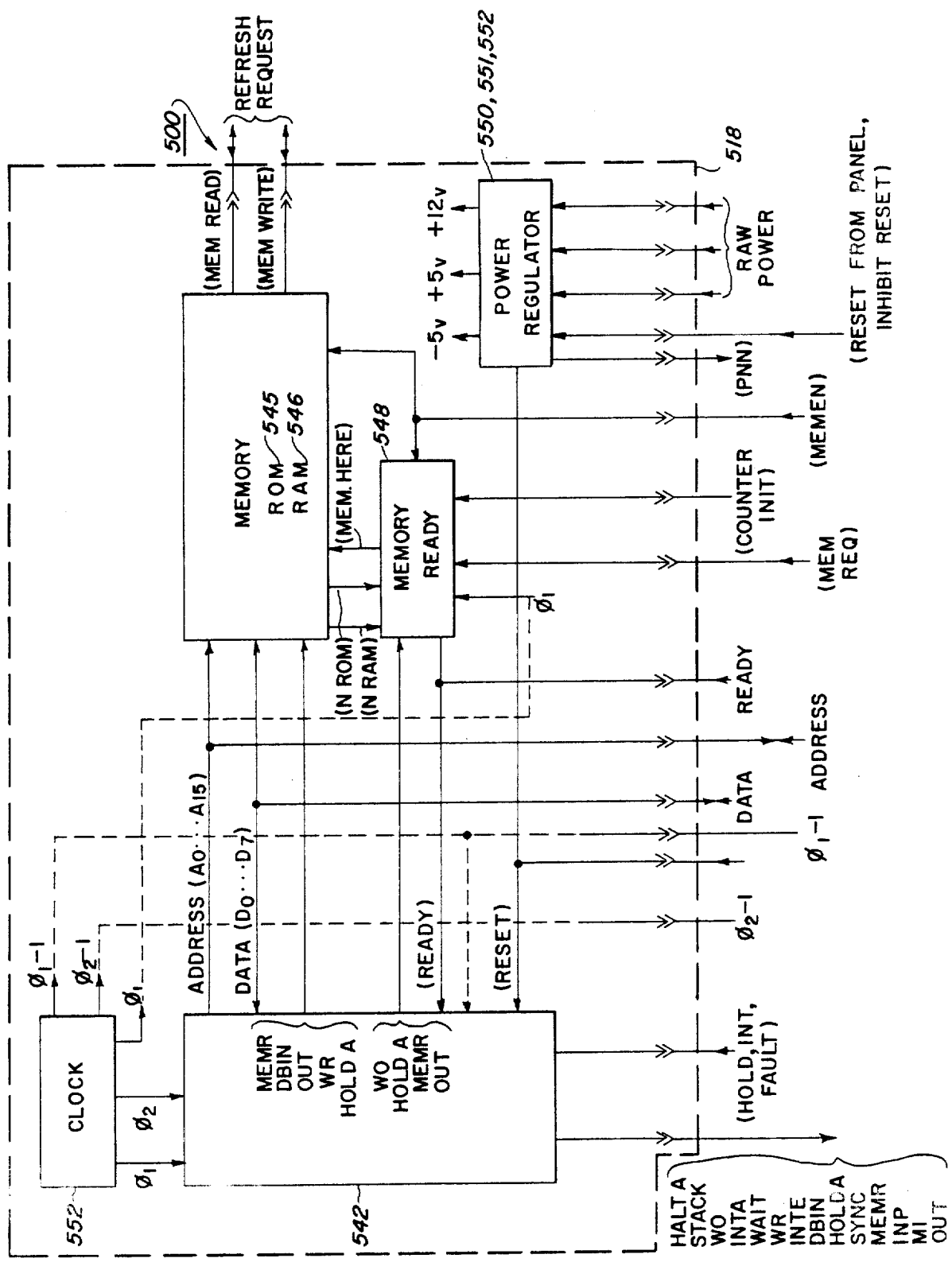
FIG. 17 is a block diagram of the controller CPU.

Referring to FIG. 15, a document handler clock 286 consisting of apertured disc 287 on the output shaft of document handler drive motor 236 and cooperating photoelectric type signal generator 288 is provided. As in the case of machine clock 202, document handler clock 286 produces an output pulse train from which components of the document handler may be synchronized. A real time clock such as clock 552 of FIG. 17, is utilized to control internal operations of the controller 18 as is known in the art.

CONTROLLER

Figure 16:
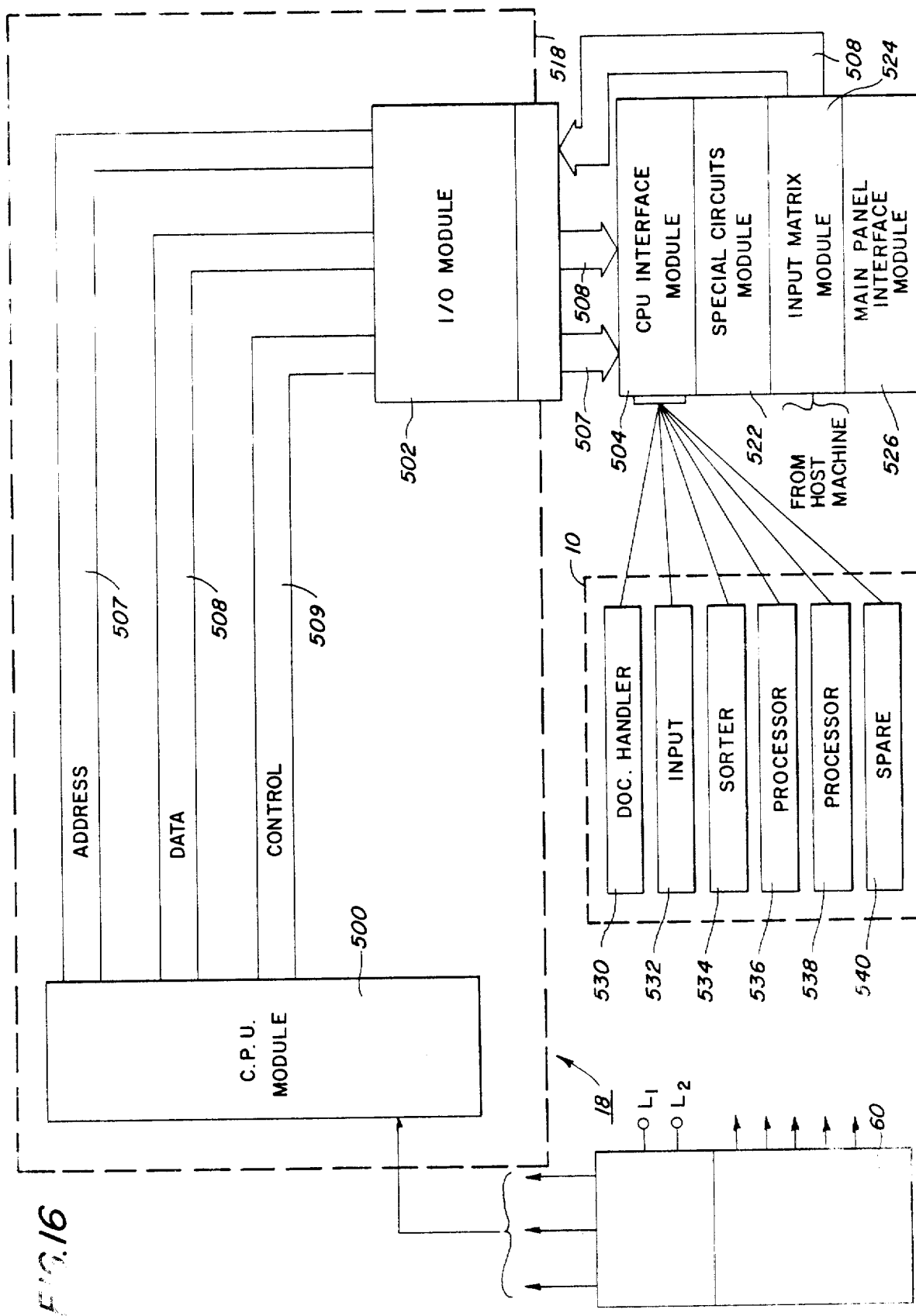
FIG. 16 is a block diagram of the controller for the apparatus shown in FIG. 1.

Referring to FIG. 16, controller 18 includes a Central Processor Unit (CPU) Module 500, Input/Output (I/O) Module 502, and Interface 504. Address, Data and Control Buses 507, 508, 509 respectively operatively couple CPU Module 500 and I/O Module 502. CPU Module 500 I/O Module 502 are disposed within a shield 518 to prevent noise interference.

Interface 504 couples I/O Module 502 with special circuits module 522, input matrix module 524, and main panel interface module 526. Module 504 also couples I/O Module 502 to operating sections of the machine, namely, document handler section 530, input section 532, sorter section 534 and processor sections 536, 538. A spare section 540, which may be used for monitoring operation of the host machine, or which may be later utilized to control other devices, is provided.

Figure 18A:
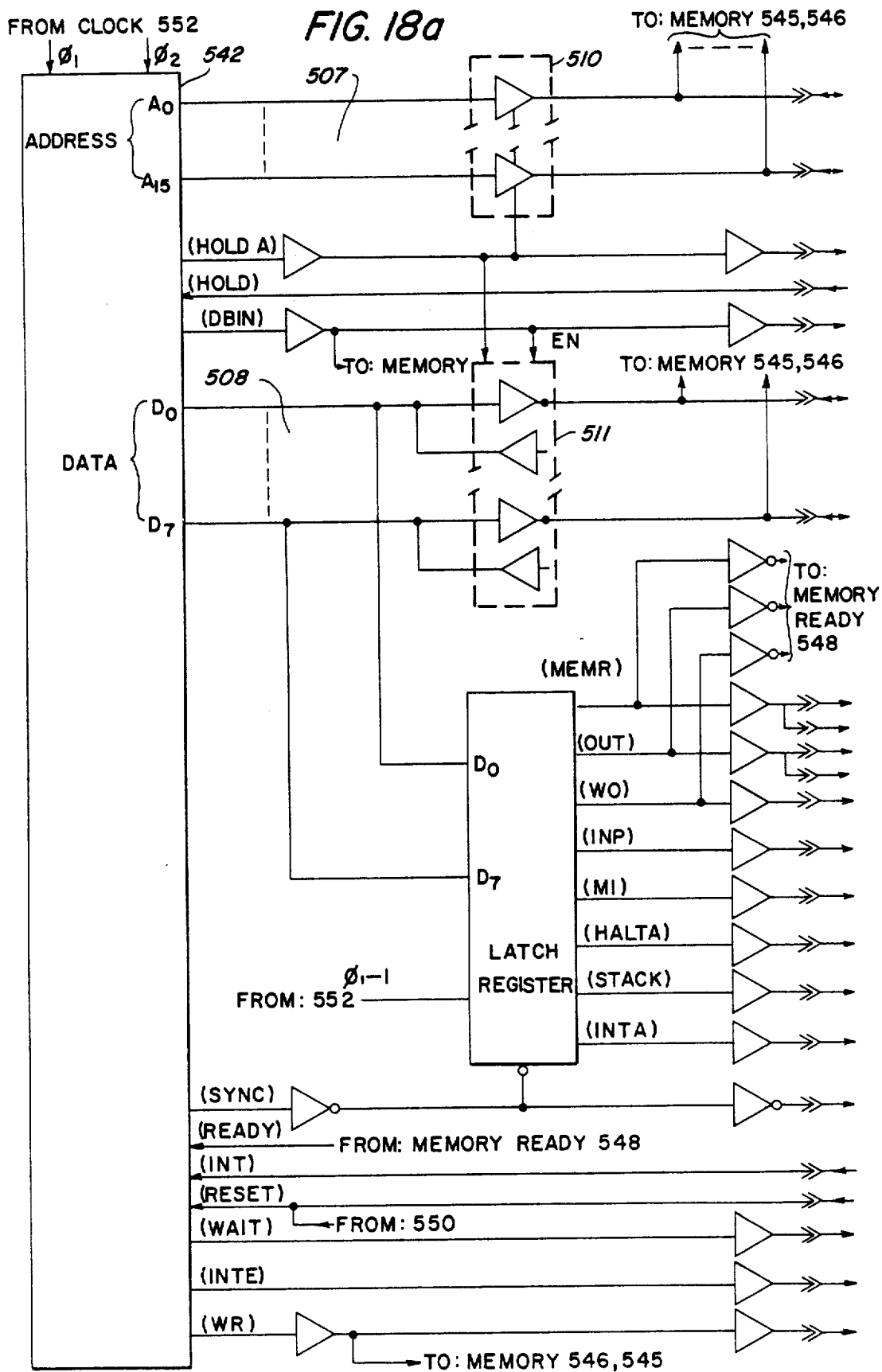
FIG. 18a is a block diagram showing the CPU microprocessor input/output connections.
Figure 18B:
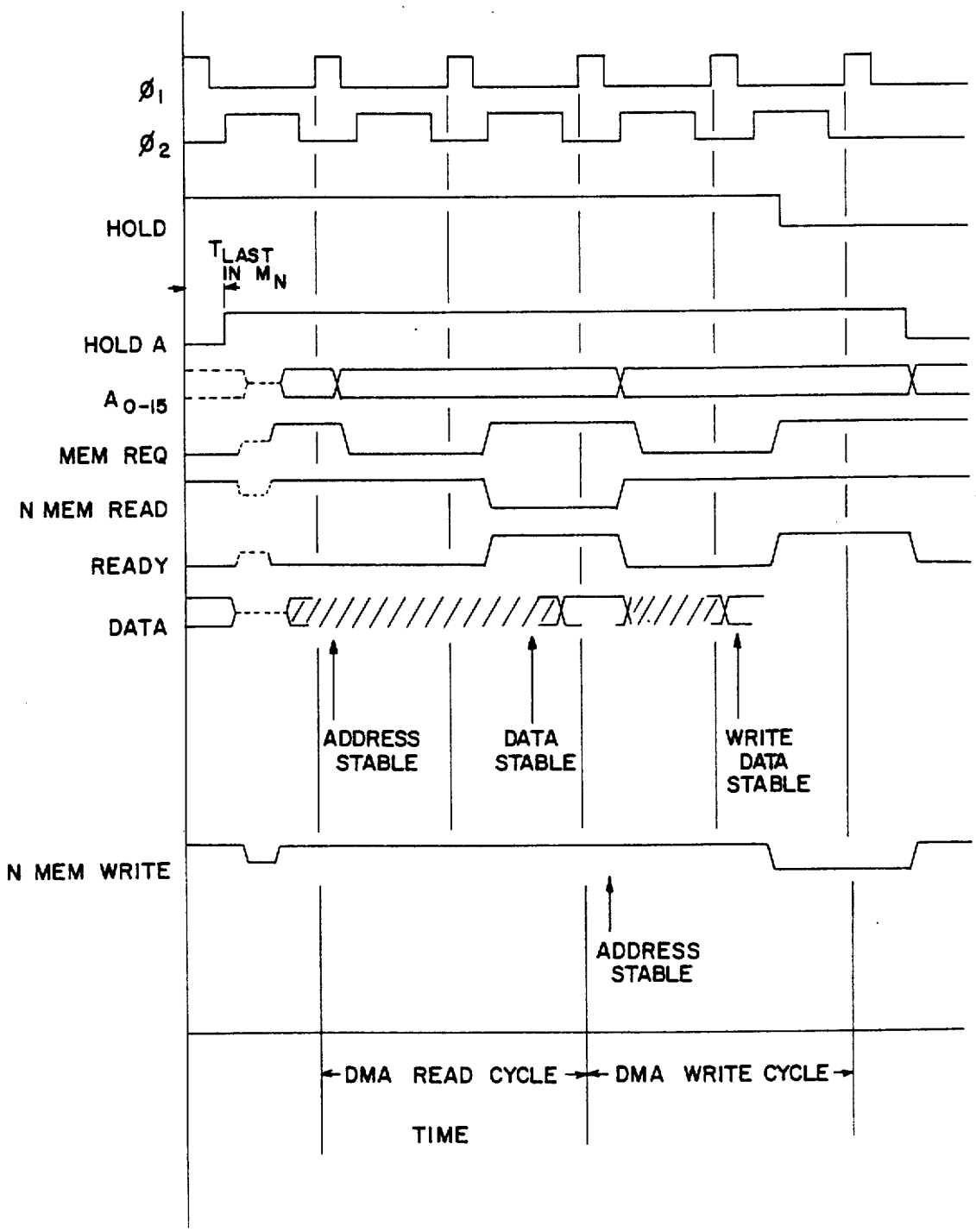
FIG. 18b is a timing chart of Direct Memory access (DMA) Read and Write cycles.

Referring to FIGS. 17, 18, CPU module 500 comprises a processor 542 such as an Intel 8080 microprocessor manufactured by Intel Corporation, Santa Clara, California, 16K Read Only Memory (herein ROM) and 2K Random Access Memory (herein RAM) sections 545, 546, Memory Ready section 548, power regulator section 550, and onboard clock 552. Bipolar tri-state buffers 510, 511 in Address and Data buses 507, 508 disable the bus on a Direct Memory access (DMA) signal (HOLDA) as will appear. While the capacity of memory sections 545, 546 are indicated throughout as being 16K and 2K respectively, other memory sizes may be readily contemplated.

Figure 19A:
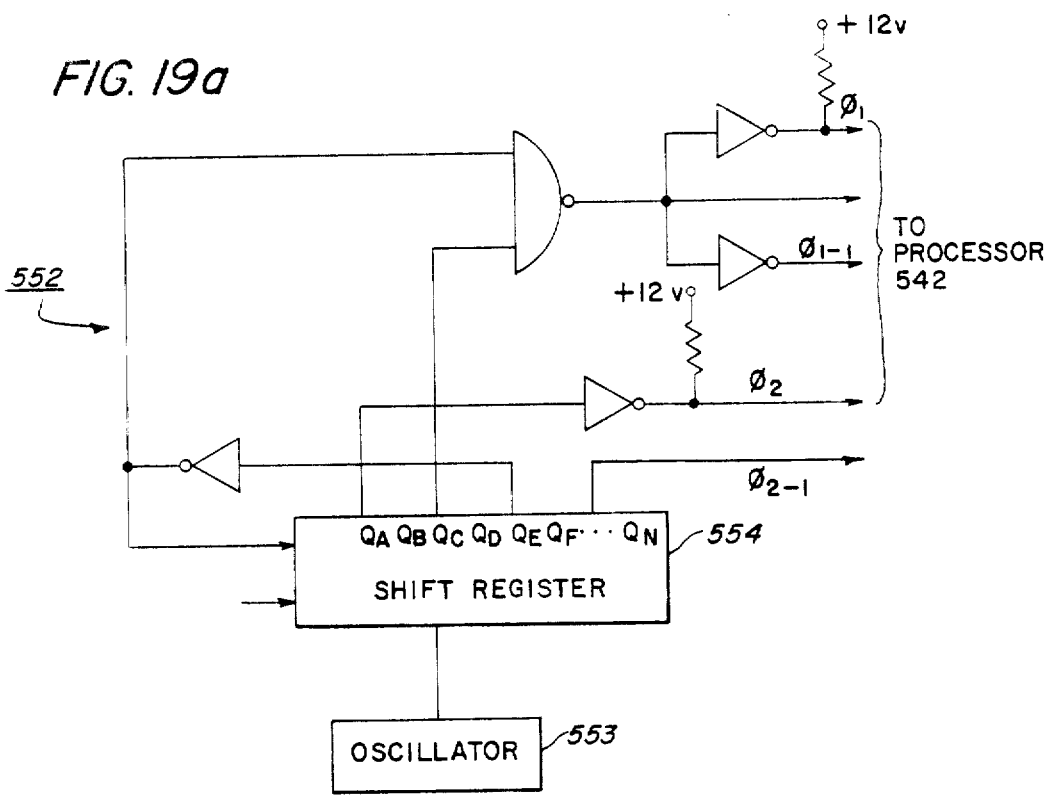
FIG. 19a is a logic schematic of the CPU clock.
Figure 19B:
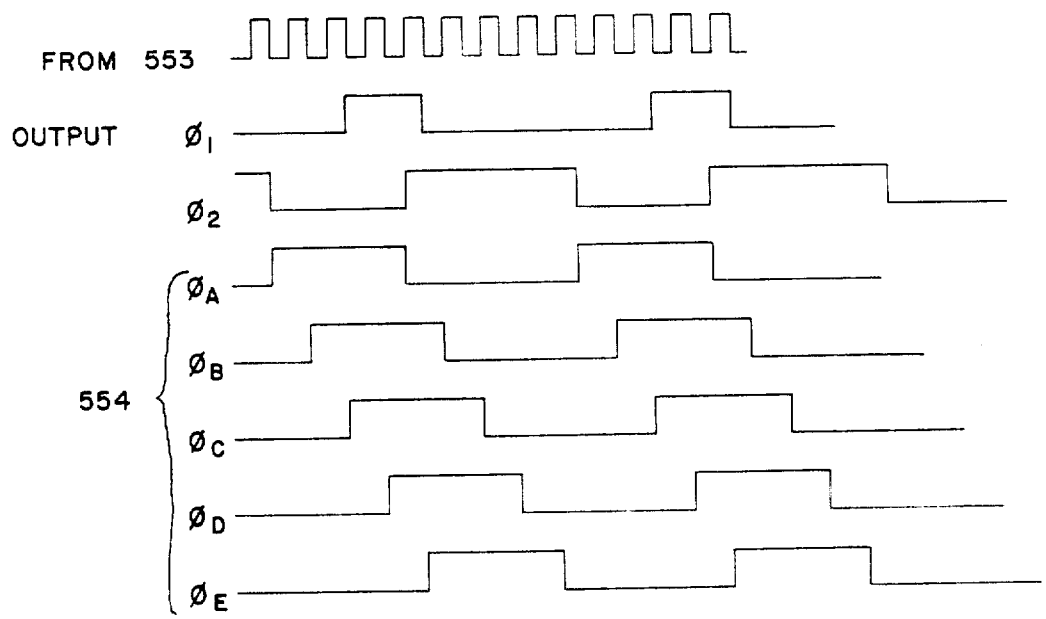

Referring particularly to FIG. 19, clock 552 comprises a suitable clock oscillator 553 feeding a multi-bite ($Qa$ - $Qn$) shift register 554. Register 554 includes an internal feedback path from one bit to the serial input of register 554. Output signal waveforms $\phi_1$, $\phi_2$, $\phi_{1-1}$ and $\phi_{2-1}$ are produced for use by the system.

Referring to FIG. 20, the memory bytes in ROM section 545 are implemented by address signals (A0 - A15) from processor 542, selection being effected by 3 to 8 decode chip 560 controlling chip select 1 (CS-1) and a 1 bit selection (A13) controlling chip select 2 (CS-2). The most significant address bits (A14, A15) select the first 16K of the total 64 bytes of the addressing space. The memory bytes in RAM section 546 are implemented by Address signals (A0 - A15) through selector circuit 561. Address bit A10 serves to select the memory bank while the remaining five most significant bits (A11 - A15) select the last 2K bytes out of the 64K bytes of addressing space. RAM memory section 546 includes a 40 bit output buffer the output of which is tied together with the output from ROM memory section 545 and goes to tri-state buffer 562 to drive Data bus 508. Buffer 562 is enabled when either memory section 545 or 546 is being addressed and either a (MEM READ) or DMA (HOLD A) memory request exists. An enabling signal (MEMEN) is provided from the machine control or service panel (not shown) which is used to permit disabling of buffer 562 during servicing of CPU Module 500. Write control comes from either processor 542 (MEM WRITE) or from DMA (HOLD A) control. Tri-state buffers 563 permit Refresh Control 605 of I/O Module 502 to access MEM READ and MEM WRITE control channels directly on a DMA signal (HOLD A) from processor 542 as will appear.

Figure 21:
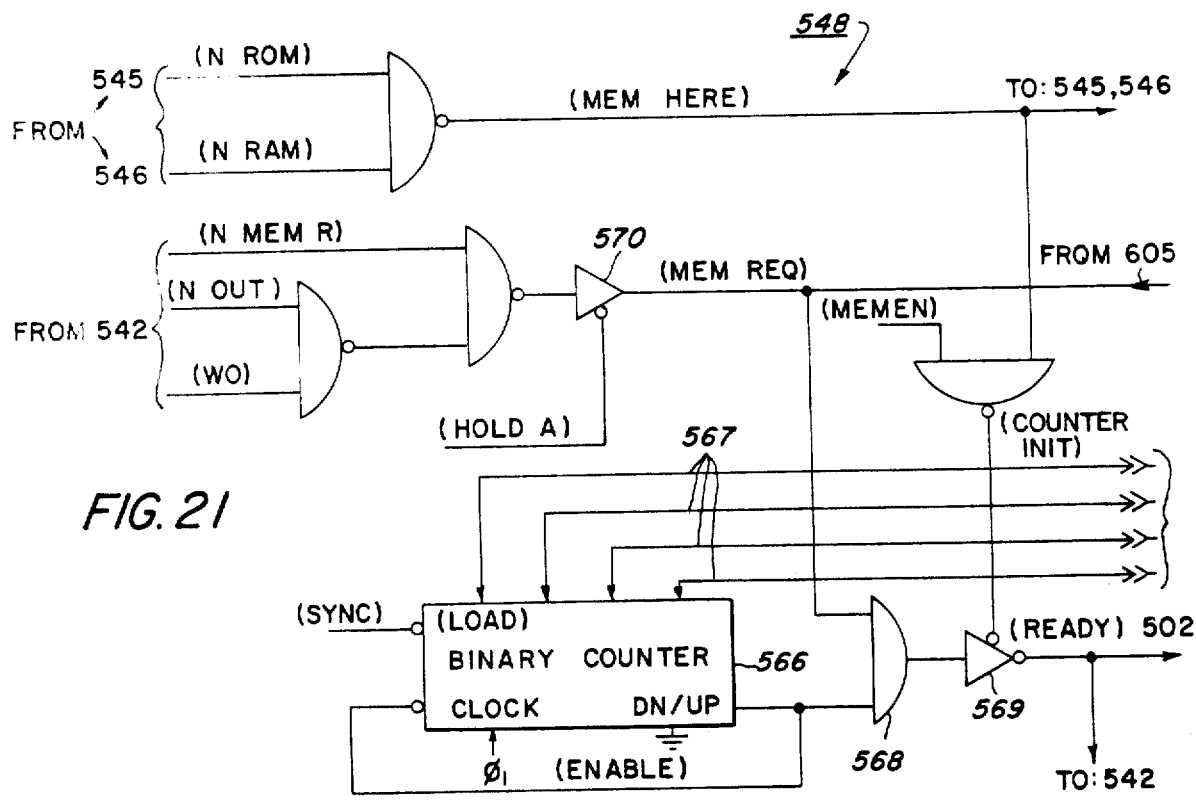
FIG. 21 is a logic schematic of the CPU memory ready.

Referring to FIG. 21, memory ready section 548 provides a READY signal to processor 542. A binary counter 566, which is initialized by a SYNC signal ($\phi_1$) to a prewired count as determined by input circuitry 567, counts up at a predetermined rate. At the maximum count, the output at gate 568 comes true stopping the counter 566. If the cycle is a memory request (MEM REQ) and the memory location is on board as determined by the signal (MEM HERE) to tri-state buffer 569, a READY signal is sent to processor 542. Tri-state buffer 570 in MEM REQ line permits Refresh Control 605 of I/O Module 502 to access the MEM REQ channel directly on a DMA signal (HOLD A) from processor 542 as will appear.

Figure 22A:
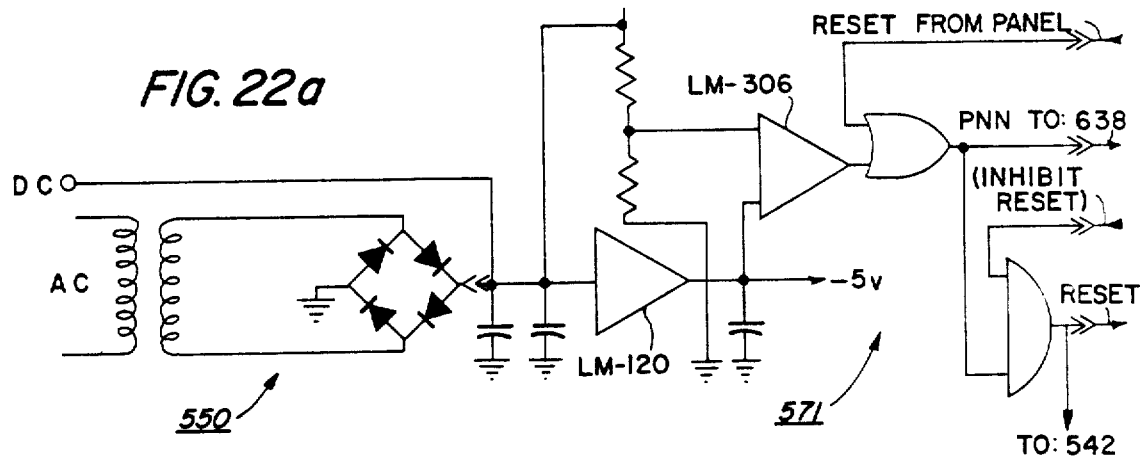
FIGS. 22a, 22b, 22c are logic schematics of the CPU power supply stages.
Figure 22B:
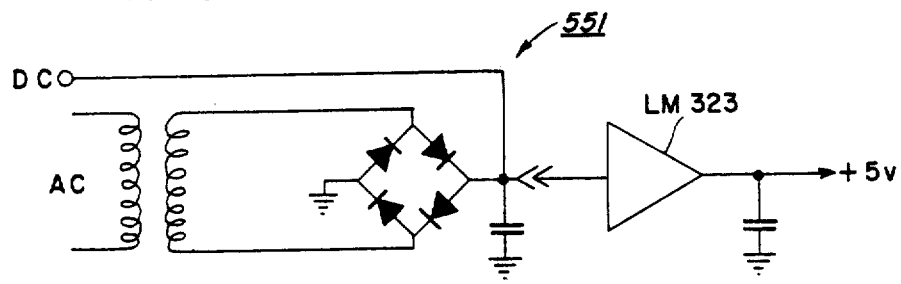
Figure 22C:
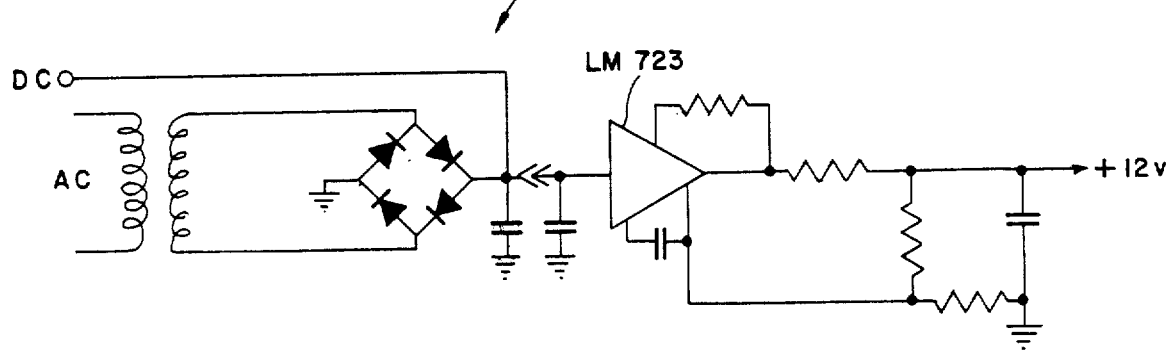

Referring to FIG. 22, power regulators 550, 551, 552 provide the various voltage levels, i.e. +5v, +12v, and −5v D.C. required by the module 500. Each of the three on board regulators 550, 551, 552 employ filtered D.C. inputs. Power Not Normal (PNN) detection circuitry 571 is provided to reset processor 542 during the power up time. Panel reset is also provided via PNN. An enabling signal (INHIBIT RESET) allows completion of a write cycle in Non Volatile (N.V.) Memory 610 of I/O Module 502.

Figure 23A:
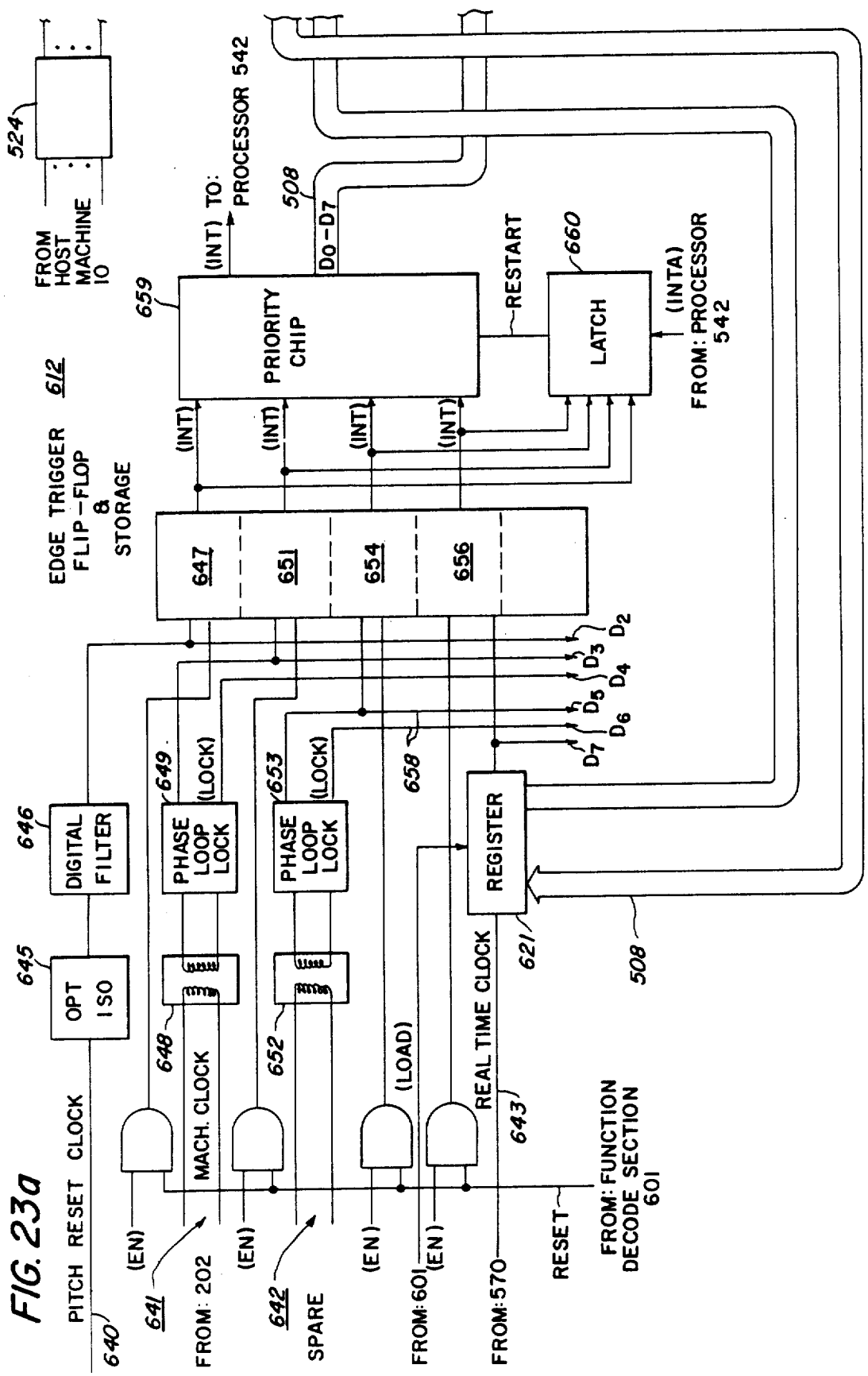

Referring to FIGS. 18, 20, 21, and the DMA timing chart (FIG. 18a) data transfer from RAM section 546 to host machine 10 is effected through Direct Memory Access (DMA), as will appear. To initiate DMA, a signal (HOLD) is generated by Refresh Control 605 (FIG. 23a). On acceptance, processor 542 generates a signal HOLD ACKNOWLEDGE (HOLD A) which works through tri-state buffers 510, 511 and through buffers 563 and 570 to release Address bus 507, Data bus 508 and MEM READ, MEM WRITE, and MEM REQ channels (FIGS. 20, 21) to Refresh Control 605 of I/O Module 502.

Referring to FIG. 23, I/O Module 502 interfaces with CPU module 500 through bi-directional Address, Data and Control buses 507, 508, 509. I/O Module 502 appears to CPU module 500 as a memory portion. Data transfers between CPU and I/O modules 500, 502, and commands to I/O module 502 except for output refresh are controlled by memory reference instructions executed by CPU module 500. Output refresh which is initiated by one of several uniquely decoded memory reference commands, enables Direct Memory access (DMA) by I/O module 502 to RAM section 546.

I/O module 502 includes Matrix Input select 604 (through which inputs from the host machine 10, are received), Refresh Control 605, Nonvolatile (NV) memory 610, Interrupt Control 612, Watch dog Timer and failure Flag 614 and clock 570.

A Function Decode Section 601 receives and interprets commands from CPU section 500 by decoding information on address bus 507 along with control signals from processor 542 on control bus 509. On command, decode section 601 generates control signals to perform the function indicated. These functions include (a) controlling tri-state buffers 620 to establish the direction of data flow in Data bus 508; (b) strobing data from Data bus 508 into buffer latches 622; (c) controlling multiplexer 624 to put data from Interrupt Control 612, Real Time clock register 621, Matrix Input Select 604 or N.V. memory 610 onto data bus 508; (d) actuating refresh control 605 to initiate a DMA operation; (e) actuating buffers 634 to enable address bits Ao - A 7 to be sent to the host machine 10 for input matrix read operations; (f) commanding operation of Matrix Input Select 604; (g) initiating read or write operation of N.V. memory 610 through Memory Control 638; (h) loading Real Time clock register 621 from data bus 508; and (i) resetting the Watch Dog timer or setting the Fault Failure flag 614. In addition, section 601 includes logic to control and synchronize the READY control line to CPU module 500, the READY line being used to advise module 500 when data placed on the Data bus by I/O module 502 is valid.

Watch dog timer and failure flag 614, which serves to detect certain hardwired and software malfunctions, comprises a free running counter which under normal circumstances is periodically reset by an output refresh command (REFRESH) from Function Decode Section 601. If an output refresh command is not received within a preset time interval, (i.e. 25m sec) a fault flip flop is set and a signal (FAULT) sent to the host machine 10. The signal (FAULT) also raises the HOLD line to disable CPU Module 500. Clearing of the fault flip flop may be by cycling power or generating a signal (RESET). A selector (not shown) may be provided to disable (DISABLE) the watch dog timer when desired. The fault flip flop may also be set by a command from the CPU Module to indicate that the operating program detected a fault.

Matrix Input select 604 has capacity to read up to 32 groups of 8 discrete inputs from host machine 10. Lines $A_3$ through $A_7$ of Address bus 507 are routed to host machine 10 via CPU Interface Module 504 to select the desired group of 8 inputs. The selected inputs from machine 10 are received via Input Matrix Module 524 (FIG. 28) and are placed by matrix 604 onto data bus 508 and sent to CPU Module 500 via multiplexer 624. Bit selection is effected by lines $A_0$ through $A_2$ of Address bus 507.

Output refresh control 605, when initiated, transfers either 16 or 32 sequential words from RAM memory output buffer 546' to host machine 10 at the predetermined clock rate in line 574. Direct Memory access (DMA) is used to facilitate transfer of the data at a relatively high rate. On a Refresh signal from Function Decode Section 601, Refresh Control 605 generates a HOLD signal to processor 542. On acknowledgement (HOLD A) processor 542 enters a hold condition. In this mode, CPU Module 500 releases address and data buses 507, 508 to the high impedance state giving I/O module 502 control thereover. I/O module 502 then sequentially accesses the 32 memory words from output buffer 546' (REFRESH ADDRESS) and transfers the contents to the host machine 10. CPU Module 500 is dormant during this period.

A control signal (LOAD) in line 607 along with the predetermined clock rate determined by the clock signal (CLOCK) in line 574 is utilized to generate eight 32 bit serial words which are transmitted serially via CPU Interface Module 504 to the host machine remote locations where serial to parallel transformation is performed. Alternatively, the data may be stored in addressable latches and distributed in parallel directly to the required destinations.

Figure 24:
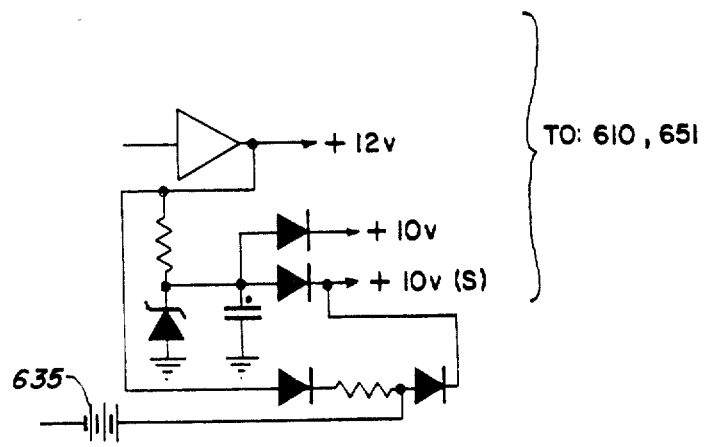
FIG. 24 is a logic schematic of the nonvolatile memory power supply.

N.V. memory 610 comprises a predetermined number of bits of non-volatile memory stored in I/O module 502 under Memory Control 638. N.V. memory 610 appears to CPU module 500 as part of the CPU module memory complement and therefore may be accessed by the standard CPU memory reference instruction set. Referring particularly to FIG. 24, to sustain the contents of N.V. memory 610 should system power be interrupted, one or more rechargeable batteries 635 are provided exterior to I/O module 502. CMOS protective circuitry 636 couples batteries 635 to memory 610 to preserve memory 610 on a failure of the system power. A logic signal (INHIBIT RESET) prevents the CPU Module 500 from being reset during the N.V. memory write cycle interval so that any write operation in progress will be completed before the system is shut down.

For tasks that require frequent servicing, high speed response to external events, or synchronization with the operation of host machine 10, a multiple interrupt system is provided. These comprise machine based interrupts, herein referred to as Pitch Reset interrupt and the Machine interrupt, as well as a third clock driven interrupt, the Real Time interrupt.

Figure 34:
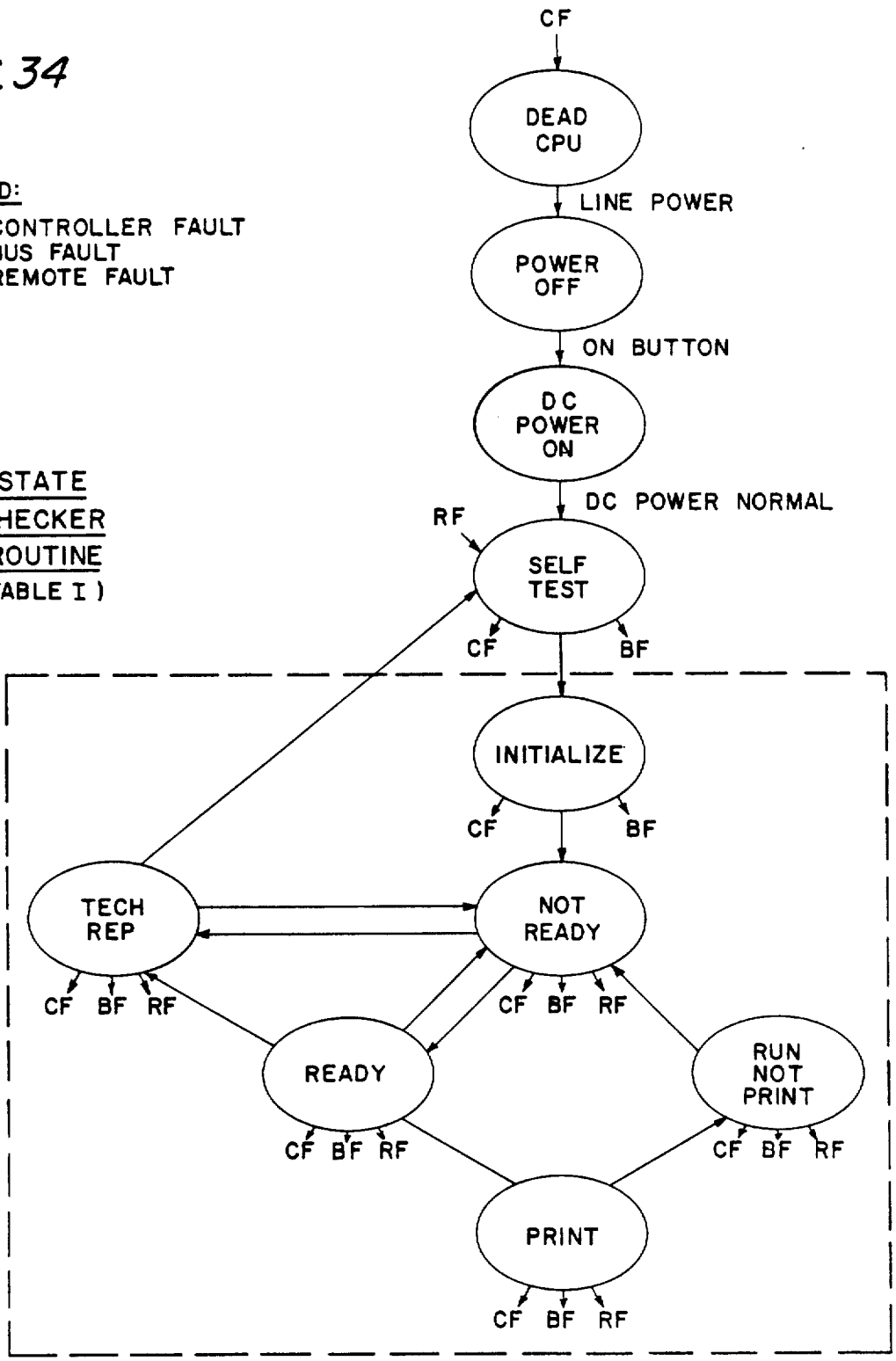
FIG. 34 is a flow chart of the machine state routine.

Referring particularly to FIGS. 23(a) and 34, the highest priority interrupt signal, Pitch reset signal 640, is generated by the signal output of pitch reset clock 138. The clock signal is fed via optical isolator 645 and digital filter 646 to edge trigger flip flop 647.

The second highest priority interrupt signal, machine clock signal 641, is sent directly from machine clock 202 through isolation transformer 648 to a phase locked loop 649. Loop 649, which serves as bandpath filter and signal conditioner, sends a square wave signal to edge trigger flip flop 651. The second signal output (LOCK) serves to indicate whether loop 649 is locked onto a valid signal input or not.

The lowest priority interrupt signal, Real Time Clock signal 643, is generated by register 621. Register 621 which is loaded and stored by memory reference instructions from CPU module 500 is decremented by a clock signal in line 643 which may be derived from I/O Module clock 570. On the register count reaching zero, register 621 sends an interrupt signal to edge trigger flip flop 656. A spare interrupt 642 is also provided.

Setting of one or more of the edge trigger flip flops 647, 651, 654, 656 by the interrupt signals 640, 641, 642, 643 generates a signal (INT) via priority chip 659 to processor 542 of CPU Module 500. On acknowledgement, processor 542, issues a signal (INTA) transferring the status of the edge trigger flip flops 647, 651, 654, 656 to a four bit latch 660 to generate an interrupt instruction code (RESTART) onto the data bus 508.

Each interrupt is assigned a unique RESTART instruction code. Should an interrupt of higher priority be triggered, a new interrupt signal (INT) and RESTART instruction code are generated resulting in a nesting of interrupt software routines whenever the interrupt recognition circuitry is enabled within the CPU 500.

Priority chip 659 serves to establish a handling priority in the event of simultaneous interrupt signals in accordance with the priority schedule described.

Once triggered, the edge trigger flip flop 647, 651, 654 or 656 must be reset in order to capture the next occurrence of the interrupt associated therewith. Each interrupt subroutine serves, in addition to performing the functions programmed, to reset the flip flops (through the writing of a coded byte in a uniquely selected address) and to re-enable the interrupt (through execution of a re-enabling instruction). Until re-enabled, initiation of a second interrupt is precluded while the first interrupt is in progress.

Lines 658 permit interrupt status to be interrogated by CPU module 500 on a memory reference instruction.

I/O Module 502 includes a suitable pulse generator or clock 570 for generating the various timing signals required by module 502. Clock 570 is driven by the pulse-like output $\phi_{1-1}, \phi_{2-1}$ of processor clock 552 (FIG. 19a). As described, clock 570 provides a reference clock pulse (in line 574) for synchronizing the output refresh data and is the source of clock pulses (in line 643) for driving Real Time register 621.

CPU interface module 504 interfaces I/O module 502 with the host machine 10 and transmits operating data stored in RAM section 546 to the machine. Referring particularly to FIGS. 25 and 26, data and address information are inputted to module 504 through suitable means such as optical type couplers 700 which convert the information to single ended logic levels. Data in bus 508 on a signal from Refresh Control 605 in line 607 (LOAD), is clocked into module 546 at the reference clock rate in line 574 parallel by bit, serial by byte for a preset byte length, with each data bit of each successive byte being clocked into a separate data channel D0 - D7. As best seen in FIG. 25, each data channel D0 - D7 has an assigned output function with data channel D0 being used for operating the front panel lamps 830 in the digital display, (see FIG. 32), data channel D1 for special circuits module 522, and remaining data channels D2 - D7 allocated to the host machine operating sections 530, 532, 534, 536, 538 and 540. Portions of data channels D1 - D7 have bits reserved for front panel lamps and digital display.

Since the bit capacity of the data channels D2 - D7 is limited, a bit buffer 703 is preferably provided to catch any bit overflow in data channels D2 - D7.

Inasmuch as the machine output sections 530, 532, 534, 536, 538 and 540 are electrically a long distance away, i.e. remote, from CPU interface module 504, and the environment is electrically "noisy", the data stream in channels D2 - D7 is transmitted to remote sections 530, 532, 534, 536, 538 and 540 via a shielded twisted pair 704. By this arrangement, induced noise appears as a differential input to both lines and is rejected. The associated clock signal for the data is also transmitted over line 704 with the line shielded carrying the return signal currents for both data and clock signals.

Data in channel $D_1$ destined for special circuits module 522 is inputted to shift register type storage circuitry 705 for transmittal to module 522. Data is also inputted to main panel interface module 526. Address information in bus 507 is converted to single ended output by couplers 700 and transmitted to Input Matrix Module 524 to address host machine inputs.

CPU interface module 504 includes fault detector circuitry 706 for monitoring both faults occurring in host machine 10 and faults or failures along the buses, the latter normally comprising a low voltage level or failure in one of the system power lines. Machine faults may comprise a fault in CPU module 500, a belt mistrack signal from sensor 27 (see FIG. 2), opening one of the machine doors or covers as responded to by conventional cover interlock sensors (not shown), a fuser over temperture as detected by sensor 175, etc. In the event of a bus fault, a reset signal (RESET) is generated automatically in line 709 to CPU module 500 (see FIGS. 17 and 18) until the fault is removed. In the event of a machine fault, a signal is generated by the CPU in line 710 to actuate a suitable relay (not shown) controlling power to all or a portion of host machine 10. A load disabling signal (LOAD DISBL) is inputted to optical couplers 700 via line 708 in the event of a fault in CPU module 500 to terminate input of data to host machine 10. Other fault conditions are monitored by the software background program. In the event of a fault, a signal is generated in line 711 to the digital display on control console 800 (via main panel interface module 526) signifying a fault.

Referring particularly to FIGS. 25 and 27, special circuits module 522 comprises a collection of relatively independent circuits for either monitoring operation of and/or driving various elements of host machine 10. Module 522 incorporates suitable circuitry 712 for amplifying the output of sensors 225, 226, 227, 228 and 280, 281, 282 of sorter 14 and document handler 16 respectively; circuitry 713 for operating fuser release clutch 159; and circuitry 714 for operating main and auxiliary paper tray feed roll clutches 130, 131 and document handler feed clutch 244.

Additionally, fuser detection circuitry 715 monitors temperature conditions of fuser 150 as responded to by sensor 174. On overheating of fuser 150, a signal (FUS- OT) is generated to turn heater 163 off, actuate clutch 159 to separate fusing and pressure rolls 160, 161; trigger trap solenoid 158 to prevent entrance of the next copy sheet into fuser 150, and initiate a shutdown of host machine 10. Circuitry 715 also cycles fuser heater 163 to maintain fuser 150 at proper operating temperatures and signals (FUS-RDUT) host machine 10 when fuser 150 is ready for operation.

Circuitry 716 provides closed loop control over sensor 98 which responds to the presence of a copy sheet 3 on belt 20. On a signal from sensor 98, solenoid 97 is triggered to bring deflector 96 into intercepting position adjacent belt 20. At the same time, a backup timer (not shown) is actuated. If the sheet is lifted from the belt 20 by deflector 96 within the time allotted, a signal from sensor 99 disables the timer and a misstrip type jam condition of host machine 10 is declared and the machine is stopped. If the signal from sensor 99 is not received within the allotted time, a sheet on selenium (SOS) type jam is declared and an immediate machine stop is effected.

Circuitry 718 controls the position (and hence the image reduction effected) by the various optical elements that comprise main lens 41 in response to the reduction mode selected by the operator and the signal inputs from lens position responsive sensors 116, 117, 118. The signal output of circuitry 718 serves to operate lens drive motor 43 as required to place the optical elements of lens 41 in proper position to effect the image reduction programmed by the operator.

Figure 28:
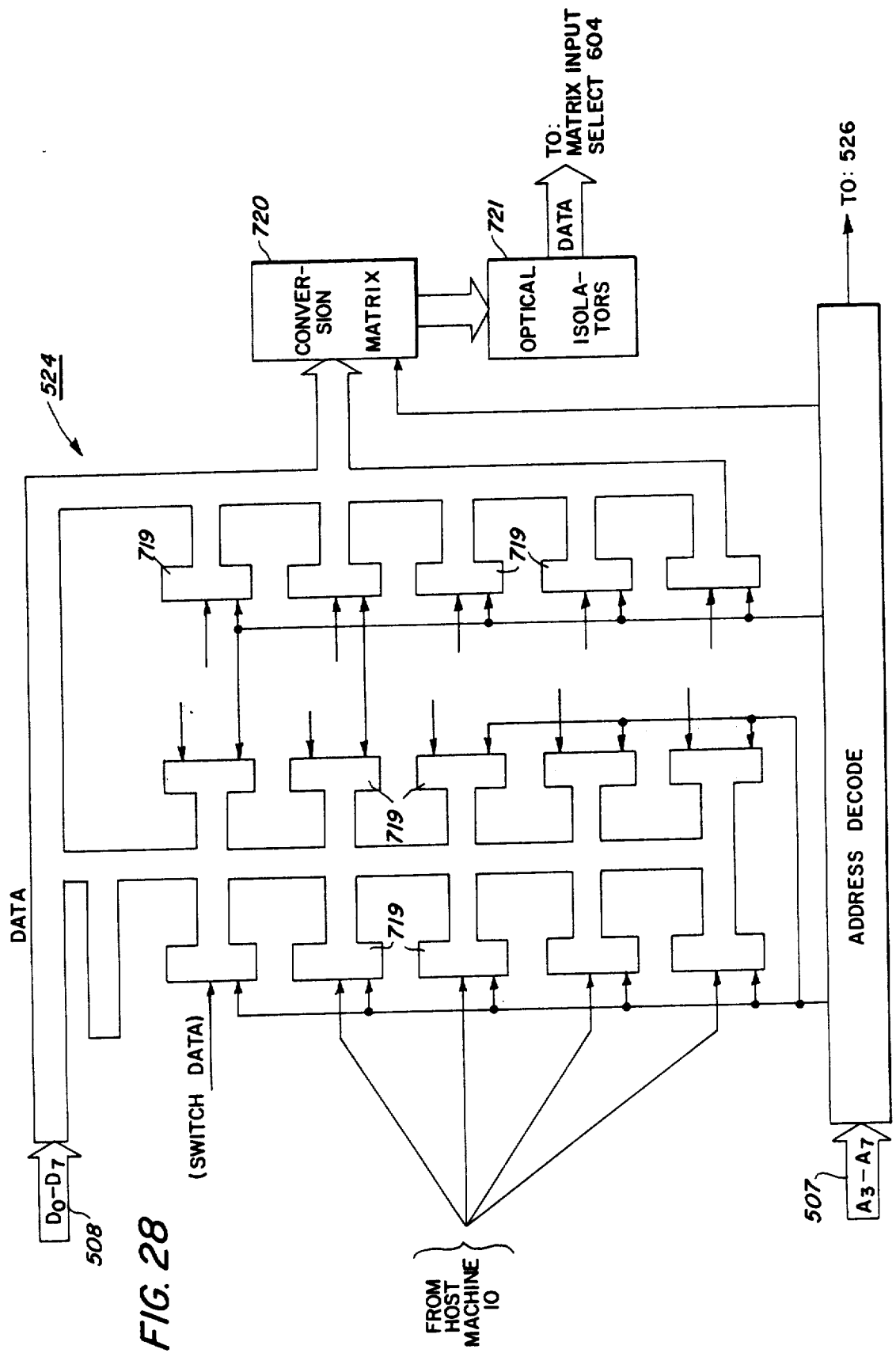
FIG. 28 is a block diagram of the main panel interface module.

Referring to FIG. 28, input matrix module 524 provides analog gates 719 for receiving data from the various host machine sensors and inputs (i.e. sheet sensors 135, 136; pressure sensor 157; etc), module 524 serving to convert the signal input to a byte oriented output for transmittal to I/O module 502 under control of Input Matrix Select 604. The byte output to module 524 is selected by address information inputted on bus 507 and decoded on module 524. Conversion matrix 720, which may comprise a diode array, converts the input logic signals of "0" to logic "1" true. Data from input matrix module 524 is transmitted via optical isolators 721 and Input Matrix Select 604 of I/O module 502 to CPU Module 500.

Figure 29:
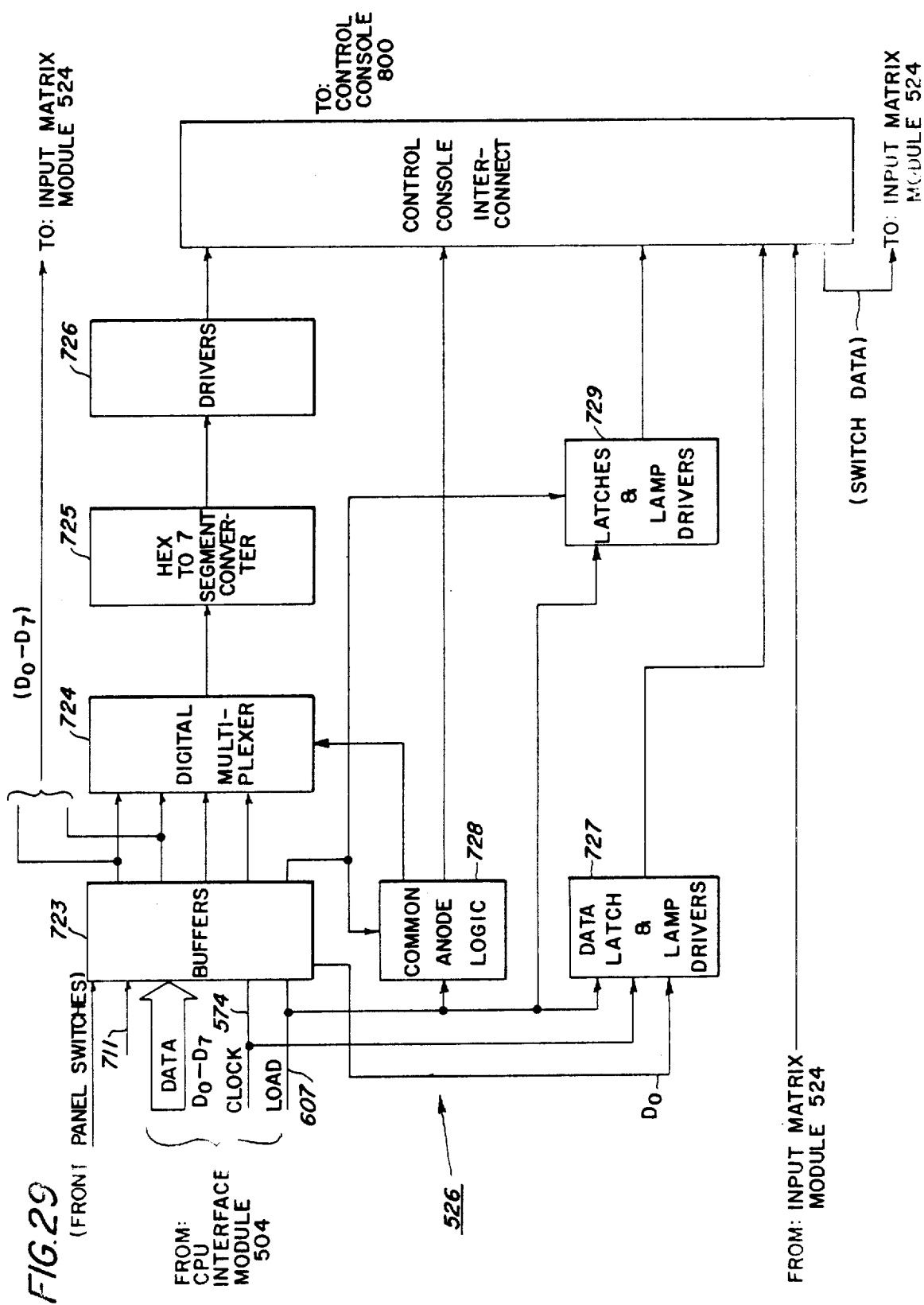
FIG. 29 is a block diagram of the input matrix module.

Referring particularly to FIG. 29, main panel interface module 526 serves as interface between CPU interface module 504 and operator control console 800 for display purposes and as interface between input matrix module 524 and the console switches. As described, data channels D0-D7 have data bits in each channel associated with the control console digital display or lamps. This data is clocked into buffer circuitry 723 and from there, for digital display, data in channels D1-D7 is inputted to multiplexer 724. Multiplexer 724 selectively multiplexes the data to HEX to 7 segment converter 725. Software controlled output drivers 726 are provided for each digit which enable the proper display digit in response to the data output of converter 725. This also provides blanking control for leading zero suppression or inter digit suppression.

Buffer circuitry 723 also enables through anode logic 728 the common digit anode drive. The signal (LOAD) to latch and lamp driver control circuit 729 regulates the length of the display cycle.

For console lamps 830, data in channel D0 is clocked to shift register 727 whose output is connected by drivers to the console lamps. Access by input matrix module 524 to the console switches and keyboard is through main panel interface module 526.

The machine output sections 530, 532, 534, 536, 538, 540 are interfaced with I/O module 502 by CPU interface module 504. At each interrupt/refresh cycle, data is outputted to sections 530, 532, 534, 536, 538, 540 at the clock signal rate in line 574 over data channels D2, D3, D4, D5, D6, D7 respectively.

Figure 30:
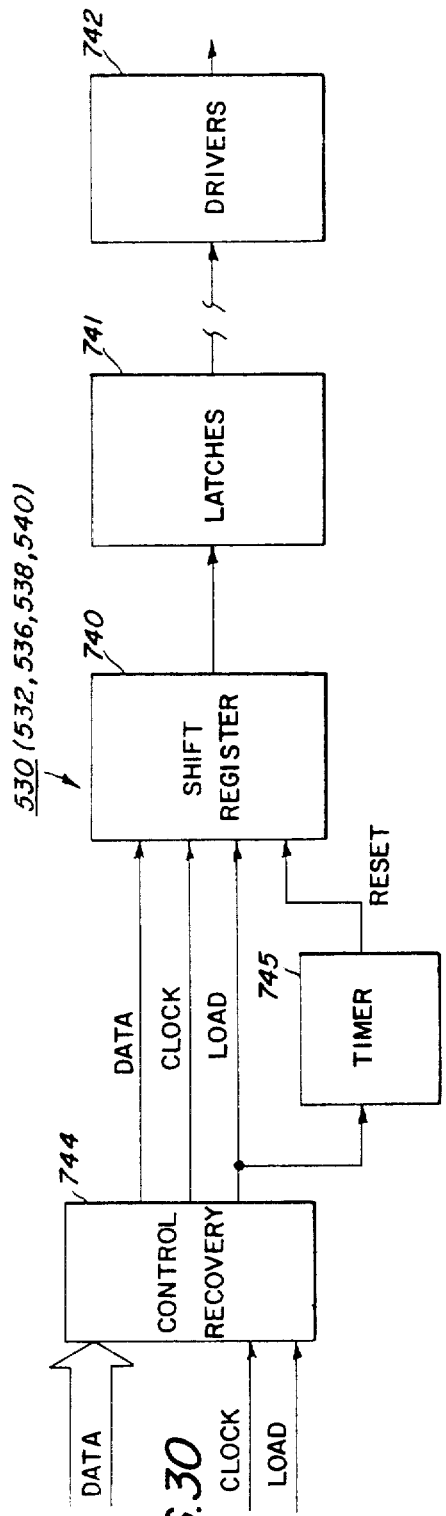
FIG. 30 is a block diagram of a typical remote.

Referring to FIG. 30, wherein a typical output section i.e. document handler section 530 is shown, data inputted to section 530 is stored in shift register/latch circuit combination 740, 741 pending output to the individual drivers 742 associated with each machine component. Preferably d.c. isolation between the output sections is maintained by the use of transformer coupled differential outputs and inputs for both data and clock signals and a shielded twisted conductor pair. Due to transformer coupling, the data must be restored to a d.c. waveform. For this purpose, control recovery circuitry 744, which may comprise an inverting/non-inverting digital comparator pair and output latch is provided.

The LOAD signal serves to lockout input of data to latches 741 while new data is being clocked into shift register 740. Removal of the LOAD signal enables commutation of the fresh data to latches 741. The LOAD signal also serves to start timer 745 which imposes a maximum time limit within which a refresh period (initiated by Refresh Control 605) must occur. If refresh does not occur within the prescribed time limit, timer 745 generates a signal (RESET) which sets shift register 740 to zero.

With the exception of sorter section 534 discussed below, output sections 532, 536, 538 and 540 are substantially identical to document handler section 530.

Figure 31:
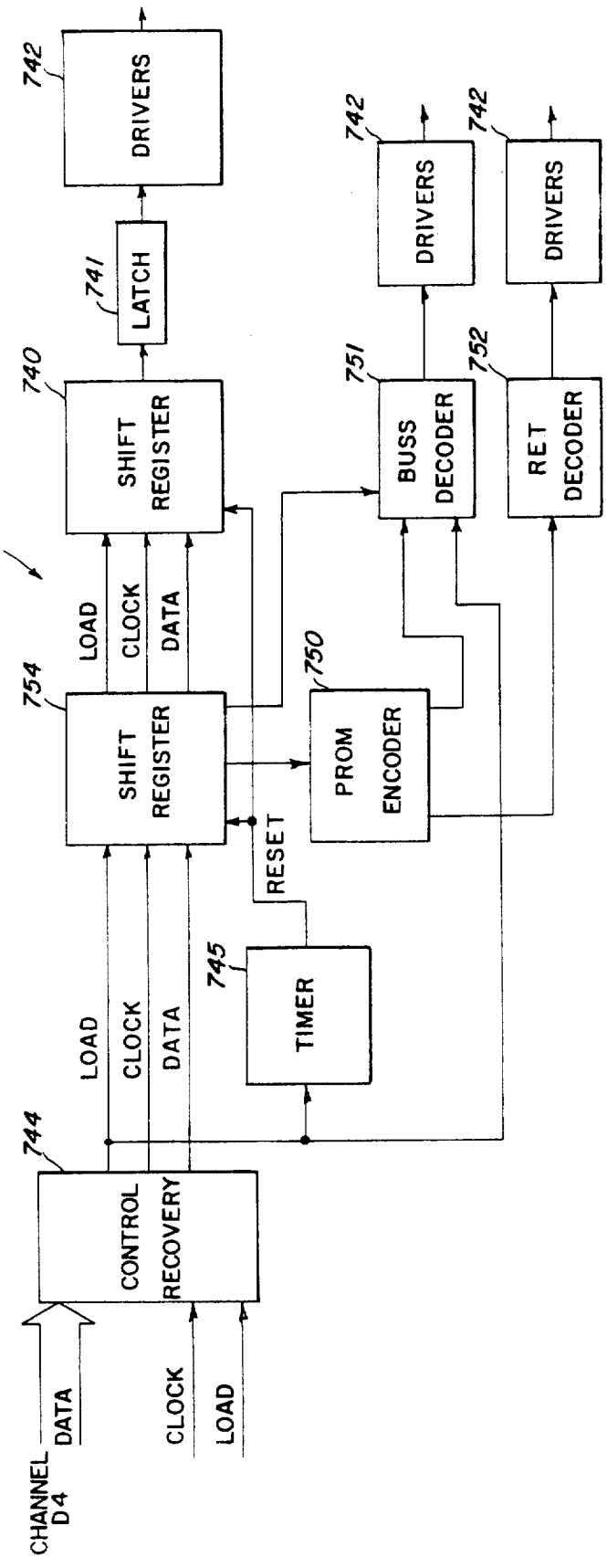
FIG. 31 is a block diagram of the sorter remote.

Referring to FIG. 31 wherein like numbers refer to like parts, to provide capacity for driving the sorter deflector solenoids 221, a decode matrix arrangement consisting of a Prom encoder 750 controlling a pair of decoders 751, 752 is provided. The output of decoders 751, 752 drive the sorter solenoids 221 of upper and lower bin arrays 210, 211 respectively. Data is inputted to encoder 750 by means of shift register 754.

Figure 32:
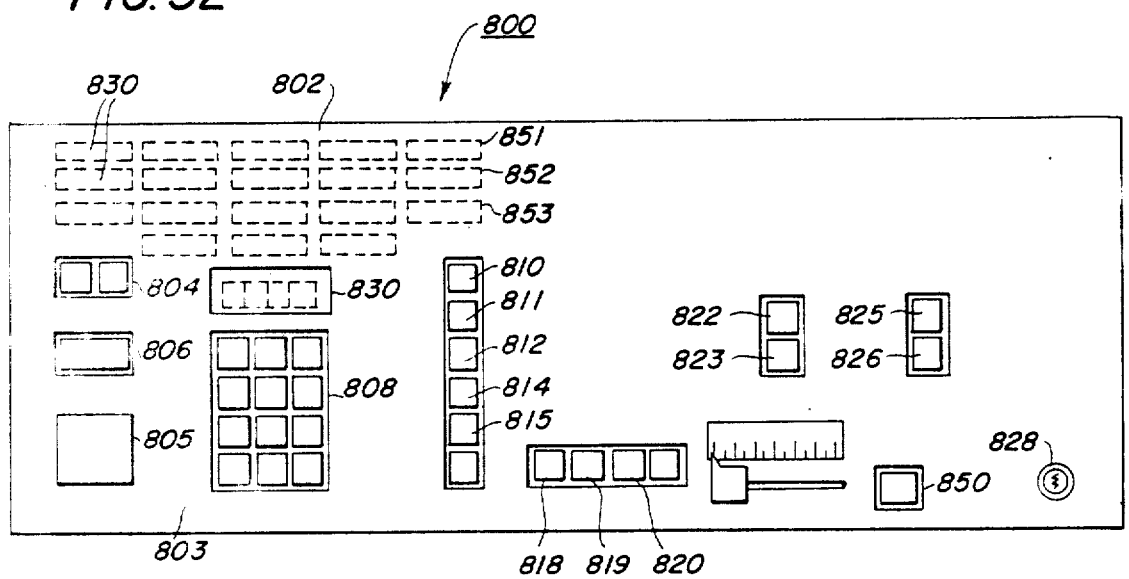
FIG. 32 is a view of the control console for inputting copy run instructions to the apparatus shown in FIG. 1.

Referring now to FIG. 32, control console 800 serves to enable the operator to program host machine 10 to perform the copy run or runs desired. At the same time, various indicators on console 800 reflect the operational condition of machine 10. Console 800 includes a bezel housing 802 suitably supported on host machine 10 at a convenient point with decorative front or face panel 803 on which the various machine programming buttons and indicators appear. Programming buttons include power on/off buttons 804, start print (PRINT) buttons 805, stop print (STOP) button 806 and keyboard copy quantity selector 808. A series of feature select buttons consisting of auxiliary paper tray button 810, two sided copy button 811, copy lighter button 814, and copy darker button 815, are provided.

Additionally, image size selector buttons 818, 819, 820; multiple or single document select buttons 822, 823 for operation of document handler 16; and sorter sets or stacks buttons 825, 826 are provided. An on/off serive selector 828 is also provided for activation during machine servicing.

Indicators comprise program display lamps 830 and displays such as READY, WAIT, SIDE 1, SIDE 2, ADD PAPER, CHECK STATUS PANEL, PRESS FAULT CODE, QUANTITY COMPLETED, CHECK DOORS, UNLOAD AUX TRAY, CHECK DOCUMENT PATH, CHECK PAPER PATH, JOB INCOMPLETE and UNLOAD SORTER. Other display information may be envisioned.

MACHINE OPERATION

As will appear, host machine 10 is conveniently divided into a number of operational states. The machine control program is divided into background routines and Foreground routines with operational control normally residing in the Background routine or routines appropriate to the particular machine state then in effect. The output buffer 546' of RAM memory section 546 is used to transfer/refresh control data to the various remote locations in host machine 10, control data from both Background and Foreground routines being inputted to buffer 546' for subsequent transmittal to host machine 10. Transmittal/refresh of control data presently in output buffer 546' is effected through Direct Memory access (DMA) under the aegis of a Machine Clock interrupt routine.

Foreground routine control data which includes a Run Event Table built in response to the particular copy run or runs programmed, is transferred to output buffer 546' by means of a multiple prioritized interrupt system wherein the Background routine in process is temporarily interrupted while fresh Foreground routine control data is inputted to buffer 546' following which the interrupted Background routine is resumed.

The operating program for host machine 10 is divided into a collection of foreground tasks, some of which are driven by the several interrupt routines and background or non-interrupt routines. Foreground tasks are tasks that generally require frequent servicing, high speed response, or synchronization with the host machine 10. Background routines are related to the state of host machine 10, different background routines being performed with different machine states. A single background software control program (STCK) composed of specific sub-programs associated with the principal operating states of host machine 10 is provided. A byte called STATE contains a number indicative of the current operating state of host machine 10. The machine STATES are as follows:

| STATE NO. | MACHINE STATE | CONTROL SUBR. |
|---|---|---|
| 0 | Software Initialize | INIT |
| 1 | System Not Ready | NRDY |
| 2 | System Ready | RDY |
| 3 | Print | PRINT |
| 4 | System Running, Not Print | RUNNPRT |
| 5 | Service | TECHREP |

Figure 33:
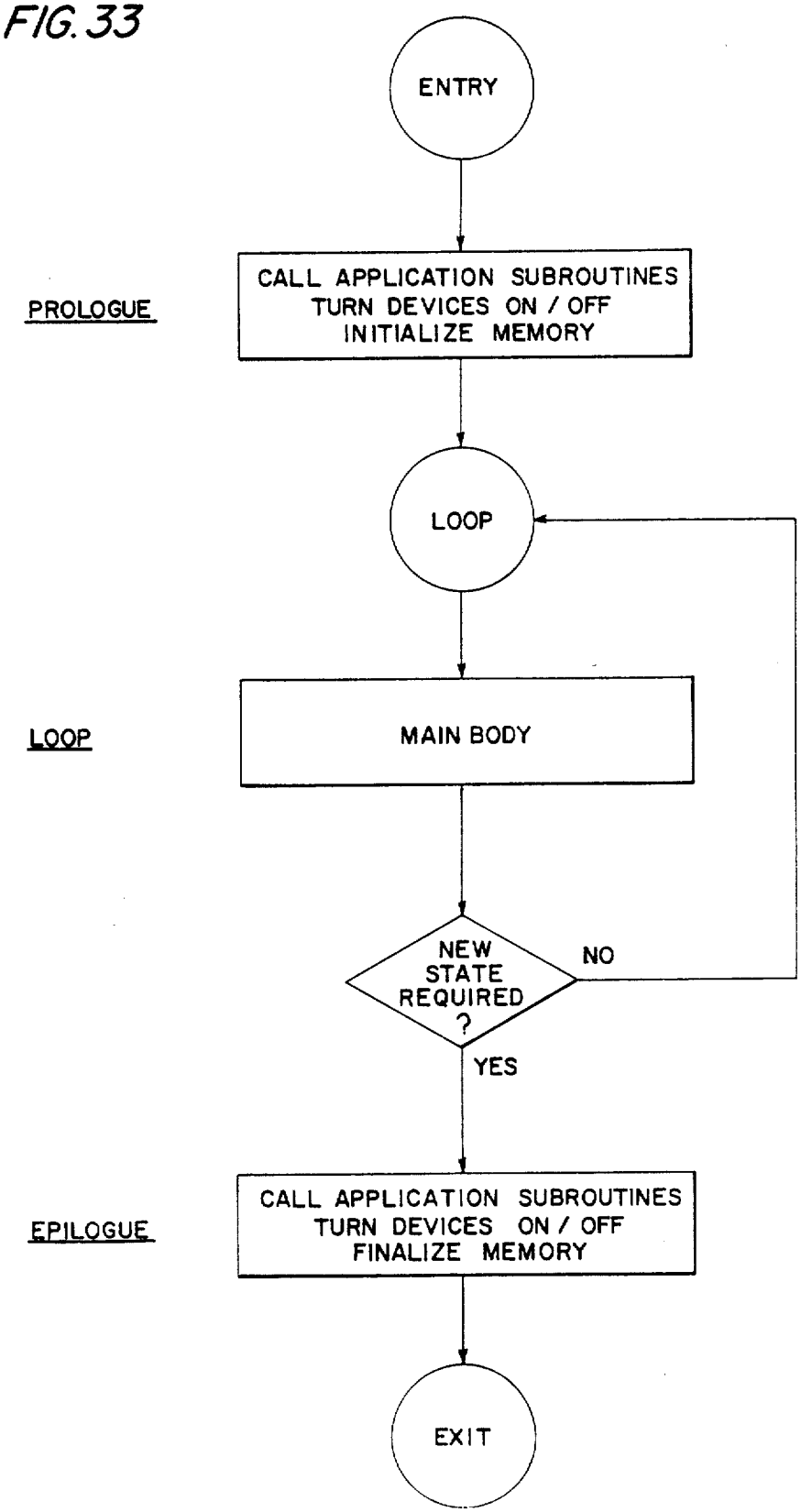
FIG. 33 is a flow chart illustrating a typical machine state.

Referring to FIG. 33, each STATE is normally divided into PROLOGUE, LOOP and EPILOGUE sections. As will be evident from the exemplary program STCK reproduced in TABLE I, entry into a given STATE (PROLOGUE) normally causes a group of operations to be performed, these consisting of operations that are performed once only at the entry into the STATE. For complex operations, a CALL is made to an applications subroutine therefor. Relatively simpler operations (i.e. turning devices on or off, clearing memory, presetting memory, etc.) are done directly.

Once the STATE PROLOGUE is completed, the main body (LOOP) is entered. The program (STCK) remains in this LOOP until a change of STATE request is received and honored. On a change of STATE request, the STATE EPILOGUE is entered wherein a group of operations are performed, following which the STATE moves into the PROLOGUE of the next STATE to be entered.

Referring to FIG. 34 and the exemplary program (STCK) in TABLE I. On actuation of the machine POWER-ON button 804, the software Initialize STATE (INIT) is entered. In this STATE, the controller is initialized and a software controlled self test subroutine is entered. If the self test of the controller is successfully passed, the System Not Ready STATE (NRDY) is entered. If not, a fault condition is signaled.

In the System Not Ready STATE (NRDY), background subroutines are entered. These include setting of Ready flags, control registers, timers, and the like; turning on power supplies, the fuser, etc., initializing the Fault Handler, checking for paper jams (left over from a previous run), door and cover interlocks, fuser temperatures, etc. During this period, the WAIT lamp on console 800 is lit and operation of host machine 10 precluded.

When all ready conditions have been checked and found acceptable, the controller moves to the system ready state (RDY). The READY lamp on console 800 is lit and final ready checks made. Host Machine 10 is now ready for operation upon completion of input of a copy run program, loading of one or more originals 2 into document handler 16 (if selected by the operator), the actuation of START PRINT button 805. As will appear hereinafter, the next state is PRINT wherein the particular copy run programmed is carried out.

While the machine is completing a copy run, the controller normally enters the Run Not Print state (RUNNPRT) where the controller calculates the number of copies delivered, resets various flags, stores certain machine event information in the memory, as well as generally conditioning the machine for another copy run, if desired. The controller then returns to the System Not Ready state (NRDY) to recheck for ready conditions prepatory for another copy run, with the same state sequence being repeated until the machine is turned off by actuation of POWER OFF button 804 or a malfunction inspired shutdown is triggered. The last state (TECH REP) is a machine servicing state wherein certain service routines are made available to the machine/repair personnel, i.e. Tech Reps.

Referring particularly to FIG. 32 and Tables II, III, IV, V, VI and VII, the machine operator uses control console 800 to program the machine for the copy run desired. Programming may be done during either the System Not Ready (NRDY) or System Ready (RDY) states, although the machine will not operate during the System Not ready state should START PRINT button 805 be pushed. The copy run includes selecting (using keyboard 808) the number of copies to be made, and such other ancillary program features as may be desired, i.e. use of auxiliary paper tray 102, (push button 810), image size selection (push buttons 818, 819, 820), document handler/sorter selection (push buttons 822, 823, 825, 826), copy density (push buttons 814, 815), duplex or two sided copy button 811, etc. On completion of the copy run program, START PRINT button 805 is actuated to start the copy run programmed (presuming the READY lamp is on and an original or originals 2 have been placed in tray 233 of document handler 16 if the document handler has been selected).

With programming of the copy run instructions, controller 18 enters a Digit Input routine in which the program information is transferred to RAM section 546.

The copy run program data passes via Main Panel Interface Module 526 to Input Matrix Module 524 and from there is addressed through Matrix Input Select 604, Multiplexer 624, and Buffers 620 of I/O Module 502 to RAM section 546 of CPU Module 500.

On entering PRINT STATE, a Run Event Table (FIG. 35) comprised of Foreground tasks is buit for operating in cooperation with the background tasks the various components of host machine 10 in an integrated manner to produce the copies programmed. The run Event Table is formed by controller 18 through merger of a Fixed Pitch Event Table (TABLE II) (stored in ROM 545 and Non Volatile Memory 610) and a Variable Pitch Event Table (TABLE III) in a fashion appropriate to the parameters of the job selected.

The Fixed Pitch Event Table (TABLE II) is comprised of machine events whose operational timing is fixed during each pitch cycle such as the timing of bias to transfer roll 75, (TRN 2 CURR), actuating toner concentration sensor 65 (ADC ACT), loading roll 161 of fuser 150 (FUS*LOAD), and so forth, irrespective to the particular copy run programmed. The Variable Pitch Table (TABLE III) is comprised of machine events whose operational timing varies with the individual copy run programmed, i.e. timing of pitch fadeout lamp 44 (FO*ONBSE) and timing of flash illumination lamps 37 (FLSH BSE). The variable Pitch Table is built by the Pitch Table Builder (TABLE IV) from the copy run information programmed in by controller 18 (using the machine control program stored in ROM section 545 and Non-Volatile Memory 610), coupled with event address information from ROM section 545, sorted by absolute clock count (via the routine shown in TABLE V), and stored in RAM section 546 (via the routine shown in TABLE VI). The Fixed Pitch Event Table and Variable Pitch Table are merged with the relative clock count differences between Pitch events calculated to form a Run Event Table (TABLE VII).

Referring particularly to FIG. 35, the Run Event Table consists of successive groups of individual events 851. Each event 851 is comprised of four data blocks, data block 852 containing the number of clock pulses (from machine clock 202) to the next scheduled pitch event (REL DIFF), data block 853 containing the shift register position associated with the event (REL SR), and data blocks 854, 855 (EVENT LO) (EVENT HI) containing the address of the event subroutine.

In machine states other than PRINT, data blocks 852, 853 (REL DIFF) (REL SR) are set to zero. Data blocks 854, 855 hold the address information for the Non-Print state event.

Control Data in the Run Event Table represents a portion of the foreground tasks and is transferred to the output buffer 546' of RAM memory section 546 by the Pitch Reset and Machine Clock interrupt routines. Other control data, representing foreground tasks not in the Run Event Table is transferred to RAM output buffer 546' by the Real Time Clock interrupt routine. Transfer of the remainder of the control data to output buffer 546' is by means of background (non-interrupt) routines.

Transfer of control data from output buffer 546' of RAM memory section 546 to the various locations in host machine 10 is through output Refresh via Direct Memory access (DMA) in response to machine clock interrupt signals as will appear. The interrupt routines are initiated by the respective interrupt signals.

Referring particularly to FIGS. 23 and 35-37 and TABLES VII, VIII the interrupt having the highest priority, the Pitch Reset interrupt (signal 640), is operable only during the PRINT state, and occurs once each revolution of sheet register fingers 141 as responded to by sensor 146 of pitch reset clock 138. At each pitch reset interrupt signal, after a determination of priority by Priority Chip 659 in the event of multiple interrupt signals, an interrupt signal (INT) is generated. The acknowledgement signal (INTA) from processor 542 initiates the pitch reset interrupt routine.

On entering the pitch reset routine, the interrupt is re-enabled and the contents of the program working registers stored. A check is made to determine if building of the Run Event Table is finished. Also checks are made to insure that a new shift register schedules have been built and at least 910 clock counts since the last pitch reset have elapsed. If not, an immediate machine shutdown is initiated.

Presuming that the above checks are satisfactory, the shift register pointer (SR PTR), which is the byte variable containing the address of a pre-selected shift register position (SR O), is decremented by one and adjusted for overflow and the shift register contents are updated with a byte variable (SR+VALUV) containing the new shift register value to be shifted in following the pitch reset interrupt. The event pointer (EV*PTR), a two byte variable containing the full address of the next scheduled event, is reset to Event #1. The count in the C register equals the time to the first event.

Machine Cycle Down, Normal Down, and Side One Delay checks are made, and if negative, the count on a cycle up counter (CYC UP CT) is checked. If the count is less than a predetermined control count (i.e. 5), the counter (CYC UP CT) is incremented by one. When the count on the cycle up counter equals the control count, an Image Made Flag is set.

If a Normal Down, Cycle Down, or Side One Delay has been initiated, the cycle up counter (CYC UP CT) is reset to a preset starting count (i.e. 2). The pitch reset interrupt routine is exited with restoration of the working registers and resetting of pitch reset flip flop 647.

The Machine Clock Interrupt routine, which is second in priority, is operative in all operational states of host machine 10. Although nominally driven by machine clock 202, which is operative only during Print state when processor main drive motor 34 is energized, machine clock pulses are also provided by phase locked loop 649 when motor 34 is stopped.

Referring particularly to FIG. 38 and TABLE IX, entry to the Machine Clock interrupt routine there shown is by a signal (INTA) from processor 542 following a machine clock interrupt signal 642 as described earlier. On entry, the event control register (C REG) is obtained and the working register contents stored. The C REG is decremented by one, the register having been previously set to a count corresponding to the next event in the Event Run Table.

The control register (C REG) is checked for zero. If the count is not zero and is an odd number, an output refresh cycle is initiated to effect transfer/refresh of data in RAM output buffer 546' to host machine 10. If the number is even, or following an output refresh, the interrupt system is re-enabled, the machine clock interrupt flip flop 651 is reset and the working registers are restored. Return is then made to the interrupted routine.

If the control register (C REG) count is zero, the Event Pointer (EV*PTR), which identifies the clock count (in data block 852) for the next scheduled event (REL DIFF), is loaded and the control register (C REG) reset to a new count equal to the time to the next event. The Event Pointer (EV*PTR) is incremented to the relative shift register address for the event (REL SR, data block 853), and the shift register address information is set in appropriate shift registers (B, D, E, A registers).

The event Pointer (EV*PTR) is incremented successively to the event subroutine address information (EVENT LO) (EVENT HI) in the Event Run Table, and the address information therefrom loaded into a register pair (D & E registers). The Event Pointer (EV PTR) is incremented to the first data block (REL DIFF) of the next succeeding event in the Run Event Table, saved, and the register pair (H & L registers) that comprise the Event Pointer are loaded with the event subroutine address from the register pair (D & E registers) holding the information. The register pair (D & E registers) are set to the return address for the Event Subroutine. Using the address information, the Event Subroutine is called and the subroutine data transferred to RAM output buffer 546' for transfer to the host machine on the next Output Refresh.

Following this, the Machine Clock interrupt routine is exited as described earlier.

The Output Refresh cycle alluded to earlier functions, when entered, to transfer/refresh data from the output buffer of 546' RAM section 546 to host machine 10. Direct Memory Access (DMA) is used to insure a high data transfer rate.

On a refresh, Refresh Control 605 (see FIG. 23) raises the HOLD line to processor 542, which on completion of the operation then is progress, acknowledges by a HOLD A signal. With processor 542 in a hold mode and Address and Data buses 507, 508 released to I/O Module 502 (through operation of tri-state buffers 510, 511, 563, 570), the I/O module then sequentially accesses the output buffer 546' of RAM section 546 and transfers the contents thereof to host machine 10. Data previously transferred is refreshed.

The Real Time Interrupt, which carries the lowest priority, is active in all machine states. Primarily, the interrupt acts as an interval timer by decrementing a series of timers which in turn serve to control initiation of specialized subroutines used for control and error checking purposes.

Figure 39A:
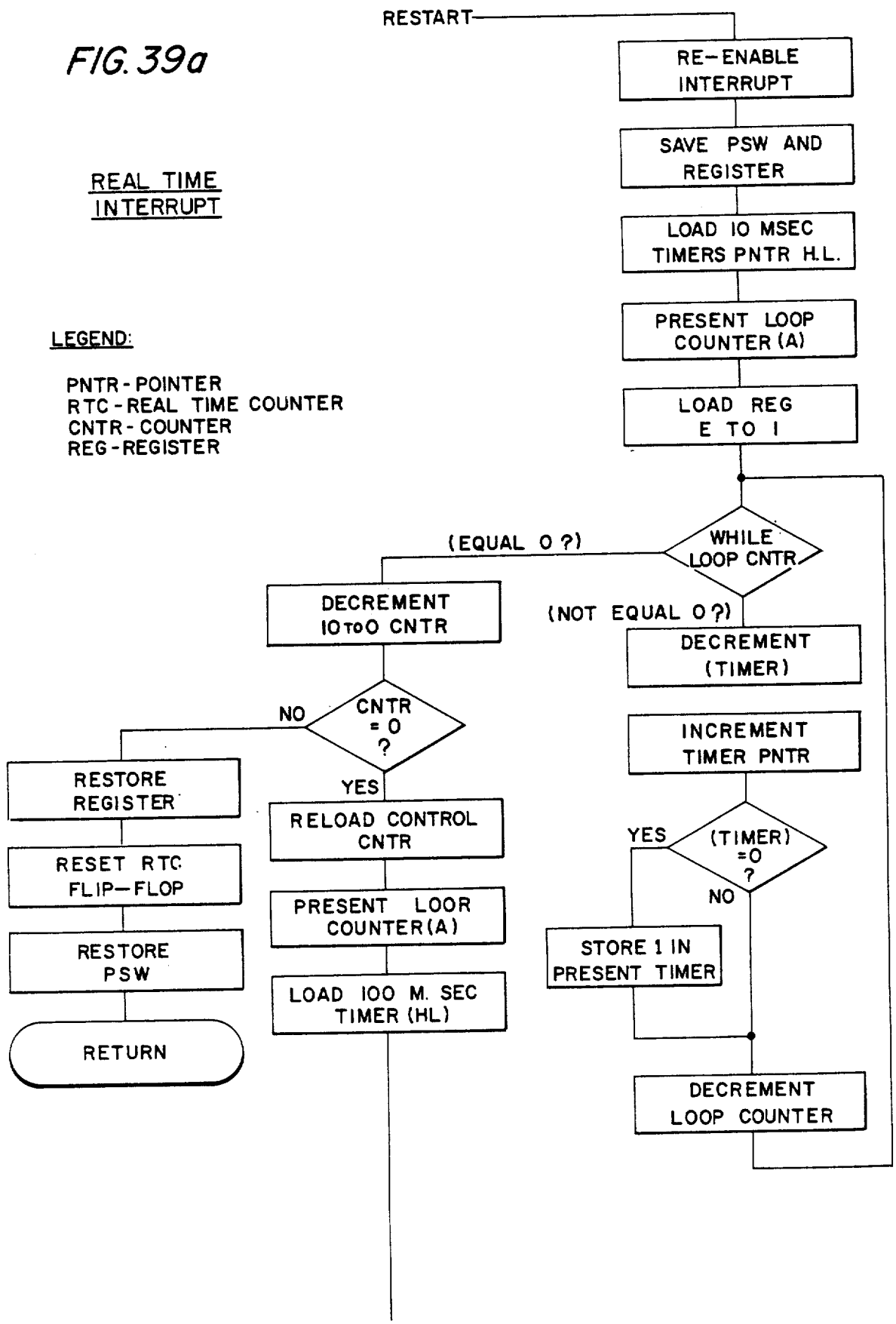
FIGS. 39a and 39b comprise a flow chart of the real time interrupt routines.
Figure 39B:
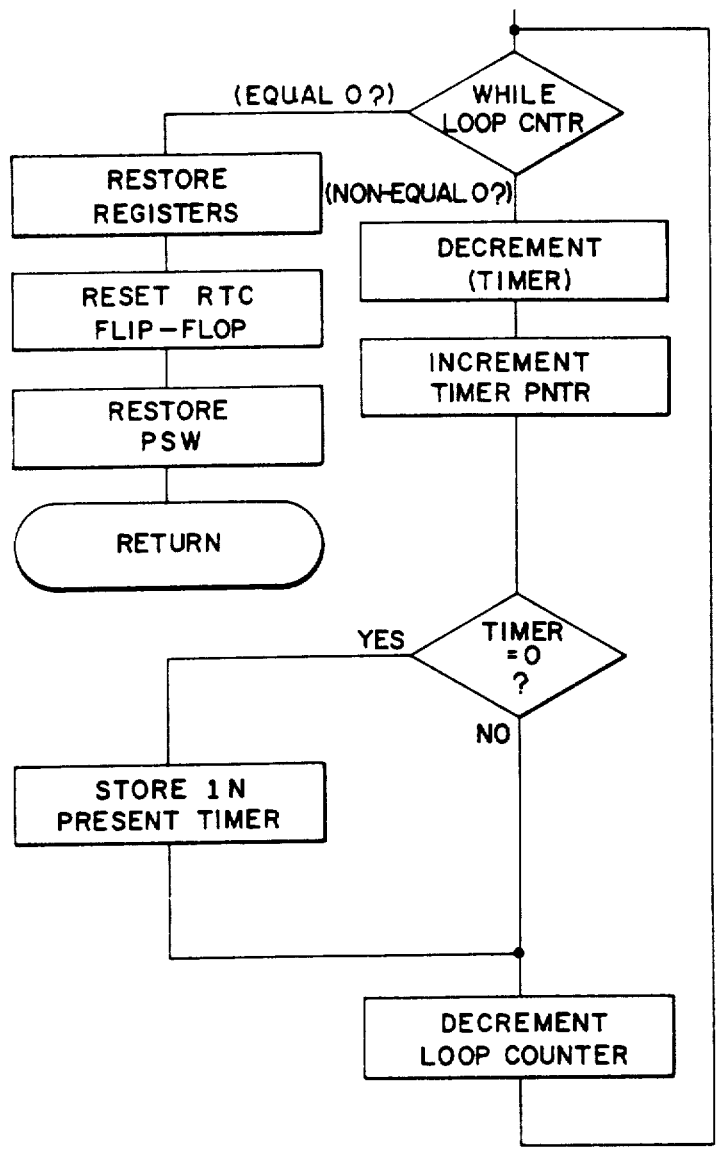

Referring particularly to FIG. 39 and TABLE X, the Real Timer interrupt routine is entered in the same manner as the interrupt routines previously described, entry being in response to a specific RESTART instruction code assigned to the Real Time interrupt. On entry, the interrupt is re-enabled and the register contents stored. The timer pointer (PNTR) for the first class of timers (i.e. 10 msec TIMERS) is loaded, and a loop counter identifying the number of timers of this class (i.e. 10 msec TIMERS) preset. A control register (E REG) is loaded and a timer decrementing loop is entered for the first timer. The loop decrements the particular timer, increments the timer pointer (PNTR) to the location of the next timer in this class, checks the timer count, and decrements the loop counter. The decrementing loop routine is repeated for each timer in the class (i.e. 10 msec TIMERS) following which a control counter (CNTR) for the second group of timers (i.e. 100 msec TIMERS) is decremented by one and the count checked.

The control counter (CNTR) is initially set to a count equal to the number of times the first timer interval is divisible into the second timer interval. For example, if the first class of timers are 10 msec timers and the second timer class are 100 msec timers, the control counter (CNTR) is set at 10 initially and decremented on each Real Time interrupt by one down to zero.

If the count on the control counter (CNTR) is not zero, the registers are restored, Real Time interrupt flip flop 856 reset, and the routine exited. If the count on the control counter is zero, the counter is reloaded to the original maximum count (i.e. 10) and a loop is entered decrementing individually the second group of timers (i.e. 100 msec TIMERS). On completion, the routine is exited as described previously.

In the following TABLES:

"'" — is used to indicate flags, counters and subroutine names.

"#" — is used to indicate input signals.

"$" — is used to indicate output signals.

":" — is used to indicate macro instructions, system subroutines, system flags, and data, etc.

For further explanation of the mnemonics and particular instructions utilized by the following routines, the reader is directed to Intel Corporation's Programming Manual for the 8080 Microcomputer System.

TABLE I

```
 99                              *NAR
100                               *
101              -                *        I N I T I A L I Z E   S T A T E
102                               *
103                               *     INIT: SUBROUTINE
104                               *
105                               *     INITIALIZE STATE- EXECUTED AFTER EACH START OR RESTART.  SETS
106                               *     ALL POINTERS, FLAGS, AND DATA TO INITIAL VALUES REQUIRED TO
107                               *     START EXECUTION OF ANY CONTROL ALGORITHMS.  ALWAYS EXITS TO
108                               *     'NOT READY' STATE.

110                               *     EPILOG 112   05 00000   3E0A   A   INIT: MVI    A,10
113   05 00002   3252FD  N         STA    DIVD:10              INITIALIZE TO 10
114   05 00005   32P5FC  N         STA    SLRMTOGL             INITIALIZE TO 10
115   05 00008   211907  N         LXI    H,EVBSTBY1           H&L= ADDR OF STBY EVENT TABLE
116   05 0000B   2264FD  N         SHLD   EV3PTR:              SAVE FOR MACH CLK ROUTINE
117   05 0000E   21FFFF  A         LXI    H,X1FFFF1            INIT INSTRUMENTATION REMOTE
118   05 00011   2272FB  N         SHLD   INS3PTRR              ADDR PNTR TO END OF RAM
119   05 00014   21FFFF  N         LXI    H,ADH9RAMT-1         SET PNTR TO RAM CNTRL TABLE
120   05 00017   2278FB  N         SHLD   TAB3STRT             SAVE PNTR
121   05 0001A   3E7F    A         MVI    A,X'7F'              INIT TO UN-BYPASS
122   05 0001C   32ADFC  N         STA    JAM9BYPS                          ALL JAM SWS
123                               *                                                  ,
124                               *     TIMER INITIALIZATION
125                               *     MUST BE DONE BEFORE ANY TIMERS CAN BE USED
126                               *
```

```
127  05 0001F  211FF9  A          LXI     H,AVAILI**8+X'1F'            SET H&L TO END OF AVAIL: TABLE
128  05 00022  36FF    A          MVI     M,X'FF'                      STORE X'FF' IN LAST TABLE ADDR
129  05 00024  3E1F    A          MVI     A,31                         SET A-REG TO VALUE TO BE STORED
130                               REPEAT
131  05 00026  2D      A              DCR     L                        STEP TO NEXT TABLE LOCATION
132  05 00027  77      A              MOV     M,A                      STORE INITIALIZATION VALUE
133  05 00028  3D      A              DCR     A                        STEP TO NEXT VALUE
134  05 00029  C22600  N          UNTIL:   CC,Z,S                      IS INITIALIZATION COMPLETE
135  05 0002C  2120FE  A          LXI     H,ADR(DATA,TIME:OUT)         TO INITIALIZE TIME:OUT TABLE
136  05 0002F  225FFD  N          SHLD    INPTR:                       SET IN/OUT POINTERS TO
137  05 00032  2261FD  N          SHLD    OUTPTR:                      BEGINNING OF TIME:OUT TABLE
138                         *
139                         *     INITIALIZE SPOOL
140                         *     POINTERS
141                         *
142  05 00035  2140FE  A          LXI     H,ADR(DATA,SPLITBL)          SET PNTRS
143  05 00038  226AFD  N          SHLD    SPL:IN                             TO START
144  05 0003B  226CFD  N          SHLD    SPL:OUT                                  OF TABLE
145
146                         *     CHECK IF PAPER WAS PRESENT WHEN POWER WENT DOWN
147                         *
148  05 0003E  3AC9E2  A          RNVNIB  NVBJAMPN                     A = JAM INFO FROM POWER DOWN
149  05 00041  0F      A          RRC                                  SET CARRY TO FDR JAM INFO
150  05 00042  D25A00  N          IF:     CC,C,S                       WAS THERE PAPER IN FDR AREA
151  05 00045  47      A              MOV     B,A                      YES, SAVE JAM INFO
152  05 00046  213CFD  A          SFBIT,P FDR@AJAM,FDR@MJAM            SET FEEDER JAM*
     05 00049  3E0C    A
     05 0004B  86      A
     05 0004C  77      A
153  05 0004D  2121F9  A          SFBIT,P ON@X@2,ON@X@3                SIGNAL TRANSPT CL:RANCE REQ:D
     05 00050  3E03    A
     05 00052  86      A
     05 00053  77      A
154  05 00054  3E80    A          SFLG    CLP@REQD                     TELL FLT HNDLR CLEARANCE REQD
     05 00056  3267F4  A
155  05 00059  78      A          MOV     A,B                          RESTORE THE A-REG
156                               ENDIF
157  05 0005A  0F      A          RRC                                  SET CARRY TO IMED@DN:
158  05 0005B  D27100  N          IF:     CC,C,S                       WAS THERE AN IMED@DN:
159                         *
160                                      MVI     L,MSK(FBIT,L@PR@FLT,JAM2@FLT,JAM3@FLT,JAM4@FLT,,
161  05 0005E  2EFF    A                          JAM5@FLT,JAM6@FLT,RET1@FLT,RET2@FLT)
162                         *                                          SETS ALL JAM FBITS IN REG-L
163  05 00060  2603    A                  MVI     H,MSK(FBIT,S@S@JAM,MISSTRIP)
164                         *                                          SETS ADDITIONAL FBITS IN H
165  05 00062  2238FD  A                  SHLD    ADR(FBYT,PAP11)      MOVE FBITS INTO FBYTES
166  05 00065  3E80    A                  SFLG    CLR@REQD             TELL FLT HNDLR CLEARANCE REQD
     05 00067  3267F4  A
167  05 0006A  2120F9  A                  SFBIT,P TS@FUS,TS@X@2        TURN ON UNDEDICATED MAP LAMPS
     05 0006D  3E21    A
     05 0006F  86      A
     05 00070  77      A
168                               ENDIF
169                               IF:     XBYT,A,AND,,                 IS EITHER SRT JAM FLAG SET
170  05 00071  E60C    A                  MSK(NVBIT,NV@L@W@J,NV@UP@J),NZ ' IN NVNIB
     05 00073  CA8A00  N
171                                      IF:     XBYT,A,EQ,,           YES, ARE BOTH SET
172  05 00076  FE0C    A                          MSK(NVBIT,NV@L@W@J,NV@UP@J)
     05 00078  C28300  N
173  05 0007B  3E80    A                          SFLG    TW@@ACT      TELL SRT THAT THERE WAS A JAM
     05 0007D  3261F4  A
174  05 00080  C38700  N                      ELSE:
175  05 00083  0F      A                          RRC                  GET NV@L@W@J TO SIGN BIT &
176                                                ID:READ NV@L@W@J
177  05 00084  3237F4  A                          MODFLG  L@W@M@D      TELL SRT IF UP OR LOW JAM
178                                      ENDIF
179  05 00087  CD0000  N                  CALL    JAM@SET              LET SRT SET JAM FLAGS & LAMPS
180                               ENDIF
181  05 0008A  3E80    A          SFLG    SRT@RDY                      SIGNAL SRT NOT IN USE (READY)
     05 0008C  32$CF7  A
182  05 0008F  3287F7  A          MODFLG  PROG@RDY                     SET PROG ROUTINE READY
183  05 00092  3268F4  A          MODFLG  2SD@ENAB                     ALLOW SELECTION OF DUPLEX MODE
184  05 00095  3EF2    A          MVI     A,X'F2'                      RE-ENABLE
185  05 00097  3200E6  A          STA     RSINTFF:                               INTERRUPT
186  05 0009A  FB      A          F1                                                    SYSTEM
187  05 0009B  CD0000  N          S@BIT,S NPF@@BH:,24V@SPL             PF@ OFF (INVT'D) & 24V ON
     05 0009E  02      A
     05 0009F  E480    A
     05 000A1  EE80    A
188  05 000A3  CD0000  N          STIMR   FLT@DLY,25000,FLT@CHK        START LENS FAULT TIMER
     05 000A6  12      A
     05 000A7  FA      A
     05 000A8  0000    N
189  05 000AA  CD0000  N          CALL    D@C@CLR                      INITIALIZE D@C#NUM T@ 1    (1)
190  05 000AD  327AFC  A          STA     CF@DIGIT                     ENABLE '0' IN QTY FLASHED  (2)
191  05 000B0  3E08    A          MVI     A,MSK(FBIT,P@P@RS)           TELL FLT ASSUME
192  05 000B2  3286FC  A          STA     XP@PREV                                    BRUSH HOUSE OPN
193  05 000B5  3E02    A          MVI     A,:NRDY                      INIT STCK
194  05 000B7  3254FD  N          STA     ISTATE:                                SYNCHRONIZED BACKGROUND
195  05 000BA  3253FD  N          STA     STATE:                                         CONTROL LOOP
196  05 000BD  CD3702  N          CALL    NRDY:PRL                     INIT CONTROL TO NOT-READY STATE
```

```
198          *****************************************************************
199          *                                                               *
200          *     SYCRONIZED   BACKGROUND   CONTROL   LOOPS                 *
201          *                                                               *
202          *****************************************************************

204                      *    PRIORITIES:
205                      *         FIRST     10MS TIME OUT REQUESTS
206                      *         SECOND    10MS CALLS
207                      *         THIRD     SPOOLED CALLS
208                      *         FOURTH    20MS CALLS
209                      *         FIFTH     100MS CALLS
210                      *         SIXTH     100MS TIME OUT REQUESTS 212  05 000C0  2151FD  A       LXI      H,ADR(DATA,SB:RQST)     SET MEM PNTR TO SB BYTE
213                             REPEAT                           LOOP-3 FROM HLT ON ALL INTER'S
214                              REPEAT                          LOOP-2 BACK AFTER EACH 100MS
215                               REPEAT                         LOOP-1 BACK AFTER EACH 20MS
216  05 000C3  7E      A         MOV      A,M                   A= SYNC BKGND REQUESTS FROM RTC
217                              ID:READ  SB:RQST
218  05 000C4  07      A         RLC                            TEST FOR 10MS
219  05 000C5  D2F700  N         IF:      CC,C,S                       SB REQUEST
220                      *
221                      *                                       TIMER SERVICE REQUESTS
222                      *                                       CALLS TIMED OUT TIMER SUBRS
223                      *                                       USING WRAP ARBUND TABLE AND
224                      *                                       IN/OUT PNTRS - RTCI SETS
225                      *                                       INPTR: & ENTERS CALL ADDR
226                      *
227                                WHILE:   XBYT,INPTR:,NE,OUTPTR: ARE PNTRS AT SAME TABL
     05 000C8  3A5FFD  N
     05 000CB  2161FD  N
     05 000CE  BE      A
     05 000CF  CAE500  N
228  05 000D2  6E      A            MOV      L,H            SET L-REG TO ADDR(L) IN TABLE
229  05 000D3  26FE    A            MVI      H,HADR(DATA,TIME:OUT) MEM PNTR NOW SET TO
230  05 000D5  5E      A            MOV      E,M            MOVE CALL ADDR(L) TO E
231  05 000D6  23      A            INX      H              STEP TO NEXT TABLE BYTE
232  05 000D7  56      A            MOV      D,M            MOVE CALL ADDR(H) TO D
233  05 000D8  23      A            INX      H              STEP TO NEXT TABLE BYTE
234  05 000D9  7D      A            MOV      A,L            PREPARE TO UPDATE PNTR
235                                 ID:READ  TIME:OUT       DYNAMIC TABLE CONTAINING ADDRS
236                                 MODBYT   A,AND,:        ADJUST FOR END OF TABLE
                                             TIME:MSK
237  05 000DA  E62F    A            STA      ADR(DATA,OUTPTR:) PNTR TO ADDR OF LAST SE
238  05 000DC  3261FD  A            CALL     DE:IND         DO TIMEOUT CALL
239  05 000DF  CD0000  N          ENDWHILE                  YES, ALL TIME OUTS SERVICED
240  05 000E2  C3C800  N                                    END TIMER SECTION
241
242  05 000E5  2A55FD  N          LHLD     10:CALLS        GET PROPER 10MS CALL TABLE
243  05 000E8  CDC000  N          CALL     HL:IND          DO 10MS CALLS
244  05 000EB  2151FD  A          LXI      H,ADR(DATA,SB:RQST) SET MEM PNTR TO SB BYTE
245  05 000EE  F3      A          DI
246  05 000EF  7E      A          MODBYT   M,AND,!10:RQST  REMOVE 10MS REQUEST
     05 000F0  E67F    A
     05 000F2  77      A
247                               ID:ALTR  SB:RQST
248  05 000F3  FB      A          EI                       (WATCH OUT FOR UNPRINTABLE NOT)
249  05 000F4  C31501  N         ELSE:                     DO ANY SPOOLED ROUTINES
250  05 000F7  3A6AFD  N          IF:      XBYT,SPLI:IN,NE,SPL:OUT
     05 000FA  216CFD  N
     05 000FD  BE      A
     05 000FE  CA1101  N
251  05 00101  6E      A            MOV      L,M
252  05 00102  26FE    A            MVI      H,HADR(DATA,SPL:TBL)
253  05 00104  5E      A            MOV      E,M
254  05 00105  23      A            INX      H
255  05 00106  56      A            MOV      D,M
256  05 00107  23      A            INX      H
257  05 00108  7D      A            MOV      A,L
258  05 00109  E64F    A            MODBYT   A,AND,SPL:MSK
259  05 0010B  326CFD  A            STA      ADR(DATA,SPL:OUT)
260  05 0010E  CD0000  N            CALL     DE:IND
261                               ENDIF
262  05 00111  2151FD  A          LXI      H,ADR(DATA,SB:RQST)
263  05 00114  7E      A          MOV      A,M
264                              ENDIF
265                              ID:READ  SB:RQST
266  05 00115  07      A          RLC
267  05 00116  07      A          RLC                      TEST FOR 20MS
                                                                    SB REQUEST
268  05 00117  D24201  N          IF:      CC,C,S
269  05 0011A  2A59FD  N            LHLD     20PNTR        SET MEM PTR TO CALL IN 20MS TAB
270  05 0011D  5E      A            MOV      E,M           MOVE CALL ADDR(L) TO E
271  05 0011E  23      A            INX      H             STEP MEM PTR TO ADDR(H)
272  05 0011F  7E      A            IF:      XBYT,M,EQ,X'FF' IS POINTER AT END OF TABLE
     05 00120  FEFF    A
     05 00122  C23701  N
273  05 00125  2A57FD  N              LHLD     20:PNTR     YES, SET MOVING POINTER
274  05 00128  2259FD  N              SHLD     20PNTR      BACK TO BEGINNING OF TABLE
275  05 0012B  2151FD  A              LXI      H,ADR(DATA,SB:RQST)   SET MEM PNTR TO
276  05 0012E  F3      A              DI
277  05 0012F  7E      A              MODBYT   M,AND,!20:RQST REMOVE 20MS REQUEST
     05 00130  E6BF    A
     05 00132  77      A
278                                   ID:ALTR  SB:RQST
279  05 00133  FB      A              EI
280  05 00134  C34201  N            ELSE:
                                       MOV      D,M         NO, MOVE CALL ADDR(H) TO D
281  05 00137  56      A              INX      H            STEP TO NEXT CALL IN TABLE
282  05 00138  23      A              SHLD     20PNTR       SAVE FOR NEXT LOOP-1
283  05 00139  2259FD  N              CALL     DE:IND
284  05 0013C  CD0000  N              LXI      H,ADR(DATA,SB:RQST) SET MEM PNTR TO SB BY
285  05 0013F  2151FD  A            ENDIF
286                              ENDIF
287                              UNTIL:   XBYT,M,AND,20:RQST,Z MORE 20MS CALLS TO DO  (LOOP-1)
288  05 00142  7E      A
     05 00143  E640    A
     05 00145  C2C300  N
```

```
289
290    05 0014B    7E       A
       05 00149    E620     A
       05 0014B    CA9E01   N
291
292    05 0014E    2A5DFD   N
293    05 00151    5E       A
294    05 00152    23       A
295    05 00153    7E       A
       05 00154    FEFF     A
       05 00156    C29301   N
296    05 00159    2A5BFD   N
297    05 0015C    225DFD   N
298
299
300
301
302
303
304
305
306
307
308
309    05 0015F    2130FA   N
310    05 00162    1614     A
312
314    05 00164    3A45FD   A
       05 00167    E640     A
       05 00169    CA6E01   N
315
316    05 0016C    1611     A
317
318
319
320    05 0016E    7E       A
       05 0016F    A7       A
       05 00170    CA8201   N
321    05 00173    35       A
322    05 00174    C28201   N
323    05 00177    D5       A
324    05 00178    E5       A
325    05 00179    24       A
326    05 0017A    5E       A
327    05 0017B    24       A
328    05 0017C    56       A
329    05 0017D    CD0000   N
330    05 00180    E1       A
331    05 00181    D1       A
332
333
334
335    05 00182    23       A
336    05 00183    15       A
337    05 00184    C26E01   N
338
339    05 00187    2151FD   A
340    05 0018A    F3       A
341    05 0018B    7E       A
       05 0018C    E6DF     A
       05 0018E    77       A
342
343    05 0018F    FB       A
344    05 00190    C39E01   N
345    05 00193    56       A
346    05 00194    23       A
347    05 00195    225DFD   N
348    05 00198    CD0000   N
349    05 00198    2151FD   A
350
351
352    05 0019E    7E       A
       05 0019F    A7       A
       05 001A0    C2C300   N
353
354    05 001A3    76       A
355    05 001A4    CAC300   N
356    05 001A7    F3       A
357    05 001A8    76       A
359
360
361
362
363
364
365    05 001A9    3A53FD   N
366    05 001AC    110600   A
367    05 001AF    210501   N
368
369    05 001B2    19       A
370    05 001B3    30       A
371    05 001B4    F28201   N
372
373
374
375    05 001B7    1155FD   N
376    05 001BA    0602     A
377    05 001BC    CDCE01   N
378    05 001BF    2B       A
379    05 001C0    2B       A
380    05 001C1    0602     A
381    05 001C3    CDCE01   N
```

```
ID:READ    SB:RQST
IF:        XBYT,H,AND,100:RQST,NZ   TEST FOR 100MS SB REQUEST

ID:READ    SB:RQST
LHLD       100PNTR                  SET MEM PNTR TO CALL IN 100 TAB
MOV        E,M                      MOVE CALL ADDR(L) TO E
INX        H                        STEP MEM PNTR TO ADDR(H)
IF:        XBYT,M,EQ,X'FF'          IS PNTR AT END OF TABLE

LHLD       100:PNTR                 YES, SET MOVING PNTR BACK
SHLD       100PNTR                       TO BEGINNING OF TABLE

100MS TIMER SERVICE
                                    DECREMENTS TIMERS AND CALLS
                                    SUBROUTINE REQUESTED WHEN
                                    TIMER TIMES OUT
                                    USES 3 TABLES ON 3 CONSECUTIVE
                                    RAM PAGES -100:CNT W/TIMER
                                              -100:LS W/ADDR(L)
                                              -100:LS W/ADDR(H)
                                    ADDR IS FOR REQSTED SUBR

LXI        H,100:CNT                STARTING ADDR OF 100MS TIMERS
MVI        D,100:TMAX               D-REG SET TO QTY OF 100MS TMRS

CONDITIONAL HOLD OF 100MS TMRS

IF:        FBIT,STDBOPNO,T          IS STAND-BY RELAY OPEN

MVI        D,100:TMAX;              YES, HOLD SPECIFIED NUMBER
           -HOLDTMRS                     OF TIMERS

FNDIF

REPEAT                              LOOP TO DECR & SERVICE TIMEOUTS
IF:        VBYT,M,NZ                IS TIMER ACTIVE

DCR        M                        DECR TIMER
IF:        CC,Z,S                   HAS TIMER TIMED OUT
  PUSH     D                        SAVE # TIMERS TO SERVICE
  PUSH     H                        SAVE ADDR OF CURRENT TIMER
  INR      H                        STEP TO NEXT RAM PAGE
  MOV      E,M                      MOVE CALL ADDR(L) TO E
  INR      H                        STEP TO NEXT RAM PAGE
  MOV      D,M                      MOVE CALL ADDR(H) TO D
  CALL     DE:IND
  POP      H                        RECALL ADDR OF CURRENT TMR
  POP      D                        RECALL NUMBER OF TIMERS
                                         YET TO BE SERVICED
ENDIF
ENDIF
INX        H                        STEP TO NEXT TIMER ADDR
DCR        D                        DECR NUMBER OF 100MS TIMERS
UNTIL:     CC,Z,S                   HAVE ALL TIMERS BEEN SERVICED
                                    END 100MS TIMER SECTION
LXI        H,ADR(DATA,SB:RQST)      SET MEM PNTR TO SB BYTE
DI
MODBYT     M,AND,100:RQST           REMOVE 100MS REQUEST

ID:ALTR    SB:RQST
EI
ELSE:
  MOV      D,M                      NO, MOVE CALL ADDR(H) TO D
  INX      H                        STEP PNTR TO NEXT CALL
  SHLD     100PNTR                  SAVE FOR NEXT LOOP-2
  CALL     DE:IND
  LXI      H,ADR(DATA,SB:RQST)      SET MEM PNTR TO SB BYTE
ENDIF
ENDIF
UNTIL:     VBYT,M,Z                 MORE SB CALLS TO DO  (LOOP-2)

ID:READ    SB:RQST
HLT                                 COOL IT UNTIL INTERRUPT RESTART
UNTIL:     CC,Z,C                   WAS INTERRUPT RTC (LOOP-3)
DI                                  ONLY KIDDING BEFORE, BUT THIS
HLT                                 TIME REALLY STOP (ABORT)

SUBR TO SET CALL TABLE POINTERS
           CALLED BY EACH STATE PROLOG

POSITION SB:TABLE POINTER

SB:PNTRS   LDA    STATE:            WHAT STATE IS WANTED
           LXI    D,X'06'           LOAD D&E WITH SKIP NUMBER
           LXI    H,SB:TABLE-X'06'  H&L=6'<' TABLE ADDR
           REPEAT                   SKIP THREE WORDS
             DAD  D
             DCR  A                 DECR STATE LOOP COUNTER
           UNTIL: CC,S,S            IS POINTER AT CORRECT STATE

TRANSFER ADDRS TO VARIABLE SB POINTERS

LXI        D,10:CALLS               SET D&E TO FIRST OF SB PNTRS
MVI        B,2                      LOAD 10:CALLS
CALL       MV:WORDS                                & 20:PNTR
DCX        H                        ADJUST 'FROM' PNTR
DCX        H                                       BACK 1 WORD
MVI        B,2                      LOAD 20PNTR
CALL       MV:WORDS                                & 100:PNTR
```

```
382  05 001C6   2B       A              DCX       H                              ADJUST 'FROM' PNTR
383  05 001C7   2B       A              DCX       H                                                    BACK 1 WORD
384  05 001C8   CDCC01   N              CALL      MVIWORD                        LOAD 100PNTR
385                                     ID:ALTR   101CALLS,20:PNTR,20PNTR,;      DATA WORDS MODIFIED
386                                               100IPNTR,100PNTR               BY THIS SUBR
387  05 001CB   C9       A              RET
388                                *NAR
389                                *
390                                *    MVIWORD/MVIWORDS SUBROUTINES
391                                *
392                                *    SUBR TO TRANSFER WORDS (2BYTES) FROM MEMORY POINTED TO BY <H&L>
393                                *    TO MEMORY POINTED TO BY <D&E>. CALL MVIWORD FOR 1 TRANSFER,
394                                *    AND CALL MVIWORDS (WITH B-REG # WORDS TO TRANSFER) FOR
395                                *    MULTIPLE TRANSFERS. USES ALL BUT C-REG.
396                                *
397  05 001CC   0601     A    MVIWORD   MVI       B,1
398                                MVIWORDS REPEAT                                B= # WORDS TO BE MOVED
399  05 001CE   7E       A              MOV       A,M                            A= 1ST 'FROM' BYTE
400  05 001CF   12       A              STAX      D                              STORE IN 1ST 'TO' LOCATION
401  05 001D0   23       A              INX       H                              ADVANCE 'FROM'
402  05 001D1   13       A              INX       D                                                 AND 'TO' PNTRS
403  05 001D2   7E       A              MOV       A,M                            A= 2ND 'FROM' BYTE
404  05 001D3   12       A              STAX      D                              STORE IN 2ND 'TO' LOCATION
405  05 001D4   23       A              INX       H                              ADVANCE 'FROM'
406  05 001D5   13       A              INX       D                                                 AND 'TO' PNTRS
407  05 001D6   05       A              DCR       B                              DECRM # OF WORDS CNTR
408  05 001D7   C2CE01   N              UNTIL!    CC,Z,S                         LOOP UNTIL ALL WORDS TRANSFERRD
409  05 001DA   C9       A              RET
410
411                                *
412                                *    TABLE OF SR CALL POINTERS
413                                *    FOR EACH STATE
414  05 001DB   0906     N    SBITABLE  DW        COMP10
415  05 001DD   0A06     N              DW        COMP20
416  05 001DF   1206     N              DW        COMP100
417  05 001E1   8105     N              DW        TREP10
418  05 001E3   85C5     N              DW        TREP20
419  05 001E5   C305     N              DW        TREP100
420  05 001E7   4202     N              DW        NRDY10
421  05 001E9   4602     N              DW        NRDY20
422  05 001EB   52C2     N              DW        NRDY100
423  05 001ED   AF02     N              DW        RDY10
424  05 001EF   B302     N              DW        RDY20
425  05 001F1   BF02     N              DW        RDY100
426  05 001F3   A803     N              DW        PRNT10
427  05 001F5   B203     N              DW        PRNT20
428  05 001F7   C803     N              DW        PRNT100
429  05 001F9   1905     N              DW        RUNN10
430  05 001FB   1DD5     N              DW        RUNN20
431  05 001FD   2F05     N              DW        RUNN100
432
433                                *
434                                *    SUBR TO DO EPILOGS & PROLOGS LAST CALL IN EVERY 100MS TABLE
435                                *
436  05 001FF   2153FD   A    STATICHG  LXI       H,ADR(DATA,STATE1)             A= PRESENT STATE # IF UNCHANGED
437  05 00202   7E       A              MOV       A,M                            OR NEXT STATE IF CHANGED
438  05 00203   23       A              INX       H                              H&L= ADDR 'FORMER STATE' GLOBAL
439  05 00204   BE       A              IF!       XBYT,A,NE,M                    HAS THERE BEEN A STATE CHANGE
     05 00205   CA3602   N
440
441  05 00208   46       A              ID:READ   STATE!,!STATE!
442  05 00209   77       A              MOV       B,M                            YES, B= FORMER STATE
443                                               MOV       M,A                  UPDATE 'FORMER' TO 'PRESENT'
444  05 0020A   78       A              ID:ALTR   !STATE!
     05 0020B   111F02   N              CASE!     VBYT,B                         DO EPILOG FOR FORMER STATE
     05 0020E   FE06     A
     05 00210   C00000   N
445  05 00213   1806     N                        C,0       COMP:EPL             COMPONENT CONTROL STATE
446  05 00215   0B05     N                        C,1       TREP:EPL             TECH REP STATE
447  05 00217   7A02     N                        C,2       NRDY:EPL             NOT-READY STATE
448  05 00219   E302     N                        C,3       RDY:EPL              READY STATE
449  05 0021B   E603     N                        C,4       PRNT:EPL             PRINT STATE
450  05 0021D   4105     N                        C,5       RUNN:EPL             SYSTEM RUNNING, NOT PRINT STATE
451                                     ENDCASE
452  05 0021F   3A53FD   N              CASE!     VBYT,STATE!                    DO PROLOG FOR PRESENT STATE
     05 00222   113602   N
     05 00225   FE06     A
     05 00227   C00000   N
453  05 0022A   FF05     N                        C,0       COMP:PRL             COMPONENT CONTROL STATE
454  05 0022C   A505     N                        C,1       TREP:PRL             TECH REP STATE
455  05 0022E   3702     N                        C,2       NRDY:PRL             NOT-READY STATE
456  05 00230   A602     N                        C,3       RDY:PRL              READY STATE
457  05 00232   1603     N                        C,4       PRNT:PRL             PRINT STATE
458  05 00234   0B05     N                        C,5       RUNN:PRL             SYSTEM RUNNING, NOT PRINT STATE
459                                     ENDCASE
460                                     ENDIF
461  05 00236   C9       A              RET                                      RETURN TO 100 MSEC SYNC BKGND
462
463                                *NAR
464                                *
465                                *    N O T   R E A D Y   S T A T E
466                                *
467                                *    NOT READY STATE- EXECUTES AFTER INITIALIZE UNTIL ALL READY CONDITIONS
468                                *    ARE MET. THIS STATE CAN ALSO BE ENTERED FROM 'RUN NOT PRINT','READY'
469                                *    AND 'TECH REP'. CONTROL EXITS TO EITHER 'READY' OR 'TECH REP' STATES.
470
471                                *    PROLOG
472
473  05 00237   CDA901   N    NRDY:PRL  CALL      SB:PNTRS                       SYNC BKG PNTRS TO NEW STATE
474  05 0023A   CD0000   N              STIMR     INST@TMR,1000,NEXT@FLT         UPDATES INST FLT CODE IN STBY
     05 0023D   49       A
     05 0023E   64       A
     05 0023F   0000     N
475  05 00241   C9       A              RET
```

```
477                         *       CALLS FOR NOT READY 10 MS SYN BACKGROUND 479   05 00242  CD0000  N   NRDY10  CALL    ADHBCTRL
480   05 00245  C9      A           RET

482                         *       CALLS FOR NOT READY 20 MS SYN BACKGROUND 484   05 00246  0000    N   NRDY20  DW      NRDYBSWS
485   05 00248  0000    N           DW      MN@ELVPS
486   05 0024A  0000    N           DW      DSPL@CTL
487   05 0024C  0000    N           DW      LMP@CTRL
488   05 0024E  0000    N           DW      INSTRU
489   05 00250  FFFF    A           DW      X'FFFF'                 END OF TABLE

491                         *       CALLS FOR NOT READY 100 MS SYN BACKGROUND 493   05 00252  0000    N   NRDY100 DW      NRILKBCK
494   05 00254  0000    N           DW      RED@BGND
495   05 00256  0000    N           DW      OVL@DUMP
496   05 00258  0000    N           DW      RECAPFR
497   05 0025A  0000    N           DW      BIN@CHK         1
498   05 0025C  0000    N           DW      MINIPHS1        2
499   05 0025E  0000    N           DW      BIL@JHP@
500   05 00260  0000    N           DW      FUS@ROUT
501   05 00262  0000    N           DW      FLT@100         1
502   05 00264  0000    N           DW      FLT@CTFL        2
503   05 00266  0000    N           DW      FLT@CLRN        3
504   05 00268  0000    N           DW      PR@G2SJM
505   05 0026A  0000    N           DW      ?SD@STPY
506   05 0026C  0000    N           DW      XMP@STPY
507   05 0026E  0000    N           DW      JAM@RST
508   05 00270  0000    N           DW      KEY@CNTR
509   05 00272  0000    N           DW      TST@LP@
510   05 00274  8402    N           DW      NRDY:CHG                TEST IF OK TO
511   05 00276  FF01    N           DW      STATICHG                LEAVE NOT READY
512   05 00278  FFFF    A           DW      X'FFFF'                 END OF TABLE

514                         *       EPILOG 516   05 0027A  C0C000  N   NRDYIEPL C@BIT/S WAIT@                  INSURE WAIT OFF AT NRDY EXIT
      05 0027D  E9FE    A
517   05 0027F  AF      A           CFLG    STRT:P@T                DIS-ABLE TRANSFER TO 'PRINT'
      05 00280  325BF4  A
518   05 00283  C9      A           RET 520
521
522                         *       SUBR FOR 'NOT-READY' 100MS SYNC BKGND
523                         *       TESTS FOR CHANGE TO 'READY' OR 'TREP REP'

524   05 00284  CDCF05  N   NRDY:CHG CALL    TREP:CHG               TEST FOR STATE CHANGE TO !TREP
525   05 00287  7E      A           IF:     XBYT,H,ME,!TREP         DID IT CHANGE TO !TREP STATE
      05 00288  FE01    A
      05 0028A  CA9302  N
526                                 ID:READ STATE:
527   05 0028D  CD9402  N           CALL    RDYTEST:                TEST ALL 'READY' FLAGS
528   05 00290  CD0803  N           CALL    NRDY:RDY                MOVE TO EITHER INRDY OR IRDY
529                                 ENDIF
530   05 00293  C9      A           RET 532
533                         *       SUBR TO TEST ALL 'READY' FLAGS IN A LOOP
534
535   05 00294  2184F7  A   RDYTEST: LXI    H,RDYFLGS:               H&L= START ADDR OF READY FLAGS
536   05 00297  0609    A           MVI     B,RDYFNUM:               B= # OF READY FLAGS TO CHK
537                                 REPEAT
538   05 00299  7E      A           MOV     A,M                      A= <PRESENT READY FLAG>
539   05 0029A  07      A           RLC                              SET C IF FLAG SET (READY)
540   05 0029B  DAA002  N           IF:     CC,C,C                   IS PRESENT FLAG INDICATING RDY
541   05 0029E  0601    A           MVI     B,1                      NO, DON'T TEST ANY FURTHER
542                                 ENDIF
543   05 002A0  23      A           INX     H                        MOVE TO NEXT FLAG LOCATION
544   05 002A1  05      A           DCR     B                        DECRM LOOP CNTR (# READY FLAGS)
545   05 002A2  C29902  N           UNTIL:  CC,Z,S                   LOOP UNTIL ALL FLAGS CHKED
546                                 ID:READ LENS@RDY,ELV@RDY,FUS@RDY,: FLAGS READ
547                                         PR@G@RDY,ILCK@RDY,XMH@RDY,:
548                                         FLT@RDY,ADH@NH@V,SRT@RDY
549   05 002A5  C9      A           RET                             RETURN
551                         *NAR
552                         *
553                         *       R E A D Y    S T A T E
554                         *
555                         *       READY STATE- EXECUTES WHEN MACHINE IS READY TO GO INTO PRINT STATE.
556                         *       CONTROL CAN GO BACK TO 'NOT READY' OR GO TO 'TECH REP' IF REQUIRED.

558                         *       PROLOG 560   05 002A6  CD0000  N   RDY:PRL S@BIT/S READY@
      05 002A9  E701    A
561   05 002AB  CDA901  N           CALL    SB:PNTRS                SYNC BKG PNTRS TO NEW STATE
562   05 002AE  C9      A           RET

564                         *       CALLS FOR READY 10MS SYN BACKGROUND 566   05 002AF  CD0000  N   RDY10   CALL    ADH@CTRL
567   05 002B2  C9      A           RET

569                         *       CALLS FOR READY 20MS SYN BACKGROUND 571   05 002B3  0000    N   RDY20   DW      RDYBSWS
572   05 002B5  0000    N           DW      MN@ELVPS
573   05 002B7  0000    N           DW      DSPL@CTL
574   05 002B9  0000    N           DW      LMP@CTRL
575   05 002BB  0000    N           DW      INSTRU
576   05 002BD  FFFF    A           DW      X'FFFF'                 END OF TABLE
```

```
578                             *       CALLS FOR READY 100MS SYN BACKGROUND 580   05 002BF   0000   N   RDY100  DW      RINBCHK                         1
581   05 002C1   0000   N           DW      MINIPHS1                        2
582   05 002C3   0000   N           DW      BIL8JMPO
583   05 002C5   0000   N           DW      OVL8DUMP
584   05 002C7   0000   N           DW      RECAPER
585   05 002C9   0000   N           DW      FUS8ROUT
586   05 002CB   0000   N           DW      FLT8100                         1
587   05 002CD   0000   N           DW      FLT8CTRL                        2
588   05 002CF   0000   N           DW      NRILK8CK
589   05 002D1   0000   N           DW      RED8BGND
590   05 002D3   0000   N           DW      25D8STPY
591   05 002D5   00C0   N           DW      XMM8STPY
592   05 002D7   0000   N           DW      JAM8RST
593   05 002D9   0000   N           DW      KEY8CNTR
594   05 002DB   0000   N           DW      TST8LP4
595   05 002DD   E9C2   N           DW      RDY:CHG                         TEST IF OK TO
596   05 002DF   FFC1   N           DW      STAT:CHG                              LEAVE READY
597   05 002E1   FFFF   A           DW      X:FFFF:                         END OF TABLE

599                             *       EPILOG 601   05 002E3   C00000  N   RDY:EPL COBIT,S  READY:
      05 002E6   E7FE    A
602   05 002E8   C9      A           RET

604                             *       CHANGE OF STATE ROUTINES

606                             *
607                             *       SUBR FOR 'READY' 100MS SYNC BKGND
608                             *       TESTS FOR CHANGE TO 'NOT-READY' OR 'TECH REP'
609                             *
610   05 002E9   CDDF05  N   RDY:CHG CALL    TREP:CHG                        TEST FOR STATE CHANGE TO :TREP
611   05 002EC   7E      A           IF:     XBYT,M,NE,:TREP                 DID IT CHANGE TO :TREP STATE
      05 002ED   FE01    A
      05 002EF   CA0A03  N
612                                     ID:READ  STATE:
613   05 002F2   CD9402  N               CALL    RDYTEST:                   TEST ALL 'READY' FLAGS
614   05 002F5   CD0B03  N               CALL    NRDY:RDY                   MOVE TO EITHER :NRDY OR :RDY
615   05 002F8   3A58F4  A               IF:     FLG,STRT:PRT,T             IS START PRINT REQUESTED
      05 002FB   07      A
      05 002FC   D20A03  N
616   05 002FF   2153FD  A                       LXI     H,ADR(DATA,STATE:) SET MEM PNTR
617   05 00302   7E      A                       IF:     XBYT,M,EQ,:RDY     OK TO GO TO PRINT
      05 00303   FE03    A
      05 00305   C20A03  N
618                                             ID:READ  STATE:
619   05 00308   3604    A                       MVI     M,:PRNT            CHG TO PRT STATE
620                                             ID:ALTR  STATE:
621                                     ENDIF
622                                     ENDIF
623                                 ENDIF
624   05 0030A   C9      A           RET

626                             *
627                             *       SUBR TO USE INFO FROM :RDYTEST: AND EXECUTE THE PROPER CHANGE OF STATE
628                             *
629   05 0030B   2153FD  A   NRDY:RDY LXI     H,ADR(DATA,STATE:)             SET MEM PNTR
630   05 0030E   3603    A           MVI     M,:RDY                         ASSUME GOING TO 'READY' STATE
631                                 ID:ALTR  STATE:
632   05 00310   DA1503  N           IF:     CC,C,C                         ARE ALL 'READY' FLAGS SET
633   05 00313   3602    A           MVI     M,:NRDY                        NO, MOVE TO 'NOT-READY' STATE
634                                 ID:ALTR  STATE:
635                                 ENDIF
636   05 00315   C9      A           RET
638                             *NAR
639                             *
640                             *       P R I N T   S T A T E
641                             *
642                             *       PRINT STATE- EXECUTES WHILE MACHINE IS PRODUCING COPIES.
643                             *       ENTERED FROM 'READY' AND EXITS TO 'RUN NOT PRINT'.

645                             *       PROLOG 647   05 00316   2160FE  N   PRNT:PRL CLR:MEM  16,SHIFTREG                   CLEAR SHIFT REGISTER
      05 00319   0610    A
      05 0031B   CD0000  N
648   05 0031E   3E60    A           MVI     A,LADR(DATA,SHIFTREG)          FORCE SHIFT REG TO START AT
649   05 00320   3263FD  A           STA     ADR(DATA,SR8PTR:)              BEGINNING OF SHIFTREG TABLE
650                                 CLR:MEM  SD18DLY-TIME8DNI+1,:           CLEAR THE FOLLOWING FLAGS
651   05 00323   21A7F4  A                   ADR(FLG,TIME8DNI)
      05 00326   0609    A
      05 00328   CD0000  N
652                                     ID:CLR   TIME8DN:,IMED8DN:,:
653                                              CYCL8DN:,NORM8DN:,QWIK:OUT,:
654                                              IMGMADE:,SD18TIM8,SD18DLY
655   05 0032B   3E80    A           SFLG    910800NE                       ALLOW FIRST PITCH RESET
      05 0032D   326FF4  A
656   05 00330   AF      A           XRA     A
657   05 00331   3266FD  N           STA     CYCUPCT:                       :INIT CYCLE-UP CNTR TO 0
658   05 00334   3269FD  N           STA     SR8VALU:                       INIT 'NEW SR VALUE' TO 0
659   05 00337   325DFA  N           STA     PLL8INF8                       INIT PLL SHUTDOWN CONTROL TO 0
660   05 0033A   3268FD  N           STA     SMPL8CT:                       INIT SAMPLE COPY CNTR TO 0
661   05 0033D   3E03    A           MVI     A,3                            INIT 'NO IMAGE CNTR' TO 3
662   05 0033F   3267FD  N           STA     N8IMGCT:                       SHIFT REG SCHEDULER (INIT SR#0)
663   05 00342   CD0000  N           CALL    SRSK                           CALC SHIFTED IMAGE VALUES   (1)
664   05 00345   CD0000  N           CALL    TIM8MED                        SET 'OVER-RUN EVENT' TIMER  (2)
665   05 00348   CD0000  N           STIMR   935:TMR,810,RETURN:
      05 0034B   22      A
      05 0034C   51      A
      05 0034D   0000    N
666   05 0034F   CD0000  N           CALL    TBLD8PPT                       BUILD NEW PITCH TABLE       (3)
```

```
667  05 00352  CD0000  N         SBBIT,S  PRNT$RLY,PR$COOL              PRINT RELAY & COOLING FAN ON
     05 00355  02      A
     05 00356  EA08    A
     05 00358  F608    A
                                 CTIMR    PR$COOL                       CLEAR COOLING FAN TIMER
668  05 0035A  AF      A
     05 0035B  3232FA  N         CBBIT,S  NPF0$ON                       TURN OFF PF0 (INVERTED DRIVER)
669  05 0015E  CD0000  N
     05 00361  E47F    A         IFI      FLG,ADH$SELC,T
670  05 00363  3AB0F4  A
     05 00366  07      A
     05 00367  D27003  N                  CALL     ADH$MOTN
671  05 0036A  CD0000  N         ELSE:
672  05 0036D  C37503  N                  SFLG     ADH$WTEN
673  05 00370  3E80    A
     05 00372  32CCF4  A         ENDIF
674                              CALL     TRN$BGD
675  05 00375  CD0000  N         CALL     PAP$SIZE                      CHK PAPER WIDTH FOR FUSER   (1)
676  05 00378  CD0000  N         CALL     EDGE$FO                       CHK WHICH EDGE FADE OUT     (2)
677  05 0037B  CD0000  N         CALL     PAP$PPL3
678  05 0037E  CD0000  N         CALL     PRG$UP                        PROG INITIALIZATION SUBR
679  05 00381  CD0000  N         CALL     PRG$UP1
680  05 00384  CD0000  N         CALL     FDR$PRT                       CHECK FEEDER SELECTION
681  05 00387  CD0000  N         CALL     BLG$BKPT                      READ BILLING BREAK-POINTS
682  05 0038A  CD0000  N         CALL     DO$ELV                        CAUSE ELV TO EXECUTE
683  05 0038D  CD0000  N         IFI      FLG,SRT$SEL,T                 IS SORTER BEING USED
684  05 00390  3A54F4  A
     05 00393  07      A
     05 00394  D29F03  N                  CALL     SRT$INIT              INITIALIZE SORTER JAM DETECT
685  05 00397  CD0000  N                  MVI      A,MSK(NV$IT,NV$FJAM,)  SETS ALL 4 JAM CONDITIONS
686                                                NV$IMED,NV$LOW$J,NV$UP$J)
687  05 0039A  3E0F    A         ELSE:
688  05 0039C  C3A403  N                  RNVNIB   NV$JAM$N              READ SAVED PREVIOUS SRT JAMS
689  05 0039F  3AC9E2  A                  MODBYT   A,OR,MSK(NV$IT,)      & SET IMED ON K FOR JAM
690                                                NV$FJAH,NV$IMED)
691  05 003A2  F603    A         ENDIF
692                                       WNVNIB   NV$JAM$N              STORE IN CASE OF PWR ON
693  05 003A4  32C9E2  A         IO:ALTR  NV$FJAM,NV$IMED,NV$LOW$J,)    SEE ABOVE IFI/ELSE:
694                                                NV$UP$J
695
696  05 003A7  CDA901  N         CALL     SB:PNTRS                      SYNC BKG PNTRS TO NEW STATE
697  05 003AA  C9      A         RET

699                              * CALLS FOR PRINT 10 MS SYN BACKGROUND 701  05 003AB  CD0000  N PRNT10  CALL     ADH$CTRL
702  05 003AE  CDC004  N         CALL     PRT1IMD
703  05 003B1  C9      A         RET

705                              * CALLS FOR PRINT 20 MS SYN BACKGROUND 707  05 003B2  0000    N PRNT20  DW       PRT$SWS
708  05 003B4  0000    N         DW       TBN$DIS
709  05 003B6  0000    N         DW       PAP$TGL3
710  05 003B8  0000    N         DW       LMP$CTRL
711  05 003BA  0000    N         DW       FDR$BKFD
712  05 003BC  0000    N         DW       SRTERR
713  05 003BE  0000    N         DW       FLV$PRNT
714  05 003C0  0000    N         DW       S@S@JHDT
715  05 003C2  0000    N         DW       DSPL$CTL
716  05 003C4  0000    N         DW       INSTRU
717  05 003C6  FFFF    A         DW       X'FFFF'                       END OF TABLE

719                              * CALLS FOR PRINT 100 MS SYN BACKGROUND 721  05 003C8  0000    N PRNT100 DW       BILK$CK
722  05 003CA  0000    N         DW       2SD$RUN
723  05 003CC  0000    N         DW       LITE$OFF
724  05 003CE  0000    N         DW       XMH$PANT
725  05 003D0  0000    N         DW       FUS$RDUT
726  05 003D2  0000    N         DW       READY$CK
727  05 003D4  0000    N         DW       JAM$RST
728  05 003D6  0000    N         DW       MINIPH$B
729  05 003D8  4F06    N         DW       SMPL$CPY                      STUB IN US IMG
730  05 003DA  0000    N         DW       RXCYCLDN
731  05 003DC  0000    N         DW       KEY$CNTR
732  05 003DE  0000    N         DW       TST$LP4
733  05 003E0  2C04    N         DW       PRT:CHG                       TEST IF BK TO
734  05 003E2  FF01    N         DW       STAT:CHG                             LEAVE PRINT
735  05 003E4  FFFF    A         DW       X'FFFF'                       END OF TABLE

737                              * EPILOG 739  05 003E6  CD0000  N PRNT:EPL CALL    AX$EPTY                       (1)
740  05 003E9  CD0000  N         CALL     FDM$EPL3                      (2)
741  05 003EC  CD0000  N         CALL     FDA$EPL3                      (3)
742  05 003EF  CD0000  N         CALL     TRN$EPL3
743  05 003F2  CD0000  N         CALL     OVL$NRDY
744                              CBBIT,S  FUS$CRPL,FUS$LOAD,ILLM$SPL,)
745  05 003F5  CD0000  N                  FF$$11,EF$$12$5,SMPL$CPY,READY$
     05 003F8  07      A
     05 003F9  E6F7    A
     05 003FB  EDF0    A
     05 003FD  F2F7    A
     05 003FF  ECF7    A
     05 00401  EBF7    A
     05 00403  E2FE    A
     05 00405  E7FE    A
746  05 00407  CD0000  N         SBBIT,S  NPF0$ON                       TURN OFF PF0 (INVERTED DRIVER)
     05 0040A  E480    A
747  05 0040C  AF      A         CFLG     ELV$AUTO                      DISABLE AUTO-TRAY SWITCHING
     05 0040D  3222F4  A
748  05 00410  CD0000  N         CALL     PAP$EPL3
749  05 00413  CD1704  N         CALL     ABORT
750  05 00416  C9      A         RET
```

```
752
753                                    *
754                                    *      SUBROUTINE
                                       *
756   05 00417   F3       A    ABORT   DI                                  TURN OFF INTERRUPT SYSTEM
757   05 00418   AF       A            CFLG      TBLD#FIN                  SIGNAL NEW PITCH TABLE REQ'D
      05 00419   3250F4   A
758   05 0041C   211907   N            LXI       H,EV#STBY!                ADDR OF STBY EVENT TABLE
759   05 0041F   2264FD   N            SHLD      EV#PTR!                   SAVE FOR MACH CLK ROUTINE
760   05 00422   CD0000   N            COBIT,S   BTR$LOAD,PRNT$RLY         UN-LOAD BTR & DROP PRINT RELAY
      05 00425   02       A
      05 00426   E17F     A
      05 00428   EAF7     A
761   05 0042A   FB       A            EI
762   05 0042B   C9       A            RET
764   05 0042C   3A66FD   N    PRT!CHG IF!       XBYT,CYCUPCT!,EQ,2        CHECK FOR PROLOG 2 OR CYCLE OUT
      05 0042F   FEC2     A
      05 00431   C23C04   N
765   05 00434   3E8C     A                SFLG     PRT#PRO2               YES, SET 'PRINT PROLOG 2' FLAG
      05 00436   3271F4   A
766   05 00439   C37004   N            ORIF!     XBYT,A,EQ,3               NO, IS CYCLE UP CNTR=3
      05 0043C   FEC3     A
      05 0043E   C27004   N
767   05 00441   3A71F4   A            ANDIF!    FLG,PRT#PRO2,T            YES, AND IS PROLOG 2 FLAG SET
      05 00444   07       A
      05 00445   D27004   N
768   05 00448   AF       A                CFLG     PRT#PRO2               YES, DO PROLOG 2 AND CLR FLAG
      05 00449   3271F4   A
769
770                                    *
771                                    *      PRINT STATE BACKGROUND- PROLOG 2
                                       *
772   05 0044C   CD0000   N                CALL      PAP#PRL2
773   05 0044F   CD0000   N                CALL      PROG#UP2              RETN XPORT OFF IF NOT SIDE 1
774   05 00452   3AADF4   A                IF!       FLG,IMGMADE!,T        HAS 1ST IMAGE BEEN MADE
      05 00455   07       A
      05 00456   D25C04   N
775   05 00459   CD0000   N                  CALL      PROG#UP             YES, CALL PROG INITIALIZATION
776                                        ENDIF
777   05 0045C   3A57FA   N                IF!       VBYT,MINIBYTE,NZ      IS MINI-PHYSICAL ACTIVE
      05 0045F   A7       A
      05 00460   CA7004   N
778   05 00463   AF       A                  CFLG      DSPL#1ST            YES, ENABLE DISPLAY UPDATE
      05 00464   329AF4   A
779   05 00467   3C       A                  INR       A                   DISPLAY QUANTITY
780   05 00468   3250FA   N                  STA       DSPL#ST1             COMPLETE
781   05 0046B   3EC6     A                  MVI       A,6                 SET DOCUMENT TOTAL TO
782   05 0046D   326FFA   N                  STA       DOC#TOTL            6 FOR ADH DOCUMENT, CHECK
783                                        ENDIF
784                                    ENDIF
786                                    *      END PROLOG2
788                                    *
789                                    *      BUILD FLAG BYTE
790                                    *
791   05 00470   0608     A            MVI       B,8                       NUMBER OF FLAGS REQ'D
792   05 00472   AF       A            XRA       A                         CLEAR A-REG
793   05 00473   57       A            MOV       D,A                       CLEAR D-REG
794   05 00474   21A9F4   A            LXI       H,ADR(FLG,IMED#DN!)       STARTING ADDR OF PRT!CHG FLAGS
795                                    REPEAT
796   05 00477   7E       A              MOV       A,M                     LOAD A W/CONTENTS OF FLAG ADDR
797   05 00478   07       A              RLC                               ROTATE FLAG(D7) INTO CARRY
798   05 00479   7A       A              MOV       A,D                     LOAD A W/FLAGS BILT INTO BYTE
799   05 0047A   17       A              RAL                               PUT FLAG IN D0 & SHIFT LEFT
800   05 0047B   57       A              MOV       D,A                     SAVE RESULT IN D-REG
801   05 0047C   23       A              INX       H                       STEP TO NEXT FLAG
802   05 0047D   05       A              DCR       B                       DECR NUMBER OF FLAGS REQ'D
803   05 0047E   C27704   N            UNTIL!    CC,Z,S                    LOOP UNTIL ALL FLAGS IN BYTE
804                                    !DIREAD   !MED#DN!,CYCL#DN!,NORM#DN!,!    FLAGS READ
805                                              QWIK!OUT,IMGMADE!,SD1#TIMO,!
806                                              SD1#DLY,ADH#SELC
807
808                                    *      TEST FOR STATE CHANGE TO IRUNN
809                                    *
810   05 00481   3A67FD   N            LDA       NOIMGCT!                  MOV CURRENT NO IMAGE COUNTER
811   05 00484   5F       A            MOV       E,A                       TO THE E-REG
812   05 00485   060E     A            MVI       B,14                      LOOP CNTR FOR STATE CHG TESTS
813   05 00487   21E104   N            LXI       H,CYC!OUT                 TABLE ADDR OF PRT!CHG TESTS
814                                    REPEAT
815   05 0048A   7A       A              MOV       A,D                     MOV FLAG BYTE TO THE A-REG
816   05 0048B   A6       A              MODBYT    A,AND,M                 MASK FOR DESIRED FLAGS
817   05 0048C   23       A              INX       H                       STEP TO STATUS TEST
818   05 0048D   AE       A              MODBYT    A,XOR,M                 TEST FLAG STATUS
819   05 0048E   C29F04   N              IF!       CC,Z,S                  DID TEST PASS
820   05 00491   23       A                INX       H                     YES, STEP TO NOIMGCT! TEST
821   05 00492   7B       A                IF!       XBYT,E,GE,M           IS NOIMGCT! AT CORRECT VALUE
      05 00493   BE       A
      05 00494   DA9E04   N
822   05 00497   3E05     A                  MVI       A,IRUNN             YES, CHANGE STATE
823   05 00499   3253FD   N                  STA       STATE!              TO RUN NOT PRINT
824   05 0049C   0601     A                  MVI       B,1                 FORCE END OF TESTS (EARLY OUT)
825                                        ENDIF
826   05 0049E   2B       A                DCX       H                     ADJ PNTR BACK TO NO IMG TEST
827                                      ENDIF
828   05 0049F   23       A              INX       H                       STEP OVER NO IMG TEST
829   05 004A0   23       A              INX       H                       STEP TO MASK FOR NEXT TEST
830   05 004A1   05       A              DCR       B                       DECR LOOP COUNTER
831   05 004A2   C28A04   N            UNTIL!    CC,Z,S                    ALL TESTS COMPLETE OR STATE CHG
832                                    *
833   05 004A5   7A       A            MOV       A,D                       MOV FLAG BYTE TO A-REG
834   05 004A6   E662     A            MODBYT    A,AND,D6105101            MASK AND TEST FOR FLAGS TRUE
835                                    !DIREAD   NORM#DN!,CYCL#DN!,SD1#DLY FROM ABOVE BYTE BUILD
```

```
836  05 004A8  CAFF04   N         IF1    CC,Z,C                    ARE ANY FLAGS TRUE
837  05 004AB  2166FD   A                LXI    H,ADR(DATA,CYCUPCT1) PREPARE TO TEST OR MODIFY
838  05 004AE  7E       A                IF1    XBYT,M,0F,3          HAS PROG PUSHED IT TO 0
     05 004AF  FE03     A
     05 004B1  DAB604   N
839                                      ID:READ   CYCUPCT1
840  05 004B4  3602     A                MVI    M,2                  NO, FORCE CYCLE-UP MODE AGAIN
841                                      ID:ALTR   CYCUPCT1
842                                      ENDIF
843  05 004B6  CD0000   N                COBIT,S   ILLM*SPL          ILLM SPL OFF DURING DEAD CYCLE
     05 004B9  F2F7     A
844  05 004BB  AF       A                CFLG   SMPL*FLG             CANCEL SAMPLE COPY SEQUENCE
     05 004BC  324CF4   A
845                                      ENDIF
846  05 004BF  C9       A                RET

848                              PRT11MD IF1    FLGS,IMEDDDNI,AND,;  IS IMEDIATE DOWN REQUESTED
849  05 004C0  3AA9F4   A                       TBLDSF1N,T           AND HAS PROB BEEN DETECTED
     05 004C3  2150F4   A
     05 004C6  A6       A
     05 004C7  F20004   N
850  05 004CA  CD1704   N                CALL   AB*RT
851  05 004CD  C3E004   N                BRIF1  FLG,TIMFDONI,T       IF TIMED DWN RFQ'D DROP OUT
     05 004D0  3AA7F4   A
     05 004D3  07       A
     05 004D4  D2F004   N
852  05 004D7  21E1FF   A                COBIT  BTP*LOAD             BIAS TRANS ROLL (ASAP)
     05 004DA  3E7F     A
     05 004CC  F3       A
     05 004DD  46       A
     05 004DE  77       A
     05 004DF  F8       A
853                                      ENDIF
854  05 004E0  C9       A                RET 856
857                                                                  D7 6 5 4 3 2 1 0  (X=DON'T CARE)
858
859                                      TABLE OF FLAG STATUS TESTS  I C N Q I S S A   N C
860                                      AND NO IMAGE COUNTER VALUES M Y Q W M D O D   0 O
861                                      USED TO DETERMINE IF STATE  E C R I Q 1 1 H   U   T N
862                                      SHOULD CHANGE FROM PRINT TO D L M K M 8 8 8   I N E U
863                                      RUN NOT PRINT               8 8 8 I A T D S   M T S M
864                                                                  D D D B D I L E   A E T B
865                                                                  N N N U E M Y L   G R   E
866                                                                  I I I T I 8   C   E     R
867
868  05 004E1  48   A   CYC18UT  DB   D6|D3                          X 1 X X 0 X X X   00    1
869  05 004E2  40   A            DB   D6
870  05 004E3  00   A            DB   0
871  05 004E4  5C   A            DB   D6|D4|D3|D2                    X 1 X 0 1 1 X X   16    2
872  05 004E5  4C   A            DB   D6|D3|D2
873  05 004E6  10   A            DB   16
874  05 004E7  5C   A            DB   D6|D4|D3|D2                    X 1 X 0 1 0 X X   11    3
875  05 004E8  48   A            DB   D6|D3
876  05 004E9  0B   A            DB   11
877  05 004EA  68   A            DB   D6|D5|D3                       X 0 1 X 0 X X X   00    4
878  05 004EB  20   A            DB   D5
879  05 004EC  00   A            DB   0
880  05 004ED  75   A            DB   D6|D5|D4|D2|D0                 X 0 0 0 X 1 X 0   36    5
881  05 004EE  04   A            DB   D2
882  05 004EF  24   A            DB   36
883  05 004F0  75   A            DB   D6|D5|D4|D2|D0                 X 0 0 0 X 1 X 1   20    6
884  05 004F1  05   A            DB   D2|D0
885  05 004F2  14   A            DB   20
886  05 004F3  7D   A            DB   D6|D5|D4|D3|D2|D0              X 0 1 0 1 1 X 0   36    7
887  05 004F4  2C   A            DB   D5|D3|D2
888  05 004F5  24   A            DB   36
889  05 004F6  7D   A            DB   D6|D5|D4|D3|D2|D0              X 0 1 0 1 1 X 1   20    8
890  05 004F7  2D   A            DB   D5|D3|D2|D0
891  05 004F8  14   A            DB   20
892  05 004F9  75   A            DB   D6|D5|D4|D2|D0                 X 0 0 0 X 0 X 0   21    9
893  05 004FA  00   A            DB   0
894  05 004FB  15   A            DB   21
895  05 004FC  7D   A            DB   D6|D5|D4|D3|D2|D0              X 0 1 0 1 0 X 0   21   10
896  05 004FD  28   A            DB   D5|D3
897  05 004FE  15   A            DB   21
898  05 004FF  75   A            DB   D6|D5|D4|D2|D0                 X 0 0 0 X 0 X 1   13   11
899  05 00500  01   A            DB   D0
900  05 00501  0D   A            DB   13
901  05 00502  7D   A            DB   D6|D5|D4|D3|D2|D0              X 0 1 0 1 0 X 1   13   12
902  05 00503  29   A            DB   D5|D3|D0
903  05 00504  0D   A            DB   13
904  05 00505  10   A            DB   D4                             X X X 1 X X X X   11   13
905  05 00506  10   A            DB   D4
906  05 00507  0B   A            DB   11
907  05 00508  80   A            DB   D7                             1 X X X X X X X   00   14
908  05 00509  A0   A            DB   D7
909  05 0050A  00   A            DB   0

912                              *NAR
913                              *
914                              *     R U N    N O T    P R I N T    S T A T E
915                              *
916                              *     RUN NOT PRINT- EXECUTES WHILE MACHINE IS COMPLETING A COPY RUN.
917                              *     ENTERED FROM 'PRINT' AND EXITS TO 'NOT READY'.

919                              *     PROLOG 921  05 0050B  CD0000  N  RUNN:PRL CALL  DO*ELV                      CAUSE ELV TO EXECUTE
922  05 0050E  CD0000  N           STIMR RUNN1TMR,2500,RUNN*CHG      STAY IN RUNN 2.5 SEC
```

```
                                                                      4,122,996
                                    43                                                               44
        05 00511    2F      A
        05 00512    FA      A
        05 00513    7505    N
923     05 00515    C0A901  N              CALL    SB:PNTRS                SYNC BKG PNTRS TO NEW STATE
924     05 00518    C9      A              RET

926                                    •   CALLS FOR RUN NOT PRINT 10 MS SYN BACKGROUND 928     05 00519    CD0000  N    RUNN10    CALL    ADH&CTRL
929     05 0051C    C9      A              RET

931                                    •   CALLS FOR RUN NOT PRINT 20 MS SYN BACKGROUND 933     05 0051D    0000    N    RUNN20    DW      RUNN&SWS
934     05 0051F    0000    N              DW      SORTER&
935     05 00521    0000    N              DW      S&S&JMOT
936     05 00523    0000    N              DW      FLV&PRNT
937     05 00525    0000    N              DW      LMP&CTRL
938     05 00527    0000    N              DW      PAP&TGL&
939     05 00529    0000    N              DW      DSPL&CTL
940     05 0052B    0000    N              DW      INSTRU
941     05 0052D    FFFF    A              DW      X'FFFF'                 END OF TABLE

943                                    •   CALLS FOR RUN NOT PRINT 100 MS SYN BACKGROUND 945     05 0052F    0000    N    RUNN100   DW      JAM&RST
946     05 00531    0000    N              DW      RILK&CK
947     05 00533    0000    N              DW      FUS&RDUT
948     05 00535    0000    N              DW      PSD&RUN
949     05 00537    0000    N              DW      XMM&PRNT
950     05 00539    0000    N              DW      LITE&OFF
951     05 0053B    0000    N              DW      TST&LP&
952     05 0053D    FF01    N              DW      STAT:CHG                TEST IF OK TO LEAVE RUN NOT PRT
953     05 0053F    FFFF    A              DW      X'FFFF'                 END OF TABLE 955     05 00541    CD0000  N    RUNN:EPL  CALL    DEL&CK                  CALC COPIES DELIVERED
956     05 00544    CD0000  N              CALL    PAP&EPL&                'RUNNPRT' PAPER PATH MOP UP SUB
957     05 00547    CD0000  N              CALL    MOT&OFF                 TURN OFF SORTER MOTORS
958     05 0054A    CD0000  N              CALL    DO&FLV                  CAUSE FLV TO EXECUTE
959     05 0054D    AF      A              CFLG    AXFD&FLT                RESET FOR USE DURING NEXT RUN
        05 0054E    323FF&  A
960     05 00551    2123FC  A              CFBIT,P TF&XMM&                 STOP BLINKING OF XMM 'OTHER'
        05 00554    3EFE    A
        05 00556    A6      A
        05 00557    77      A
961     05 00558    CD0000  N              COBIT,S SOS&SMPL
        05 0055B    ECFD    A
962     05 0055D    CD7805  N              CALL    NV&JAM
963     05 00560    CD0000  N              CALL    RCP&STRE                STORE RECAP DATA IN RAM
964     05 00563    CD0000  N              CALL    ADH&M&TF
965     05 00566    3E08    A              MVI     A,8                     SET COUNTER FOR 7 TIMEOUTS
966     05 00568    3285FA  N              STA     COOLCNT
967     05 0056B    CD0000  N              CALL    PR&FAN                  (1)
968     05 0056E    CD0000  N              CALL    FLT&EPL&                (2) LOG HISTORY DATA FOR RUN
969     05 00571    CD0000  N              CALL    HIST&FLE                (3)
970     05 00574    C9      A              RET 972     05 00575    2153FD  N    RUNN&CHG  LXI     H,STATE1                SET H&L TO ADDR OF STATE1
973     05 00578    3602    A              MVI     H,INRDY                 CHANGE STATE1 TO NOT READY
974                                         IDIALTR STATE1
975     05 0057A    C9      A              RET 977     05 0057B    3A66F4  A    NV&JAM    RFLG    UP&JAM                  LOAD A WITH SRT UPPER JAM FLAG
        05 0057E    07      A                                              & SAVE IT IN THE CARRY BIT
978                                    •                                   LOAD A WITH SRT LOWER JAM FLAG
979     05 0057F    3A36F4  A              LDAFLG  LOW&JAM                 & MOVE CARRY &
980     05 00582    17      A              RAL                             LOW&JAM INTO THEIR POSITIONS
981     05 00583    17      A              RAL
982     05 00584    07      A              RLC
983     05 00585    07      A              RLC
984                                         MODBYT  A,AND,MSK(NV&IT),      MASK FOR DESIRED BITS
                                                    NV&LOW&J,NV&UP&J)
985     05 00586    E60C    A                                              & SAVE IT IN THE B-REG
986     05 00588    47      A              MOV     B,A                     WAS THERE AN IMED&ON CONDITION
987     05 00589    3AA9F4  A              IF:     FLG,IMED&ON1,T
        05 0058C    07      A
        05 0058D    D29605  N                      MOV     A,P             YES,RESTORE A-REG
988     05 00590    78      A                      MODBYT  A,OR,MSK(NV&IT,NV&FJAM,  & SET NV JAM BITS
989                                                         NV&IMED)
990     05 00591    F603    A              ELSE:
991     05 00593    C3A105  N                      IF:     FBITS,FOR&AJAM,OR,FOR&MJAM,T IS EITHER JAM CONDITION TRUE
992     05 00596    3A3CF0  A
        05 00599    E60C    A
        05 0059B    CA9F05  N
                                                            STC                     YES,SET CARRY
993     05 0059E    37      A              ENDIF
994                                                 RAL                             ROTATE INTO D0
995     05 0059F    17      A                      MODBYT  A,OR,B                   'OR' IN SRT JAM BITS
996     05 005A0    B0      A              ENDIF
997                                        WNVNIB  NV&JAM&N
998     05 005A1    32C9E2  A              IDIALTR NV&FJAM,NV&IMED,NV&LOW&J,NV&UP&J
999                                         RET                                     RETURN TO STATE CHECKER
1000    05 005A4    C9      A
1002                                   •NAR
1003                                    •
1004                                    •   T E C H   R E P   S T A T E
1005                                    •
1006                                    •   THE TECH REP STATE IS ENTERED WHEN THE SERVICE KEY IS ON IN
1007                                    •   'NOT READY' & 'READY' STATES. THIS ALLOWS THE TECH REP TO PERFORM SUCH
1008                                    •   TASKS AS ACCESS NON-VOLATILE MEMORY & COMPONENT CONTROL.

1010                                    •
1011                                    •   PROLOG
1012                                    •
1013    05 005A5    CD0000  N    TREP:PRL  COBIT,S WAIT&                   INSURE WAIT OFF AT TREP ENTRANC
        05 005A8    E9FE    A
```

```
1014   05 005AA   CD0000   N            CALL      DGN@PRL              DIAGNOSTIC PROLOG
1015   05 005AD   CDA901   N            CALL      SB:PNTRS             SYNC BKG PNTRS. TO NEW STATE
1016   05 005B0   C9       A            RET

1019                                *    CALLS FOR TECH REP 10MS SYN BACKGROUND 1021   05 005B1   CD0000   N   TREP10   CALL      ADH@CTRL
1022   05 005B4   C9       A            RET

1024                                *    CALLS FOR TECH REP 20MS SYN BACKGROUND 1026   05 005B5   0000     N   TREP20   DW        TREP@SWS
1027   05 005B7   0000     N            DW        MN@ELVRS
1028   05 005B9   0000     N            DW        LMP@CTPL
1029   05 005BB   0000     N            DW        DSPL@CTL
1030   05 005BD   0000     N            DW        DGN@BKG
1031   05 005BF   0000     N            DW        INSTRU
1032   05 005C1   FFFF     A            DW        X'FFFF'              END OF TABLE

1034                                *    CALLS FOR TECH REP 100MS SYN BACKGROUND 1036   05 005C3   0000     N   TREP100  DW        NRILK@CK
1037   05 005C5   0000     N            DW        PSD@STPY
1038   05 005C7   0000     N            DW        XMH@STPY
1039   05 005C9   0000     N            DW        RED@BGND
1040   05 005CB   0000     N            DW        RIN@CHK
1041   05 005CD   0000     N            DW        JAM@RST
1042   05 005CF   0000     N            DW        DVL@DUMP
1043   05 005D1   0000     N            DW        FUS@ROUT
1044   05 005D3   0000     N            DW        TST@LP4
1045   05 005D5   DF05     N            DW        TREP1CHG             TEST IF OK TO
1046   05 005D7   FF01     N            DW        STAT1CHG                           LEAVE TREP REP
1047   05 005D9   FFFF     A            DW        X'FFFF'              END OF TABLE

1049                                *
1050                                *    EPILOG   (TECH REP STATE)
1051                                *
1052   05 005DB   CD0000   N   TREP1EPL CALL      DGN@EPL              DIAGNOSTIC EPILOG
1053   05 005DE   C9       A            RET

1055                                *    CHANGE OF STATE CHECK 1057   05 005DF   2153FD   A   TREP1CHG LXI       H,ADR(DATA,STATE1)   PREPARE FOR POSSIBLE STATE CHG
1058   05 005E2   7E       A            IF:       XBYT,M,NE,:COMP      DO NOT CHG STATE IF IN COMP
       05 005E3   FE00     A
       05 005E5   CAFE05   N
1059   05 005E8   3A49F4   A              IF       FLG,SER@ACT,T       IF SERVICE KEY IS ON AND IF
       05 005EB   07       A
       05 005EC   D2FC05   N
1060   05 005EF   3A20FC   A              ANDIF1   FBIT,DGN@PRT@,F     IN DIAG PRINT PROGRAM
       05 005F2   E6C2     A
       05 005F4   C2FC05   N
1061   05 005F7   3601     A                MVI      M,1TREP           CHG TO TREP STATE
1062   05 005F9   C3FE05   N              ELSE1                        IF KEY IS TURNED OFF
1063   05 005FC   36C2     A                MVI      M,1NRDY           CHG TO NOT READY STATE
1064                                       ENDIF
1065                                       ID1ALTR   STATE1
1066                                     ENDIF
1067   05 005FE   C9       A            RET
```

TABLE II

```
96                                  *    FIXED PITCH EVENT TABLE
97                                  *
98                                  *    EVENTS MUST BE IN SEQUENTIAL ORDER STARTING
99                                  *    WITH THE EVENT CLOSES TO PITCH RESET FIRST
100                                 *
101                                 *    THERE CAN BE NO MORE THAN 256 COUNTS BETWEEN EVENTS
102                                 *
103                                 *    FORMAT OF EVENTS FOR EVENT TABLE
104                                 *
105                                 *    EVENT     X,Y,Z
106                                 *    WHERE:
107                                 *    X = ABSOLUTE COUNTS FROM RESET
108                                 *    Y = SHIFT REGISTER NEEDED IN EVENT
109                                 *    Z = EVENT NAME
110                                 *
111                                 *
112                                 *    PITCH EVENTS
113                                 *
114                                      TABLE
115    05 0001E   0200    A              EVENT     2,3,TRN2CURR
       05 00020   03      A
       05 00021   0000    N
116    05 00023   0300    A              EVENT     3,2,ADC@ACT
       05 00025   02      A
       05 00026   0000    N
117    05 00028   0400    A              EVENT     4,3,FDR5AFLT
       05 0002A   03      A
       05 0002B   0000    N
118    05 0002D   0700    A              EVENT     7,0,SPLYS@RN
       05 0002F   00      A
       05 00030   0000    N
119    05 00032   0800    A              EVENT     8,2,FDR1AXFD
       05 00034   02      A
```

| | | | | | | |
|---|---|---|---|---|---|---|
| | 05 00035 | 0000 | N | | | |
| 120 | 05 00037 | 0A00 | A | EVENT | 10,3,FUS0LOAD | |
| | 05 00039 | 03 | A | | | |
| | 05 0003A | 0000 | N | | | |
| 121 | 05 0003C | 3000 | A | EVENT | 48,8,DECG0INV | DECISION GATE FOR INVTO COPIES |
| | 05 0003E | 08 | A | | | |
| | 05 0003F | 0000 | N | | | |
| 122 | 05 00041 | 3600 | A | EVENT | 54,5,FUS0NTLD | FUSER LOADED TEST |
| | 05 00043 | 05 | A | | | |
| | 05 00044 | 0000 | N | | | |
| 123 | 05 00046 | 5500 | A | EVENT | 85,3,FDR6MFLT | |
| | 05 00048 | 03 | A | | | |
| | 05 00049 | 0000 | N | | | |
| 124 | 05 0004B | 5900 | A | EVENT | 89,2,FDR2MNFD | |
| | 05 0004D | 02 | A | | | |
| | 05 0004E | 0000 | N | | | |
| 125 | 05 00050 | 5D00 | A | EVENT | 93,8,JAM60NON | PAPER PATH JAM SW PITCH EVENT |
| | 05 00052 | 08 | A | | | |
| | 05 00053 | 0000 | N | | | |
| 126 | 05 00055 | 7600 | A | EVENT | 118,9,JAM50INV | PAPER PATH JAM SW PITCH EVENT |
| | 05 00057 | 09 | A | | | |
| | 05 00058 | 0000 | N | | | |
| 127 | 05 0005A | 7800 | A | EVENT | 120,0,FSH0OFF | |
| | 05 0005C | 00 | A | | | |
| | 05 0005D | 0000 | N | | | |
| 128 | 05 0005F | 8700 | A | EVENT | 135,0,PROG0HST | PROG HISTORY FILE UPDATE |
| | 05 00061 | 00 | A | | | |
| | 05 00062 | 0000 | N | | | |
| 129 | 05 00064 | 8F00 | A | EVENT | 143,6,JAM4@CHK | PAPER PATH JAM SW PITCH EVENT |
| | 05 00066 | 06 | A | | | |
| | 05 00067 | 0000 | N | | | |
| 130 | 05 00069 | AA00 | A | EVENT | 170,10,RET2@CHK | PAPER PATH JAM SW PITCH EVENT |
| | 05 0006B | 0A | A | | | |
| | 05 0006C | 0000 | N | | | |
| 131 | 05 0006E | CF00 | A | EVENT | 207,3,S0S0CLN | |
| | 05 00070 | 03 | A | | | |
| | 05 00071 | 0000 | N | | | |
| 132 | 05 00073 | D100 | A | EVENT | 209,2,TRN5CURR | |
| | 05 00075 | 02 | A | | | |
| | 05 00076 | 0000 | N | | | |
| 133 | 05 00078 | E300 | A | EVENT | 227,5,JAM3@CHK | PAPER PATH JAM SW PITCH EVENT |
| | 05 0007A | 05 | A | | | |
| | 05 0007B | 0000 | N | | | |
| 134 | 05 0007D | 0901 | A | EVENT | 265,2,FDR3/EDG | ENABLE AUX FDR WT SENSOR |
| | 05 0007F | 02 | A | | | |
| | 05 00080 | 0000 | N | | | |
| 135 | 05 00082 | 0B01 | A | EVENT | 267,4,JAM2@CHK | PAPER PATH JAM SW PITCH EVENT |
| | 05 00084 | 04 | A | | | |
| | 05 00085 | 0000 | N | | | |
| 136 | 05 00087 | 0E01 | A | EVENT | 270,8,RET1@CHK | PAPER PATH JAM SW PITCH EVENT |
| | 05 00089 | 08 | A | | | |
| | 05 0008A | 0000 | N | | | |
| 137 | 05 0008C | 6901 | A | EVENT | 361,3,TRN3DTCK | |
| | 05 0008E | 03 | A | | | |
| | 05 0008F | 0000 | N | | | |
| 138 | 05 00091 | 6C01 | A | EVENT | 364,2,FDR4MEDG | ENABLE MAIN WT SENSOR |
| | 05 00093 | 02 | A | | | |
| | 05 00094 | 0000 | N | | | |
| 139 | 05 00096 | B901 | A | EVENT | 441,9,JAM60INV | PAPER PATH JAM SW PITCH EVENT |
| | 05 00098 | 09 | A | | | |
| | 05 00099 | 0000 | N | | | |
| 140 | 05 0009B | C201 | A | EVENT | 450,4,FUS0UNLD | |
| | 05 0009D | 04 | A | | | |
| | 05 0009E | 0000 | N | | | |
| 141 | 05 000A0 | C301 | A | EVENT | 451,2,TRN1ROLL | |
| | 05 000A2 | 02 | A | | | |
| | 05 000A3 | 0000 | N | | | |
| 142 | 05 000A5 | F401 | A | EVENT | 500,0,DPM0SMPL | |
| | 05 000A7 | 00 | A | | | |
| | 05 000A8 | 0000 | N | | | |
| 143 | 05 000AA | 0E02 | A | EVENT | 526,3,TRN4DTCK | |
| | 05 000AC | 03 | A | | | |
| | 05 000AD | 0000 | N | | | |
| 144 | 05 000AF | 1B02 | A | EVENT | 539,0,DVLV0OFF | TURN OFF VAR DFNS DEVELOPERS |
| | 05 000B1 | 00 | A | | | |
| | 05 000B2 | 0000 | N | | | |
| 145 | 05 000B4 | 5802 | A | EVENT | 600,0,PIL0PLOP | TEST FOR PLATEN OPEN (BLG) |
| | 05 000B6 | 00 | A | | | |
| | 05 000B7 | 0000 | N | | | |
| 146 | 05 000B9 | 7602 | A | EVENT | 630,5,INVTRCTL | INVTR GATE & RETURN CONTROL |
| | 05 000BB | 05 | A | | | |
| | 05 000BC | 0000 | N | | | |
| 147 | 05 000BE | 8A02 | A | EVENT | 650,6,DECG0NON | DECISION GATE FOR NON-INVTO |
| | 05 000C0 | 06 | A | | | |
| | 05 000C1 | 0000 | N | | | |
| 148 | 05 000C3 | 9A02 | A | EVENT | 666,0,JAM0DLY | |
| | 05 000C5 | 00 | A | | | |
| | 05 000C6 | 0000 | N | | | |
| 149 | 05 000C8 | BC02 | A | EVENT | 700,7,JAM50NON | PAPER PATH JAM SW PITCH EVENT |
| | 05 000CA | 07 | A | | | |
| | 05 000CB | 0000 | N | | | |
| 150 | 05 000CD | 2003 | A | EVENT | 800,0,PROGMODE | |
| | 05 000CF | 00 | A | | | |
| | 05 000D0 | 0000 | N | | | |
| 151 | 05 000D2 | 2203 | A | EVENT | 802,0,FSH0ENB | |
| | 05 000D4 | 00 | A | | | |
| | 05 000D5 | 0000 | N | | | |
| 152 | 05 000D7 | 5003 | A | EVENT | 848,0,DVB0VAR | TURN ON VARIABLE-BIAS DEVELOPER |
| | 05 000D9 | 00 | A | | | |
| | 05 000DA | 0000 | N | | | |
| 153 | 05 000DC | 5203 | A | EVENT | 850,4,SRSK0EV | INIT SRSK & SRT MOTOR |
| | 05 000DE | 04 | A | | | |
| | 05 000DF | 0000 | N | | | |

TABLE III (continued)

```
154   05 000E1    5403      A        EVENT      852,0,PECOFFEV      TURN OFF POST EXP. COROTRON
      05 000E3    00        A
      05 000E4    0000      N
155   05 000E6    8C03      A        EVENT      908,0,PECONEV       TURN ON POST EXP COROTRON
      05 000E8    00        A
      05 000E9    0000      N
156   05 000EB    8EC3      A        EVENT      910,0,910BEV
      05 000ED    00        A
      05 000EE    0000      N
157   05 000F0    90C3      A        EVENT      912,0,DGN&HCNT
      05 000F2    00        A
      05 000F3    0000      N
158   05 000F5    A703      A        EVENT      935,0,OVERBRUN
      05 000F7    00        A
      05 000F8    0000      N
159                                  ENDTABLE
```

TABLE III

```
71                              *
72                              *         VARIABLE PITCH EVENT TABLE
73                              *
74           00000001           FLSH@BSE  EQU    1
75           00000019           F0@ONBSE  EQU    25
76           00000064           F0@OFFBS  EQU    100
77   05 00000    0100    A      ROM@FSH   DW     FLSH@BSE
78   05 00002    00      A                DB     0
79   05 00003    0000    N                DW     FSH@ON
80   05 00005    6400    A      ROM@OFF   DW     F0@OFFBS
81   05 00007    00      A                DB     0
82   05 00008    0000    N                DW     F0@OFF
83   05 0000A    1900    A      ROM@ON    DW     F0@ONBSE
84   05 0000C    00      A                DB     0
85   05 0000D    0000    N                DW     F@R@N
86   05 0000F    0100    A      ROM@FSHS  DW     FLSH@BSE
87   05 00011    00      A                DB     0
88   05 00012    0000    N                DW     FSH@ON@S
89   05 00014    6400    A      ROM@OFFS  DW     F0@OFF@S
90   05 00016    00      A                DB     0
91   05 00017    0000    N                DW     F0@OFF@S
92   05 00019    1900    A      ROM@ONS   DW     F0@ONBSE
93   05 0001B    00      A                DB     0
94   05 0001C    0000    N                DW     F0@ON@S
95                              *
```

TABLE IV

```
161          00000396          BASE@CNT  SET    918            #CLK CNTS/PITCH
162          0000038E          SAFE@CNT  SET    910            MIN # CLK CNTS/PITCH
163                            *
164                            *        PITCH TABLE BUILDER
165                            *
166                            *        BUILD VARIABLE PITCH EVENT TABLE INTO RAM
167                            *        FROM ROM DATA + REDUCTION ADJUST & F0 TRIM
168                            *
169  05 000FA   2A0000   N     TBLD@PRT  LHLD    ROM@FSH        H&L= BASE CNT OF FLASH
170  05 000FD   EB       A               XCHG                   D&E= BASE CNT OF FLASH
171  05 000FE   2A9AFC   N               LHLD    1FLSH@ON       H&L= RED ADJ
172  05 00101   19       A               DAD     D              H&L= BASE + ADJ
173  05 00102   2244FC   N               SHLD    RAM@FSH        RAM@FSH = BASE + ADJ
174                            *
175  05 00105   2A0500   N               LHLD    ROM@OFF        H&L= BASE CNT OF F0 OFF
176  05 00108   EB       A               XCHG                   D&E= BASE CNT OF F0 OFF
177  05 00109   2A9CFC   N               LHLD    1F0@OFF        H&L= RED ADJ + TRIM ADJ
178  05 0010C   19       A               DAD     D              H&L= BASE + ADJ
179  05 0010D   2249FC   N               SHLD    RAM@OFF        RAM@OFF = BASE + ADJ
180                            *
181  05 00110   2A0A00   N               LHLD    ROM@ON         H&L= BASE CNT OF F0 ON
182  05 00113   EB       A               XCHG                   D&E= BASE CNT OF F0 ON
183  05 00114   2A9EFC   N               LHLD    1F0@ON         H&L= RED ADJ + TRIM ADJ
184  05 00117   19       A               DAD     D              H&L= BASE + ADJ
185  05 00118   CDEA02   N               CALL    MN@MOD         CALL MOD ROUTINE TO MOD IF<0
186  05 0011B   224EFC   N               SHLD    RAM@ON         RAM@ON = RESULTS OF ABOVE
187                            *
188  05 0011E   3A31F4   A      IF1     FLG,IMG@SFT,T           IS THERE IMAGE SHIFT
     05 00121   07       A
     05 00122   025601   N
189  05 00125   3E06     A               MVI     A,6            YES,# OF VAR EVENTS TO USE = 6
190  05 00127   47       A               MOV     B,A            SET UP B-REG FOR LOOP CONTROL
191  05 00128   3262FA   N               STA     TBLD@NUM       STORE # OF VAR EVENTS
192  05 0012B   3D       A               DCR     A              SET UP # OF TIMES TO GO
193  05 0012C   3263FA   N               STA     TBLD@TMP       THRU SORT
194                            *
195  05 0012F   2A0F00   N               LHLD    ROM@FSHS       UPDATE ROM@FSHS TO
196  05 00132   EB       A               XCHG                   INCLUDE RED MODE ADJ + SHIFT
197  05 00133   2AA0FC   N               LHLD    2FLSH@ON       ADJ AND SAVE FOR THE
198  05 00136   19       A               DAD     D              IMAGE SHIFT
199  05 00137   2253FC   N               SHLD    RAM@FSHS       FLASH EVENT
200                            *
201  05 0013A   2A1400   N               LHLD    ROM@OFFS       UPDATE ROM@OFFS TO INCLUDE
202  05 0013D   EB       A               XCHG                   RED MODE ADJ + TRIM ADJ +
203  05 0013E   2AA2FC   N               LHLD    2F0@OFF        SHIFT ADJ AND SAVE
204  05 00141   19       A               DAD     D              FOR THE IMAGE SHIFT
205  05 00142   2258FC   N               SHLD    RAM@OFFS       FADE OUT EVENT
206                            *
```

```
207   05 00145   2A1900   N        LHLD   ROMSONS              UPDATE ROMSONS TO INCLUDE
208   05 00148   EB       A        XCHG                        RED MODE ADJ + TRIM ADJ +
209   05 00149   2AA4FC   N        LHLD   2FC00N               SHIFT ADJ
210   05 0014C   19       A        DAD    D
211   05 0014D   CDEA02   N        CALL   ONOMOD               CALL MOD ROUTINE TO MOD IF <0
212   05 00150   225DFC   N        SHLD   RAMSONS              SAVE THE RESULTS
213                               .
214   05 00153   C36001   N ELSE:
215   05 00156   3E03     A        MVI    A,3                  IF IMAGE SHIFT NOT SET
216   05 00158   47       A        MOV    B,A                  #OF VAR EVENTS TO USE = 3
217   05 00159   3262FA   N        STA    TBLDBNUM             SET UP B-REG FOR LOOP CONTROL
218   05 0015C   3D       A        DCR    A                    STORE # OF VAR EVENTS & SETUP
219   05 0015D   3263FA   N        STA    TBLDBTMP             #OF TIMES TO GO THRU SORT
220                               ENDIF
221

440                               .
441                               .        SUBROUTINE TO DETERMINE IF MODIFIED FB ON EVENT
442                               .        CLK COUNT IF CLK COUNT RESULTS ARE NEGATIVE OR 0
443                               .
444   05 002EA   7C       A ONOMOD MOV    A,H                   A= MS PART OF ABS CLK COUNT
445   05 002EB   07       A        RLC                          CARRY= SIGN OF ABS CLK COUNT
446   05 002EC   D20203   N        IF:    CC,C,S                IS THE ABS CLK CNT NEG
447   05 002EF   119603   A        LXI    D,BASEBCNT            YES,ADD # CLK COUNTS PER PITCH
448   05 002F2   19       A        DAD    D                     TO NEG #
449   05 002F3   11AE03   A        IF:    XWRD,H,GE,SAFEBCNT    IS RESULTS GE SAFE # CLK/PITCH
      05 002F6   CD0000   N
      05 002F9   DAFF02   N
450   05 002FC   210100   A        LXI    H,1                  YES,MOVE TO TURN ON LATER
451                               ENDIF
452   05 002FF   C30E03   N ORIF:  XWRD,H,EQ,0                  IF RESULTS = 0, MOVE LATER IN
      05 00302   110000   A
      05 00305   CD0000   N
      05 00308   C20E03   N
453   05 0030B   210100   A        LXI    H,1                  PITCH BECAUSE EVENT MUST BE > 0
454                               ENDIF
455   05 0030E   C9       A        RET
456                               END

CONTROL SECTION SUMMARY: 01 00000   PT 0   02 00000   PT 0   03 00000   PT 0   04 OFFD8   PT 2
                         05 0030F   PT 1
* NO UNDEFINED SYMBOLS
* ERROR SEVERITY LEVEL: 0
* NO ERROR LINES
```

TABLE V

```
252                               .
253                               .        SORTS VARIABLE RAM EVENT TABLE BY
254                               .        ABS CLK COUNT & LOWEST ENDS IN EVBRAM
255                               .
256                               .        SORTS ONLY 1ST 3 IF NO IMAGE SHIFT, OTHERWISE SORTS ALL 6
257                               .
258   05 0017E   2144FC   N        LXI    H,EVBRAM             H&L= ADDR OF TOP OF VAR RAM TBL
259   05 00181   3A63FA   N WHILE: XBYT,TBLDBTMP,NE,0          TIMES TO GO THRU OUTER LOOP
      05 00184   FE00     A
      05 00186   CAFD01   N
260   05 00189   3253FA   N        STA    INBLPBCT             INTER LOOP CNT=OUTER LOOP CNT
261   05 0018C   3E80     A        SFLG   TBLDB1ST             SET 1ST FLAG FOR THIS POSITION
      05 0018E   325EF4   A
262   05 00191   2252FB   N        SHLD   FIXBADDR             ADDR OF POSITION TO FULL
263   05 00194   B7       A        ORA    A                    CLEAR Z CONDITION BIT
264   05 00195   CAEF01   N WHILE: CC,Z,C
265   05 00198   5E       A        MOV    E,M                  E= LS PART OF ABS CLK COUNT
266   05 00199   23       A        INX    H
267   05 0019A   56       A        MOV    D,M                  D= MS PART OF ABS CLK COUNT
268   05 0019B   D5       A        PUSH   D                    STORE ABS CLK CNT OF FILL POS
269   05 0019C   3A5EF4   A        IF:    FLG,TBLDB1ST,T       IS IT 1ST TIME FOR THIS POS
      05 0019F   07       A
      05 001A0   D2AE01   N
270   05 001A3   AF       A        CFLG   TBLDB1ST             YES, CLEAR ITS FLAG
      05 001A4   325EF4   A
271   05 001A7   23       A        INX    H                    AND INCREMENT
272   05 001A8   23       A        INX    H                    POINTER TO LS PART OF
273   05 001A9   23       A        INX    H                    ABS CLK COUNT OF NEXT
274   05 001AA   23       A        INX    H                    EVENT
275   05 001AB   C30601   N        ELSE:
276   05 001AE   2A5CFB   N        LHLD   VARBADDR             H&L= ADDR
277   05 001B1   23       A        INX    H                    OF LS PART OF
278   05 001B2   23       A        INX    H                    ABS CLK COUNT TO
279   05 001B3   23       A        INX    H                    COMPARE TO FILL
280   05 001B4   23       A        INX    H                    POSITION
281   05 001B5   23       A        INX    H
282                               ENDIF
283   05 001B6   225CFB   N        SHLD   VARBADDR             STORE POINTER TO COMPARE EVENT
284   05 001B9   5E       A        MOV    E,M                  E= LS PART OF COMPARE ABS CLK
285   05 001BA   23       A        INX    H
286   05 001BB   56       A        MOV    D,M                  D= MS PART OF COMPARE ABS CLK
287   05 001BC   E1       A        POP    H                    H&L= ABS CLK COUNT OF FILL POS
288   05 001BD   EB       A        IF:    XWRD,D,LT,H          IS CLK OF COMPARE < FILL
      05 001BE   CD0000   N
      05 001C1   D2E501   N
289   05 001C4   2A5CFB   N        LHLD   VARBADDR             YES, SWITCH THE 2 EVENTS
290   05 001C7   EB       A        XCHG                        D&E= ADDR LOWER CLK VALUE
291   05 001C8   2A52FB   N        LHLD   FIXBADDR             H&L= ADDR LARGER CLK VALUE
292   05 001CB   3EFB     A        MVI    A,=5                 INITIALIZE LOOP COUNTER TO 5
293   05 001CD   3265FA   N        STA    TSWBNUM              WHICH = # OF ITEMS TO MOVE
294   05 001D0   B7       A        ORA    A                    CLEAR Z CONDITION BIT
295   05 001D1   CAE501   N WHILE: CC,Z,C
296   05 001D4   1A       A        LDAX   D                    A= CONTAINS OF COMPARE EVENT
```

| | | | | | | | |
|---|---|---|---|---|---|---|---|
|297|05 001D5|46|A| | MOV | B,M | B= CONTAINS OF FILL EVENT |
|298|05 001D6|77|A| | MOV | M,A | UPDATE FILL POS |
|299|05 001D7|78|A| | MOV | A,B | UPDATE COMPARE POS |
|300|05 001D8|12|A| | STAX | D | WITH NEW VALUE |
|301|05 001D9|13|A| | INX | D | MOVE POINTERS TO |
|302|05 001DA|23|A| | INX | H | NEXT ITEM |
|303|05 001DB|3A65FA|N| | LDA | TSW#NUM | INC MOVE |
|304|05 001DE|3C|A| | INR | A | LOOP CONTROL |
|305|05 001DF|3265FA|N| | STA | TSW#NUM | COUNTER |
|306|05 001E2|C30101|N| | ENDWHILE | | |
|307| | | | | ENDIF | | |
|308|05 001E5|2153FA|N| | DECBYT | IN&LP&CT | DECRM INNER LOOP CNTR |
| |05 001E8|35|A| | | | |
|309|05 001E9|2A52FB|N| | LHLD | FIX#ADDR | H&L= ADDR OF FILL POSITION |
|310|05 001EC|C39501|N| | ENDWHILE | | |
|311|05 001EF|110500|A| | LXI | D,5 | MOVE H&L TO LOOK AT NEXT EVENT |
|312|05 001F2|19|A| | DAD | D | POSITION TO FILL |
|313|05 001F3|3A63FA|N| | LDA | TBLD#TMP | DECREMENT # OF EVENTS |
|314|05 001F6|3D|A| | DCR | A | TO SORT |
|315|05 001F7|3263FA|N| | STA | TBLD#TMP | |
|316|05 001FA|C38101|N| | ENDWHILE | | |

TABLE VI

| | | | | | | | |
|---|---|---|---|---|---|---|---|
|223| | | |*| | | |
|224| | | |*| MOVE THE SR# & EVENT ADDR FROM ROM TABLE | | |
|225| | | |*| TO RAM TABLE. MOVES ONLY THE FIRST 3 IF | | |
|226| | | |*| NO IMAGE SHIFT, OTHERWISE MOVES ALL 6 | | |
|227| | | | | | | |
|228|05 00160|1144FC|N| | LXI | D,RAM#FSH | D&E = ADDR OF RAM TABLE |
|229|05 00163|210000|N| | LXI | H,ROM#FSH | H&L = ADDR OF ROM TABLE |
|230|05 00166|B0|A| | ORA | B | CLEAR Z CONDITION BIT |
|231|05 00167|CA7E01|N| | WHILE! | CC,Z,C | |
|232|05 0016A|23|A| | INX | H | INCREMENT H&L AND D&E |
|233|05 0016B|23|A| | INX | H | POINTERS OVER THE |
|234|05 0016C|13|A| | INX | D | ABS CLK COUNT |
|235|05 0016D|13|A| | INX | D | |
|236|05 0016E|7E|A| | MOV | A,M | LOAD A WITH SR# |
|237|05 0016F|12|A| | STAX | D | STORE SR# IN RAM TABLE |
|238|05 00170|23|A| | INX | H | MOVE POINTERS TO LS |
|239|05 00171|13|A| | INX | D | ADDR OF EVENT |
|240|05 00172|7E|A| | MOV | A,M | LOAD A WITH LS ADDR OF EVENT |
|241|05 00173|12|A| | STAX | D | & STORE IT IN RAM TABLE |
|242|05 00174|23|A| | INX | H | MOVE POINTERS TO MS |
|243|05 00175|13|A| | INX | D | ADDR OF EVENT |
|244|05 00176|7E|A| | MOV | A,M | MOVE MS ADDR OF EVENT |
|245|05 00177|12|A| | STAX | D | TO RAM |
|246|05 00178|23|A| | INX | H | MOVES POINTERS TO |
|247|05 00179|13|A| | INX | D | LS PART OF ABS CLK COUNT |
|248|05 0017A|05|A| | DCR | B | DECREMENT LOOP COUNTER |
|249|05 0017B|C36701|N| | ENDWHILE | | |
|250| | | |*| | | |

TABLE VII

| | | | | | | | |
|---|---|---|---|---|---|---|---|
|318| | | |*| | | |
|319| | | |*| MERGE VARIABLE PITCH EVENT TABLE & FIXED EVENT | | |
|320| | | |*| TABLE CALCULATING THE REL DIFFERENCE WITH THE | | |
|321| | | |*| RESULTS GOING INTO THE RUN EVENT TABLE | | |
|322| | | |*| | | |
|323|05 001FD|2A44FC|N| | LHLD | EV#RAM | INITIALIZE VAR#CLK TO ABS CLK |
|324|05 00200|225EFB|N| | SHLD | VAR#CLK | COUNT OF 1ST VAR PITCH EVENT |
|325|05 00203|2144FC|N| | LXI | H,EV#RAM | INITIALIZE VAR#ADDR TO ADDR OF |
|326|05 00206|225CFB|N| | SHLD | VAR#ADDR | 1ST VAR PITCH EVENT |
|327|05 00209|211E00|N| | LXI | H,FV#ROM | INITIALIZE FIX#ADDR TO ADDR OF |
|328|05 0020C|2252FB|N| | SHLD | FIX#ADDR | 1ST FIXED PITCH EVENT |
|329|05 0020F|3E80|A| | SFLG | TBLD#1ST | NOTES 1ST EVENT TO RUN TABLE |
| |05 00211|325EF4|A| | | | |
|330|05 00214|3E2C|A| | MVI | A,TABLENUM | INITIALIZE TSW#NUM TO # OF |
|331|05 00216|3265FA|N| | STA | TSW#NUM | EVENTS IN FIXED PITCH TABLE |
|332|05 00219|2A1E00|N| | LHLD | FV#ROM | INITIALIZE D&E WITH ABS CLOCK |
|333|05 0021C|EB|A| | XCHG | | COUNT OF 1ST FIXED EVENT |
|334|05 0021D|AF|A| | CFLG | VAR#DONE | FLAG DENOTES VAR EVENTS |
| |05 0021E|3259F4|A| | | | |
|335|05 00221|3A59F4|A| | WHILE! | FLG,VAR#DONE,F | WHILE THERE ARE MORE VAR EVENTS |
| |05 00224|07|A| | | | |
| |05 00225|DA6F02|N| | | | |
|336|05 00228|2A5EFB|N| | IF! | XWRD,VAR#CLK,LE,D | IS VAR CLK CNT <= FIXED CLK CNT |
| |05 0022B|CD0000|N| | | | |
| |05 0022E|DA3402|N| | | | |
| |05 00231|C25902|N| | | | |
|337|05 00234|2A5CFB|N| | LHLD | VAR#ADDR | YES, H&L= VAR EVENT ADDR |
|338|05 00237|CD9302|N| | CALL | TBLD#UPD | PLACE VAR EVENT AT END RUN TBL |
|339|05 0023A|3A62FA|N| | LDA | TBLD#NUM | DECREMENT # OF |
|340|05 0023D|3D|A| | DCR | A | VARIABLE EVENTS LEFT |
|341|05 0023E|3262FA|N| | STA | TBLD#NUM | TO MERGE |
|342|05 00241|C24C02|N| | IF! | CC,Z,S | DID TBLD#NUM GO TO 0 |
|343|05 00244|3E80|A| | SFLG | VAR#DONE | YES,DENOTE NO MORE VAR EVENTS |
| |05 00246|3259F4|A| | | | |
|344|05 00249|C35602|N| | ELSE! | | |
|345|05 0024C|225CFB|N| | SHLD | VAR#ADDR | STORE ADDR OF NEXT VAR EVENT |
|346|05 0024F|5E|A| | MOV | E,M | UPDATE VAR#CLK TO |
|347|05 00250|23|A| | INX | H | VALUE OF ABS CLK COUNT |
|348|05 00251|56|A| | MOV | D,M | OF PRESENT VARIABLE |
|349|05 00252|EB|A| | XCHG | | EVENT |
|350|05 00253|225EFB|N| | SHLD | VAR#CLK | |
|351| | | | | ENDIF | | |
|352|05 00256|C36602|N| | ELSE! | | IF FIXED TABLE CLK COUNT IS |
|353|05 00259|2A52FB|N| | LHLD | FIX#ADDR | LESS THEN VAR TABLE UPDATE THE |

```
354  05 0025C  CD9302  N           CALL     TBLD0UPD         RUN TABLE WITH THAT EVENT
355  05 0025F  2252FB  N           SHLD     FIX0ADDR         UPDATE TO NEXT FIXED EVENT
356  05 00262  2165FA  N           LXI      H,TSW0NUM        DECREMENT # OF FIXED EVENTS
357  05 00265  35      A           DCR      M                LEFT
358                                ENDIF
359  05 00266  2A52FB  N           LHLD     FIX0ADDR
360  05 00269  5E      A           MOV      E,M              UPDATE D&L TO =
361  05 0026A  23      A           INX      H                ABS CLK CNT VALUE
362  05 0026B  56      A           MOV      D,M              OF PRESENT FIXED TABLE
363  05 0026C  C32102  N           ENDWHILE
364  05 0026F  3EFF    A           MVI      A,X'FF'          CLEAR Z CONDITION
365  05 00271  B7      A           ORA      A                BIT FOR LOOP
366  05 00272  2A52FB  N           LHLD     FIX0ADDR         NO MORE VAR EVENTS, USE FIXED
367  05 00275  CA8402  N           WHILE!   CC,Z,C           DONE WITH FIXED TABLE
368  05 00278  CD9302  N           CALL     TBLD0UPD         NO,UPDATE RUN TABLE
369  05 0027B  EB      A           XCHG                      SAVE H&L IN D&E
370  05 0027C  2165FA  N           LXI      H,TSW0NUM        DECREMENT # OF FIXED
371  05 0027F  35      A           DCR      M                EVENTS LEFT
372  05 00280  EB      A           XCHG                      RESTORE H&L
373  05 00281  C37502  N           ENDWHILE
374  05 00284  2A58FB  N           LHLD     P0TBL0A          H&L=ADDR OF LAST MS ADDR IN RUN
375  05 00287  2B      A           DCX      H                MOVE H&L POINTER BACK TO POINT
376  05 00288  2B      A           DCX      H                AT THE BEGINNING OF THE LAST
377  05 00289  2B      A           DCX      H                EVENT (OVERORUN) & STORE IT
378  05 0028A  2264F0  N           SHLD     EV0PTR!          FOR MACH CLK INTERRUPT HANDLER
379  05 0028D  3E80    A           SFLG     TBLD0FIN         DENOTES PITCH TABLE IS COMPLETE
     05 0028F  325DF4  A
380  05 00292  C9      A           RET

382                                *
383                                *        SUBROUTINE TO CALCULATE REL DIFFERENCE BETWEEN
384                                *        2 EVENTS & MOVE REST OF TABLE TO RUN TABLE
385                                *
386  05 00293  3A5EF4  A  TBLD0UPD IF!      FLG,TBLD01ST,T   THIS IS THE FIRST EVENT
     05 00296  07      A
     05 00297  D2AF02  N
387  05 0029A  AF      A           CFLG     TBLD01ST         YES, CLR FLAG TO KEEP OUT
     05 0029B  325EF4  A
388  05 0029E  7E      A           MOV      A,M              A= LS OF 1ST EVENT ABS CLK CNT
389  05 0029F  3251FA  N           STA      EV01STIM         USED AT PITCH RESET
390  05 002A2  5F      A           MOV      E,A              E=LS OF 1ST EVENT ABS CLK CNT
391  05 002A3  23      A           INX      H                H&L=ADDR OF MS ABS CLK CNT
392  05 002A4  56      A           MOV      D,M              D=MS OF 1ST EVENT ABS CLK CNT
393  05 002A5  EB      A           XCHG                      D&E= ADDR OF MS ABS CLK CNT
394  05 002A6  2256FB  N           SHLD     LCLK0CNT         STORE ABS CLK OF 1ST EVENT
395  05 002A9  21E8FE  N           LXI      H,EV0BASE!       H&L = ADDR OF RUN TABLE
396  05 002AC  C3D802  N           ELSE!
397  05 002AF  5E      A           MOV      E,M              E=LS CLK CNT OF NEW EVENT
398  05 002B0  23      A           INX      H                H&L= ADDR OF MS ABS CLK CNT
399  05 002B1  56      A           MOV      D,M              D=MS CLK CNT OF NEW EVENT
400  05 002B2  E5      A           PUSH     H                SAVE ADDR OF MS ABS CLK CNT
401  05 002B3  2A56FB  N           IF!      XWRD,LCLK0CNT,GE,D IS LAST CLK CNT GE NEW CLK CNT
     05 002B6  CD0000  N
     05 002B9  DAC502  N
402  05 002BC  23      A           INX      H                H&L= LAST CLK CNT + 1
403  05 002BD  2256FB  N           SHLD     LCLK0CNT         STORE IT FOR NEXT TIME
404  05 002C0  3E01    A           MVI      A,1              PUT THIS EVENT AT THE NEXT CLK
405  05 002C2  C3CC02  N           ELSE!
406  05 002C5  45      A           MOV      B,L              B=LS CLK CNT OF LAST EVENT
407  05 002C6  EB      A           XCHG                      H&L=ABS CLK CNT OF NEW EVENT
408  05 002C7  2256FB  N           SHLD     LCLK0CNT         STORE IT FOR THE NEXT TIME
409  05 002CA  7D      A           MOV      A,L              A=LS CLK CNT OF NEW EVENT
410  05 002CB  90      A           SUB      B                FIND DIFF (ONLY NEED LS IF CLK
411                                ENDIF                     CNTS BETWEEN EVENTS <256)
412  05 002CC  D1      A           POP      D                D&E=ADDR OF MS OF CLK OF NEW EV
413  05 002CD  2A58FB  N           LHLD     P0TBL0A          H&L= ADDR OF END OF LAST RUN EV
414  05 002D0  2B      A           DCX      H                MOVE H&L POINTER
415  05 002D1  2B      A           DCX      H                TO REL DIFF OF LAST
416  05 002D2  2B      A           DCX      H                EVENT IN RUN TABLE
417  05 002D3  77      A           MOV      M,A              MOVE REL DIFF TO RUN TABLE
418  05 002D4  23      A           INX      H                INCREMENT RUN TABLE
419  05 002D5  23      A           INX      H                POINTER OVER LAST
420  05 002D6  23      A           INX      H                EVENT
421  05 002D7  23      A           INX      H
422                                ENDIF
423  05 002D8  23      A           INX      H                H&L= ADDR OF SR# IN RUN TABLE
424  05 002D9  13      A           INX      D                D&E= ADDR OF SR#
425  05 002DA  1A      A           LDAX     D                MOVE SR# FROM TABLE TO
426  05 002DB  77      A           MOV      M,A              RUN TABLE
427  05 002DC  23      A           INX      H                MOVE POINTERS TO LS 8 BITS
428  05 002DD  13      A           INX      D                OF EVENT ADDR
429  05 002DE  1A      A           LDAX     D                MOVE LS 8 BITS OF ADDR
430  05 002DF  77      A           MOV      M,A
431  05 002E0  23      A           INX      H                MOVES POINTER TO MS 8 BITS
432  05 002E1  13      A           INX      D                OF EVENT ADDR
433  05 002E2  1A      A           LDAX     D                MOVES MS 8 BITS OF ADDR
434  05 002E3  77      A           MOV      M,A
435  05 002E4  2258FB  N           SHLD     P0TBL0A          STORE ADDR OF RUN TABLE
436  05 002E7  13      A           INX      D                POINTER TO LS 8 BITS OF CLK CNT
437  05 002E8  EB      A           XCHG                      H&L= ADDR OF LS 8 BITS OF CLK
438  05 002E9  C9      A           RET

440                                *
441                                *        SUBROUTINE TO DETERMINE IF MODIFIED FB ON EVENT
442                                *        CLK COUNT IF CLK COUNT RESULTS ARE NEGATIVE OR 0
443                                *
444  05 002EA  7C      A  0N0M0D   MOV      A,H              A= MS PART OF ABS CLK COUNT
445  05 002EB  07      A           RLC                       CARRY= SIGN OF ABS CLK COUNT
446  05 002EC  D20203  N           IF!      CC,C,S           IS THE ABS CLK CNT NEG
447  05 002EF  119603  A           LXI      D,PASE0CNT       YES,ADD # CLK COUNTS PER PITCH
448  05 002F2  19      A           DAD      D                TO NEG #
449  05 002F3  118E03  A           IF!      XWRD,H,GE,SAFE0CNT IS RESULTS GE SAFE # CLK/PITCH
     05 002F6  CD0000  N
     05 002F9  DAFF02  N
```

```
450   05 002FC   210100    A                LXI      H,1             YES, MOVE TO TURN ON LATER
451                                       ENDIF
452   05 002FF   C30E03    N      ORIF:    XWRD,H,EQ,0              IF RESULTS = 0, MOVE LATER IN
      05 00302   110000    A
      05 00305   CD0000    N
      05 00308   C20E03    N
453   05 0030B   210100    A                LXI      H,1             PITCH BECUASE FVENT MUST BE > 0
454                                       ENDIF
455   05 0030E   C9        A                RET
456                                       END

CONTROL SECTION SUMMARY:  01 00000   PT 0    02 00000   PT 0    03 00000   PT 0    04 0FFD8   PT 2
                          05 0030F   PT 1
* NO UNDEFINED SYMBOLS
*    ERROR SEVERITY LEVEL: 0
* NO ERROR LINES
```

TABLE VIII

```
219
220                              * PITCH RESET INTERRUPT HANDLER
221
223   06 000F9   FB        A   RSET:    EI                              RE-ENABLE INTERRUPTS
224   06 000FA   F5        A            PUSH     PSW                    SAVE A-REG & CONDITION BITS
225   06 000FB   3A5DF4    A            IF:      FLG,TBLDDFIN,T         IS PITCH TABLE BUILD FINISHED
      06 000FE   07        A
      06 000FF   D26201    N
226   06 00102   E5        A            PUSH     H                      SAVE H&L
227                                     IF:      FLGS,SRDDONE,,        YES, IS THERE A NEW SR VALUE
228   06 00103   3A4DF4    A                     AND,910DDONE,T         YES, DID 910 EVENT GET DONE
      06 00106   216FF4    A
      06 00109   A6        A
      06 0010A   F25501    N
229   06 0010D   AF        A            CFLG     910DDONE               YES, RESET & MACH CLK TIMING OK
      06 0010E   326FF4    A
230   06 00111   324DF4    A            MODFLG   SRDDONE                CLR FLAG UNTIL NEXT SR EVENT
231   06 00114   2163FD    A            LXI      H,ADR(DATA,SROPTR)     LOAD RELATIVE
232   06 00117   7E        A            MOV      A,M                              PNTR TO SR #0
233   06 00118   C60F      A            MODBYT   A,ADD,15               MOVE PNTR BACK
234   06 0011A   E66F      A            MODBYT   A,AND,SRDADJ                     BY 1 (CIRCULAR)
235   06 0011C   77        A            MOV      M,A                    SAVE NEW REL SR PNTR IN SROPTR
236   06 0011D   26FE      A            MVI      H,HADR(DATA,SHIFTREG)  H&L = ABS ADDR
237   06 0011F   6F        A            MOV      L,A                              OF SR #0
238   06 00120   3A69FD    A            LDA      ADR(DATA,SRDVALU)      A = NEW SR VALUF FROM SRSK
239   06 00123   77        A            MOV      M,A                    UPDATE CONTENTS OF SR#0
240   06 00124   3A51FA    A            LDA      ADR(DATA,EVDIDTIM)     INIT MCLKICNT
241   06 00127   326EFD    A            STA      ADR(DATA,MCLKICNT)               TO 1ST EVENT TIME
242   06 0012A   21E8FE    A            LXI      H,ADR(DATA,EVDBASE)    INIT EVDPTR
243   06 0012D   2264FD    A            SHLD     ADR(DATA,EVDPTR)                 TO 1ST EVENT ADDR
244                                     IF:      FLGS,NORMDDN,,        IS NORMAL SHUTDOWN REQUESTED
245                                              AND,CYCLDDNI,,        NO, IS CYCLE-DOWN REQUESTED
246   06 00130   3AABF4    A                     AND,SDIDDLY,F          NO, IS PROC DEAD CYCLING
      06 00133   21AAF4    A
      06 00136   B6        A
      06 00137   21AFF4    A
      06 0013A   B6        A
      06 0013B   FA5201    N
247   06 0013E   2166FD    A            LXI      H,ADR(DATA,CYCUPCT)    NO, LOAD CYCLE-UP CNTR
248   06 00141   7E        A            IF:      XBYT,M,NE,5            IS PROC IN CYCLE-UP MODE
      06 00142   FE05      A
      06 00144   CA5201    N
249   06 00147   FE04      A                     IF:  XBYT,A,EQ,4       YES, IS IT RDY TO MAKE 1ST IMG
      06 00149   C25101    N
250   06 0014C   3E80      A                     SFLG     IMGMADE       YES, SIGNAL 1ST IMAGE MADE
      06 0014E   32ADF4    A
251                                              ENDIF
252   06 00151   34        A                     INR      M             INCRM CYCLE-UP CNTR (UNTIL= 5)
253                                     ENDIF
254                                     ELSE:                           NEW SR VALUE NOT AVAILABLE
255   06 00152   C36101    N                     SFLG     IMEDDDN       REQUEST AN IMED SHUTDOWN
256   06 00155   3E80      A
      06 00157   32A9F4    A
257   06 0015A   2132FD    A            SFRIT,P  EDPRDFLT                SIGNAL EARLY PITCH RESET FAULT
      06 0015D   3E40      A
      06 0015F   B6        A
      06 00160   77        A
258                                     ENDIF
259   06 00161   E1        A            POP      H                      RESTORE H&L
260                                  ENDIF
261   06 00162   3EFE      A            MVI      A,RSETFF               RESET PITCH RESET
262   06 00164   3200E6    A            STA      ADR(EQU,RSINTFF)                    INT FLIP-FLOP
263   06 00167   F1        A            POP      PSW                    RESTORE A-REG & CONDITION BITS
264   06 00168   C9        A            RET                             RETURN TO INTERRUPTED ROUTINE
```

TABLE IX

```
57
58                               * MACHINE CLOCK INTERRUPT HANDLER
59
61          06 00028                     ORIGIN   X'38'                  INTERRUPT TRAP CELL LOCATION 64    06 00038   F5        A   MCLK:    PUSH     PSW                    SAVE A-REG & CONDITION CODES
65    06 00039   3A6EFD    A            LDA      ADR(DATA,MCLKICNT)     IS THERE
66    06 0003C   30        A            DCR      A                              A PITCH
67    06 0003D   C26600    N            IF:      CC,Z,S                         EVENT TO DO
68    06 00040   E5        A                     PUSH     H             YES, SAVE
69    06 00041   D5        A                     PUSH     D                      ALL REMAINING
70    06 00042   C5        A                     PUSH     B                          REGS
```

```
71  06 00043  2A64FD  A         LHLD    ADR(DATA,EV8PTR1)      H&L= 1ST LOC OF NEXT PE TO DO
72  06 00046  7E      A         MOV     A,H                    SAVE RELATIVE DIFFERENTIAL TO
73  06 00047  326EFD  A         STA     ADR(DATA,MCLKICNT)       NEXT EVENT (# CLOCK COUNTS)
74  06 0004A  23      A         INX     H                      MOVE PNTR TO REL SR IN TABLE
75  06 0004B  3A63FD  A         LDA     ADR(DATA,SR8PTR1)      LOAD REL POSITION OF SR #0
76  06 0004E  86      A         MODBYT  A,ADD,M                C= LS PORTION OF ADDR OF THE
77  06 0004F  E66F    A         MODBYT  A,AND,SRBADJ1            REQUESTED SHIFT REGISTER
78  06 00051  4F      A         MOV     C,A                      POSITION (FOR USE WITHIN PE)
79  06 00052  06FE    A         MVI     B,HADR(SHIFTREG)       B&C= ADDR REQUESTED SR POSITION
80  06 00054  0A      A         LDAX    B                      A= <REQUESTED SR POSITION>
81  06 00055  23      A         INX     H                      E= LS PORTION OF ADDR OF THE
82  06 00056  5E      A         MOV     E,M                      REQUESTED PITCH EVENT
83  06 00057  23      A         INX     H                      D= MS PORTION OF ADDR OF THE
84  06 00058  56      A         MOV     D,M                      REQUESTED PITCH EVENT
85  06 00059  23      A         INX     H                      SAVE PNTR TO
86  06 0005A  2264FD  A         SHLD    ADR(DATA,EV8PTR1)        NEXT PITCH EVENT
87  06 0005D  C00000  N         CALL    DE;IND                 VECTOR TO REQUESTED PITCH EVENT
88  06 00060  C1      A         POP     B                      RESTORE
89  06 00061  D1      A         POP     D                              SAVED
90  06 00062  E1      A         POP     H                              REGISTERS
91  06 00063  C37000  N         ELSE:
92  06 00066  326EFD  A         STA     ADR(DATA,MCLKICNT)     NO PE, SAVE DECRM'D 'MCLKICNT'
93  06 00069  0F      A         RRC                            IS IT TIME FOR
94  06 0006A  027000  N         IF:     CC,C,S                            A REFRESH
95  06 0006D  3202E6  A         REFRESH                        YES, REFRESH REMOTES (1 MSEC)
96                              ENDIF
97                              ENDIF
98  06 00070  FB      A         EI                             RE-ENABLE INTERRUPT SYSTEM
99  06 00071  3EFD    A         MVI     A,MCLKFF1              RESET MCLK
100 06 00073  3200E6  A         STA     ADR(EQU,RSINTFF1)                INTERRUPT FLIP-FLOP
101 06 00076  F1      A         POP     PSW                    RESTORE A-REG & CONDITION CODES
102 06 00077  C9      A         RET                            RETURN TO INTERRUPTED ROUTINE
```

TABLE X

```
139                             *
140                             * REAL TIME CLOCK INTERRUPT HANDLER
141                             *

143 06 00081  FB      A   RTC:  EI                             RE-ENABLE INTERRUPTS
144 06 00082  F5      A         PUSH    PSW                    SAVE A-REG & CONDITION BITS
145 06 00083  3EF7    A         MVI     A,RTCFF1               RESET RTC
146 06 00085  3200E6  A         STA     ADR(EQU,RSINTFF1)               INTERRUPT FLIP-FLOP
147 06 00088  D5      A         PUSH    D                      SAVE D&E REGS
148 06 00089  E5      A         PUSH    H                      SAVE H&L REGS
149 06 0008A  C5      A         PUSH    B                      SAVE 'B' REGISTER
150                             *
151 06 0008B  2150FD  N         DECBYT  GLBITIMR               DECREMENT THE CLOCK CELL
    06 0008E  35      A
152 06 0008F  7E      A         MOV     A,M                    A = <GLBITIMR>  ( 0 TO 255 )
153 06 00090  23      A         INX     H                      MEM. PTR. TO SR;RQST BYTE
154 06 00091  E601    A         IF:     XBYT,A,AND,X'01',NZ    IS IT 20 MSEC TIME YET
    06 00093  CA9D00  N
155 06 00096  7E      A                 MODBYT  M,OR,10:RQST:20:RQST   YES - BOTH 10 AND 20 BKGD
    06 00097  F6C0    A
    06 00099  77      A
156 06 0009A  C3A100  N         ELSE:
157 06 0009D  7E      A                 MODBYT  M,OR,10:RQST           NO - 10 BKGD ONLY
    06 0009E  F680    A
    06 000A0  77      A
158                             ENDIF
159 06 000A1  23      A         INX     H                      MEM. PTR. TO DIV0110 CNTR
160 06 000A2  35      A         DCR     M                      DECREMENT 10 TO 0 COUNTER
161 06 000A3  C2A000  N         IF:     CC,Z,S                 HAS 100 MSEC PASSED
162 06 000A6  360A    A                 MVI     M,10           YES - RESET THE 10 TO 0 COUNTER
163 06 000A8  2B      A                 DCX     H              MEM. PTR. BACK TO SB;RQST
164 06 000A9  7E      A                 MODBYT  M,OR,100:RQST  ADD 100 BKGD TO REQUEST BYTE
    06 000AA  F620    A
    06 000AC  77      A
165                             ENDIF
166                             REPEAT                         NOW CHECK FOR TIME OUTS
167 06 000AD  2150FD  N         LXI     H,GLBITIMR             LOAD 'B' WITH QUANTITY TO LOOK
168 06 000B0  46      A         MOV     B,M                    FOR (CLOCK CELL VALUE)
169 06 000B1  16FB    A         MVI     D,CBUNT1               SET 'D' FOR TABLE TO SEARCH
170 06 000B3  C00000  N         CALL    FIND:LOC               GO LOOK IN ACTIVE LIST
171 06 000B6  CAF000  N         IF:     CC,Z,C                 HAS A MATCH BEEN FOUND
172 06 000B9  E5      A                 PUSH    H              YES - SAVE LOCATION ON STACK
173 06 000BA  26FC    A                 MVI     H,10:          SEGWAY MEM PTR TO 10: TABLE
174 06 000BC  5E      A                 MOV     E,M            NOW ASSEMBLE
175 06 000BD  1600    A                 MVI     D,0            ADDRESS OF TIMER
176 06 000BF  21C8F4  A                 LXI     H,TMR:FLGS     FLAG INTO THE
177 06 000C2  19      A                 DAD     D                MEMORY POINTER
178 06 000C3  0600    A                 MVI     B,0            GET SET TO CLEAR THE FLAG
179 06 000C5  F3      A                 DI                     NO INTERRUPTIONS NOW, PLEASE
180 06 000C6  7E      A                 MOV     A,M            GET FLAG
181 06 000C7  07      A                 RLC                    INTO THE CARRY BIT
182 06 000C8  D2EC00  N                 IF:     CC,C,S         IS FLAG SET
183 06 000CB  70      A                         MOV     M,B    YES - RESET AND NOW
184 06 000CC  FB      A                         EI             EVERYBODY CAN INTERRUPT AGAIN
185 06 000CD  E1      A                         POP     H      LOCATION FROM STACK TO MEM PTR
186 06 000CE  26FD    A                         MVI     H,LS:ADDR  SEGWAY MEM PTR TO LS: TABLE
187 06 000D0  5E      A                         MOV     E,M    GET LS TIME-OUT ADDRESS
188 06 000D1  24      A                         INR     H      SEGWAY MEM PTR TO MS: TABLE
189 06 000D2  56      A                         MOV     D,M    GET MS TIME-OUT ADDRESS
190 06 000D3  45      A                         MOV     B,L    LOCATION TO 'B' TEMPORARILY
191 06 000D4  2A5FFD  N                         LHLD    INPTR1 STUFF TIME-OUT ADDRESS INTO
192 06 000D7  73      A                         MOV     M,E    INTO TABLE OF TIME-OUT
193 06 000D8  23      A                         INX     H      ADDRESSES THAT IS CHECKED
194 06 000D9  72      A                         MOV     M,D    FOR ENTRIES EVERY 10 MSECONDS
195 06 000DA  23      A                         INX     H      BY THE STATE CHECKER
196 06 000DB  70      A                         MODBYT  L,AND,TIME:MSK  FORCE A CIRCULAR TABLE
    06 000DC  E62F    A
    06 000DE  6F      A
```

```
197  06 000DF  225FFD   N              SHLD     INPTR1          SAVE NEW ADDRESS LOCATION
198  06 000E2  58       A              MOV      E,B             LOCATION BACK TO 'E'
199  06 000E3  CD0000   N              CALL     DEACTV1         TAKE OUT OF ACTIVE TIMER LIST
200  06 000E6  CD0000   N              CALL     PUT1            AND MAKE LOCATION AVAILABLE
201  06 000E9  C3EE00   N          ELSE:                        . . . FLAG IS NOT SET SO
202  06 000EC  FB       A              EI                       LET INTERRUPTIONS OCCUR
203  06 000ED  E1       A              POP      H               MAKE THE STACK RIGHT AND
204                                 ENDIF                       FORCE NON-ZERO CONDITION TO
205  06 000EE  F601     A              MODBYT   A,OR,1          STAY IN UNTIL LOOP
206                                 ENDIF                       . . . NO MATCH - RTC COMPLETE
207  06 000F0  C2AD00   N        UNTIL:  CC,Z,S                 WILL FALL THROUGH THIS CRACK
208
209  06 000F3  E1       A              POP      H               RESTORE THE
210  06 000F4  44       A              MOV      B,H             ,B' REGISTER
211  06 000F5  E1       A              POP      H               RESTORE H&L REGS
212  06 000F6  D1       A              POP      D               RESTORE D&E REGS
213  06 000F7  F1       A              POP      PSW             RESTORE A-REG & CONDITION CODES
214  06 000F8  C9       A              RET                      RETURN TO 'FLOAT' BACKGROUND
215
```

TABLE XI

MEMORY CHECKSUM COMPARISON TEST

```
33     .
39     .
40     .                          ADDS THE CONTENTS OF MEMORY & COMPARES
41     .                          IT TO THE CHECK SUM
42     .
43  05 00000  AF       A   BUSNORM: XRA     A
44  05 00001  3258E3   A            WNVBYT  NVSERV:1            CLEAR LOOP TEST NV MEMORY
    05 00004  0F       A
    05 00005  0F       A
    05 00006  0F       A
    05 00007  0F       A
    05 00008  3259E3   A
45  05 0000B  2F       A            CMA                         ACTIVATE ARPM
46  05 0000C  32FFF7   A            MODFLG  ARPM&ACT
47  05 0000F  F3       A   SEC0STRT DI
48  05 00010  21FD7F   A            LXI     H,CHECKSUM          INITIALIZE ADDRESS POINTER
49  05 00013  110000   A            LXI     D,0                 ACCUMULATING CHECKSUM
50  05 00016  42       A            MOV     B,D                 REGISTERS SET TO 0
51                               REPEAT
52  05 00017  2B       A            DCX     H                   POINT TO NEXT ADDRESS
53  05 00018  7E       A            IF:     XBYT,H,GE,X'80'     IS BYTE POSITIVE OR NEGATIVE
    05 00019  FE80     A
    05 0001B  DA3100   N
54  05 0001E  80       A               MODBYT   B,ADD,A         NEGATIVE - SUBTRACT
    05 0001F  47       A
55  05 00020  DA2E00   N               IF:      CC,C,C          IF NO CARRY
56  05 00023  7B       A                  MODBYT  E,ADD,X'FF'   ADD X'FF' TO E REG
    05 00024  C6FF     A
    05 00026  5F       A
57  05 00027  DA2E00   N                  IF:    CC,C,C         IF NO CARRY FROM SUM OF E+X'FF'
58  05 0002A  7A       A                    MODBYT D,ADD,X'FF'  ADD X'FF' TO D REG
    05 0002B  C6FF     A
    05 0002D  57       A
59                                        ENDIF
60                                     ENDIF
61  05 0002E  C33700   N            ELSE:                       POSITIVE - ADDITION
62  05 00031  80       A               MODBYT   B,ADD,A         B REG = SUM OF B+A(NEW DATA)
    05 00032  47       A
63  05 00033  D23700   N               IF:      CC,C,S          IF CARRY BIT IS SET
64  05 00036  13       A                  INX    D              INCREMENT D+E REG
65                                     ENDIF
66                                  ENDIF
67  05 00037  3E01     A            MVI     A,1
68  05 00039  3201E6   A            STA     SS&BYT              RESET WATCHDOG
69  05 0003C  3E00     A            MVI     A,LED1&LED2&LED3&LED4  TURN ON LEDS
70  05 0003E  3201E6   A            STA     SS&BYT              ENABLE WATCHDOG
71  05 00041  7C       A         UNTIL:  XBYT,H,OR,L,Z          IF ADDRESS NOT ZERO - LOOP
    05 00042  B5       A
    05 00043  C21700   N
72  05 00046  2AFD7F   A            LHLD    CHECKSUM            LINKER CHECKSUM TO H+L
73  05 00049  7C       A            IF:     XBYT,H,EQ,E
    05 0004A  BB       A
    05 0004B  C27A00   N
74  05 0004E  7D       A         ANDIF:   XBYT,L,EQ,D
    05 0004F  BA       A
    05 00050  C27A00   N
75  05 00053  3AFF7F   A         ANDIF:   XBYT,CHECKSUM+2,EQ,B
    05 00056  B8       A
    05 00057  C27A00   N
76  05 0005A  3AFFF7   A            IF:     FLG,ARPM&ACT,F      IS ARPM DISABLED
    05 0005D  07       A
    05 0005E  DA6A00   N
77  05 00061  3E08     A               MVI     A,NONE&LED2      YES AND CHECKSUM PASSED WHICH
78  05 00063  3201E6   A               STA     SS&BYT           MEANS ARPM IS BAD
79  05 00066  76       A               HLT
80  05 00067  C37700   N            ELSE:
81  05 0006A  3E01     A               MVI     A,1
82  05 0006C  3201E6   A               STA     SS&BYT           RESET WATCHDOG TIMER
83  05 0006F  3201E6   A               STA     SS&BYT           INHIBIT WATCHDOG
84  05 00072  3E07     A               MVI     A,NONE&LED1      PRESET LED1 ON IN CASE RAM TEST
85  05 00074  3203E6   A               STA     SS&BYT+2         GETS LOST
86                                  ENDIF
87  05 00077  C33E00   N         ORIF:   FLG,ARPM&ACT,T         CHECKSUM IS BAD, IS ARPM ACTIVE
    05 0007A  3AFFF7   A
    05 0007D  07       A
    05 0007E  D28800   N
```

TABLE XII

OUTPUT DRIVER STUCK CHECK

```
88   05 00081   AF                       CFLG     ARPM@ACT            YES, DISABLE ARPM AND
     05 00082   32FFF7   A
89   05 00085   C3CF00   N                JMP      SECOSTRT            DO CHECKSUM AGAIN
90   05 00088   C38E00   N       ELSE:
91   05 00088   C39304   N                JMP      CPU@FAIL            ARPM IS OFF AND CHECKSUM
92                                                                     IS BAD SO CPU/MEM PWB BAD
93                               ENDIF

104                              *
105                              *       PART 1    CHECK IF ANY OUTPUT DRIVERS ARE STUCK AT '1' OR '0'
106                              *                 CHECK IF ANY CELLS ARE STUCK AT '1' OR '0'
107                              *                 USES CHECKER BOARD PATTERN
108                              *
109                              *
110                              *                                                         INTERRUPTS ARE NOT CONNECT YET
111  05 0008E   2100F4   A                LXI      H,X'F400'           STARTING ADDR OF FLAGS & RAM
112  05 00091   16AA     A                MVI      D,X'AA'             START OF CHECKER BOARD PATTERN
113  05 00093   1E55     A                MVI      E,X'55'
114                                       REPEAT
115  05 00095   72       A                   MOV    M,D                STORING X'AA' IN EVEN ADDR
116  05 00096   23       A                   INX    H
117  05 00097   73       A                   MOV    M,E                & X'55' IN ODD ADDR
118  05 00098   23       A                   INX    H
119  05 00099   7C       A                UNTIL:   XBYT,H,EQ,0         LOOP THRU 2K OF RAM
     05 0009A   FE00     A
     05 0009C   C2950D   N
120
121  05 0009F   01A500   N                LXI      B,$+6               SAVE RETURN ADDR IN B&C
122  05 000A2   C3E204   N                JMP      CHECKCMP            & BRANCH TO SUB-ROUTINE
123  05 000A5   01AB00   N                LXI      B,$+6               TEST AGAIN TO BE SURE NO DATA
124  05 000A8   C3E204   N                JMP      CHECKCMP            WAS LOST ON PREVIOUS READ
125                              *
126                              *       FORM THE COMPLEMENT CHECKER BOARD PATTERN
127                              *
128  05 000AB   2100F4   A                LXI      H,X'F400'           STARTING ADDR OF FLAGS & RAM
129  05 000AE   1655     A                MVI      D,X'55'             1ST PART OF CHECKER BOARD
130  05 000B0   1EAA     A                MVI      E,X'AA'             2ND PART OF CHECKER BOARD
131                                       REPEAT
132  05 000B2   72       A                   MOV    M,D                STORING X'55' IN EVEN ADDR
133  05 000B3   23       A                   INX    H
134  05 000B4   73       A                   MOV    M,E                & X'AA' IN ODD ADDR
135  05 000B5   23       A                   INX    H
136  05 000B6   7C       A                UNTIL:   XBYT,H,EQ,0         LOOP THRU 2K OF RAM
     05 000B7   FE00     A
     05 000B9   C2B200   N
137
138  05 000BC   01C200   N                LXI      B,$+6               SAVE RETURN ADDR IN B&C
139  05 000BF   C3E204   N                JMP      CHECKCMP            & JMP TO SUB-ROUTINE
140  05 000C2   01C800   N                LXI      B,$+6               TEST AGAIN TO BE SURE NO DATA
141  05 000C5   C3E204   N                JMP      CHECKCMP            WAS LOST ON PREVIOUS READ
142  05 000C8   01CE00   N                LXI      B,$+6               SAVE RETURN ADDR IN B&C
143  05 000CB   C3CEC5   N                JMP      RAM@ZERO            JUMP TO CLEAR RAM
145                              *
146                              *                 PART2
147                              *       CHECK FOR ANY SHORT OR OPEN ADDR LINES
148                              *       OR DECODE PROBLEMS
149                              *
150  05 000CE   1100F4   A                LXI      D,X'F400'           STARTING ADDR OF FLAGS & RAM
151                                       REPEAT
152  05 000D1   3EFF     A                   MVI    A,X'FF'            LOAD A-REG WITH NON-ZERO
153  05 000D3   12       A                   STAX   D                  & STORE IN TEST LOCATION
154  05 000D4   01DA00   N                   LXI    B,$+6              SAVE RETURN ADDR IN B&C
155  05 000D7   C3CB03   N                   JMP    ADDR@CHK           & JMP TO SUB-ROUTINE
156  05 000DA   AF       A                   XRA    A                  ZERO PRESENT
157  05 000DB   12       A                   STAX   D                  TEST LOCATION
158  05 000DC   13       A                   INX    D                  CHANGE LS & NEXT TO LS ADDR BIT
159                                          REPEAT
160  05 000DD   3EFF     A                      MVI    A,X'FF'         OF SCRATCH PAD RAM ADDR
161  05 000DF   12       A                      STAX   D               STORES X'FF' IN TEST LOCATION
162  05 000E0   01E600   N                      LXI    B,$+6           SAVE RETURN ADDR IN B&C
163  05 000E3   C3CB03   N                      JMP    ADDR@CHK        & JMP TO TEST SUB-ROUTINE
164  05 000E6   AF       A                      XRA    A
165  05 000E7   12       A                      STAX   D               CLEARS TEST LOCATION
166  05 000E8   7B       A                      MOV    A,E             ROTATES 1 THRU
167  05 000E9   07       A                      RLC                    LOWER BYTE OF
168  05 000EA   5F       A                      MOV    E,A             SCRATCH PAD RAM ADDR
169  05 000EB   D2DD00   N                   UNTIL:  CC,C,S            LOOP WALKS A 1 THRU LOWER BYTE
170  05 000EE   1E00     A                   MVI    E,0                DONE WITH LOWER BYTE OF ADDR
171  05 000F0   14       A                   INR    D                  CHANGE 1ST BIT IN HIGHER ADDR
172  05 000F1   3EFF     A                   MVI    A,X'FF'            LOADS TEST LOCATION
173  05 000F3   12       A                   STAX   D                  WITH X'FF'
174  05 000F4   01FA00   N                   LXI    B,$+6              SAVE RETURN ADDR IN B&C
175  05 000F7   C3CB03   N                   JMP    ADDR@CHK           & JMP TO TEST SUB-ROUTINE
176  05 000FA   AF       A                   XRA    A
177  05 000FB   12       A                   STAX   D                  CLEARS TEST LOCATION
178  05 000FC   14       A                   INR    D                  CHANGE 2 BITS IN HIGHER ADDR
179  05 000FD   3EFF     A                   MVI    A,X'FF'            STORE X'FF'
180  05 000FF   12       A                   STAX   D                  IN TEST LOCATION
181  05 00100   010601   N                   LXI    B,$+6              SAVE RETURN ADDR IN B&C
182  05 00103   C3CB03   N                   JMP    ADDR@CHK           & JMP TO TEST SUB-ROUTINE
183  05 00106   AF       A                   XRA    A
184  05 00107   12       A                   STAX   D                  CLEARS TEST LOCATION
185  05 00108   14       A                   INR    D                  INC D-REG OVER LS 2 BITS =1
186  05 00109   14       A                   INR    D                  INC D-REG TO LS 2 BITS=0
187  05 0010A   7A       A                UNTIL:   XBYT,D,LT,X'F4'     LOOP FOR FLAG & RAM ADDR
     05 0010B   FEF4     A
     05 0010D   D2D100   N
188  05 00110   3EFF     A                MVI      A,X'FF'             RAM TEST LEAVES ARPM DISABLED
189  05 00112   32FFF7   A                MODFLG   ARPM@ACT            RE-ENABLE ARPM
190  05 00115   31E8FE   N                LXI      SP,STKBASE:         INIT STACK PNTR TO HOME
191  05 00118   2153FD   N                LXI      H,STATE:            INIT 'STATE:' TO
192  05 0011B   3606     A                MVI      M,:INIT                          'INIT' STATE
```

TABLE XIII

```
820
821
822
823                          .      CHECK CHECKER BOARD PATTERN
824   05 004E2  2100F4  A  CHECKCMP LXI   H,X'F4C0'              STARTING ADDR OF FLAGS & RAM
825                          REPEAT
826   05 004E5  7E      A          MOV   A,H                     A-REG = EVEN ADDR FLAG VALUE
827   05 004E6  AA      A          XRA   D                       COMPARES WITH WHAT IT SHOULD BE
828   05 004E7  07      A          RLC                           ROTATES MS BIT(FLAG) INTO CARRY
829   05 004E8  DA9304  N          JC    CPUBFAIL                CARRY SET IF BITS WERE .NE.
830   05 004EB  23      A          INX   H                       H&L POINT TO NEXT STEP
831   05 004EC  7E      A          MOV   A,H                     A-REG = ODD ADDR FLAG VALUE
832   05 004ED  AB      A          XRA   E                       COMPARES WITH WHAT IT SHOULD BE
833   05 004EE  07      A          RLC                           ROTATES MS BIT(FLAG) INTO CARRY
834   05 004EF  DA9304  N          JC    CPUBFAIL                CARRY SET IF BITS WERE .NE.
835   05 004F2  23      A          INX   H
836   05 004F3  7C      A          UNTIL: XBYT,H,GE,X'F8'
      05 004F4  FEF8    A
      05 004F6  DAE504  N
837                          REPEAT
838   05 004F9  7A      A          MOV   A,D                     D-REG=WHAT SHOULD BE AT 1ST ADD
839   05 004FA  BE      A          CMP   M                       CHECK 1ST ADDR
840   05 004FB  C29304  N          JNZ   CPUBFAIL                IF IT IS DIFFERENT ABORT TEST
841   05 004FE  2F      A          CMA                           GET READY TO COMPARE NEXT ADDR
842   05 004FF  23      A          INX   H                       (COMPLEMENT FOR CHECKER BOARD)
843   05 00500  BE      A          CMP   M                       COMPARE TO SEE IF MEMORY IS OK
844   05 00501  C29304  N          JNZ   CPUBFAIL                ABORT TEST IF MEMORY IS WRONG
845   05 00504  23      A          INX   H                       GET READY FOR
846   05 00505  7C      A          UNTIL: XBYT,H,EQ,0            LOOP THRU 2K OF RAM
      05 00506  FE00    A
      05 00508  C2F904  N
847   05 00508  60      A          MOV   H,B                     LOAD H&L WITH B&E WHICH
848   05 0050C  69      A          MOV   L,C                     IS THE RETURN ADDR &
849   05 0050D  E9      A          PCHL                          RETURN TO CALLING PROGRAM
850
851
852                          .      ZERO 2K SCRATCH PAD RAM & 1K FLAGS
853
854   05 0050E  2100F4  A  RAM0ZERO LXI  H,FLGBASE!
855   05 00511  1600    A          MVI   D,0
856                          REPEAT
857   05 00513  72      A          MOV   M,D
858   05 00514  23      A          INX   H
859   05 00515  7C      A          UNTIL: XBYT,H,EQ,0
      05 00516  FE00    A
      05 00518  C21305  N
860   05 0051B  60      A          MOV   H,B                     LOAD H&L WITH B&E WHICH
861   05 0051C  69      A          MOV   L,C                     IS THE RETURN ADDR &
862   05 0051D  E9      A          PCHL                          RETURN TO CALLING PROGRAM
863
864
```

TABLE XIV
ADDRESS CHECK

```
618
619                          .      SUB-ROUTINE CHECKS SCRATCH PAD RAM ADDR
620                          .      OR FLAG RAM ADDR
621                          .      BY WALKING A 1 THRU ITS ADDR LINES
622
623   05 003CB  7A      A  ADDRBCHK IF:  XBYT,D,LT,X'F8'          IS IT A FLAG ADDR
      05 003CC  FEF8    A
      05 003CE  D21404  N
624   05 003D1  2100F4  A          LXI   H,X'F400'               YES,START AT BEGINNING OF FLAGS
625   05 003D4  7E      A          MOV   A,H                     A-REG=CONTAINS OF CHECK LOC
626   05 003D5  07      A          RLC                           CARRY=MS BIT(FLAG) OF CHECK LOC
627   05 003D6  D2E103  N          IF:   CC,C,S                  ALL FLAGS SHOULD BE CLEAR, IF
628   05 003D9  310F03  N          LXI   SP,$+6                  NOT,SAVE RETURN ADDR & JMP TO
629   05 003DC  C36804  N          JMP   FADDRBC                 TEST IF THIS WAS THE TEST LOC
630   05 003DF  62      A          MOV   H,D                     SUB-ROUTINE RETURNS ONLY IF IT
631   05 003E0  6B      A          MOV   L,E                     WAS TEST LOC, THUS RESTORE H&L
632                          ENDIF                               TO D&E BECAUSE RET USED H&L
633   05 003E1  23      A          INX   H                       CHANGES LS & NEXT TO LS BITS
634                          REPEAT                              LOOP UNTIL 1 WALKED THRU LOWER
635   05 003E2  7E      A          MOV   A,H                     BYTE OF FLAG ADDR,A=<CHECK LOC>
636   05 003E3  07      A          RLC                           CARRY= FLAG
637   05 003E4  D2EF03  N          IF:   CC,C,S                  IF FLAG WAS SET
638   05 003E7  31ED03  N          LXI   SP,$+6                  SAVE RETURN ADDR & JMP TO TEST
639   05 003EA  C36804  N          JMP   FADDRBC                 IF THIS WAS THE TEST LOC
640   05 003ED  62      A          MOV   H,D                     SUB-ROUTINE RETURNS ONLY IF IT
641   05 003EE  6B      A          MOV   L,E                     WAS TEST LOC, THUS RESTORE H&L
642                          ENDIF                               TO D&E BECAUSE RET USED H&L
643   05 003EF  7D      A          MOV   A,L                     WALK 1 THRU
644   05 003F0  07      A          RLC                           LOWER BYTE OF
645   05 003F1  6F      A          MOV   L,A                     FLAG RAM ADDR
646   05 003F2  D2E203  N          UNTIL: CC,C,S
647   05 003F5  2E00    A          MVI   L,0                     DONE WITH LOWER BYTE
648   05 003F7  24      A          INR   H                       CHANGE LS BIT IN HIGHER ADDR
649   05 003F8  7E      A          MOV   A,H                     A=<CHECK LOC>
650   05 003F9  07      A          RLC                           CARRY= FLAG OF CHECK LOC
651   05 003FA  D20504  N          IF:   CC,C,S                  IF FLAG WAS SET
652   05 003FD  310304  N          LXI   SP,$+6                  SAVE RETURN ADDR & JMP TO TEST
653   05 00400  C36804  N          JMP   FADDRBC                 IF THIS WAS THE TEST LOC
654   05 00403  62      A          MOV   H,D                     SUB-ROUTINE RETURNS ONLY IF IT
655   05 00404  6B      A          MOV   L,E                     WAS TEST LOC, THUS RESTORE H&L
656                          ENDIF                               TO D&E BECAUSE RET USED H&L
657   05 00405  24      A          INR   H                       H=X'F6'
658   05 00406  7E      A          MOV   A,H                     A=<CHECK LOC>
659   05 00407  07      A          RLC                           CARRY = FLAG OF CHECK LOC
660   05 00408  D21104  N          IF:   CC,C,S                  IF FLAG WAS SET
```

```
661   05 004OB   311104   N              LXI       SP,$+6                   SAVE RETURN ADDR & JMP TO TEST
662   05 004OE   C36804   N              JMP       FADDR&C                  IF THIS WAS THE TEST LOC
663                                    ENDIF                                TO D&E BECAUSE RET USED H&L
664   05 00411   C35F04   N            ELSE:
665   05 00414   2100F8   A              LXI       H,X'F800'                STARTING ADDR SCRATCH PAD RAM
666                                    REPEAT                               LOAD FOR THE DIFFERENT ADD LINE
667   05 00417   AF       A              XRA       A                        CLEARS A-REG
668   05 00418   BE       A              IF:       XBYT,A,NE,M              WAS MEMORY = 0
      05 00419   CA2404   N
669   05 0041C   312204   N                        LXI       SP,$+6         NO, SAVE RETURN ADDR & JMP TO
670   05 0041F   C36204   N                        JMP       ADDR&CMP       TEST IF THIS WAS THE TEST LOC
671   05 00422   62       A                        MOV       H,D            SUB-ROUTINE RETURNS ONLY IF IT
672   05 00423   6B       A                        MOV       L,E            WAS TEST LOC, THUS RESTORE H&L
673                                              ENDIF                      TO D&E BECAUSE RET USED H&L
674   05 00424   23       A              INX       H                        CHANGES LS & NEXT TO LS BITS
675   05 00425   AF       A              XRA       A                        CLEARS CARRY FOR WHILE LOOP
676                                    REPEAT                               LOOP UNTIL 1 WALKED THRU LOWER
677   05 00426   AF       A              XRA       A                        BYTE OF SCRATCH PAD MEMORY ADDR
678   05 00427   BE       A              IF:       XBYT,A,NE,M              IS LOC=0
      05 00428   CA3304   N
679   05 0042B   313104   N                        LXI       SP,$+6         NO, SAVE RETURN ADDR & JMP TO
680   05 0042E   C36204   N                        JMP       ADDR&CMP       TEST IF THIS WAS THE TEST LOC
681   05 00431   62       A                        MOV       H,D            SUBROUTINE RETURNS ONLY IF IT
682   05 00432   6B       A                        MOV       L,E            WAS TEST LOC, THUS RESTORE H&L
683                                              ENDIF                      TO D&E BECAUSE RET USED H&L
684   05 00433   70       A              MOV       A,L                      WALK 1 THRU
685   05 00434   07       A              RLC                                LOWER BYTE OF
686   05 00435   6F       A              MOV       L,A                      SCRATCH PAD RAM ADDR
687   05 00436   D22604   N            UNTIL:      CC,C,S
688   05 00439   2E00     A              MVI       L,0                      DONE WITH LOWER BYTE
689   05 0043B   24       A              INR       H                        CHANGE 1ST BIT OF HIGHER ADDR
690   05 0043C   AF       A              XRA       A                        CLEAR A-REG
691   05 0043D   BE       A              IF:       XBYT,A,NE,M              WAS TEST LOC = 0
      05 0043E   CA4904   N
692   05 00441   314704   N                        LXI       SP,$+6         NO, SAVE RETURN ADDR & JMP TO
693   05 00444   C36204   N                        JMP       ADDR&CMP       TEST IF THIS WAS THE TEST LOC
694   05 00447   62       A                        MOV       H,D            SUB-ROUTINE RETURNS ONLY IF IT
695   05 00448   6B       A                        MOV       L,E            WAS TEST LOC, THUS RESTORE H&L
696                                              ENDIF                      TO D&E BECAUSE RET USED H&L
697   05 00449   24       A              INR       H                        CHANGE 2 BITS IN HIGHER ADDR
698   05 0044A   AF       A              XRA       A
699   05 0044B   BE       A              IF:       XBYT,A,NE,M              CHECK FOR LOC = 0
      05 0044C   CA5704   N
700   05 0044F   315504   N                        LXI       SP,$+6         IT WAS = 0,SAVE RETURN ADDR &
701   05 00452   C36204   N                        JMP       ADDR&CMP       JMP TO TEST IF THIS WAS OK
702   05 00455   62       A                        MOV       H,D            SUB-ROUTINE RETURNS ONLY IF IT
703   05 00456   6B       A                        MOV       L,E            WAS TEST LOC, THUS RESTORE H&L
704                                              ENDIF                      TO D&E BECAUSE RET USED H&L
705   05 00457   24       A              INR       H                        INC H-REG TO LS 2 BITS= 1
706   05 00458   24       A              INR       H                        INC H-REG TO LS 2 BITS= 0
707   05 00459   7C       A              MOV       A,H
      05 0045A   FEF8     A
      05 0045C   D21704   N            UNTIL:      XBYT,H,LT,X'F8'
708                                    ENDIF
709   05 0045F   60       A              MOV       H,B                      LOAD H&L WITH B&C WHICH
710   05 00460   69       A              MOV       L,C                      IS THE RETURN ADDR &
711   05 00461   E9       A              PCHL                               RETURN TO CALLING PROGRAM

713                                    *
714                                    *  CHECKS TO SEE IF ADDR WHOSE CONTAINS
715                                    *  NOT = 0 IS ADDR UNDER TEST
716                                    *
717   05 00462   7E       A            ADDR&CMP IF:    XBYT,H,NE,X'FF'      IS STOP ADDR CONTAINS = X'FF'
      05 00463   FEFF     A
      05 00465   CA6804   N
718   05 00468   C39304   N                        JMP       CPU&FAIL       NO, MUST BE AN ERROR
719                                              ENDIF
720                                    *
721                                    *  ALSO CHECKS TO SEE IF ADDR WHOSE
722                                    *  FLAG WAS SET IS ADDR UNDER TEST
723                                    *
724   05 0046B   7C       A            FADDR&C  IF:    XBYT,H,NE,D          H MUST EQUAL D OR ITS AN ERROR
      05 0046C   BA       A
      05 0046D   CA7304   N
725   05 00470   C39304   N                        JMP       CPU&FAIL
726                                              ENDIF
727   05 00473   7D       A              IF:       XBYT,L,NE,E              L MUST EQUAL E OR ITS AN ERROR
      05 00474   BB       A
      05 00475   CA7804   N
728   05 00478   C39304   N                        JMP       CPU&FAIL
729                                              ENDIF
730   05 0047B   210000   A              LXI       H,0                      PLACE RETURN ADDR IN SP-REG
731   05 0047E   39       A              DAD       SP                       INTO H&L & PERFORMS
732   05 0047F   E9       A              PCHL                               A RETURN
```

TABLE XV

```
194                                    *
195                                    *         NON-VOLATILE MEMORY TEST
196                                    *
197                                    *
198                                    *
199                                    *
200                                    *
201        00000200                    NVM&LEN:  EQU       512               LENGTH OF NVM
202
203   05 0011D   3AC8E2   A            NVM&TEST  RNVNIB    NVM&TST1          A= <FIRST NVM TEST ADDR>
204   05 00120   47       A                      MOV       B,A               SAVE CONTENTS OF 1ST TEST LOC
205   05 00121   3A55E3   A                      RNVNIB    NVM&TST2          A= <OF COMPLEMENT OF NVM&TST1>
206   05 00124   FE0A     A                      IF:       XBYT,A,EQ,X'0A'   HAS 2ND TEST LOC RETAIN CONST
      05 00126   C23201   N
207   05 00129   78       A                      ANDIF:    XBYT,B,EQ,X'05'   YES, 1ST TEST LOC RATAIN CONST
      05 0012A   FE05     A
      05 0012C   C23201   N
```

```
208   05 0012F  C33C01   N         ELSE!
209   05 00132  C00000   N            CALL    RESET@NV            PUT INITIAL SETTINGS IN NV
210                      •         DO NOT FIX BATTERY CONSTANTS SO FAILURE RE OCCURS
211                      •         UNTIL DGN 32 IS EXECUTED BY TECH REP
212   05 00135  2132FD   A            SFBIT,P  NVMBBATF           NVH BATTERY FAILURE
      05 00138  3E02     A
      05 0013A  86       A
      05 0013B  77       A
213                                ENDIF
214   05 0013C  3AFBE3   A         IF:      NVNIB,NVMTBACT,NZ     YES,NVM TEST ACTIVE WHEN PWR ON
      05 0013F  A7       A
      05 00140  CA5901   N
215   05 00143  C00000   N            RNVBYT  LOBNVM             YES,RESTORE THE NIBBLE THAT WAS
      05 00146  FF       A
      05 00147  E3       A
216   05 00148  6F       A            MOV     L,A                UNDER TEST WHEN PWR WENT DOWN
217   05 00149  3AFDE3   A            RNVNIB  HIBNVM             TO ITS ORIGINAL VALUE THAT IT
218   05 0014C  F601     A            ANI     X'01'              (INSURES ADDR WITHIN NVM RANGE)
219   05 0014E  C6E2     A            ADI     NVMBASE!+*+-8      HAD BEFORE TESTING THAT LOC
220   05 00150  67       A            MOV     H,A                BY GET THE NIBBLE ADDR THAT WAS
221   05 00151  3AFCE3   A            RNVNIB  SAVEBNIB           UNDER TEST INTO HBL & ITS VALUE
222   05 00154  77       A            MOV     M,A                FROM NVM & THEN STORE SAVE VAL
223   05 00155  AF       A            XRA     A                  SINCE NIB HAS BEEN RESTORED
224   05 00156  32FBE3   A            WNVNIB  NVMTBACT           CLEAR PWR ON DURING TEST FLAG
225                                ENDIF
226   05 00159  3E10     A            MVI     A,X'10'            TEST EACH DATA LINE FOR SHORTS
227   05 0015B  21FFE3   A            LXI     H,NVMBASE!+NVMBLEN!-1  TO EACH OTHER BY ROTATING A '1'
228   05 0015E  0F       A            RRC                        THRU THE NIBBLE AT X'E3FF'
229   05 0015F  DA7001   N         WHILE:   CC,C,C
230   05 00162  77       A            MOV     M,A
231   05 00163  BE       A            IF:     XBYT,A,NE,M        IF MEMORY NOT THE SAME AS THE
      05 00164  CA6C01   N
232   05 00167  47       A               MOV     B,A             A-REG SAVE THE A-REG & SET
233   05 00168  C3A004   N               JMP     IOPBFAIL
234   05 0016B  78       A               MOV     A,B
235                                   ENDIF
236   05 0016C  0F       A            RRC
237   05 0016D  C35F01   N         ENDWHILE
238   05 00170  0604     A            MVI     B,4                # OF LOC RESERVED FOR NVM TEST
239   05 00172  B0       A            ORA     B                  CLEAR Z CONDITION BIT
240                                REPEAT
241   05 00173  CD1E05   N            CALL    TESTBNIB           WITHOUT SETTING THE NVMTBACT
242   05 00176  2B       A            DCX     H                  FLAG
243   05 00177  05       A            DCR     B
244   05 00178  C27301   N         UNTIL:   CC,Z,S               TEST THE 4 NUM RESERVE LOC
245   05 0017B  7C       A         WHILE:   XBYT,H,GE,NVMBASE!+*-8  LOOP FOR ALL NVM LOCATIONS
      05 0017C  FEE2     A
      05 0017E  DAA801   N
246   05 00181  7E       A            MOV     A,M                SAVE NIB IN TEST LOC
247   05 00182  32FCE3   A            WNVNIB  SAVEBNIB           IN SAVEBNIB NVM LOC
248   05 00185  70       A            MOV     A,L
249   05 00186  32FEE3   A            WNVBYT  LOBNVM             SAVE LS BYTE OF TEST ADDR (L)
      05 00189  0F       A
      05 0018A  0F       A
      05 0018B  0F       A
      05 0018C  0F       A
      05 0018D  32FFE3   A
250   05 00190  7C       A            MOV     A,H                FIND MS BYTE OF THE REL TEST
251   05 00191  32FDE3   A            WNVNIB  HIBNVM             ADDR & SAVE IT AS A NIBBLE
252   05 00194  3E01     A            MVI     A,1                SET BIT TO INDICATE THAT THE
253   05 00196  32FBE3   A            WNVNIB  NVMTBACT           TEST ADDR HAS BEEN SAVED
254   05 00199  CD1E05   N            CALL    TESTBNIB           TEST ADDR UNDER TEST
255   05 0019C  3AFCE3   A            RNVNIB  SAVEBNIB           RESTORE ADDR UNDER TEST TO
256   05 0019F  77       A            MOV     M,A                ORIGINAL VALUE
257   05 001A0  AF       A            XRA     A                  CLEAR BIT TO INDICATE TEST ADDR
258   05 001A1  32FBE3   A            WNVNIB  NVMTBACT           CONTENTS HAS BEEN RESTORED
259   05 001A4  2B       A            DCX     H                  DEC TO NEXT TEST LOC
260   05 001A5  C37801   N         ENDWHILE
```

PART II

```
866                      •
867                      •
868                      •         SUBROUTINE TO CHECK NVM FOR STUCK @ '0' & STUCK @'1'
869                      •
870   05 0051E  3E0F     A         TESTBNIB MVI  A,X'0F'          LS NIBBLE = ALL 1'S
871   05 00520  77       A            MOV     M,A                STORE IT IN LOC UNDER TEST
872   05 00521  BE       A            IF:     XBYT,A,EQ,M        DOES MEMORY REMEMBER 1'S
      05 00522  C22C05   N
873   05 00525  BE       A            ANDIF:  XBYT,A,EQ,M        & MEMORY RETAINS AFTER 1ST READ
      05 00526  C22C05   N
874   05 00529  C32F05   N            ELSE:                      ITS OK
875   05 0052C  C3A004   N               JMP     IOPBFAIL
876                                   ENDIF
877   05 0052F  AF       A            XRA     A                  CLEAR A-REG TO
878   05 00530  77       A            MOV     M,A                STORE 0'S IN TEST LOC
879   05 00531  BE       A            IF:     XBYT,A,EQ,M        DOES MEMORY REMEMBER 0'S
      05 00532  C23C05   N
880   05 00535  BE       A            ANDIF:  XBYT,A,EQ,M        & DOES IT RETAIN AFTER A READ
      05 00536  C23C05   N
881   05 00539  C33F05   N            ELSE:                      ITS OK
882   05 0053C  C3A004   N               JMP     IOPBFAIL
883                                   ENDIF
884   05 0053F  C9       A            RET
885                                ENDIF
                                    END
CONTROL SECTION SUMMARY:  01 00000  PT 0    02 00000  PT 0    03 00000  PT 0    04 0FFD8  PT 2
                          05 00540  PT 1
  • NO UNDEFINED SYMBOLS
  • ERROR SEVERITY LEVEL: 0
  • NO ERROR LINES
```

TABLE XVI
ADDRESS WRAP AROUND TEST

```
262
263       *****************************************************************************
264       *
265       *          SELF TEST IOPM - FAILURE OF LOOP 1 TESTS RESULT IN A CPU HALT      *
266       * WITH 'CPU STOP' AND LEDS '1' & '2' ILLUMINATED ON ADVANCED OPERATOR PANEL   *
267       *****************************************************************************
268   05 001A8   21E2E5   A   TST&LP1  LXI    H,STATUS#2-5
269   05 001AB   7E       A            MOV    A,M                         IS I/O SAFE ON
270   05 001AC   07       A            RLC
271   05 001AD   0AB301   N            IFI    CC,C,C                      SHOULD BE ON FROM END OF CKSUM
272   05 001B0   C3A004   N                   JMP    IOP&FAIL
273                                    ENDIF
274   05 001B3   01C1E6   A            LXI    B,SS&BYT
275   05 001B6   AF       A            XRA    A
276   05 001B7   02       A            STAX   B                           TURN OFF I/O SAFE
277   05 001B8   7E       A            MOV    A,M
278   05 001B9   07       A            RLC                                IS I/O SAFE OFF
279   05 001BA   02C001   N            IFI    CC,C,S
280   05 001BD   C3A004   N                   JMP    IOP&FAIL             SHOULD BE OFF
281                                    ENDIF
282   05 001C0   210BFE   A            LXI    H,(MAX&TIME-500)            DELAY 10MS FOR TEST HARDWARE
283   05 001C3   CD8004   N            CALL   V&DELAY
284   05 001C6   3E01     A            MVI    A,1
285   05 001C8   02       A            STAX   B                           TURN ON I/O SAFE
286   05 001C9   210BFE   A            LXI    H,(MAX&TIME-500)
287   05 001CC   CD9004   N            CALL   V&DELAY                     DELAY 10MS FOR TEST HARDWARE
288   05 001CF   CD8804   N            CALL   SAF&PULS                    INCREMENT TEST COUNTER TO 1
289   05 001D2   2E07     A            RIBYT  KYPD#BYT1                   READ ANY INPUT BYTE
      05 001D4   CDC000   N
290   05 001D7   EEAA     A            MODBYT A,XOR,X'AA'
291   05 001D9   5F       A            MOV    E,A
292   05 001DA   CD8804   N            CALL   SAF&PULS                    INCREMENT TEST COUNTER TO 2
293   05 001DD   2E07     A            RIBYT  KYBD#BYT1                   READ ANY INPUT BYTE
      05 001DF   CD0000   N
294   05 001E2   EE55     A            MODBYT A,XOR,X'55'
295   05 001E4   B3       A            MODBYT A,OR,E
296   05 001E5   F5       A            PUSH   PSW                         SAVE FAILED BITS FOR LATER
297                              *
298                              *    RIPPLE THROUGH INPUT MATRIX ADDRESS LINES -READ BACK AND COMPARE
299                              *
300   05 001E6   21E7E5   A            LXI    H,STATUS#2                  POINT TO ADDRESS READ BACK
301                                    REPEAT
302   05 001E9   7E       A            MOV    A,M                         READ L REG BACK
303   05 001EA   AD       A            MODBYT A,XOR,L
304   05 001EB   E6FC     A            IFI    XBYT,A,AND,X'FC',NZ         IS L THE SAME AS READ BACK
      05 001ED   CAF301   N
305                              *                                        2LSB'S DON'T CARE-CK I/O SAFE
306   05 001F0   C3A004   N                   JMP    IOP&FAIL
307                                    ENDIF
308   05 001F3   7D       A            MODBYT L,SUB,X'08'                 MOVE TO NEXT READ BACK LOCATION
      05 001F4   D6C8     A
      05 001F6   6F       A
309   05 001F7   E618     A            MODBYT A,AND,X'18'
310   05 001F9   FE18     A            IFI    XBYT,A,EQ,X'18'             HIC-UP OVER STATUS 1 ADDRESS
      05 001FB   C20202   N
311   05 001FE   7D       A                   MODBYT L,SUB,X'08'
      05 001FF   D6C8     A
      05 00201   6F       A
312                                    ENDIF
313   05 00202   7D       A            UNTIL1 XBYT,L,EQ,STATUS#2&X'FF'    STOP WHEN 32 READS COMPLETE
      05 00203   FEE7     A
      05 00205   C2E901   N
314                              *
315                              *    ADDRESS WRAP AROUND TEST IS COMPLETE
316                              *
318                              *
319                              *    START LAST BYTE OF REFRESH TEST
320                              *
321   05 00208   21FFFF   A            LXIOBYT H,DIG&BYT2
322   05 0020B   3600     A            MVI    M,0
323                                    REPEAT
324   05 0020D   11FFE5   A            LXI    D,STATUS#1
325   05 00210   3202E6   A            REFRESH                            SEND OUT LAST BYTE OF REFRESH
326   05 00213   1A       A            LDAX   D                           PUT STATUS1 READ IN ALL
327   05 00214   BE       A            IFI    XBYT,A,NE,M
      05 00215   CA1802   N
328   05 00218   C3A004   N                   JMP    IOP&FAIL             BYTE OF REFRESH
329                                    ENDIF
330                              *
331                              * THIS PORTION OF THIS IOP TEST CHECKS OUT THE MOVEMENT OF A SELECTED BIT,  *
332                              * DESIGNATED BY THE 3LSB'S OF THE MATRIX ADDRESS, TO D7 LOCATION           *
333                              *
334   05 0021B   0640     A            MVI    B,X'40'                     SET B TO HAVE D6 MASK
335                                    REPEAT
336   05 0021D   1B       A            DCX    D                           USE STATUS1 ADD TO MOVE BIT TO
337                              *                                        D7 LOCATION
338   05 0021E   7E       A            MOV    A,M
339   05 0021F   A0       A            MODBYT A,AND,B                     IS TEST BIT 1 OR 0
340   05 00220   7E       A            MOV    A,M                         GET SHIFTED DATA BACK CONDITION
341                              *                                        CODES NOT EFFECTED
342   05 00221   C22902   N            IFI    CC,Z,S
343   05 00224   E67F     A                   ANI    X'7F'                BIT WAS ZERO, PUT 0 IN D7
344   05 00226   C32B02   N            ELSE1
345   05 00229   F680     A                   ORI    X'80'                BIT WAS 1, PUT 1 IN D7
346                                    ENDIF
347   05 0022B   EB       A            XCHG
348   05 0022C   BE       A            IFI    XBYT,A,NE,M                 DOES MODIFIED OUTPUT EQ INPUT
      05 0022D   CA3302   N
349   05 00230   C3A004   N                   JMP    IOP&FAIL
350                                    ENDIF
```

```
351   05 00233   E8        A        XCHG
352   05 00234   78        A        MOV     A,B
353   05 00235   OF        A        RRC
354   05 00236   47        A        MOV     B,A                                    SHIFT MASKER RIGHT BY 1
355   05 00237   78        A        UNTIL:  XBYT,E,AND,X'07',Z                     UNTIL DO MOVED TO D7 OK
      05 00238   E607
      05 0023A   C21D02    N
356   05 0023D   3AE7E5    A        LOA     STATUS#2                               2LSB'S OF STATUS 2 SHOULD EQUAL
357   05 00240   AE        A        XRA     M                                      LAST BYTE OF REFRESH
358   05 00241   E603      A        IF:     XBYT,A,AND,X'03',NZ
      05 00243   CA4902    N
359   05 00246   C3A004    N                JMP     IOPBFAIL
360                                 ENDIF
361   05 00249   35        A        DCR     M                                      DECREMENT LAST BYTE OF REFRESH
362   05 0024A   C2CD02    N        UNTIL:  CC,Z,S                                 REPEAT 256 TIMES
363
364                            *    LAST BYTE OF REFRESH TEST COMPLETE
365
366                            *    START IOP INTERRUPT TEST
367
```

TABLE XVII
CONTROLLER INTERFACE REFRESH TEST - PART I

```
369                            ************************************************************************
370                            *
371                            *    SELF TEST CONTROLLER INTERFACE - FAILURE OF LOOP 2 TESTS RESULT IN  *
372                            *    A CPU HALT WITH 'CPU STOP' AND LED 3 ILLUMINATED ON ADVANCED OPERATOR PANEL *
373                            *
374                            ************************************************************************

376   05 0024D   CD8804   N    TSTBLP2 CALL   SAFBPULS                              INCREMENT TEST COUNTER TO 3
377   05 00250   21FFFF   A            LXIBBYT H,DIGBBYT2                           TO BE USED AS A COUNTER
378   05 00253   3600     A            MVI    M,0
379   05 00255   1E00     A            MVI    E,0                                   ZERO E REG FOR FAILED BIT STORE
380
381                            *      START LAST BYTE OF REFRESH TEST
382
383                                   REPEAT
384   05 00257   3202E6   A              REFRESH
385   05 0025A   E5       A              PUSH    H
386   05 0025B   2E8F     A              RIBYT   ILK#81#
      05 0025D   CD0000   N
387   05 00260   E1       A              POP     H
388   05 00261   2F       A              CMA
389   05 00262   AE       A              MODBYT  A,XOR,M                            IS READBACK SAME AS OUTPUT
390   05 00263   63       A              MODBYT  E,OR,A                             OR IN FAILED BITS
      05 00264   5F
391   05 00265   35       A              DCR     M                                  DECREMENT LAST BYTE OF REFRESH
392   05 00266   C25702   N          UNTIL:  CC,Z,S                                 GO AROUND LOOP 256 TIMES
393
394                            *      LAST BYTE OF REFRESH TEST COMPLETE
395
396                            *      START ADDRESS WRAP AROUND TEST
397
398   05 00269   CD8804   N          CALL    SAFBPULS                               INCREMENT TEST COUNTER TO 4
399   05 0026C   2E07     A          MVI     L,X'07'                                PRESET L WITH LOWEST MATRIX ADD
400                                  REPEAT
401   05 0026E   CD0000   N              RIBYT   L                                  READ INPUT BYT WITH ADDRESS
402                            *                                                    EQUAL TO E4+CONTENTS OF L REG
403   05 00271   AD       A              MODBYT  A,XOR,L                            IS READBACK EQUAL TO ADDRESS
404   05 00272   B3       A              MODBYT  E,OR,A                             OR IN ADDITIONAL FAILED BITS
      05 00273   5F
405   05 00274   7D       A              MODBYT  L,SUB,8                            MOVE TO NEXT VALID ADDRESS
      05 00275   0608
      05 00277   6F
406   05 00278   FE07     A          UNTIL:  XBYT,A,EQ,X'07'                        COMPLETE 32 INPUT MATRIX READS
      05 0027A   C26E02   N
407
408                            *      ADDRESS WRAP AROUND TEST COMPLETE
409
```

PART II

```
411
412                            *      DECIDE WHICH PWB FAILED IF ANY
413                                                                                 GET FAILED BITS FROM STORAGE
414   05 0027D   7B       A          MOV     A,E                                    DID SOMETHING IN LOOP 2 FAIL
415   05 0027E   A7       A          IF:     VBYT,A,NZ
      05 0027F   CA9802   N
416   05 00282   F1       A              POP     PSW                                YES, SAME BITS FAIL AS AA-55 TS
417   05 00283   F5       A              PUSH    PSW                                KEEP PUSH POP SEQUENCE OK
418   05 00284   2F       A              CMA
419   05 00285   A3       A              MODBYT  A,AND,E
420   05 00286   C29502   N              IF:     CC,Z,S                             ZERO IF SAME BITS AS LOOP 1
421   05 00289   7B       A              ANDIF1  XBYT,E,NE,X'FF'                    DID ALL BITS FAIL BOTH TESTS
      05 0028A   FEFF
      05 0028C   CA9502   N
422   05 0028F   C3A004   N                  JMP     IOPBFAIL                       COUPLER ON IOP BAD
423   05 00292   C39802   N              ELSE:
424   05 00295   C3D704   N                  JMP     CTLINTBF                       CONTROLLER INTERFACE BAD
425                                      ENDIF
426   05 00298   C3A002   N          ELSE:
427   05 0029B   F1       A              POP     PSW                                GET LOOP 1 INFO
428   05 0029C   F5       A              PUSH    PSW                                KEEP PUSH POP SEQUENCE OK
429   05 0029D   C2D704   N              JNZ     CTLINTBF                           IF ANY LOOP 1 BITS BAD MUST
430                            *                                                    BE CONTROLLER INTERFACE TEST
431                            *                                                    CIRCUITRY BAD
432                                  ENDIF
```

```
433   05 002A0   F1         A    *   POP       PSW                  DID LOOP 1 HAVE TROUBLE WITH
434                              *                                  CONSTANTS SUPPLIED BY LOOP 2
435                              *                                  YES BUT OTHER LOOP 2 TESTS
436                              *                                  PASSED SO TEST HARDWARE ON
437                              *                                  CONTROLLER INTFRFACE BAD
438   05 002A1   CD0704     N        JNZ       CTLINT#F
439   05 002A4   AF         A        XRA       A
440   05 002A5   3201E6     A        STA       SS#BYT               TURN OFF IO SAFE
441                              *                                  ENABLE WATCHDOG
442   05 002A8   210BFE     A        LXI       H,(MAX#TIME-500)
443   05 002AB   CD8004     N        CALL      V#DELAY              DELAY 10MS TO PESET TST CNTR
```

TABLE XVIII

```
445                              ********************************************************************
446                              *
447                              *  LOOP 3 SELF TEST VERIFIES DATA TRANSMISSION TO THE DIGIT DISPLAY
448                              *
449                              ********************************************************************
450   05 002AE   21FFFF     A    TST@LP3 LXI0BYT   H,DIG#PYT2       SET UP OUTPUT COUNTER
451   05 002B1   AF         A        XRA       A
452   05 002B2   77         A        M0V       M,A                  SET UP OUTPUT MEMORY AS COUNTER
453   05 002B3   11D8FF     A        LXI0BYT   D,LP4#BYT
454   05 002B6   12         A        STAX      D
455   05 002B7   3C         A        INR       A
456   05 002B8   13         A        INX       D                    MOVE TO COMPLEMENT ENABLE
457   05 002B9   12         A        STAX      D                    ENABLE FRONT PANEL REMOTE
458   05 002BA   1E00       A        MVI       E,0
459                              *    REPEAT
460   05 002BC   3202E6     A            REFRESH
461   05 002BF   E5         A            PUSH      H
462   05 002C0   2E4F       A            RI0YT     DIG#BYT1         READ LOOP 3 WRAP AROUND
      05 002C2   C00000     N
463   05 002C5   E1         A            POP       H
464   05 002C6   2F         A            CMA                        INPUTS INVERTED
465   05 002C7   AE         A            XRA       M                IS READ BACK SAME AS OUTPUT
466   05 002C8   B3         A            M0DBYT    E,OR,A           SAVE FAILED BITS IN E REG
      05 002C9   5F         A
467   05 002CA   35         A            DCR       M                DECREMENT OUTPUT COUNTER
468   05 002CB   C2BC02     N        UNTIL:    CC,Z,S               REPEAT 256 TIMES
469   05 002CE   7B         A        MOV       A,E
470   05 002CF   A7         A        ANA       A                    SET CONDITION CODES
471   05 00200   C2A604     N        JNZ       MNPL#CK              LOOP 3 BAD USE DISPLAY
```

TABLE XIX

```
473                              ********************************************************************
474                              *
475                              *  LOOP 4 STATIC TEST VERIFIES DATA TRANSMISSION TO THE REMOTE MODULES
476                              *
477                              ********************************************************************
478   05 002D3   210BFF     A        LXI0BYT   H,LP4#BYT
479   05 002D6   3600       A        MVI       M,0                  SET UP WRAP ARROUND AS COUNTER
480   05 002D8   1E00       A        MVI       F,0                  ZERO E REG FOR FAILED BIT STORE
481                              *    REPEAT
482   05 002DA   7E         A            M0V       A,M
483   05 002DB   23         A            INX       H                MOVE TO COMPLEMENT BYTE
484   05 002DC   2F         A            CMA
485   05 002DD   77         A            M0V       M,A              PUT COMPLEMENT IN MEMORY
486   05 002DE   2B         A            DCX       H                GO BACK TO ORIGINAL OUTPUT BYTE
487   05 002DF   3202E6     A            REFRESH
488   05 002E2   E5         A            PUSH      H
489   05 002E3   2EF7       A            RI0YT     REM#RET          READ WRAP AROUND
      05 002E5   C00000     N
490   05 002E8   E1         A            POP       H
491   05 002E9   AE         A            XRA       M                DOES INPUT AND OUTPUT MATCH
492   05 002EA   B3         A            M0DBYT    E,OR,A           SAVE FAILED BITS
      05 002EB   5F         A
493   05 002EC   35         A            DCR       M
494   05 002ED   C20A02     N        UNTIL:    CC,Z,S               REPEAT 256 TIMES
495   05 002F0   7B         A        M0V       A,E
496   05 002F1   E60F       A        M0DBYT    A,AND,RECAP          RECAP OUTPUT NOT CHECKED
497                              *
498                              *   IF LOOP 3 AND OR LOOP 4 FAILS DECIDE WHICH PWB AT FAULT
499                              *
500                              *       CONDITION CODES LEFT FROM PREVIOUS OPERATION
501                              *
502   05 002F3   47         A        M0V       B,A                  SAVE LOOP 4 FAILURES
503   05 002F4   CD0000     N        RNVBYT    NVSERV;1             DID RUNNING LOOP 4 TEST FAIL
      05 002F7   59         A
      05 002F8   E3         A
504   05 002F9   B0         A        M0DBYT    B,OR,A               OR STATIC DYNAMIC FAULT
      05 002FA   47         A
505   05 002FB   3231FD     A        STAFBYT   SERV;1               TELL FAULT HANDLER
506   05 002FE   2108FF     A        LXI0BYT   H,LP4#BYT
507   05 00301   A7         A        IF:       V8YT,A,NZ            ARE FAULTS PRESENT
      05 00302   CA1C03     N
508   05 00305   E6C1       A            IF:   XBYT,A,AND,X'01',Z   IS DO BAD
      05 00307   C21203     N
509   05 0030A   36C1       A                MVI       M,X'01'      ENABLE REMOTE DO ONLY
510                              *                                  TO USE DIGIT DISPLAY
511   05 0030C   23         A                INX       H
512   05 0030D   3600       A                MVI       M,0
513   05 0030F   C31903     N            ELSE:
514   05 00312   05         A                DCR       B
515   05 00313   C20004     N                JNZ       MTX#FAIL     MORE THAN ONE BIT BAD
516                              *                                  MUST BE MATRIX
517   05 00316   C39904     N            *       JMP       MNPLI#F  MAIN PANEL TO POARD FAILED
518                              *                                  LOOP 4 RUNNING TEST
519                              *        ENDIF
```

```
520    05 00319    C32103    N            ELSE:
521    05 0031C    36AA      A                    MVI      M,X'AA'              INITIALIZE LOOP 4 TEST BITS
522    05 0031E    23        A                    INX      H
523    05 0031F    3655      A                    MVI      M,X'55'
524                                       ENDIF
```

```
576                           * THE LOOP 4 SELF TEST VERIFIES DATA TRANSMISSION TO THE REMOTE MODULES
577                           * USING THE WRAP AROUND BIT FROM EACH REMOTE. ANY BIT MUST FAIL TWICE IN
578                           * A ROW TO CAUSE MACHINE SHUTDOWN.
579                           * THIS TEST IS EXECUTED ONCE EVERY 100MS IN ALL STATES
```

```
581    05 00391    3A31FD    A    TST@LP4   LDAFBYT   SERV:1                IS FAULT BEING DISPLAYED
582    05 00394    A7        A              IF:       VBYT,A,Z
       05 00395    C2CA03    N
583    05 00398    2EF7      A                        RIBYT     REM#RET      READ REMOTE WRAP AROUND INPUTS
       05 0039A    C00000    N
584    05 0039D    21D8FF    A                        LXI@BYT   H,LP4$BYT    POINTER TO WRAP AROUND OUTPUTS
585    05 003A0    AE        A                        XRA       M            LOOK FOR DIFFERENCE BETWEEN
586                                                                          INPUTS AND OUTPUTS
587    05 003A1    1168FA    N                        LXI       D,LP4@PREV   POINTER TO PREVIOUS FAULTS
588    05 003A4    E6DF      A                        MOOBYT    A,AND,RECAP  RECAP OUTPUT NOT CHECKED
589    05 003A6    EB        A                        XCHG
590    05 003A7    CAC003    N                        IF:       CC,Z,C       ANY BITS DIFFERENT
591    05 003AA    47        A                            MOV   B,A          WERE FAILED BITS SAME AS
592    05 003AB    A6        A                            ANA   M            LAST TEST
593    05 003AC    70        A                            MOV   M,B          SAVE NEW FAILED BITS
594    05 003AD    CABD03    N                            IF:   CC,Z,C       SAME BIT(S) FAILED TWICE IN ROW
595    05 003B0    3258E3    A                                WNVBYT NVSERV:1 REMEMBER FAILED BITS
       05 003B3    0F        A
       05 003B4    0F        A
       05 003B5    0F        A
       05 003B6    0F        A
       05 003B7    3259E3    A
596    05 003BA    C30F00    N                                JMP    SEC@STRT   GO BACK AND DO SELF TESTS
597                           *
598                           *         SEC@STRT ROUTINE DISABLES INTERUPTS CAUSING THE REMOTE WATCHDOG
599                           *         TIMERS TO TURN OFF ALL OUTPUT BITS
600                           *         ALL SELF TESTS WILL BE EXECUTED TO DETERMINE THE ORIGIN OF FAILURE
601                           *
602                                                        ENDIF
603    05 003BD    C3CA03    N                     ELSE:
604    05 003C0    77        A                         MOV      M,A            ZERO PREVIOUS READ FAILURES
605    05 003C1    EB        A                         XCHG                    HL POINTS TO ENABLE BYTE
606    05 003C2    F3        A                         DI
607    05 003C3    7E        A                         MOV      A,M            OUTPUT BYTES
608    05 003C4    2F        A                         CMA                     1 & 2
609    05 003C5    77        A                         MOV      M,A            LOOP 4 TEST PASSED SET-
610    05 003C6    23        A                         INX      H              UP FOR NEXT TIME THRU
611    05 003C7    2F        A                         CMA
612    05 003C8    77        A                         MOV      M,A
613    05 003C9    FB        A                         EI
614                                                 ENDIF
615                                       ENDIF
616    05 003CA    C9        A            RET
```

TABLE XX

MISC. ROUTINES

```
734                           *
735                           *         WASTE TIME SUBROUTINE.
736                           *         TIME WASTED =(65536-HL)*20USEC
737                           *         DESTROYS DE&HL RP AND LEAVES CC CARRY=1
738                           *
739           0000FFFF              MAX@TIME  EQU   X'FFFF'
740                                 *
741    05 00480    110100    A      V@DELAY   LXI   D,X'0001'
742                                           REPEAT
743    05 00483    87        A                     ORA    A                     WASTE TIME, CLEAR CARRY
744    05 00484    87        A                     ORA    A
745    05 00485    7F        A                     MOV    A,A                   WASTE TIME
746    05 00486    19        A                     DAD    D                     INCREMENT H&L UTIL IT OVERFLOWS
747    05 00487    D28304    N                     UNTIL: CC,C,S
748    05 0048A    C9        A                     RET
749                           *
750                           *         ROUTINE TO PULSE I/O SAFE LINE FROM SAFE ON-OFF-ON
751                           *
752    05 C048B    2101E6    A      SAF@PULS  LXI   H,SS@BYT
753    05 0048E    3600      A                MVI   M,0                         TURN OFF I/O SAFE
754    05 00490    3601      A                MVI   M,1                         TURN ON I/O SAFE
755    05 00492    C9        A                RET
756                           *
757                           *         STOP ON ANY CPUM BOARD FAILURE
758                           *
759    05 00493    3E07      A      CPU@FAIL  MVI   A,NONE&LED1
760    05 00495    3201E6    A                STA   SS@BYT                      SET FAULT FLIP/FLOP
761    05 00498    76        A                HLT
762                           *
763                           *         STOP ON MAIN PANEL IO FAILURE
764                           *
```

```
765    05 00499    F3        A    MNPLIOOF DI
766    05 0049A    3E01      A             MVI      A,NONE&LED1&LED2&LED3         TURN ON LEDS
767    05 0049C    3203E6    A             STA      SS&BYT+2
768    05 0049F    76        A             HLT
769                                *
770                                *     STOP ON ANY IOPM FAILURE
771                                *
772    05 004A0    3E03      A    IOPOFAIL MVI      A,NONE&LED1&LED2              * TURN ON LEDS
773    05 004A2    3201E6    A             STA      SS&BYT                        * SET FAULT FLIP/FLOP
774    05 004A5    76        A             HLT
775                                *
776                                *     BLINK DISPLAY TO DETERMINE IF MATRIX OR MAIN PANEL BOARD BAD
777                                *
778    05 004A6    3E0C      A    MNPLBCK  MVI      A,X'0C'
779    05 004A8    32F0FF    A             STA&BYT  DSPL&DIG                      ENABLE THOUS/HUND DIGITS
780    05 004AB    AF        A             XRA      A
781    05 004AC    36AA      A             MVI      M,X'AA'                       PUT A'S IN DISPLAY
782    05 004AE    CDB904    N             CALL     LOOPS
783    05 004B1    3655      A             MVI      M,X'55'                       PUT 5'S IN DISPLAY
784    05 004B3    CDB904    N             CALL     LOOPS
785    05 004B6    C3A604    N             JMP      MNPLBCK                       GO AROUND FOFEVER
786                              LOOPS     REPEAT
787    05 004B9    3202E6    A             REFRESH
788    05 004BC    E5        A             PUSH     H
789    05 004BD    F5        A             PUSH     PSW                           SAVE LOOP COUNTER
790    05 004BE    2E4F      A             RIBYT    DIG#BYT1                      READ LOOP 3 FOR SCOPE TEST
       05 004C0    CDC000    N
791    05 004C3    F1        A             POP      PSW
792    05 004C4    2198FF    A             LXI      H,(MAXBTIME-100)              DELAY 2MS
793    05 004C7    CD8004    N             CALL     V&DELAY
794    05 004CA    E1        A             POP      H
795    05 004CB    3D        A             DCR      A
796    05 004CC    C2B904    N             UNTIL1   CC,Z,S                        GO AROUND 256 TIMES
797    05 004CF    C9        A             RET
798                                *
799                                *     STOP ON INPUT MATRIX BOARD FAILURE
800                                *
801    05 004D0    F3        A    MTX&FAIL DI
802    05 004D1    3E09      A             MVI      A,NONE&LED2&LED3              TURN ON LEDS
803    05 004D3    3203E6    A             STA      SS&BYT+2
804    05 004D6    76        A             HLT
805                                *
806                                *     STOP ON CONTROLLER INTERFACE BOARD FAILURE
807                                *
808    05 004D7    F3        A    CTLINTOF DI
809    05 004D8    2101E6    A             LXI      H,SS&BYT
810    05 004DB    3600      A             MVI      M,0                           ENABLE WATCHDOG
811    05 004DD    23        A             INX      H
812    05 004DE    23        A             INX      H                             MOVE TO SPARE IOP WRITE ADDR
813    05 004DF    360D      A             MVI      M,NONE&LED3                   TURN ON LEDS
814    05 004E1    76        A             HLT
815                                *
816                                *     THIS CONTROLLER INTERFACE PWB FAILURE WILL ILLUMINATE 'CPU STOP' AND '4' ON
817                                *     ADVANCED OPERATOR LEDS
818                                *
```

Figure 40A:
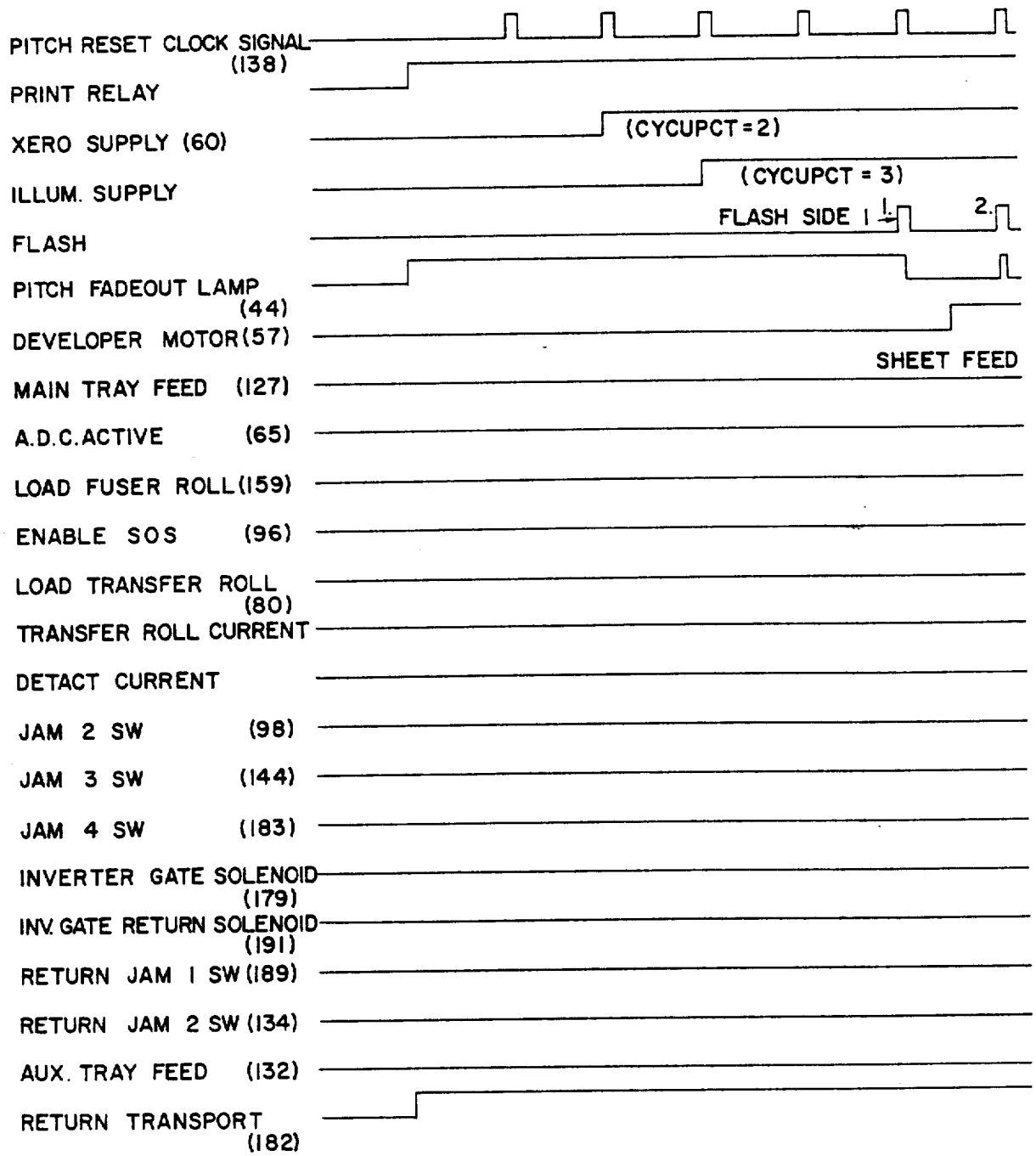
Figure 40C:
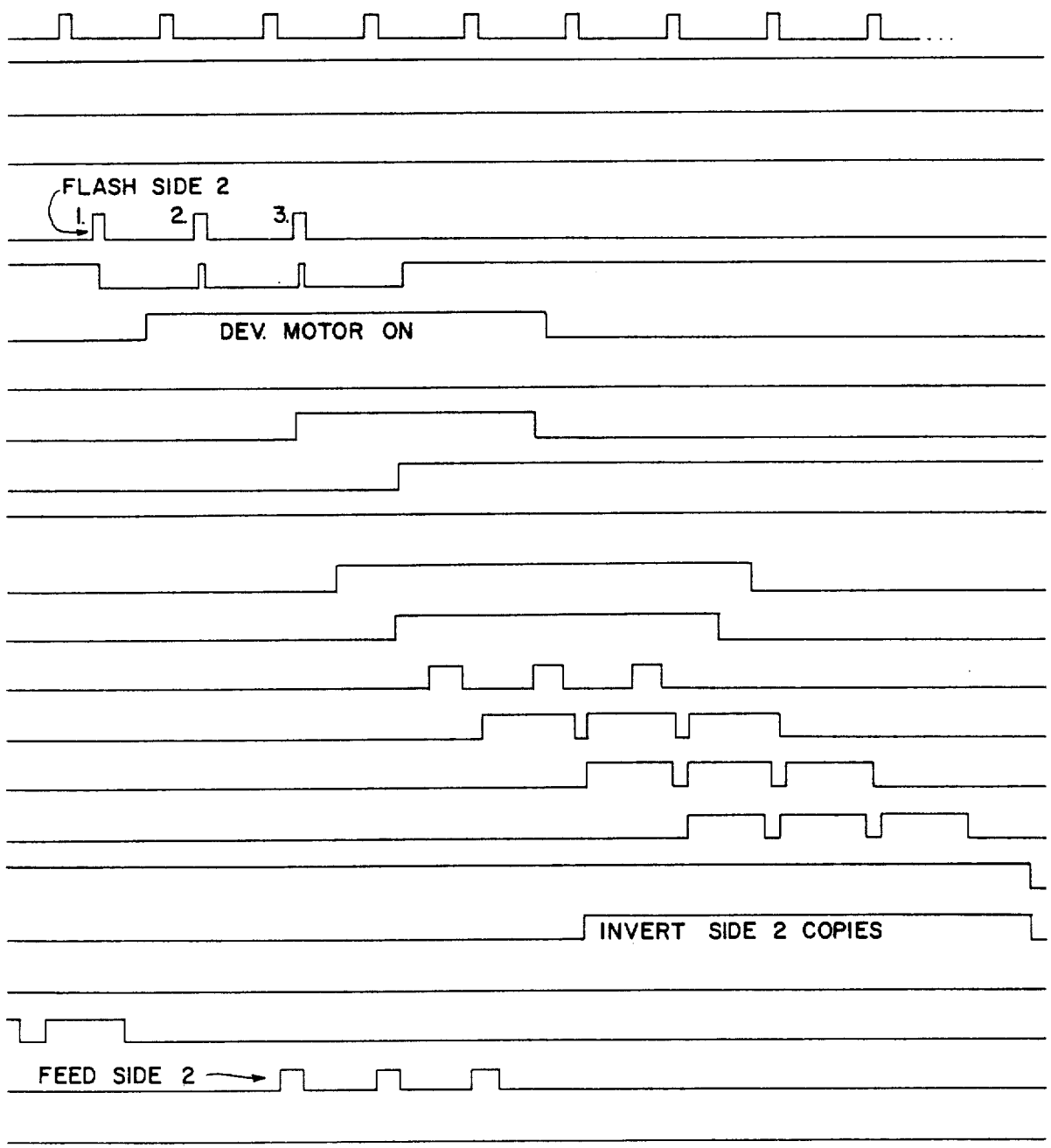

Referring particularly to the timing chart shown in FIG. 40, an exemplary copy run wherein three copies of each of two simplex or one-sided originals in duplex mode is made. Referring to FIG. 32, the appropriate button of copy selector 808 is set for the number of copies desired, i.e. 3 and document handler button 822, sorter select button 825 and two sided (duplex) button 811 depressed. The originals, in this case, two simplex or one-sided originals are loaded into tray 233 of document handler 16 (FIG. 14) and the Print button 805 depressed. On depression of button 805, the host machine 10 enters the PRINT state and the Run Event Table for the exemplary copy run programmed is built by controller 18 and stored in RAM section 546. As described, the Run Event Table together with Background routines serve, via the multiple interrupt system and output refresh (through D.M.A.) to operate the various components of hose machine 10 in integrated timed relationship to produce the copies programmed.

During the run, the first original is advanced onto platen 35 by document handler 16 where, as seen in FIG. 41, three exposures (1ST FLASH SIDE 1) are made producing three latent electrostatic images on belt 20 in succession. As described earlier, the images are developed at developing station 28 and transferred to individual copy sheets fed forward (1ST FEED SIDE 1) from main paper tray 100. The sheets bearing the images are carried from the transfer roll/belt nip by vacuum transport 155 to fuser 150 where the images are fixed. Following fusing, the copy sheets are routed by deflector 184 (referred to as an inverter gate in the tables) to return transport 182 and carried to auxiliary tray 102. The image bearing sheets entering tray 102 are aligned by edge pattern 187 in preparation for refeeding thereof.

Following delivery of the last copy sheet to auxiliary tray 102, the document handler 16 is activated to remove the first original from platen 35 and bring the second original into registered position on platen 35. The second original is exposed three times (FLASH SIDE 2), the resulting images being developed on belt 20 at developing station 28 and transferred to the opposite or second side of the previously processed copy sheets which are now advanced (FEED SIDE 2) in timed relationship from auxiliary tray 102. Following transfer, the side two images are fused by fuser 150 and routed, by gate 184 toward stop 190, the latter being raised for this purpose. Abutment of the leading edge of the copy sheet with stop 190 causes the sheet trailing edge to be guided into discharge chute 186, effectively inverting the sheet, now bearing images on both sides. The inverted sheet is fed onto transport 181 and into an output receptacle such as sorter 14 where, in this example, the sheets are placed in successive ones of the first three trays 212 of either the upper of lower arrays 210, 211 respectively depending on the disposition of deflector 220.

Other copy run programs, both simplex and duplex with and without sorter 14 and document handler 16 may be envisioned.

Figure 42A:
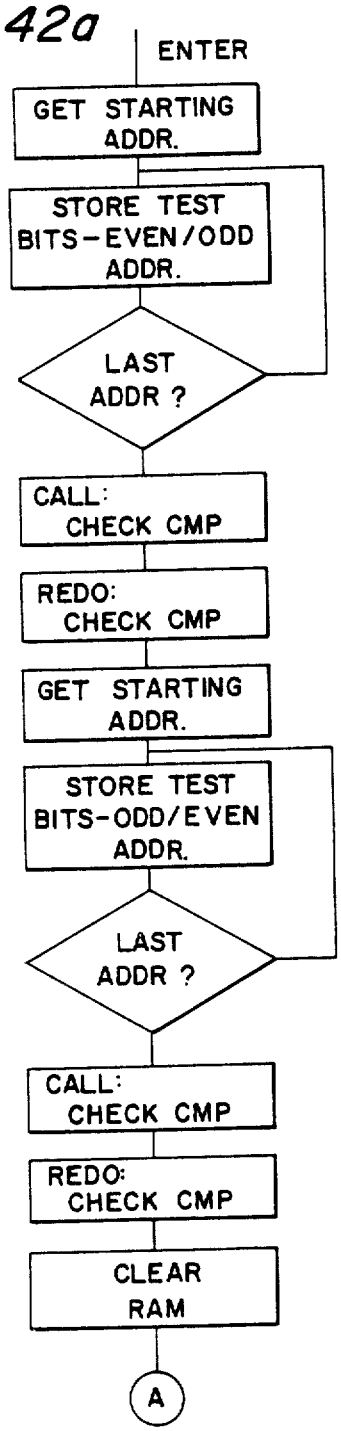
Figure 44A:
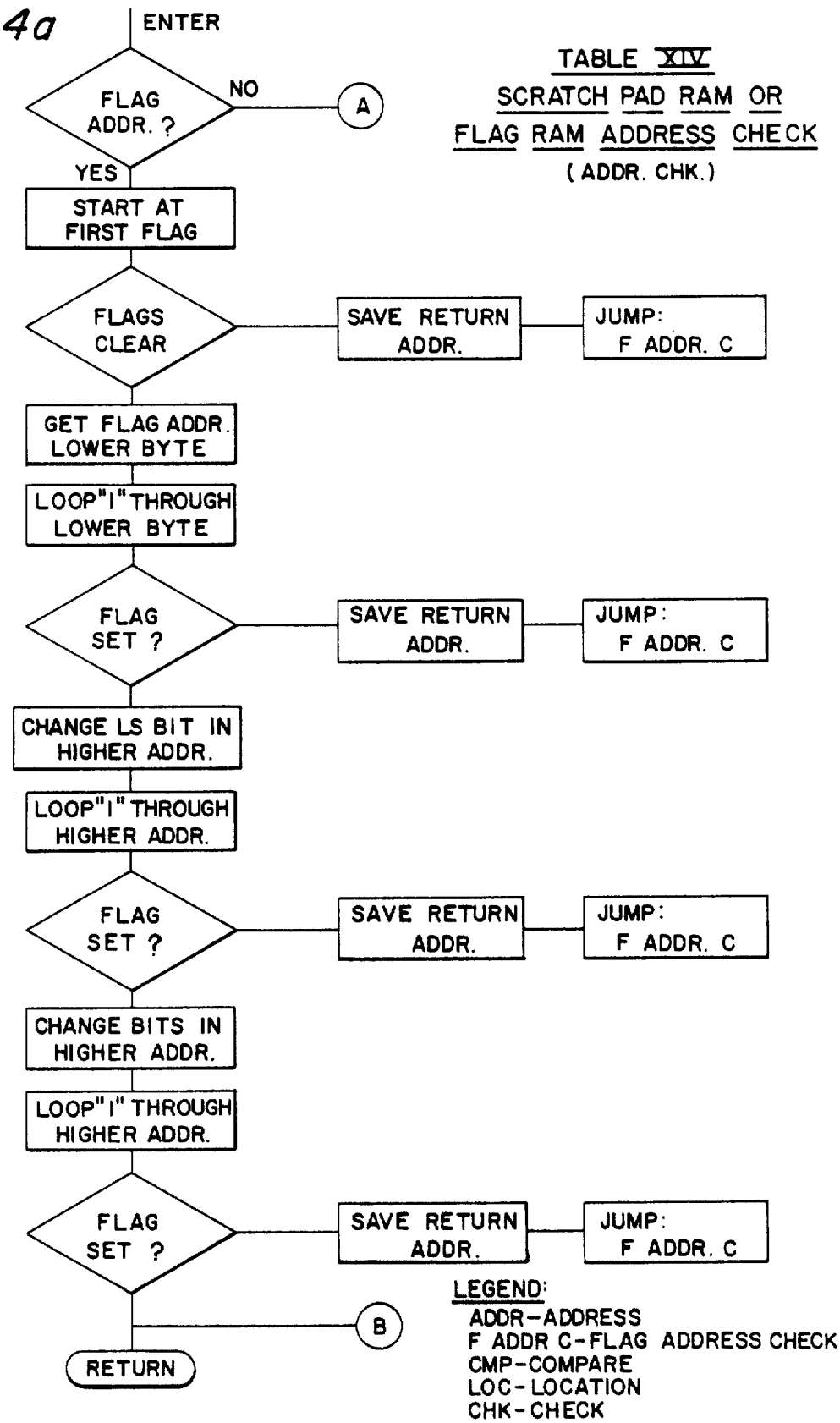
FIGS. 44a and 44b are a flow chart showing the ram address check routine.
Figure 44B:
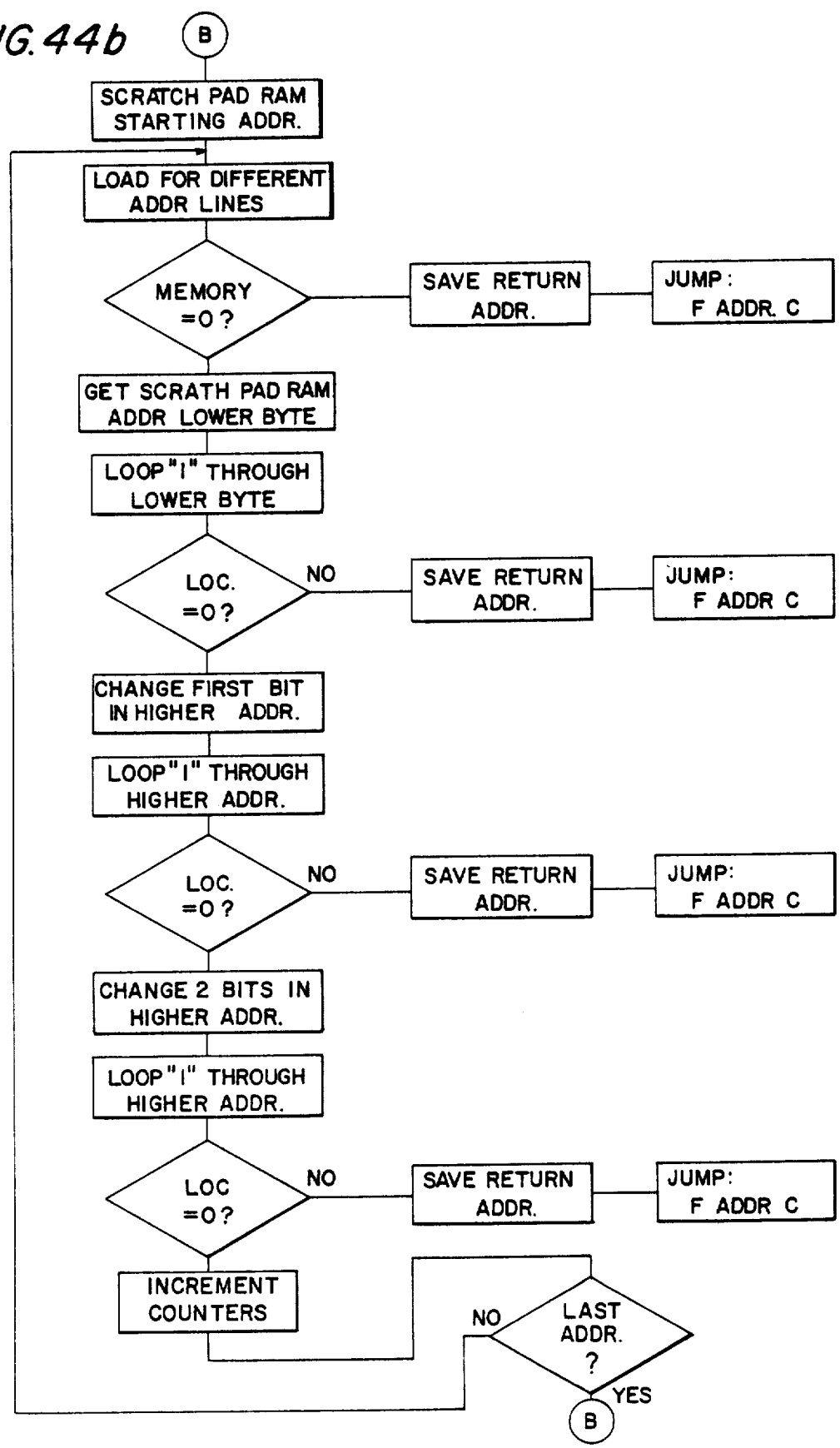
Figure 45:
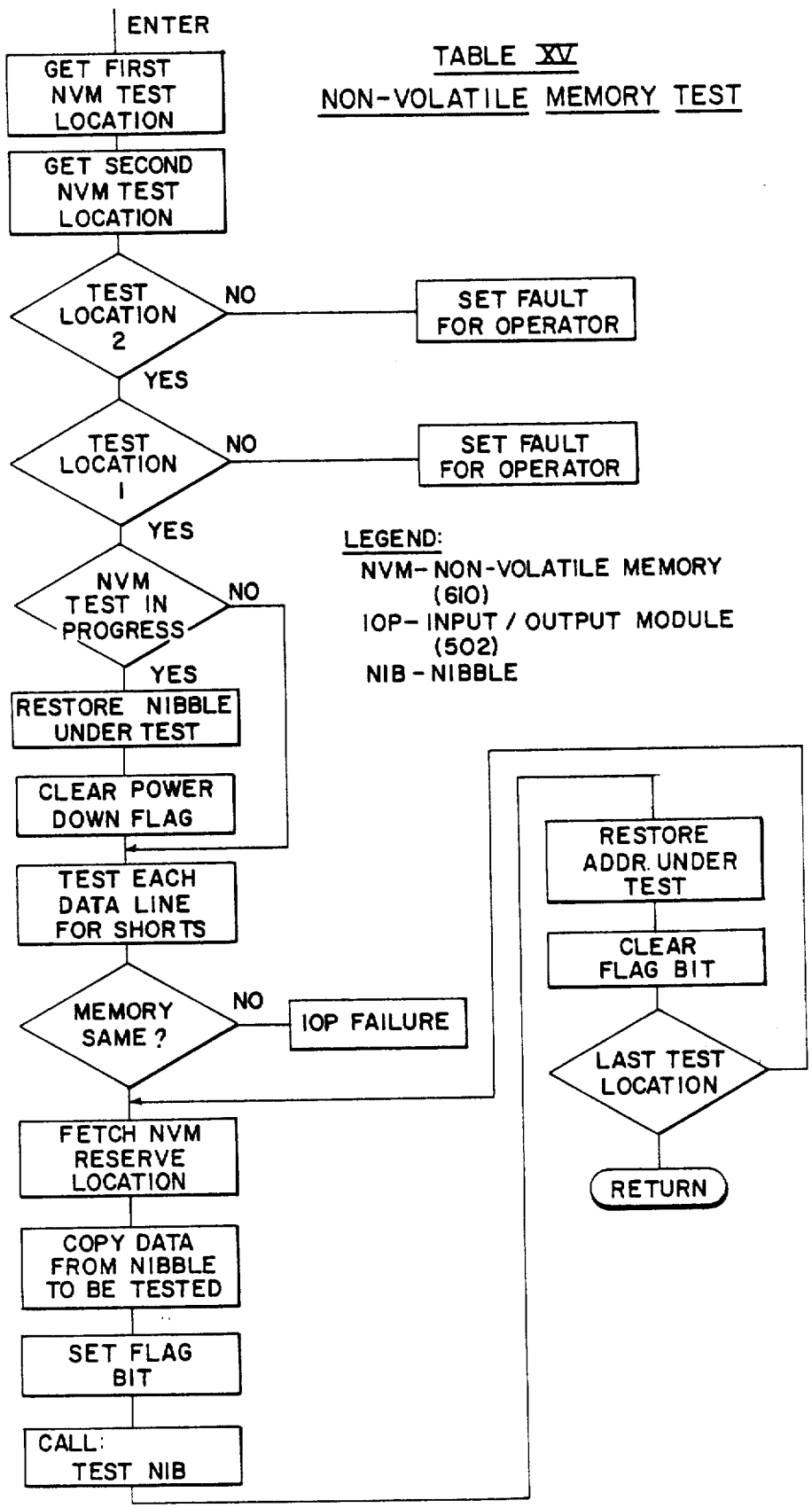
FIG. 45 is a flow chart showing the non-volatile memory test routine.
Figure 46B:
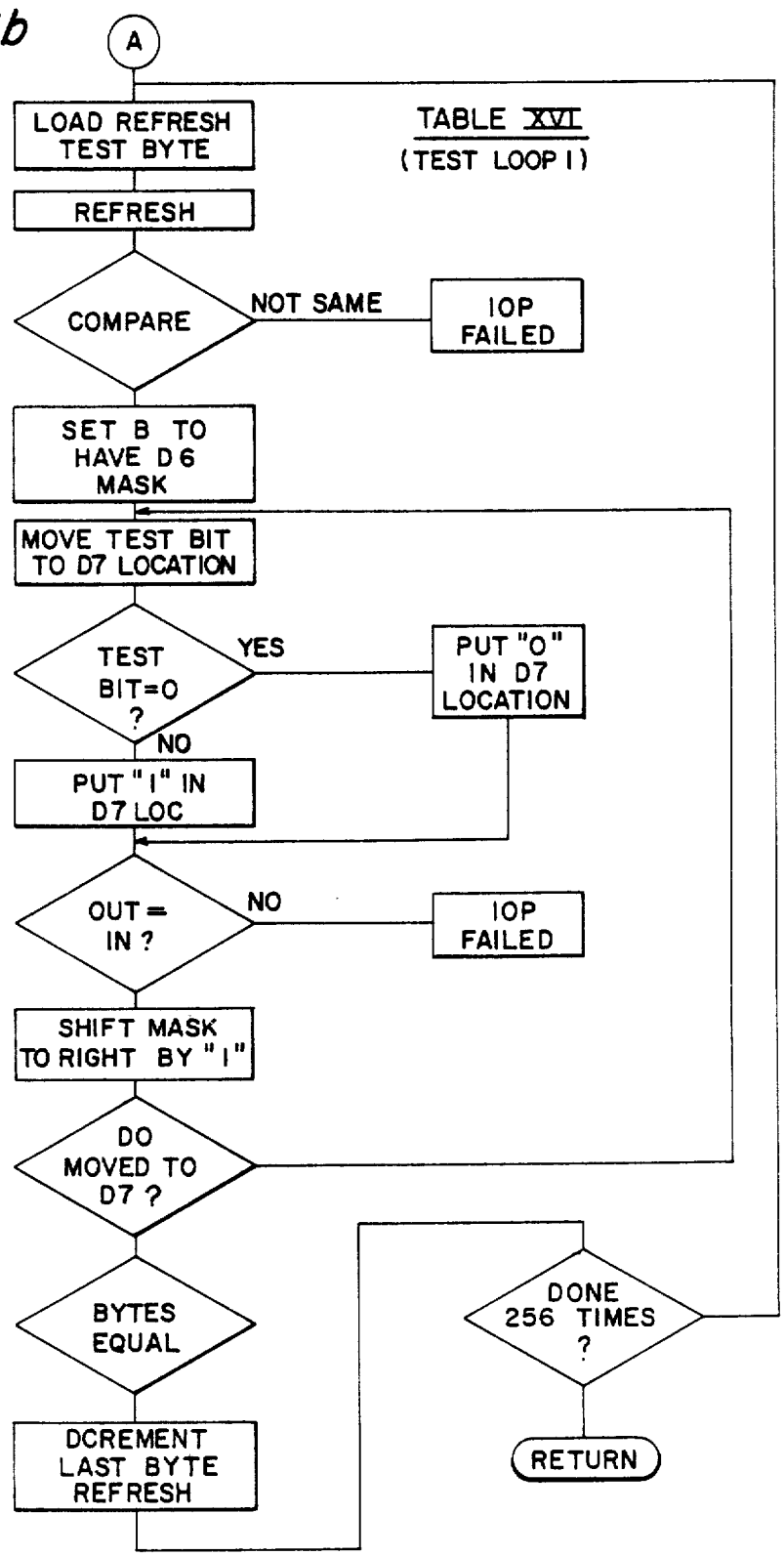
Figure 47B:
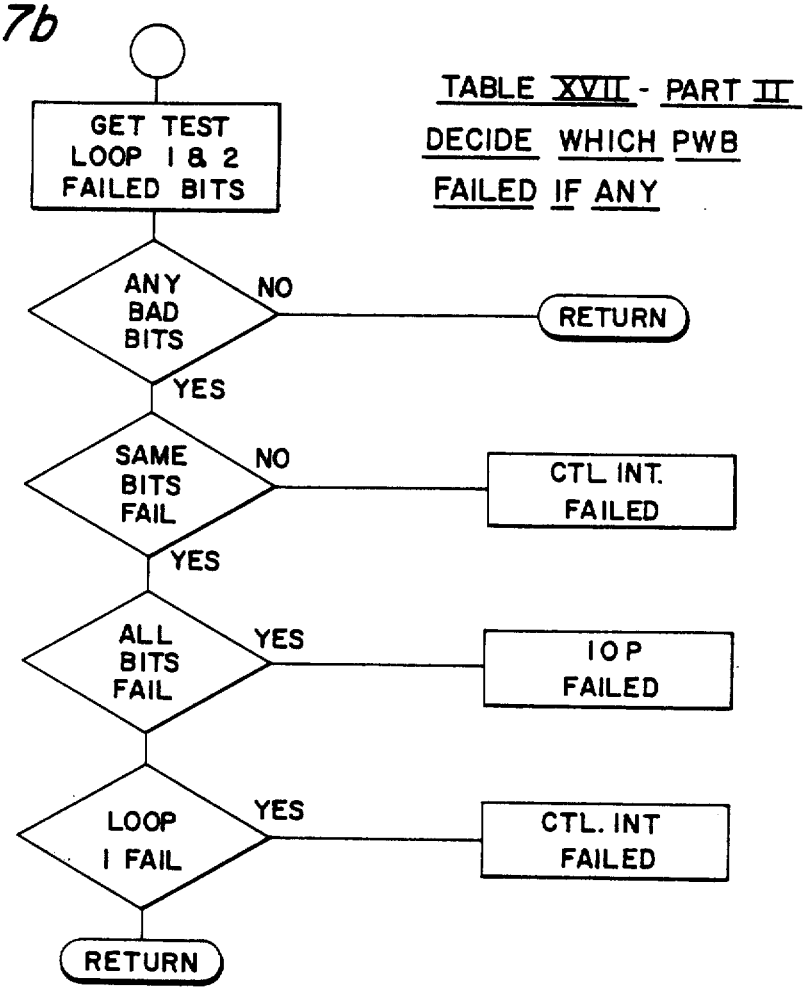
Figure 48:
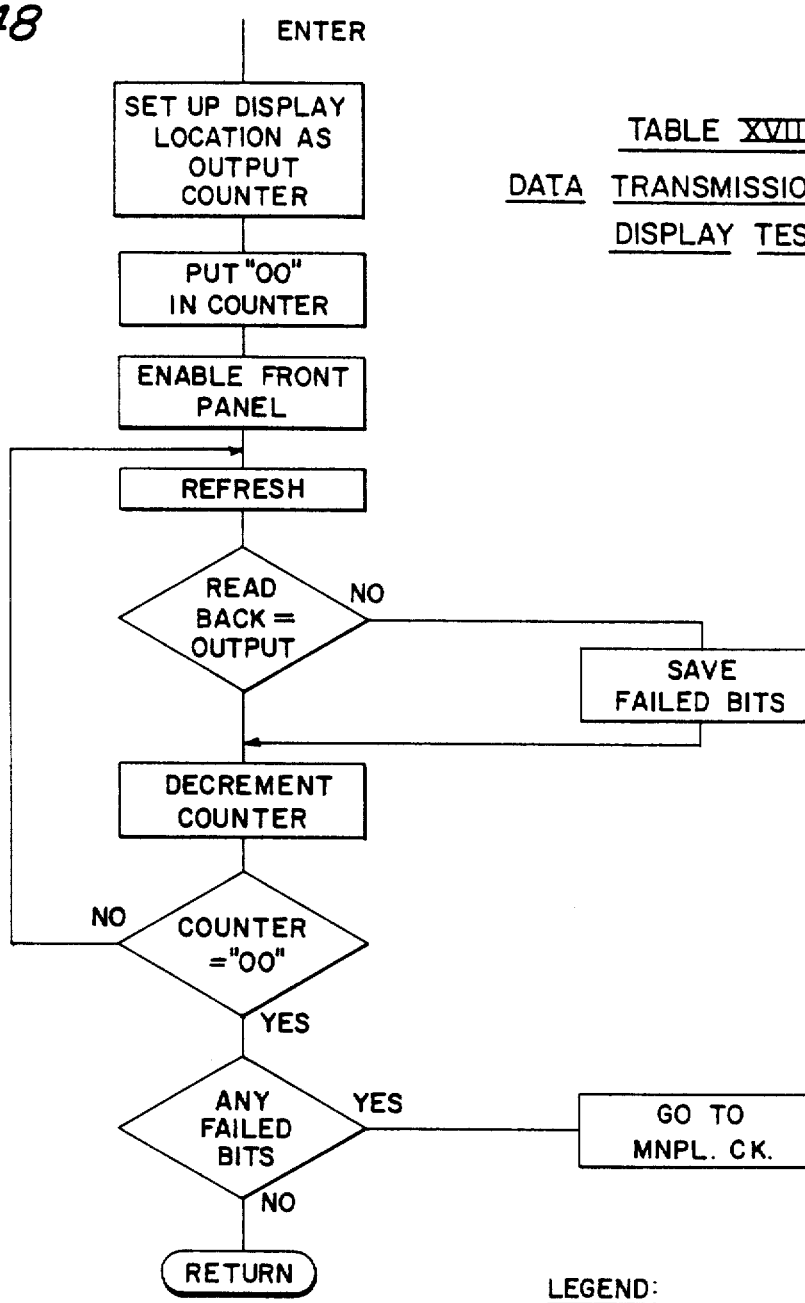
FIG. 48 is a flow chart showing the data transmission to digit display test routine.
Figure 49B:
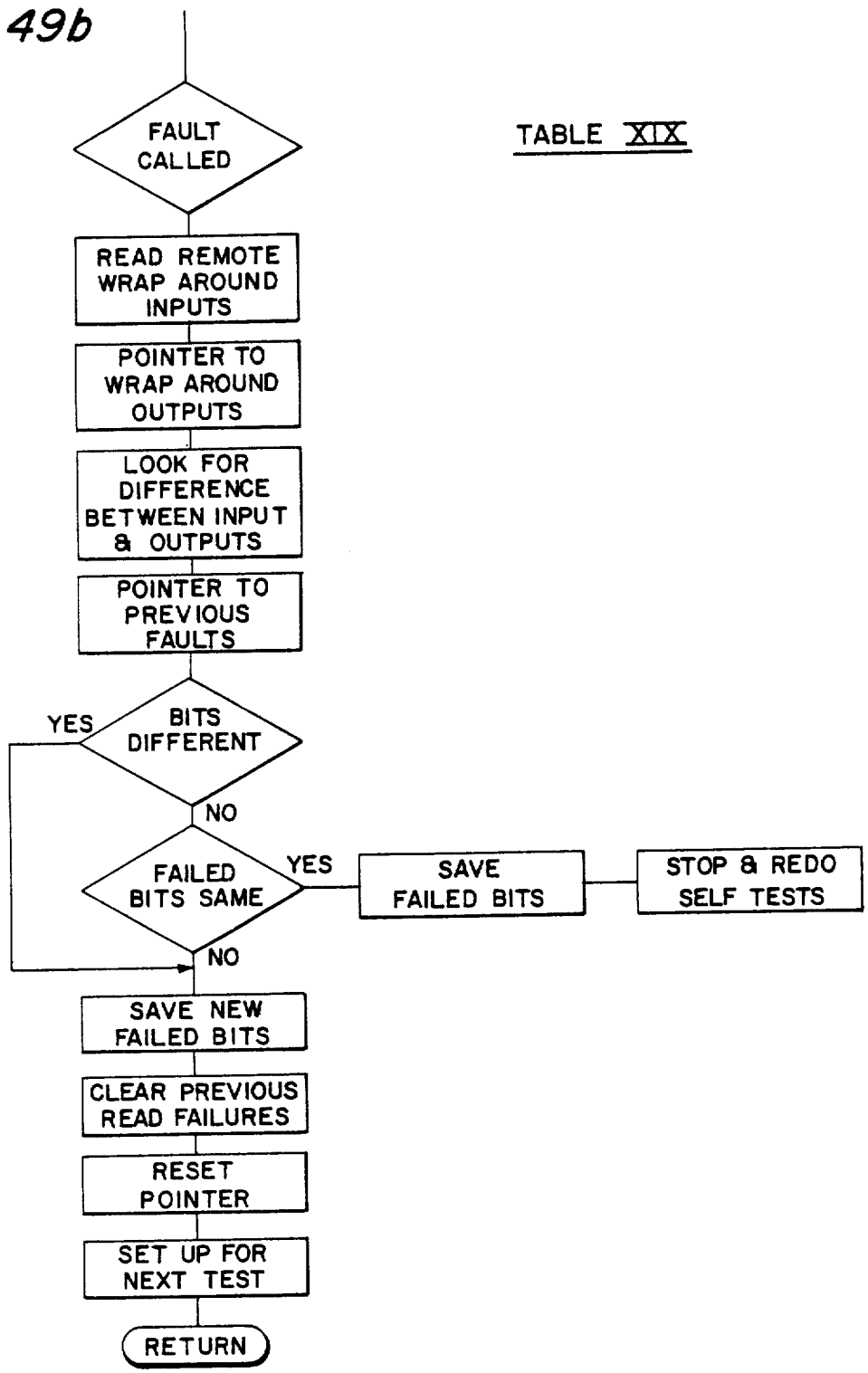
FIG. 49 is a flow chart showing the data transmission verification to remote modules routine.

In the reproduction system 10, certain self test routines are provided to check operation of the system controls, memories, and data and address lines. These include Static Self Tests comprising Memory Check Sum Test (Table XI, FIG. 41); RAM Memory Test (Tables XII, XIII, XIV, and FIGS. 42,43,44); Non-Volatile Memory (NVM) Test (Table XV, FIG. 45); Address Wrap Around Test (Table XVI, FIG. 46); Controller Interface Refresh Test (Table XVII, FIG. 47); and Data Transmission to Digit Display Test (Table XVIII, FIG. 48). A Data Transmission to Remote Modules Verifying Test (Table XIX, FIG. 49), is effected before machine startup and called periodically during machine operation. The self tests identify for the machine operator the source of the failure through display lamps, which preferably comprise Light Emitting Diodes or L.E.D.'s 860, 861, 862, 863 on operator console 800 (FIG. 23). L.E.D.'s 860, 861, 862, 863 correspond to L.E.D. 1, L.E.D. 2, L.E.D. 3 and L.E.D. 4 found in the aforementioned Self Test tables.

In the Memory Check Sum Test (Table XI, FIG. 41), the contents of ROM memory section 545 (FIG. 17) is added and that sum is compared with a check sum count (CHECK SUM). If the numbers agree, a check is made to determine if the memory section is active. If not, the memory is bad. If the memory section is active, the normal program is continued. If the sums do not agree, a check is made to determine if the memory is active. If the memory is off, i.e. not active, the CPU memory printed wiring board (PWB) is bad. The controller failed (CPU FAIL) routine of Table XXI is called and the system shutdown. If the memory is active, the memory is disabled and the test repeated.

The check sum count (CHECK SUM) is obtained from the first run through of Memory Check Sum Comparison routine. The check sum count so obtained is stored in memory for subsequent use in this routine.

The Memory Checksum Test routine includes instructions for resetting the watch dog timer 614 each time around the test loop (RESET WATCH DOG TIMER). This is required since the total test time is greater than the time out setting of the watch dog timer. Thus, if not reset on each loop through the test, the timer 614 will time out with consequent setting of the fault flip flop and shutdown of the system.

In the RAM Memory Test (Tables XII, XIII, XIV and FIGS. 42, 43, 44) a check is run through the scratch pad and flag portions of RAM memory section 546 to see if any output drivers or cells are stuck in the binary "1" or "0" position. The first portion of the routine (FIG. 42a) follows a checkboard pattern with test bits (x '55') and x 'AA') addressed alternately to the even and odd memory addresses. A comparison check (CHECK CMP Table XIII, FIG. 43) is made comparing data sent with data received. The routine is repeated with the test data addressed in a reversed (complement) checkboard pattern.

A second portion of the RAM Memory Test (Table XII, Part II, FIG. 42b) uses the subroutine ADDR CHK (Table XIV, FIGS. 44a, 44b) to check for shorted or open address lines or decode problems by walking a binary "1" through the memory address lines and checking the return. A failure in the Output Driver Stuck check routine causes a jump to the controller failed (CPU FAIL) routine of Table XX. L.E.D. 860 is turned on to identify the fault.

The NVM memory test (Table XV, FIG. 45) checks each data line for shorts by rotating a binary "1" therethrough. An input/output comparison of the memory is made. If the memory is not the same, a failure (IOP FAIL) is called. Using the Test Nibble (TEST NIB) subroutine of Table XV, Part II each of the non-volatile memory (NVM) locations are checked to determine if stuck in either a binary "0" or binary "1" condition. If so, the IOP failure (IOP FAIL) is called. Following this, the routine is exited.

In the address Wrap Around Test (Table XVI, FIG. 46), a first portion of the test is performed wherein a loop is made through the input matrix address lines to IOP Module 502. The data is read out and compared with the data inputted. If the comparison shows a difference, a CPU halt (IOP FAIL - Table XX) is called. A second portion of this routine checks out movement of a test bit via the input matrix address lines to a selected remote location (D7). A comparison is made between the bit input and output and a CPU halt (IOP FAIL - Table XX) is called if the bits are not the same. The IOP routine (IOP FAIL) turns L.E.D.'s 860, 861 on to identify the fault to the operator. The test is repeated until all of the matrix address lines for the remotes Do - D7 have been checked.

The Controller Interface Refresh Test Routine (Table XVII, FIG. 47) for CPU Interface Module 504 Part I loops a test bit through each of the data lines (total 256) to the remotes Do - D7 (FIG. 25) and checks to see if the readback is the same as the output. A second portion checks the address lines (total 32) in the same manner. Part II of the routine determines the identity of the Printed Wiring Board (PWB) at fault from the test results of the Address Wrap Around Test (Table XVI) or the Controller Interface Refresh Test (Table XVII). The appropriate subroutine IOP FAIL or CTL INTF (Table XX) is called to turn on the appropriate indicator L.E.D.'s 860, 861 or L.E.D. 863 on console 800.

In the Data Transmission to Digit Display Test Routine (Table XVIII, FIG. 48), data transmission to the Main Panel Interface Module 546, through which the digit display of control console 800 (FIG. 32) is effected, is checked by looping a test bit through the data lines Do - D7 (total 256) and reading back data sent. The data read back is compared with the data sent and any failed bits saved for use in identifying the fault.

In the Data Transmission to Remote Modules Verifying Test Routine (Table XIX, FIG. 49), a static check is made before system startup of the Input Matrix Module 524 to determine if data is being transmitted to between Module 524 and the remote modules Do - D7. In this test, a test bit is sent through each data line (total 256) and read back. A comparison is made between the bit sent and any failed bits are saved. The failed buts saved from the Data Transmission to Digit Display Test (Table XVIII) and the static Data Transmission to Remote Modules Verifying Test (Table XIX) are used in the second portion of the routine to identify either the Input Matrix Module Printed Wiring Board (PWB) or the Main Panel Interface Module PWB as the problem, and turn on the appropriate L.E.D. combination 861, 862 or 860, 861, 862.

A running check of data transmission is made periodically during machine operation. In this check, a test bit is sent to each remote Do - D7 and a comparison is made between the bit sent and the bit returned. If the comparison shows the bit sent differs from the bit returned, the failed bit is checked to see if the same bit failed earlier. Should the same bit fail twice in a row, a jump is made to the Self Test Start routie (SEC STRT - Table XI). This return disables the interrupts, allowing the watchdog timer 614, (FIG. 23) to time out and shutdown the machine. The Static Self Test Routines, which must be redone before restart of the machine 10 is allowed, locate the fault and identify the fault to the operator through the use of L.E.D.'s 860, 861, 862, 863.

The Miscellaneous Routines (Table XX) comprise subroutines called during various ones of the self test routines. These include a delay routine (V DELAY);. I/O Safeline pulse routine (SAF PULS); and failure stop routines (CPU FAIL; MNPL IOF; IOP FAIL; MNPL CK: MTX FAIL; and CTL INTF).

Referring to the controller operating cycle block diagram of FIG. 34, the aforedescribed Static Self Test Routines (Tables XI through XIX) are initially performed after power to controller 18 is established (D.C. POWER on). Following completion of the static portion of the Data Transmission to Remote Modules Verifying Test (Table XIX), the self test routine sequence is exited and the controller enters the software initialization (INIT) state of the state checker routine of Table I.

During machine operations, controller 18 is in one of the Software Initialization, System Not Ready, System Ready, Print, System Running Not Print, and Service states until shutdown. When the controller is in the System Not Ready, System Ready, Print, and System Running Not Print states, the running portion of the Data Transmission to Remote Modules Verifying Test, Table XIX (TST LP 4) is periodically called to verify transmission of operating data to the remotes. Where a problem is discovered, the machine is shutdown and return is made to the Static Self Test Routines, i.e. Memory Checksum Comparison, Table XI (SEC STRT), to determine where the fault lays as described.

While the invention has been described with reference to the structure disclosed, it is not confined to the details set forth, but is intended to cover such modifications or changes as may come within the scope of the following claims.

What is claimed is:

1. A method of operating a reproduction machine having a plurality of components which cooperate with one another and a photosensitive member to produce copies, said components being controlled by a controller having a memory section, said method comprising:
   (a) sensing the application of power to the machine;
   (b) totalizing the content of said memory;
   (c) comparing the memory total with a first checksum;
   (d) preventing actuation of the machine components if said memory total fails to correspond with said first checksum; and
   (e) displaying the cause of the failure.

2. The method of claim 1 wherein said memory total is stored for use as said first checksum in step (c) during the next succeeding test of the memory.

3. The method of claim 2 which further comprises after step (c), the steps of:
   sensing whether the memory is active if there is a failure of comparison; and
   indicating a fault in the controller printed wiring board by energizing a visual indicator device if the memory is not active.

4. The method of claim 3 which further comprises after step (c), the steps of:
   sensing whether the memory is active if the memory total corresponds with the first checksum; and
   indicating a fault in the memory if the memory is not active.

* * * * *